United States Patent
Kastner-Jung et al.

(10) Patent No.: US 11,585,504 B2
(45) Date of Patent: Feb. 21, 2023

(54) ORGANIC-LIGHT-EMITTING DIODE

(71) Applicant: PICTIVA DISPLAYS INTERNATIONAL LIMITED, Dublin (IE)

(72) Inventors: Ulrich Kastner-Jung, Munich (DE); Markus Klein, Tegernheim (DE); Stan Maes, Dilsen-Stokken (BE); Romana Sigl, Salzburg (AT); Annette Haid, Salzburg (AT); Stephan Lintner, Salzburg (AT); Julian Herget, Marktschellenberg (DE); Gregor Matjan, Bergheim (AT)

(73) Assignee: Pictiva Displays International Limited

( * ) Notice: Subject to any disclaimer, the term of this patent is extended or adjusted under 35 U.S.C. 154(b) by 2 days.

(21) Appl. No.: 16/790,198

(22) Filed: Feb. 13, 2020

(65) Prior Publication Data
US 2020/0182422 A1 Jun. 11, 2020

Related U.S. Application Data

(63) Continuation of application No. 15/651,508, filed on Jul. 17, 2017, now Pat. No. 10,605,422, which is a
(Continued)

(30) Foreign Application Priority Data

Dec. 11, 2008 (DE) .................... 10 2008 061 563.3

(51) Int. Cl.
*H01L 51/52* (2006.01)
*F21S 10/02* (2006.01)
(Continued)

(52) U.S. Cl.
CPC ................ *F21S 10/02* (2013.01); *B05B 1/18* (2013.01); *B60Q 1/268* (2013.01); *B60Q 3/30* (2017.02);
(Continued)

(58) Field of Classification Search
CPC ............ H01L 51/0097; H01L 51/5209; H01L 51/5218; H01L 51/5225; H01L 51/5246; H01L 51/5253
See application file for complete search history.

(56) References Cited

U.S. PATENT DOCUMENTS 5,734,225 A 3/1998 Biebuyck et al.
5,895,228 A 4/1999 Biebuyck
(Continued)

FOREIGN PATENT DOCUMENTS

DE 10308514 9/2004
DE 10332956 2/2005
(Continued)

OTHER PUBLICATIONS

Boffi Wedge. Stylepark, May 25, 2011. (1 page). Retrieved from http://www.stylepark.com/en/boffi/wedge.
(Continued)

*Primary Examiner* — Tung X Le
(74) *Attorney, Agent, or Firm* — Botos Churchill IP Law

(57) ABSTRACT

A device comprising an organic light-emitting diode comprising an organic layer sequence, a radiation exit area and an encapsulation, wherein the organic layer sequence comprises at least one radiation-emitting region which generates electromagnetic radiation in the spectral range from infrared radiation to UV radiation during operation, and wherein the encapsulation forms a seal of the organic layer sequence against environmental influences, at least one touch-sensitive operating element, wherein the at least one touch-
(Continued)

sensitive operating element comprises at least one touch sensor, wherein the device is flexible.

12 Claims, 60 Drawing Sheets

Related U.S. Application Data continuation of application No. 13/139,514, filed as application No. PCT/DE2009/001741 on Dec. 9, 2009, now Pat. No. 9,797,567.

(51) Int. Cl.

| | |
|---|---|
| *F21V 23/04* | (2006.01) |
| *F21V 33/00* | (2006.01) |
| *G04C 19/02* | (2006.01) |
| *G04G 11/00* | (2006.01) |
| *G04G 13/02* | (2006.01) |
| *H05B 33/22* | (2006.01) |
| *B60Q 3/74* | (2017.01) |
| *B60Q 3/30* | (2017.01) |
| *B60Q 1/26* | (2006.01) |
| *B60Q 7/00* | (2006.01) |
| *B05B 1/18* | (2006.01) |
| *F24D 19/06* | (2006.01) |
| *H05B 45/60* | (2022.01) |
| *H05B 47/16* | (2020.01) |
| *H05B 47/105* | (2020.01) |
| *F21S 8/00* | (2006.01) |
| *F21S 8/04* | (2006.01) |
| *F21S 8/06* | (2006.01) |
| *F21S 9/03* | (2006.01) |
| *F21Y 105/00* | (2016.01) |
| *F21Y 115/15* | (2016.01) |
| *F21Y 113/10* | (2016.01) |
| *F21Y 113/20* | (2016.01) |
| *H01L 51/50* | (2006.01) |
| *H05B 47/195* | (2020.01) |
| *H05B 47/125* | (2020.01) |
| *H05B 47/165* | (2020.01) |

(52) U.S. Cl.
CPC .............. *B60Q 3/745* (2017.02); *B60Q 7/00* (2013.01); *F21V 23/0442* (2013.01); *F21V 33/004* (2013.01); *F21V 33/006* (2013.01); *F21V 33/0016* (2013.01); *F21V 33/0052* (2013.01); *F24D 19/06* (2013.01); *G04C 19/02* (2013.01); *G04G 11/00* (2013.01); *G04G 13/023* (2013.01); *H05B 33/22* (2013.01); *H05B 45/60* (2020.01); *H05B 47/105* (2020.01); *H05B 47/16* (2020.01); *F21S 8/033* (2013.01); *F21S 8/04* (2013.01); *F21S 8/061* (2013.01); *F21S 9/03* (2013.01); *F21Y 2105/00* (2013.01); *F21Y 2113/10* (2016.08); *F21Y 2113/20* (2016.08); *F21Y 2115/15* (2016.08); *H01L 51/504* (2013.01); *H01L 51/506* (2013.01); *H01L 51/5076* (2013.01); *H01L 2251/5361* (2013.01); *H05B 47/125* (2020.01); *H05B 47/165* (2020.01); *H05B 47/195* (2020.01); *Y02B 20/30* (2013.01); *Y02B 20/40* (2013.01)

(56) References Cited

U.S. PATENT DOCUMENTS

| | | | |
|---|---|---|---|
| 6,236,622 B1 | 5/2001 | Blackman | |
| 6,787,976 B2* | 9/2004 | Minoura | H01L 51/5271 |
| | | | 313/506 |
| 6,926,572 B2* | 8/2005 | Park | C23C 16/45525 |
| | | | 427/255.28 |
| 7,205,714 B2 | 4/2007 | Chen | |
| 7,211,945 B2* | 5/2007 | Lee | H01L 51/5275 |
| | | | 313/506 |
| 7,280,439 B1 | 10/2007 | Shaddox | |
| 7,317,210 B2 | 1/2008 | Brabec et al. | |
| 7,560,727 B2 | 7/2009 | Ishikawa | |
| 7,733,008 B2 | 6/2010 | Ke et al. | |
| 7,922,358 B2 | 4/2011 | von Malm | |
| 2001/0043046 A1 | 11/2001 | Fukunaga | |
| 2001/0052752 A1 | 12/2001 | Ghosh | |
| 2002/0003403 A1* | 1/2002 | Ghosh | H01L 51/5253 |
| | | | 313/512 |
| 2002/0125822 A1 | 9/2002 | Graff | |
| 2002/0167270 A1 | 11/2002 | Siwinski | |
| 2003/0064540 A1 | 4/2003 | Auch et al. | |
| 2003/0071259 A1* | 4/2003 | Yoshida | C08G 61/126 |
| | | | 257/40 |
| 2003/0071804 A1 | 4/2003 | Yamazaki | |
| 2003/0121767 A1 | 7/2003 | Caldwell | |
| 2003/0175553 A1 | 9/2003 | Thompson | |
| 2003/0222577 A1 | 12/2003 | Lu | |
| 2003/0231495 A1 | 12/2003 | Searfoss, III | |
| 2004/0022058 A1* | 2/2004 | Birrell | F21V 23/005 |
| | | | 362/249.01 |
| 2004/0113542 A1 | 6/2004 | Hsiao | |
| 2005/0099824 A1 | 5/2005 | Dowling | |
| 2005/0110049 A1* | 5/2005 | Urushido | H05K 1/0281 |
| | | | 257/202 |
| 2005/0231101 A1 | 10/2005 | Chen | |
| 2006/0049381 A1 | 3/2006 | Klein | |
| 2006/0141135 A1* | 6/2006 | Wang | H01L 51/0013 |
| | | | 427/256 |
| 2007/0114520 A1 | 5/2007 | Garditz et al. | |
| 2007/0230211 A1 | 10/2007 | Osato et al. | |
| 2007/0278937 A1 | 12/2007 | Forrest et al. | |
| 2008/0219013 A1 | 9/2008 | Budinger et al. | |
| 2008/0248191 A1 | 10/2008 | Daniels | |
| 2009/0021666 A1* | 1/2009 | Chen | G02F 1/133305 |
| | | | 349/73 |
| 2009/0039272 A1 | 2/2009 | Krummacher et al. | |
| 2009/0072711 A1 | 3/2009 | Cina et al. | |
| 2009/0142556 A1* | 6/2009 | Lang | H01L 51/0015 |
| | | | 427/553 |
| 2010/0157585 A1 | 6/2010 | Diekmann | |
| 2011/0096504 A1* | 4/2011 | Hild | H01L 51/5246 |
| | | | 361/704 |
| 2011/0187668 A1* | 8/2011 | Hente | G06F 3/0443 |
| | | | 345/173 |
| 2012/0258294 A1 | 10/2012 | Leyder | |

FOREIGN PATENT DOCUMENTS

| | | |
|---|---|---|
| DE | 10 2006 037 222 | 2/2008 |
| DE | 102007059732 | 6/2009 |
| DE | 102008051132 | 1/2010 |
| JP | 2002-033198 | 1/2002 |
| JP | 2003-195775 | 7/2003 |
| JP | 2004-047179 | 2/2004 |
| JP | 2004-296423 | 10/2004 |
| JP | 2005-510851 | 4/2005 |
| JP | 2007-200887 | 8/2007 |
| JP | 2007-294143 | 11/2007 |
| JP | 2008-538155 | 10/2008 |
| JP | 4182467 B2 | 11/2008 |
| JP | 4228248 B2 | 2/2009 |
| JP | 4637390 B2 | 2/2011 |
| JP | 4713010 B2 | 6/2011 |
| JP | 4742880 B2 | 8/2011 |

(56) References Cited

FOREIGN PATENT DOCUMENTS

| | | |
|---|---|---|
| JP | 4828881 B2 | 11/2011 |
| KR | 20020079438 | 10/2002 |
| KR | 100743545 | 7/2007 |
| KR | 2008-0042275 | 5/2008 |
| KR | 20080081255 | 9/2008 |
| KR | 1020050065948 | 11/2013 |
| WO | WO 2008/040323 | 4/2008 |
| WO | WO 2008/110959 | 9/2008 |
| WO | WO 2008/146232 | 12/2008 |
| WO | WO 2009/040401 | 4/2009 |
| WO | WO 2009/074127 | 6/2009 |
| WO | WO 2009/095005 | 8/2009 |
| WO | WO 2009/106067 | 9/2009 |
| WO | WO 2010/006571 | 1/2010 |

OTHER PUBLICATIONS

Bus stop shelter intelligent series. May 25, 2011. (2 pages). Retrieved from http://www.wall.de/en/street_furniture/products?category_scope=bus_stop_shelter.

Cristina Rubinetterie sandwich shower head—new electronic LED shower head, May 12, 2007. (3 pages). Retrieved from http://www.trendir.com/archives/001435.html.

Dornbracht RainSky E Showers by Rixson & Green Shortlands Ltd. Sep. 2000. (1 page). Retrieved from http://www.rixson-green.co.uk/dornbracht_showers.htm.

Marketing-displays. Illuminated box CLP-S I freetstanding unit, one-sided (1200 x 1760 mm). May 25, 2011. (1 page). Retrieved from http://www.md-displayshop.de/ProductDetails.aspx?id=24&prodi . . .

LCD-Glass; Glass with LCD Film (max height 300—max width 120). 2009. (2 pages). Retrieved from http://www.vetroin.co.uk/en/TECHNOLOGY/LDC-Glass.html no month.

ThinkGeeklumadot LED Umbrella. May 25, 2011. (2 pages). Retrieved from http://www.thinkgeek.com/interests/moms/d16b/.

Luceplan. Strip D22/4—D22/4 EL. May 25, 2011. Retrieved from http://www.luceplan.com/Dynamic/Prodotti.php?intLangID=1&intC . . .

Multifunctional shower cabin—Well Box—Megius SpA. 2011. (1 page). Retrieved from http://www.archiexpo.com/prod/megius-spa/multifunctional-shower . . . no month.

The General Properties of Si, Ge, SiGe, SiO2 and Si3N4 (Jun. 2002, Virginia Semiconductor, Retrieved from the Internet: <URL www.virginiasemi.com/pdf/generalpropertiesSi62002.pdf>).

Edgar S. Zaus et al., Design of Highly Transparent Organic Photodiodes, IEEE Transactions of Electron Devices, Vo. 55, No. 2, Feb. 2008.

N. R. Mowrer, Polysiloxanes, Ameron International Performance Coatings and Finishes, Nov. 2003.

\* cited by examiner

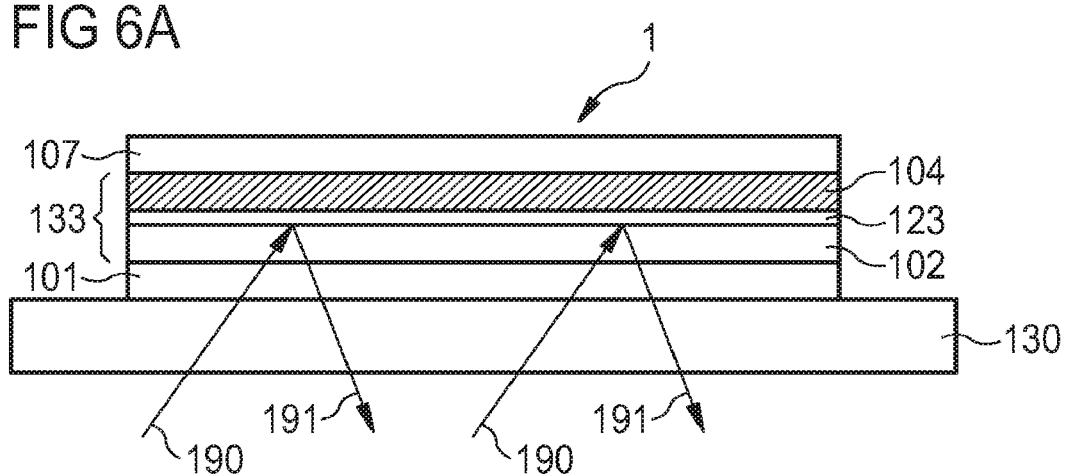
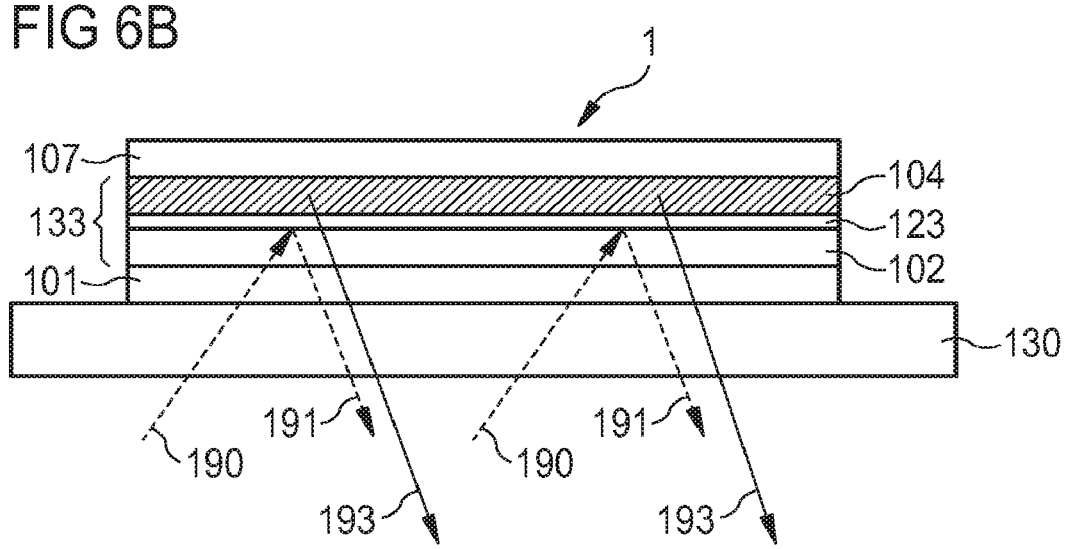

FIG 21
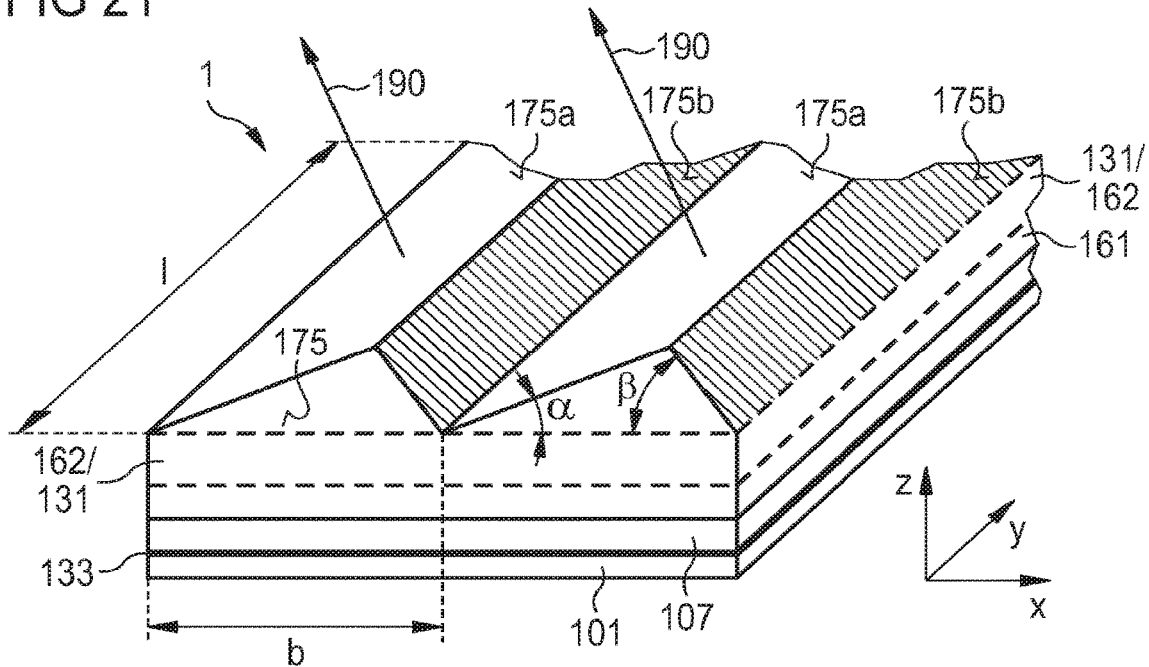
FIG 22
a) 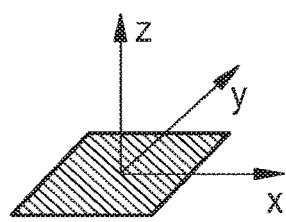
b) Typ A-1 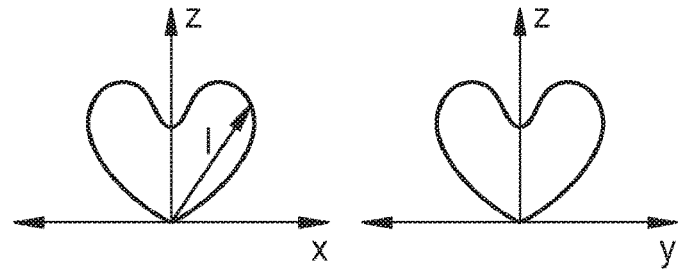
c) Typ A-2 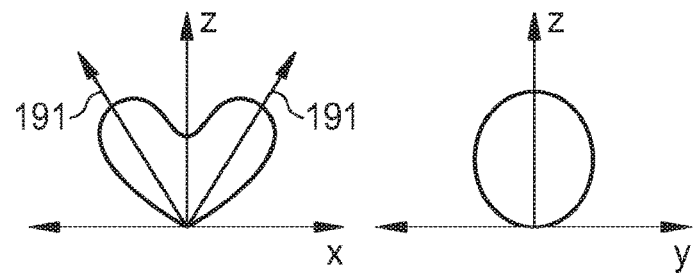
d) Typ B 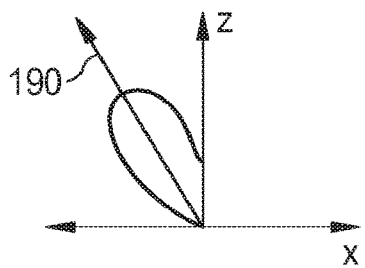

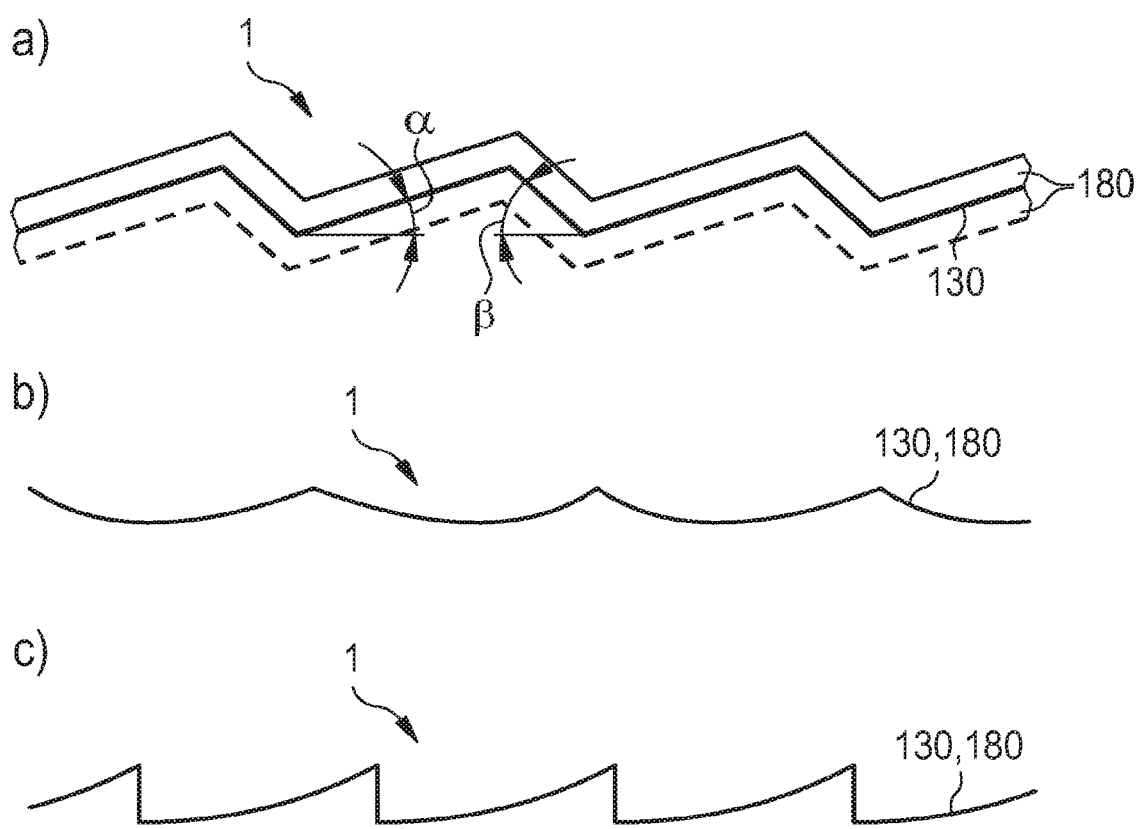

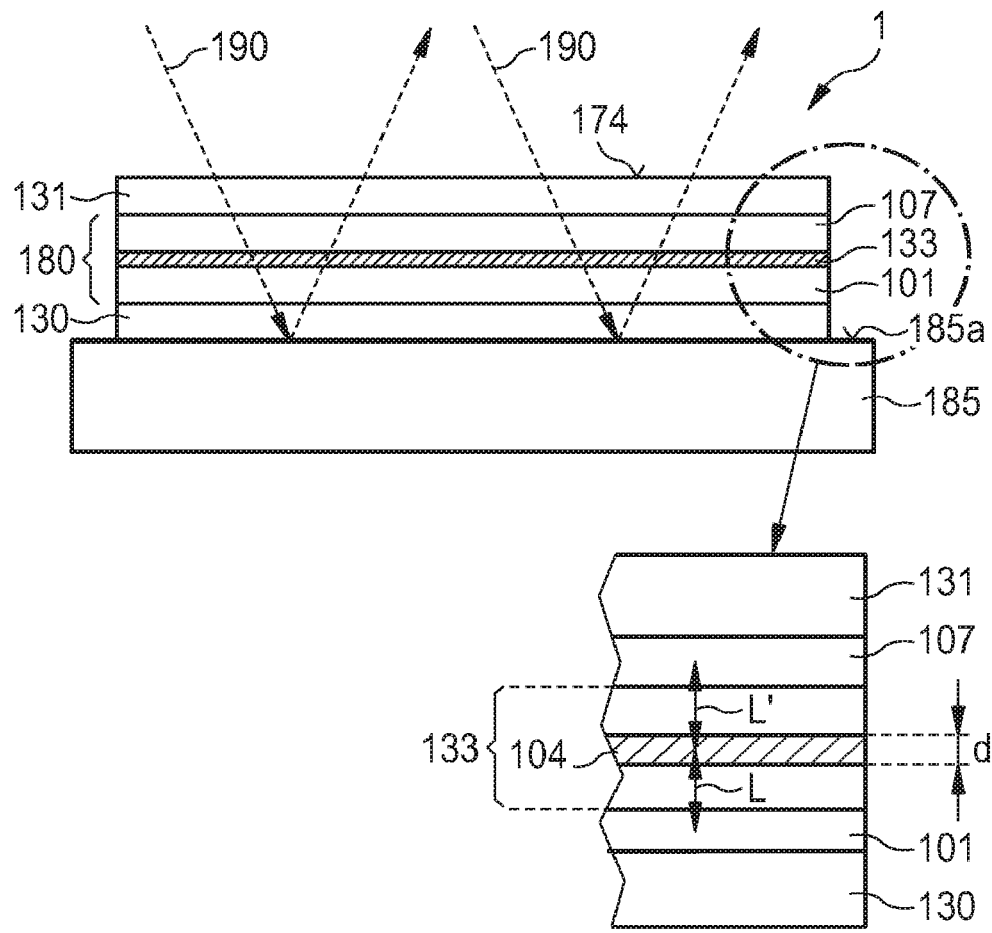
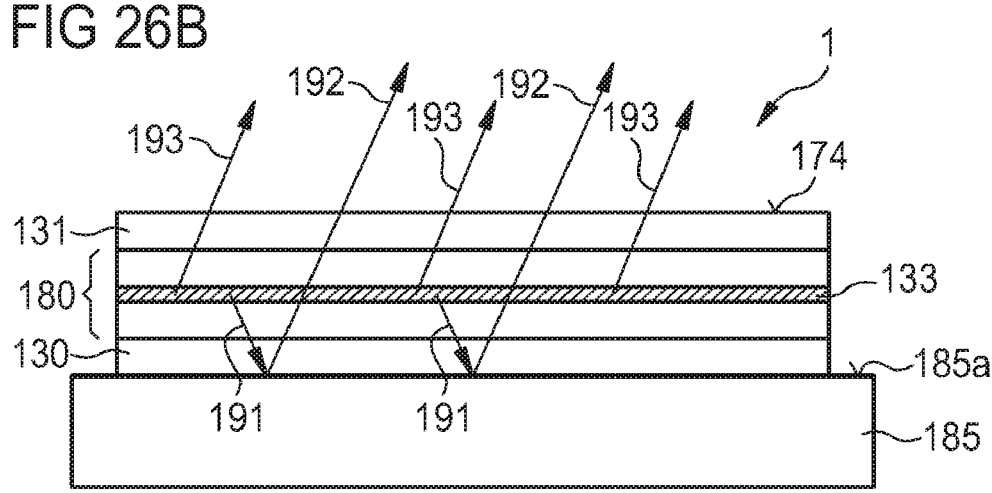

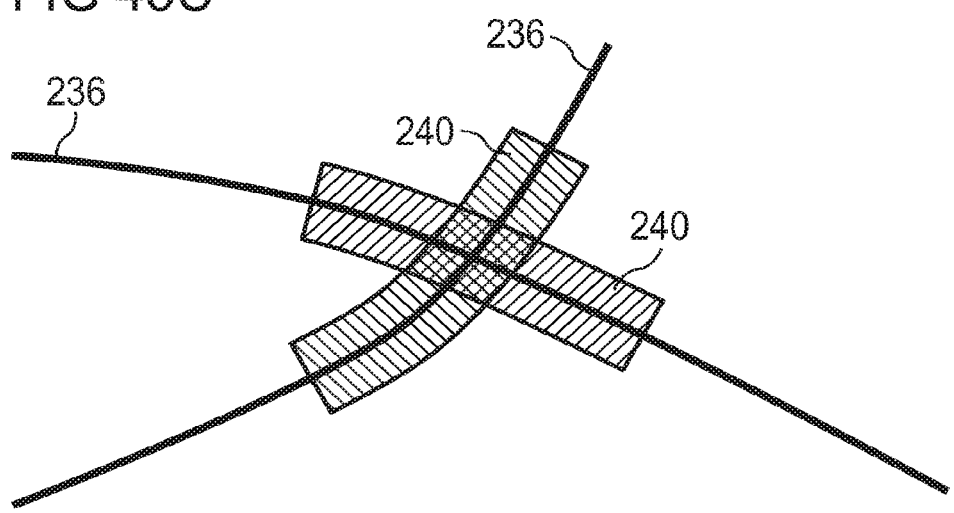

ORGANIC-LIGHT-EMITTING DIODE

RELATED APPLICATIONS

This application is a continuation of U.S. application Ser. No. 15/651,508 filed Jul. 17, 2017, which is a continuation of Ser. No. 13/139,514 filed Jan. 3, 2012 now U.S. Pat. No. 9,797,567 which issued on Oct. 24, 2017 which claims the priority under 35 U.S.C. 371 of International application No. PCT/DE2009/001741 filed on Dec. 9, 2009. Priority is also claimed of German application no. 10 2008 061 563.3 filed on Dec. 11, 2008. The entire contents of all these applications is hereby incorporated by reference.

FIELD OF THE INVENTION

Organic light-emitting diodes and luminaires are described.

SUMMARY OF THE INVENTION

One object of the invention is to provide organic light-emitting diodes which can be used particularly diversely.

This and other objects are attained in accordance with one aspect of the present invention directed to an organic light-emitting diode comprising an organic layer sequence, a radiation exit area and an encapsulation. The organic layer sequence comprises at least one radiation-emitting region which generates electromagnetic radiation in the spectral range from infrared radiation to UV radiation during operation. The radiation exit area is structured, so that the electromagnetic radiation has a directional emission profile. The encapsulation forms a seal of the organic layer sequence against environmental influences.

The organic light-emitting diodes described below can be, for example, organic light-emitting diodes which are transparent, emit on both sides, emit white light, emit colored light, emit infrared radiation, emit light diffusely, are rigid, are flexible and/or emit directional radiation. The luminaires can be, for example, luminaires which are used as an alarm clock, which form part of a shower cubicle, which form part of a shower head, which serve as solar protection, which serve as rain protection, which are provided for general lighting, which can be used in mobile fashion and/or which inherently combine a plurality of these functions.

Embodiments of organic light-emitting diodes described here are presented below. In this case, the embodiments of the organic light-emitting diodes can be combined among one another in any desired manner.

In accordance with at least one embodiment of an organic light-emitting diode described here, the organic light-emitting diode comprises a radiation-emitting region in which electromagnetic radiation is generated during the operation of the organic light-emitting diode.

In accordance with at least one embodiment of an organic light-emitting diode described here, the organic light-emitting diode generates electromagnetic radiation in the spectral range from infrared radiation to UV radiation during operation.

In accordance with at least one embodiment of an organic light-emitting diode described here, the organic light-emitting diode emits infrared radiation during the operation of the organic light-emitting diode.

In accordance with at least one embodiment of an organic light-emitting diode described here, the organic light-emitting diode emits colored light during the operation of the organic light-emitting diode.

In accordance with at least one embodiment of an organic light-emitting diode described here, the organic light-emitting diode emits white light during the operation of the organic light-emitting diode.

In accordance with at least one embodiment of an organic light-emitting diode described here, the organic light-emitting diode comprises at least one first charge carrier transport layer and at least one second charge carrier transport layer. By way of example, the organic light-emitting diode comprises a hole transport layer and also an electron transport layer as charge carrier transport layers.

In accordance with at least one embodiment of an organic light-emitting diode described here, a hole transport layer of the organic light-emitting diode comprises a matrix material that is p-doped.

In accordance with at least one embodiment of an organic light-emitting diode described here, an electron transport layer of the organic light-emitting diode comprises a matrix material that is n-doped.

In accordance with at least one embodiment of an organic light-emitting diode described here, a hole transport layer of the organic light-emitting diode comprises a matrix material and also a p-type dopant which has Lewis acid character or is a Lewis acid.

In accordance with at least one embodiment of an organic light-emitting diode described here, the matrix material and the dopant of at least one charge carrier transport layer of the organic light-emitting diode are chosen in such a way that the organic light-emitting diode gives a predetermined color impression in the switched-off operating state. That is to say that, through a suitable choice of matrix material and dopant, the organic light-emitting diode appears for example transparent, bluish, reddish, greenish or in some other color in the switched-off state. Furthermore, it is possible for the organic light-emitting diode to appear white in the switched-off state. Furthermore, the organic light-emitting diode can appear in different colors when viewed from different sides.

In accordance with at least one embodiment of an organic light-emitting diode described here, the organic light-emitting diode has a hole transport layer comprising a matrix material and a dopant that form a charge transfer complex. In this case, the charge transfer complex has a first absorption spectrum. In this case, the hole transport layer has a predetermined color impression in the switched-off operating state of the organic light-emitting diode.

In accordance with at least one embodiment of the organic light-emitting diode, the organic light-emitting diode comprises at least one first electrode and at least one second electrode.

In accordance with at least one embodiment of the organic light-emitting diode, the organic light-emitting diode comprises at least one transparent electrode.

In accordance with at least one embodiment of an organic light-emitting diode described here, the transparent electrode is formed with a transparent conductive oxide (TCO).

In accordance with at least one embodiment of an organic light-emitting diode described here, the transparent electrode is formed with a thin, transparent metal layer.

In accordance with at least one embodiment of an organic light-emitting diode described here, the transparent electrode is formed with a transparent conductive oxide (TCO) and a thin, transparent metal layer.

In accordance with at least one embodiment of an organic light-emitting diode described here, the transparent electrode is formed with a thin, transparent metal layer having a thickness of at least 1 nm and at most 50 nm.

In accordance with at least one embodiment of an organic light-emitting diode described here, at least one electrode of the organic light-emitting diode is configured in reflective fashion.

In accordance with at least one embodiment of an organic light-emitting diode described here, the reflectivity of at least one electrode of the organic light-emitting diode is at least 80%, particularly preferably at least 90%. The reflectivity has these high values preferably at least for electromagnetic radiation generated in the organic light-emitting diode during operation.

In accordance with at least one embodiment of an organic light-emitting diode described here, the organic light-emitting diode has an electrode comprising an LiF-containing layer on a side facing a radiation-emitting region of the organic light-emitting diode. Preferably, the electrode is then a cathode. By way of example, the electrode is in direct contact with the LiF-containing layer. For example, said LiF-containing layer completely covers the electrode at a main area, is in direct contact with the electrode and consists of LiF.

In accordance with at least one embodiment of an organic light-emitting diode described here, the organic light-emitting diode comprises a radiation-emitting region comprising at least one emission layer which contains an organic material. During operation of the organic light-emitting diode, electromagnetic radiation is generated in the at least one emission layer.

In accordance with at least one embodiment of an organic light-emitting diode described here, a radiation-emitting region of the organic light-emitting diode comprises at least two emission layers which emit electromagnetic radiation in different or the same wavelength ranges during operation. By way of example, it is possible for one emission layer in the radiation-emitting region to emit colored light during the operation of the organic light-emitting diode. The other emission layer can be designed to emit infrared radiation. Furthermore, it is possible for all the emission layers of the radiation-emitting region to emit colored light. In this case, different emission layers can emit light of different colors, which is mixed for an external observer to form mixed light, for example white mixed light.

In accordance with at least one embodiment of an organic light-emitting diode described here, the light-emitting diode comprises in a radiation-emitting region at least one emission layer suitable for emitting light from the spectral range for infrared light.

In accordance with at least one embodiment of an organic light-emitting diode described here, the light-emitting diode comprises in a radiation-emitting region at least one emission layer suitable for emitting light from the spectral range for red light.

In accordance with at least one embodiment of an organic light-emitting diode described here, the light-emitting diode comprises in a radiation-emitting region at least one emission layer suitable for emitting light from the spectral range for blue light.

In accordance with at least one embodiment of an organic light-emitting diode described here, the light-emitting diode comprises in a radiation-emitting region at least one emission layer suitable for emitting light from the spectral range for green light.

In accordance with at least one embodiment of an organic light-emitting diode described here, the organic light-emitting diode comprises a first emission layer in the radiation-emitting region which emits red light, a second emission layer which emits green light, and also a third emission layer which emits blue light.

In this case, the emission layers can be arranged to form a layer stack in the radiation-emitting region of the organic light-emitting diode. The emission layer facing the anode contains, for example, a matrix material suitable for transporting holes. The emitter material is then introduced into the matrix material.

The emission layer facing a cathode of the organic light-emitting diode then preferably contains a matrix material suitable for transporting electrons, the emitter material being introduced into said matrix material.

The emission layer arranged between the other two emission layers then preferably contains both a material suitable for transporting holes and a further material suitable for transporting electrons. For this purpose, charge transporting layers respectively comprising a first and a second matrix material are preferably arranged between the emission layers. The first matrix material is then a hole transporting matrix material, and the second matrix material is an electron conducting matrix material.

In accordance with at least one embodiment of an organic light-emitting diode described here, the organic light-emitting diode comprises a radiation-emitting region having at least three emission layers which emit white mixed light during operation.

In accordance with at least one embodiment of an organic light-emitting diode described here, the organic light-emitting diode is a transparent organic light-emitting diode. In this case, all the layers of the organic light-emitting diode are embodied in radiation-transmissive fashion.

In accordance with at least one embodiment of an organic light-emitting diode described here, the organic light-emitting diode is embodied in pellucid fashion. That is to say that electromagnetic radiation that passes through the organic light-emitting diode is hardly scattered or not scattered at all therein. If an organic light-emitting diode embodied in pellucid fashion in this way is placed for example onto a sheet of paper with printed text, then the text can still be read through the organic light-emitting diode. Preferably, at most 50% of the electromagnetic radiation passing through in the wavelength range of visible light is scattered and/or absorbed upon passing through the organic light-emitting diode. Particularly preferably, at most 25% of the electromagnetic radiation passing through in the wavelength range of visible light is scattered and/or absorbed upon passing through the organic light-emitting diode.

In accordance with at least one embodiment of an organic light-emitting diode described here, the organic light-emitting diode is embodied in radiation-transmissive fashion such that at least 50% of the radiation passing through is not absorbed in the organic light-emitting diode. Preferably, at least 75% of the radiation passing through is not absorbed in the organic light-emitting diode.

In accordance with at least one embodiment of an organic light-emitting diode described here, the organic light-emitting diode is an organic light-emitting diode which emits on both sides. That is to say that the organic light-emitting diode emits electromagnetic radiation from two radiation exit areas of the organic light-emitting diode during operation. The radiation exit areas can be arranged parallel to one another. Preferably, a radiation-emitting region of the organic light-emitting diode is situated between the two radiation exit areas. In this case, the organic light-emitting diode can be embodied as radiation-transmissive or non-radiation-transmissive. The organic light-emitting diode can furthermore be suitable for emitting electromagnetic radiation having mutually different wavelengths from both radiation passage areas. By way of example, visible light can pass through one radiation passage area, whereas infrared radiation passes through the other radiation passage area.

In accordance with at least one embodiment of an organic light-emitting diode described here, the organic light-emitting diode comprises at least one charge transporting layer which comprises a hole transporting matrix material and an electron transporting matrix material. The charge transporting layer is then suitable for transporting both holes and electrons.

In accordance with at least one embodiment of an organic light-emitting diode described here, the organic light-emitting diode comprises a radiation-transmissive electrode having a first layer composed of a first TCO material, a second layer, composed of a second TCO material, and also a third layer, which is arranged between first and second layers and is embodied as a transparent metal layer. In this case, the first and second TCO materials preferably differ from one another. The layers can directly adjoin one another. In this case, the thickness of the metal layer is, for example, between at least 1 nm and at most 50 nm, particularly preferably between at least 20 nm and at most 40 nm. The thin metal layer can be made so thin that it is netlike. In this case, it is possible that the first TCO layer and the second TCO layer can be situated in openings of the thin metal layer in direct contact with one another. In this case, the organic light-emitting diode can have, for example, an anode and/or a cathode embodied in each case in the layer construction described. If both electrodes of the organic light-emitting diode are embodied in the manner described, then the organic light-emitting diode can be a radiation-transmissive, a transparent or a pellucid organic light-emitting diode. Furthermore, the organic light-emitting diode can then be an organic light-emitting diode which emits on both sides and which is not embodied as radiation-transmissive, but rather emits electromagnetic radiation through both electrodes.

In accordance with at least one embodiment of an organic light-emitting diode described here, the organic light-emitting diode has a different color expression in the switched-off operating state than in the switched-on operating state. By way of example, the organic light-emitting diode can appear bluish in the switched-off operating state, whereas it emits white light in the switched-on operating state. Furthermore, it is possible for the organic light-emitting diode to give a different color impression in each case from two main areas, for example from two radiation passage areas, in the switched-off state.

In accordance with at least one embodiment of an organic light-emitting diode described here, the organic light-emitting diode is a transparent organic light-emitting diode which emits on both sides and which appears colored from both emission sides in the switched-off operating state and emits white light in the switched-on state. In this case, the colored impression can be different at the two emission sides of the organic light-emitting diode. By way of example, the organic light-emitting diode can appear red from one side, whereas it appears blue from the other side.

In accordance with at least one embodiment of an organic light-emitting diode described here, the organic light-emitting diode is encapsulated. That is to say that the organic light-emitting diode has at least one encapsulation which permits a seal of the functional layers of the organic light-emitting diode against environmental influences, such as moisture or atmospheric gases. The functional layers of the organic light-emitting diode are, for example, electrodes, charge carrier barrier layers, charge carrier transport layers and/or radiation-emitting layers such as emission layers.

In accordance with at least one embodiment of an organic light-emitting diode described here, the organic light-emitting diode comprises at least one first carrier. The first carrier can be a rigid carrier. By way of example, the first carrier is then formed from a glass, from a ceramic material or a metal. Furthermore, the first carrier can be a flexible carrier. The first carrier is then formed for example from a film or from a laminate.

In accordance with at least one embodiment of an organic light-emitting diode described here, the organic light-emitting diode comprises a second carrier alongside a first carrier. In this case, the second carrier can be formed from the same materials as the first carrier. Furthermore, it is possible for the first and second carriers to be formed from different materials. At least one of the carriers is at least partly transmissive to electromagnetic radiation generated in the radiation-emitting region of the organic light-emitting diode.

In accordance with at least one embodiment of an organic light-emitting diode described here, the first carrier and the second carrier are formed with a glass. That is to say that the first carrier and the second carrier contain a glass or consist of a glass. By way of example, both carriers then consist of the same glass.

In accordance with at least one embodiment of an organic light-emitting diode described here, the organic light-emitting diode comprises at least one carrier formed with a borosilicate glass. The organic light-emitting diode can comprise two carriers, for example, which consist of this glass.

In accordance with at least one embodiment of an organic light-emitting diode described here, the organic light-emitting diode comprises at least one carrier formed from a soda-lime glass. By way of example, the organic light-emitting diode then comprises two carriers consisting of this glass.

In accordance with at least one embodiment of an organic light-emitting diode described here, the organic light-emitting diode comprises a first carrier, which is embodied as radiation-transmissive, and a second carrier, which is embodied as non-radiation-transmissive. By way of example, the second carrier is embodied as reflective and/or absorbent for electromagnetic radiation generated in the radiation-emitting region of the organic light-emitting diode.

In accordance with at least one embodiment of an organic light-emitting diode described here, the organic light-emitting diode comprises a first carrier and also a second carrier. Functional layers of the organic light-emitting diode are arranged between first and second carriers. Furthermore, the first carrier and the second carrier are connected to one another by means of a connecting means, which laterally encloses the functional layers of the organic light-emitting diode and connects the two carriers to one another. In other words, the connecting means and the two carriers form a cavity, in which the functional layers of the organic light-emitting diode are arranged. The connecting means, the first carrier and the second carrier constitute the encapsulation or a part of the encapsulation of the organic light-emitting diode.

In accordance with at least one embodiment of an organic light-emitting diode described here, the connecting means comprises a glass solder material. By way of example, the connecting means is formed by a glass solder material. The glass solder material can directly adjoin the first and/or the second carrier at least in places.

In accordance with at least one embodiment of an organic light-emitting diode described here, the connecting means comprises a glass frit material. By way of example, the connecting means is formed by a glass frit material. The glass frit material can directly adjoin the first and/or the second carrier at least in places.

In accordance with at least one embodiment of an organic light-emitting diode described here, the connecting means comprises an adhesive. By way of example, the connecting means is formed by an adhesive. The adhesive can directly adjoin the first and/or the second carrier at least in places.

In accordance with at least one embodiment of an organic light-emitting diode described here, both the first carrier and the second carrier are embodied as radiation-transmissive, transparent or pellucid. Such carriers are particularly well suited to the formation of radiation-transmissive, transparent or pellucid organic light-emitting diodes.

In accordance with at least one embodiment of an organic light-emitting diode described here, at least one part of the encapsulation for the functional layers of the organic light-emitting diode is formed by an insulation layer, which can contain at least one of the following electrically insulating materials: resist, epoxy resin, silicon oxide, silicon nitride. Alongside its properties for encapsulating the functional layers of an organic light-emitting diode described here, the insulation layer can also serve for electrically insulating the first electrode of the organic light-emitting diode from a second electrode of the organic light-emitting diode.

In accordance with at least one embodiment of an organic light-emitting diode described here, the organic light-emitting diode has at least one thin-film encapsulation which forms at least one part of the encapsulation of the organic light-emitting diode. The thin-film encapsulation can produce a basic impermeability with respect to environmental influences, such as moisture and atmospheric gases, for the functional layers of the organic light-emitting diode. By way of example, the thin-film encapsulation is produced by applying oxide and/or nitride layers to functional layers of the organic light-emitting diode. The application can be effected by means of a PECVD method, for example.

In accordance with at least one embodiment of an organic light-emitting diode described here, the organic light-emitting diode comprises a diffusion barrier for the purpose of encapsulation. The diffusion barrier can be formed for example from an amorphous material, such as amorphous silicon dioxide, for example. The diffusion barrier can be applied by means of atmospheric pressure plasma, for example, to functional layers of the organic light-emitting diode and/or an insulation layer and/or a thin-film encapsulation.

In accordance with at least one embodiment of an organic light-emitting diode described here, the organic light-emitting diode has an encapsulation comprising at least one first layer embodied as thin-film encapsulation, and also a second layer embodied as diffusion barrier. Preferably, these two layers then directly adjoin one another at least in places, wherein, for example, the thin-film encapsulation is applied to functional layers of the organic light-emitting diode and the diffusion barrier is applied to the thin-film encapsulation.

In accordance with at least one embodiment of an organic light-emitting diode described here, the organic light-emitting diode comprises a diffusion barrier having a thickness of at least 50 nm and at most 1000 nm, preferably of at least 100 nm and at most 250 nm.

In accordance with at least one embodiment of an organic light-emitting diode described here, the organic light-emitting diode comprises a diffusion barrier for the purpose of encapsulation, said diffusion barrier having at least two individual layers, wherein the individual layers are deposited one above the other. Preferably, each of the individual layers has a thickness of at least 50 nm and at most 100 nm. In this case, the diffusion barrier can be constructed from individual layers consisting in each case of silicon dioxide or alternately of silicon dioxide and silicon nitride.

In accordance with at least one embodiment of an organic light-emitting diode described here, the organic light-emitting diode has a resist layer for the purpose of encapsulation. The resist layer can be used for example as an alternative or in addition to a diffusion barrier.

In accordance with at least one embodiment of an organic light-emitting diode described here, the organic light-emitting diode has a layer stack composed of a resist layer and a thin-film encapsulation, which are used for sealing the functional layers of the organic light-emitting diode. By way of example, the resist layer is arranged directly onto the functional layers of the organic light-emitting diode. The thin-film encapsulation is then arranged directly on the resist layer. By way of example, the thin-film encapsulation then encloses the resist layer at all exposed areas of the thin-film encapsulation.

In accordance with at least one embodiment of an organic light-emitting diode described here, the encapsulation of the organic light-emitting diode comprises a pre-encapsulation layer, which can serve as a planarization layer for a thin-film encapsulation of the organic light-emitting diode. By way of example, the pre-encapsulation layer is a transparent oxide or a radiation-transmissive adhesive. The pre-encapsulation layer can then cover a thin-film encapsulation in places, for example. Preferably, the pre-encapsulation layer then covers the thin-film encapsulation at all exposed outer areas of the thin-film encapsulation.

In accordance with at least one embodiment of an organic light-emitting diode described here, the organic light-emitting diode comprises as encapsulation at least one first carrier and one second carrier which are connected to one another by means of a connecting means, which laterally encloses the functional layers of the organic light-emitting diode. At the same time, the encapsulation comprises between the two carriers at least one of the following layers or encapsulation possibilities: insulation layer, resist layer, pre-encapsulation layer, thin-film encapsulation layer, and/or diffusion barrier.

In accordance with at least one embodiment of an organic light-emitting diode described here, the organic light-emitting diode comprises at least one encapsulation layer sequence having at least two encapsulation layers for the purpose of encapsulation. By way of example, the encapsulation layer sequence has at least one first encapsulation layer, which can be applied by means of plasma enhanced chemical vapor deposition. In this case, the first encapsulation layer can directly adjoin the functional layers of the organic light-emitting diode at least in places. Alternatively, the first encapsulation layer can be applied for example by means of deposition methods such as physical vapor deposition, sputtering or the like.

In accordance with at least one embodiment of an organic light-emitting diode described here, the first encapsulation layer of the encapsulation layer sequence has a thickness of at least 50 nm, preferably at least 100 nm, particularly preferably of at least 1 µm.

In accordance with at least one embodiment of an organic light-emitting diode described here, the encapsulation layer sequence comprises at least one second encapsulation layer which can be arranged directly on the first encapsulation layer. That is to say that the second encapsulation layer can be in direct contact with the first encapsulation layer. By way of example, the second encapsulation layer covers the entire exposed outer area of the first encapsulation layer.

In accordance with at least one embodiment of an organic light-emitting diode described here, the organic light-emitting diode comprises a second encapsulation layer deposited onto a first encapsulation layer by means of atomic layer deposition for the purpose of encapsulation.

In accordance with at least one embodiment of an organic light-emitting diode described here, the second encapsulation layer has a thickness of at least 1 nm, preferably of at least 10 nm, and at most 30 nm.

In accordance with at least one embodiment of an organic light-emitting diode described here, the organic light-emitting diode comprises a first carrier encapsulated at least in places with the encapsulation layer sequence having a first encapsulation layer and a second encapsulation layer. The first carrier can be a flexible carrier, for example, which is formed by a plastic film or a laminate. That is to say that the encapsulation layer sequence can also be used for hermetically sealing carriers for functional layers of the organic light-emitting diode.

In accordance with at least one embodiment of an organic light-emitting diode described here, the entire organic light-emitting diode is covered with the encapsulation layer sequence all around. In this case, it is possible for the organic light-emitting diode to comprise a first carrier, a second carrier and also a connecting means, which form a first encapsulation for the functional layers of the organic light-emitting diode. The encapsulation layer sequence can then be arranged in places or completely at the exposed outer areas of first carrier, second carrier and/or connecting means. Furthermore, it is also possible for the functional layers additionally or alternatively to be sealed directly with the encapsulation layer sequence. That is to say that the functional layers of the organic light-emitting diode then directly adjoin the encapsulation layer sequence.

In accordance with at least one embodiment of an organic light-emitting diode described here, the organic light-emitting diode comprises the encapsulation layer sequence having a first encapsulation layer and a second encapsulation layer for the purpose of encapsulation, wherein the first encapsulation layer and the second encapsulation layer each comprise an inorganic material, the first encapsulation layer is arranged directly on functional layers of the organic light-emitting diode, and the second encapsulation layer is arranged directly on the first encapsulation layer.

In accordance with at least one embodiment of an organic light-emitting diode described here, the organic light-emitting diode comprises the encapsulation layer sequence having a first encapsulation layer, a second encapsulation layer and a third encapsulation layer for the purpose of encapsulation, wherein the third encapsulation layer is arranged directly on the functional layers of the organic light-emitting diode, the first encapsulation layer is arranged directly on the third encapsulation layer, the second encapsulation layer is arranged directly on the first encapsulation layer, the first and second encapsulation layers each comprise an inorganic material, and the third encapsulation layer comprises an amorphous inorganic material. In this case, it is possible for the second and third encapsulation layers to be embodied identically.

In accordance with at least one embodiment of an organic light-emitting diode described here, the organic light-emitting diode comprises the encapsulation layer sequence having a first layer and a second layer, wherein the first encapsulation layer and the second encapsulation layer each comprise an inorganic material, the second encapsulation layer is arranged directly on the first encapsulation layer, and the encapsulation layer sequence is hermetically impermeable at a temperature of greater than or equal to 60° C. and at a relative air humidity of greater than or equal to 85% for longer than 500 hours.

In accordance with at least one embodiment of an organic light-emitting diode described here, the first encapsulation layer and the second encapsulation layer of the encapsulation layer sequence for encapsulating the organic light-emitting diode each have a volume structure, wherein the volume structure of the second encapsulation layer is independent of the volume structure of the first encapsulation layer. In this case, the volume structure of the second encapsulation layer preferably has a higher amorphicity than the volume structure of the first encapsulation layer. Particularly preferably, the second encapsulation layer is amorphous.

In accordance with at least one embodiment of an organic light-emitting diode described here, the second encapsulation layer of the encapsulation layer sequence comprising first encapsulation layer and second encapsulation layer has a thickness having a thickness variation which is independent of a surface structure and/or a volume structure of the first encapsulation layer sequence. In this case, the thickness variation is preferably less than or equal to 10%.

In accordance with at least one embodiment of an organic light-emitting diode described here, the organic light-emitting diode comprises an encapsulation layer sequence having a plurality of first encapsulation layers and a plurality of second encapsulation layers for the purpose of encapsulation, wherein the first and the second encapsulation layers are applied alternately one directly above another.

In accordance with at least one embodiment of an organic light-emitting diode described here, the encapsulation layer sequence completely encloses the functional layers of the organic light-emitting diode. In this case, the encapsulation layer sequence can also completely enclose a first and/or a second carrier.

In accordance with at least one embodiment of an organic light-emitting diode described here, the organic light-emitting diode has a first carrier and a second carrier, and also the encapsulation layer sequence arranged between first and second carriers, for the purpose of encapsulation.

In accordance with at least one embodiment of an organic light-emitting diode described here, the organic light-emitting diode has a first carrier and a second carrier and also a connecting means, which connects first and second carriers to one another, for the purpose of encapsulation. Furthermore, the organic light-emitting diode has the encapsulation layer sequence having at least two encapsulation layers, which covers and thus encapsulates an interface between the connecting means and the first carrier and/or the second carrier.

In accordance with at least one embodiment of an organic light-emitting diode described here, the organic light-emitting diode has a protective layer arranged between an organic layer sequence of the organic light-emitting diode and an electrode of the organic light-emitting diode. By way of example, said protective layer is a sputtering protective layer that protects the organic layer sequence against damage during the sputtering of electrode material onto the organic layer sequence.

In accordance with at least one embodiment of an organic light-emitting diode described here, the sputtering protective layer contains or consists of a transition metal oxide. In this case, the sputtering protective layer can be in direct contact with an electrode of the organic light-emitting diode and/or an organic layer of the organic light-emitting diode.

In accordance with at least one embodiment of an organic light-emitting diode described here, the light emitted through at least one radiation exit area of the organic light-emitting diode does not have a Lambertian emission characteristic. By way of example, this electromagnetic radiation then has a directional emission profile. That is to say that in this case the emission of electromagnetic radiation is not symmetrical, rather an intensified emission in the direction of a main emission direction takes place.

In accordance with at least one embodiment of an organic light-emitting diode described here, the organic light-emitting diode comprises a structured radiation exit area. By way of example, the radiation exit area of the organic light-emitting diode is structured into a multiplicity of prisms arranged parallel to one another. The radiation exit area can then have first areas and second areas, for example, wherein the first areas are inclined by a first angle relative to a plane running for example parallel to a main extension plane of the organic layer sequence of the organic light-emitting diode. The second areas are then inclined by second angles relative to said plane.

By way of example, a carrier of the organic light-emitting diode is correspondingly structured in order to form the structured radiation exit area. Furthermore, it is possible for the encapsulation layer sequence, for example the second encapsulation layer to be correspondingly structured. Furthermore, it is also possible for a correspondingly structured layer to be applied for example on a carrier for the organic light-emitting diode or some other encapsulation for the organic light-emitting diode. That is to say that the structured radiation exit area can be formed by the structuring of an element of the encapsulation of the organic light-emitting diode. However, it is also possible for the structured radiation exit area, for example in the form of a further layer, to be applied as an independent element onto the encapsulation of the organic light-emitting diode.

In accordance with at least one embodiment of an organic light-emitting diode described here, the radiation exit area of the organic light-emitting diode is structured into a multiplicity of prisms arranged parallel to one another. In this case, the prisms preferably have macroscopic orders of magnitude in one direction. In this direction, the length of the prisms can be at least 1 cm, preferably at least 1 decimeter. In a direction perpendicular thereto, the prisms can have an order of magnitude which is in the submillimeters range, such that no diffraction effects can occur at the prisms in this direction. By way of example, the length of the prisms in this direction is 500 µm or less.

In accordance with at least one embodiment of an organic light-emitting diode described here, an irradiation exit area of the organic light-emitting diode is structured into a multiplicity of first areas and second areas, wherein the first areas are embodied as radiation-transmissive and the second areas are embodied as reflective. In this way, electromagnetic radiation can leave the radiation passage area only through the first areas. As a result, a directional emission is effected through the first radiation passage area, in a manner dependent on the first angle by which the first areas are inclined.

In accordance with at least one embodiment of the organic light-emitting diode, the organic light-emitting diode is an organic light-emitting diode which emits on both sides and which has two radiation passage areas arranged at opposite sides of the organic light-emitting diode. In this embodiment, it is possible for both of the radiation exit areas to be structured in the manner described. That is to say that directional electromagnetic radiation is then emitted by the organic light-emitting diode through both radiation exit areas. Furthermore, it is also possible, however, for only one of the radiation exit areas to be structured in the manner described. Electromagnetic radiation having a Lambertian emission characteristic is then emitted by the organic light-emitting diode from the other radiation exit area, for example.

In accordance with at least one embodiment of an organic light-emitting diode described here, for the purpose of generating directional electromagnetic radiation, a radiation exit area of the organic light-emitting diode is not structured, rather for example the top side of a carrier of the organic light-emitting diode, to which carrier the functional layers of the organic light-emitting diode are applied, is structured. By way of example, the carrier is then structured into a multiplicity of parallel prisms having first areas and second areas, which are arranged in a manner tilted with respect to one another. The functional layers can then be applied to the first and/or to the second areas at the top side of the carrier. In this case, it is possible that functional layers which are arranged on different areas can be driven separately from one another. It is thus possible to realize for example an organic light-emitting diode which alternately emits electromagnetic radiation in two different main extension directions. In a simple case, the separate drivability can be achieved by virtue of at least one electrode of the organic light-emitting diode not being arranged continuously over the entire organic layer sequence, but rather being separated into regions corresponding to the individual areas of the structured carrier. By means of the angle that the areas of the structured carrier form with one another and also the basic area of the respective areas it is possible to set a specific desired emission characteristic, that is to say a desired emission direction and emission intensity of the electromagnetic radiation generated by the organic light-emitting diode during operation.

In accordance with at least one embodiment of an organic light-emitting diode described here, the organic light-emitting diode is provided for illuminating an area to be illuminated, on which the organic light-emitting diode is fixed at least indirectly. That is to say that the organic light-emitting diode is arranged at least indirectly on an element to be illuminated having an area to be illuminated. In this case, the organic light-emitting diode can be adhesively bonded onto the element to be illuminated by means of a transparent adhesive, for example. Other fixing methods such as hook and loop fasteners, screw connections, clamping connections, press-fit connections or the like are also possible. The organic light-emitting diode is preferably embodied as transparent or pellucid at least in places, such that, in the switched-off state, the area to be illuminated can be discerned through the organic light-emitting diode. The area to be illuminated can be, for example, the surface of a tile, of a poster, of a slab, of a traffic sign, of an information board, of a sign, of an image, of a mirror, of a glass pane, or of any other element.

In accordance with at least one embodiment of an organic light-emitting diode described here, the organic light-emitting diode is designed for illuminating an area to be illuminated, wherein the organic light-emitting diode emits during operation a first component of electromagnetic radiation, which passes toward the outside directly from the radiation-emitting region of the organic light-emitting diode without impinging beforehand on the area to be illuminated. Furthermore, the radiation has a second component, which, before emerging from the organic light-emitting diode, impinges on the area to be illuminated and has been at least partly reflected by the latter.

In accordance with at least one embodiment of an organic light-emitting diode described here, the relative ratio of the intensities of the two radiation components mentioned, that is to say of the intensities of indirectly emerging electromagnetic radiation and directly emerging electromagnetic radiation, can be set and chosen by means of an optical cavity and/or by means of first electrodes and second electrodes of the organic light-emitting diode that are set with different degrees of transparency.

In accordance with at least one embodiment of an organic light-emitting diode described here, the organic light-emitting diode is a transparent or pellucid organic light-emitting diode arranged on an area to be illuminated of an element to be illuminated, wherein the area to be illuminated is visible through the organic light-emitting diode in the switched-off state of the organic light-emitting diode. In the switched-on state, the intensity of the directly emitted electromagnetic radiation in comparison with the indirectly emitted electromagnetic radiation can then be chosen to be so great that the area to be illuminated is no longer discernible. That is to say that the organic light-emitting diode can be switched from a transparent operating state to a luminous operating state in which an area arranged behind the organic light-emitting diode is no longer discernible. Such an intensity distribution can be achieved by means of an optical cavity, for example.

In accordance with at least one embodiment of an organic light-emitting diode described here, the organic light-emitting diode is a transparent organic light-emitting diode wherein an electrically switchable optical element is arranged at a radiation exit area. The electrically switchable optical element is, for example, an electrically switchable diffuser or an electrochromic material. Such an arrangement of organic light-emitting diode and electrically switchable element can be used for example in conjunction with an element to be illuminated, wherein the element to be illuminated can be, for example, a mirror or a transparent element such as a glass plate. By means of the electrically switchable optical element, such an arrangement can be switched for example from transparent to opalescent. In this way, a concealing screen that can be switched on and off can be realized, for example, which can also be utilized as a luminaire.

In accordance with at least one embodiment of an organic light-emitting diode described here, the electrically switchable optical element is embodied in structured fashion. That is to say that the electrically switchable optical element is applied in a specific pattern, for example, to a radiation exit area of the organic light-emitting diode. In this way, by way of example, information or a decoration can be inserted into the beam path of the organic light-emitting diode upon the electrically switchable optical element being switched on and can be masked out again upon the electrically switchable optical element being switched off.

In accordance with at least one embodiment of an organic light-emitting diode described here, the organic light-emitting diode is embodied at least as radiation-transmissive and is arranged with one of its radiation exit areas on a reflective optical element such as a mirror or a retroreflector.

In accordance with at least one embodiment of an organic light-emitting diode described here, the organic light-emitting diode is embodied in radiation-transmissive fashion and arranged with one of its radiation exit areas on a reflective optical element such as mirror or a retroreflector. Furthermore, a color filter is arranged at the opposite radiation exit area of the organic light-emitting diode. The color filter has, for example, a high transmission for a first spectral subrange of the visible wavelength spectrum and high absorption for a second spectral subrange of the visible wavelength spectrum. An intensity maximum of the electromagnetic radiation generated by the organic light-emitting diode during operation lies within the first spectral subrange transmitted by the color filter. Advantageously, that proportion of the ambient light which is reflected back from the reflective element to the radiation exit area and is coupled out from the organic light-emitting diode in this way produces substantially the same color impression as the light emitted by the organic light-emitting diode.

In accordance with at least one embodiment, an organic light-emitting diode described here comprises a reflective layer which reflects electromagnetic radiation impinging on the light-emitting diode from outside back in the direction of the radiation exit area of the organic light-emitting diode. The organic light-emitting diode furthermore comprises, at the radiation exit area, a color filter, such that the organic light-emitting diode brings about the same color impression independently of the operating state. That is to say that the organic light-emitting diode has the same color impression in the switched-off operating state as in the switched-on operating state.

In accordance with at least one embodiment of an organic light-emitting diode described here, a touch sensor is integrated into the organic light-emitting diode. By way of example, the touch sensor is a capacitively or resistively operating touch sensor. That is to say that the organic light-emitting diode forms for example a light source and simultaneously an operating element.

Luminaires are specified below which are provided for example for general lighting or as lights in road traffic. In this case, the luminaires can comprise organic light-emitting diodes described here as light sources. The luminaires can furthermore comprise any combination of organic light-emitting diodes described as light sources. Furthermore, it is also possible to combine the luminaires described here or elements of the luminaires described here to form further luminaires.

In accordance with at least one embodiment of a luminaire described here, the luminaire comprises at least one organic light-emitting diode in accordance with at least one embodiment described here.

In accordance with at least one embodiment of a luminaire described here, the luminaire is designed for general lighting and furthermore has a wake-up function. That is to say that the luminaire can be operated in the manner of an alarm clock in one operating state of the luminaire.

In accordance with at least one embodiment of a luminaire described here, the luminaire comprises a driving device, by means of which an activation time—for example a wake-up time—can be set by the user of the luminaire. At said activation time, the luminaire then starts to emit light.

In accordance with at least one embodiment of a luminaire described here, the luminaire is designed for general lighting and as an alarm clock, wherein the luminaire comprises at least one transparent, pellucid organic light-emitting diode in accordance with at least one of the previous embodiments. The organic light-emitting diode can be arranged, for example, in front of an area to be illuminated, which is visible through the organic light-emitting diode in the switched-off operating state of the luminaire.

In accordance with at least one embodiment of the luminaire, the luminaire comprises a driving device, which, starting from a specific activation time, increases the light intensity of the light emitted by the luminaire, for example continuously.

In accordance with at least one embodiment of a luminaire described here, the luminaire comprises a driving device, which is designed to increase, starting from an activation time, the light intensity of the light emitted by the luminaire in steps, wherein for predeterminable times, the luminaire generates light having a constant light intensity, which is increased in predeterminable time intervals.

In accordance with at least one embodiment of a luminaire described here, the luminaire is designed to generate light having a light intensity of between zero and at least 1000 cd, preferably at least 5000 cd, particularly preferably at least 10 000 cd. By way of example, for this purpose the luminaire comprises at least one organic light-emitting diode having a phosphorescent emitter material in its radiation-generating region. The organic light-emitting diode can also comprise fluorescent emitter materials in its radiation-generating region, in addition to the phosphorescent emitter material.

In accordance with at least one embodiment of a luminaire described here, the luminaire comprises at least one touch-sensitive operating element which can be operated by the user of the luminaire by means of a touch sensor. The operating element can be arranged for example in a radiation exit area of the luminaire. Particularly preferably, an organic light-emitting diode in accordance with at least one of the previous embodiments which has an integrated touch sensor is employed for forming the touch-sensitive operating element.

In accordance with at least one embodiment of the luminaire, the luminaire can be operated by means of a remote control. By way of example, the remote control can exchange information with the luminaire by means of radio or infrared radiation.

In accordance with at least one embodiment of the luminaire, the luminaire is subdivided into a multiplicity of segments. By way of example, different segments can be suitable for generating electromagnetic radiation having different wavelengths.

In accordance with at least one embodiment of a luminaire described here, the luminaire comprises a driving device, which is designed to increase the color temperature of the light emitted by the luminaire continuously or in steps.

In accordance with at least one embodiment of the luminaire, the luminaire is designed to generate light, preferably white light having color temperatures of at least 4000 K to color temperatures of at most 25 000 K.

In accordance with at least one embodiment of a luminaire described here, the luminaire comprises a driving device, which is designed to increase the light intensity and also the color temperature of the light generated by the luminaire during operation in steps or continuously, wherein the light intensity is increased, for example, as the color temperature is increased.

In accordance with at least one embodiment of a luminaire described here, the luminaire is designed to simulate a sunrise in time-lapse fashion. That is to say that, starting from a specific start time, the luminaire generates white light, in the case of which the color temperature is increased continuously or in steps from at least 4000 K to at most 25 000 K, wherein the light intensity is simultaneously increased from 0 cd to a maximum of 10 000 cd. In this case, the rise in the color temperature can take place at the same time or independently of a rise in the light intensity.

In accordance with at least one embodiment of a luminaire described here, the luminaire serves as a splash guard alongside its use as a light for general lighting. By way of example, the luminaire forms the part of a shower cubicle. Thus, the luminaire can form the part of a wall of a shower cubicle or can be arranged on a wall of the shower cubicle. Furthermore, it is possible for the luminaire to form the wall for the shower cubicle.

In accordance with at least one embodiment of the luminaire, the luminaire comprises at least two carriers between which at least one organic light-emitting diode or functional layers of an organic light-emitting diode are arranged. In this case, preferably at least one of the carriers is embodied such that it scatters light diffusely, with the result that the luminaire is not pellucid, but rather also serves as a concealing screen.

In accordance with at least one embodiment of the luminaire, the luminaire comprises at least one organic light-emitting diode having at least one double encapsulation. In this case, double encapsulation means that at least two of the possibilities described here for encapsulating an organic light-emitting diode are used in combination in order, in this way, to obtain a particularly well hermetically sealed organic light-emitting diode.

In accordance with at least one embodiment of the luminaire described here, the luminaire is designed to come directly into contact with water.

In accordance with at least one embodiment of a luminaire described here, the luminaire is designed to be adhesively bonded in the sense of a transfer onto the wall of a shower cubicle.

In accordance with at least one embodiment of a luminaire described here, the luminaire comprises at least one inorganic light-emitting diode as light source of the luminaire.

In accordance with at least one embodiment of a luminaire described here, the luminaire comprises at least one organic light-emitting diode as light source and also at least one inorganic light-emitting diode as light source.

In accordance with at least one embodiment of a luminaire described here, the luminaire has at least one carrier formed with a radiation-transmissive material suitable for guiding light. By way of example, the carrier is a glass plate.

In accordance with at least one embodiment of a luminaire described here, at least one inorganic light-emitting diode is arranged at the carrier of the luminaire, said carrier being embodied as an optical waveguide, said at least one inorganic light-emitting diode coupling electromagnetic radiation into the optical waveguide. The electromagnetic radiation coupled in can, for example, be distributed in the optical waveguide and be emitted toward the outside by the latter over a large area.

In accordance with at least one embodiment of a luminaire described here, the luminaire has an operating state in which infrared radiation is generated. By way of example, the infrared radiation is used for warming a user of the luminaire, for deicing a pane or for heating a moist environment. For example, by means of the infrared radiation, the user of a shower cubicle comprising the luminaire can be warmed and/or the shower cubicle can be dried by means of the infrared radiation after the conclusion of showering. In this case, the infrared radiation can be generated by at least one inorganic or by at least one organic light-emitting diode.

In accordance with at least one embodiment of the luminaire, the luminaire is suitable for emitting ultraviolet radiation during operation. By way of example, the ultraviolet radiation is generated by at least one inorganic light-emitting diode of the luminaire. In this case, the ultraviolet radiation can be used for tanning a user of the luminaire and/or for disinfecting the environment of the luminaire. By way of example, a luminaire embodied as a splash guard in a shower or integrated in a shower head can be used in this way.

In accordance with at least one embodiment of the luminaire, the luminaire is integrated in a shower or in a bath tub. By way of example, the luminaire forms a splash guard or is part of a shower head. The luminaire can then serve as an indicating device for the water temperature. By way of example, the luminaire can be suitable for emitting blue light, which indicates cold water. Furthermore, the luminaire can be suitable for emitting red light, which indicates hot water, and mixed colors comprising red and blue components for indicating warm water.

In accordance with at least one embodiment of a luminaire described here, the color locus, the light intensity and/or the color temperature can be adjustable by means of the mixing faucet of a water supply. For this purpose, the mixing faucet is connected to a driving device for the luminaire.

In accordance with at least one embodiment of the luminaire, the luminaire can comprise a touch-sensitive operating element, by means of which, in addition to operating states of the luminaire, it is also possible to set the water temperature and/or the water pressure for example in a shower cubicle or in a bath tub.

In accordance with at least one embodiment of a luminaire described here, the luminaire serves as a light for general lighting and forms at least the part of a spray or shower head.

In accordance with at least one embodiment of a luminaire described here, the luminaire is in direct contact with water during operation. That is to say that, for example, water washes around a carrier of the luminaire. In this case, water can wash around the luminaire while the latter is in a switched-on operating state.

In accordance with at least one embodiment of a luminaire described here, the luminaire is in direct contact with water, wherein the water serves as an optical waveguide for the electromagnetic radiation generated by the luminaire. That is to say that the light generated by the luminaire during operation is at least partly coupled into at least one water jet in which it can propagate like in an optical waveguide. In this way it is possible—for example upon illumination of a multiplicity of water jets with different colors—to give the impression of a rainbow.

In accordance with at least one embodiment of a luminaire described here, the luminaire comprises at least one organic light-emitting diode having an opening. In this case, the opening preferably extends continuously from one main side of the organic light-emitting diode to the opposite main side of the organic light-emitting diode. The opening can be closed at the edge with a connecting means such as a glass solder material or a glass frit. Furthermore, it is possible to employ even further measures for sealing the organic light-emitting diode in the region of the opening, such as an encapsulation layer sequence, a thin-film encapsulation, a diffusion barrier or the like. Preferably, water flows through the opening in at least one operating state of the organic light-emitting diode. In this case, it is also possible for the organic light-emitting diode to have a multiplicity of openings through which water can flow during the operation of the organic light-emitting diode.

In accordance with at least one embodiment of a luminaire described here, the luminaire, alongside a light for general lighting, is a mirror and also a display device for displaying simple graphical elements. In this case, the luminaire can be used for example as a bathroom mirror or wardrobe mirror. The luminaire preferably has at least three operating states: a first operating state, in which the luminaire serves for general lighting and emits light, a second operating state, in which the luminaire actively emits no electromagnetic radiation and serves as a mirror, and also a third operating state, in which the luminaire displays simple graphical elements such as patterns or the like. In the third operating state, the luminaire can additionally serve as a mirror and/or for general lighting, wherein the emitted light intensity is then preferably reduced in comparison with the first operating state.

In accordance with at least one embodiment of a luminaire described here, the luminaire comprises a structured electrically switchable element. The electrically switchable element is structured in accordance with a predetermined pattern, for example. If the electrically switchable optical element is operated in a switched-on electrical operating state, for example, the pattern to be represented is visible. The electrically switchable optical element is, for example, an electrically switchable diffuser or an electrochromic material. By way of example, the electrically switchable optical element can be used in a luminaire serving for general lighting and as a mirror.

In accordance with at least one embodiment of a luminaire described here, the luminaire can be operated by means of gesture control. That is to say that the luminaire comprises an optical sensor, for example a camera, and also an evaluation circuit for evaluating the signals of the optical sensor. A switch-on, switch-off or other changes of operating states can then be effected by means of gesture control.

In accordance with at least one embodiment of a luminaire described here, the luminaire forms a tile or the part of a tile. Preferably, the luminaire is embodied in non-slip fashion in this case.

In accordance with at least one embodiment of a luminaire described here, the luminaire comprises two carriers between which spacers are arranged at regular distances. The spacers can be posts or dams, for example, which connect the two carriers to one another. The spacers are, for example, formed with a glass solder or a glass frit material or consist of one of these materials.

In accordance with at least one embodiment of a luminaire described here, the luminaire serves as wall or floor heating. In this case, the luminaire need not necessarily be suitable for generating visible electromagnetic radiation. It is sufficient, for example, if the luminaire comprises at least one organic light-emitting diode suitable for generating infrared radiation. Furthermore, it is possible for the luminaire to comprise organic light-emitting diodes which emit infrared radiation and also organic light-emitting diodes which emit visible light. Furthermore, it is possible for the luminaire to comprise at least one organic light-emitting diode which comprises, in its radiation-generating region, an emission layer comprising an infrared-emitting emitter material, and also at least one emission layer comprising an emitter material which emits colored light.

In accordance with at least one embodiment of the luminaire, the luminaire is embodied in flexible fashion and can be applied to a carrier in the manner of a transfer. By way of example, the carrier is an element to be illuminated. In this case, the luminaire can be embodied such that it is transparent and emits on both sides, such that the element to be illuminated by the luminaire is visible during the operation of the luminaire. By way of example, the luminaire can, in this way, be adhesively bonded onto a tile which is presented in a manner highlighted by means of the luminaire.

In accordance with at least one embodiment of a luminaire described here, the luminaire can be operated by means of induction or capacitive driving. That is to say that, in this case, the luminaire has no external connection conductors that are connected to a current source. Rather, the luminaire comprises for example an antenna suitable for picking up electromagnetic radiation, with which the luminaire is operated.

In accordance with at least one embodiment of a luminaire described here, a large-area luminaire having a multiplicity of organic light-emitting diodes is involved. In this case, the organic light-emitting diodes can be arranged for example in a combined series and parallel circuit. The large-area, segmented luminaire can form, for example, a ceiling light or solar protection.

In accordance with at least one embodiment of a luminaire described here, the luminaire comprises at least two organic light-emitting diodes which are suitable for generating light of mutually different colors.

In accordance with at least one embodiment of a luminaire described here, the luminaire comprises at least two organic light-emitting diodes which are mechanically connected to one another by means of connection conductors. Alongside a mechanical stabilization of the luminaire, the connection conductors then also serve for making electrical contact with the organic light-emitting diodes of the luminaire.

In accordance with at least one embodiment of a luminaire described here, the luminaire is embodied in flexible fashion, such that it is bendable. In this case, it is possible for the luminaire to maintain its form after bending. That is to say that the luminaire can be brought to a desired form by the user of the luminaire by bending, for example.

In accordance with at least one embodiment of a luminaire described here, the luminaire has a luminous area comprising an area content of at least 0.1 m$^2$.

In accordance with at least one embodiment of a luminaire described here, the luminaire has a luminous area having an area content of at least 0.5 m$^2$.

In accordance with at least one embodiment of a luminaire described here, the luminaire has a luminous area having an area content of at least 1.0 m$^2$.

In accordance with at least one embodiment of a luminaire described here, the luminaire has a luminous area having an area content of at least 2.5 m$^2$.

In accordance with at least one embodiment of a luminaire described here, the luminaire has a luminous area having an area content of at least 5.0 m$^2$.

In accordance with at least one embodiment of a luminaire described here, the luminaire has a luminous area having an area content of at least 10.0 m$^2$.

In accordance with at least one embodiment of a luminaire described here, the luminaire serves for covering a device used for cooling or heating a room. By way of example, the device is a radiator, an air-conditioning system or a ventilation shaft.

In accordance with at least one embodiment of a luminaire described here, the luminaire serves as a simple temperature indicator. By way of example, the luminaire in this case comprises a temperature sensor, which detects the ambient temperature or the temperature of an object to which the luminaire is connected. In this case, the luminaire emits light having a color locus and/or a color temperature which is correlated with the measured temperature.

By way of example, the luminaire is applied as a covering directly on a radiator. In this case, the luminaire, depending on the temperature of the radiator, can emit bluish light—for a cold radiator—or reddish light—for a warm radiator.

In accordance with at least one embodiment of a luminaire described here, the luminaire has a rear wall comprising at least one cooling device. The cooling device can be, for example, cooling lamellae, cooling channels, or a water cooling system.

In accordance with at least one embodiment of a luminaire described here, the luminaire can be fixed to a further element by means of a fixing means. By way of example, the fixing means is an adhesive strip, a magnet, screws, clamps or a hook and loop fastener.

In accordance with at least one embodiment of a luminaire described here, the luminaire has a driving device, by means of which the luminaire can be operated in a flickering manner. That is to say the luminaire emits light which flickers like a candle. This can be realized, for example, by means of a temporal variation of the current intensity with which the luminaire is operated.

In accordance with at least one embodiment of a luminaire described here, the luminaire serves as a desk lamp for illuminating a work area.

In accordance with at least one embodiment of a luminaire described here, the luminaire emits electromagnetic radiation in a directional manner. For this purpose, the luminaire can comprise, for example, an organic light-emitting diode that emits directional light. Furthermore, it is possible for the luminaire to have a structured radiation exit area that leads to a directional emission of light by means of light refraction and/or light reflection.

In accordance with at least one embodiment of a luminaire described here, the luminaire is used as a light for general lighting and as a room divider. In this case, the luminaire can be embodied as a large-area luminaire, for example, which is embodied not as transparent and not as pellucid, but rather such that it scatters light diffusely. In this way, the luminaire can also serve as a concealing screen.

In accordance with at least one embodiment of a luminaire described here, the luminaire is a luminaire which emits on both sides and which is embodied such that it scatters light diffusely. That is to say that the luminaire has at least two oppositely arranged radiation exit areas through which, for example, light can leave the luminaire. In this case, the luminaire is embodied as visually impenetrable, such that it serves as a concealing screen.

In accordance with at least one embodiment of a luminaire described here, the luminaire is embodied such that it can be rolled up and unrolled. By way of example, for this purpose, the luminaire can be subdivided into individual segments which are each formed by a single organic light-emitting diode or at least two organic light-emitting diodes which, in turn, can be embodied in rigid fashion. Furthermore, it is possible for the luminaire to be embodied as fully flexible and to be able to be unrolled and rolled up in this way. In this case, the luminaire can comprise, for example, a single organic light-emitting diode embodied in flexible fashion.

In accordance with at least one embodiment of a luminaire described here, the luminaire also serves for sound insulation alongside its property as a light for general lighting. By way of example, in this case, the luminaire comprises an insulating material suitable for acoustic insulation.

In accordance with at least one embodiment of a luminaire described here, the luminaire is embodied as a louver.

The luminaire in this case comprises, for example, a multiplicity of organic light-emitting diodes which are electrically contact-connected and mechanically connected to one another by means of a holding device.

In accordance with at least one embodiment of a luminaire described here, the luminaire serves for room darkening and/or as a concealing screen. That is to say that the luminaire can have a radiation exit area facing away from a window, for example. That side of the luminaire which faces away from the radiation exit area can comprise a radiation-absorbing or radiation-reflecting area facing the window.

In accordance with at least one embodiment of a luminaire described here, at least parts of the luminaire form an enclosure having at least one side wall and, if appropriate, a top. The luminaire or at least parts of the luminaire can then form, for example, a changing cubicle, a passenger shelter, a rain shelter or the like. By way of example, all the walls and top parts of the enclosure are formed by at least one luminaire.

In accordance with at least one embodiment of a luminaire described here, the luminaire comprises a light barrier, by means of which an operating state of the luminaire can be switched. By way of example, the luminaire can be switched on or off by means of the light barrier.

In accordance with at least one embodiment of a luminaire described here, the luminaire forms a dividing wall in an open-plan office.

In accordance with at least one embodiment of a luminaire described here, the luminaire forms solar protection alongside its properties for general lighting. In this case, the luminaire can have, for example, an outer area that faces away from the radiation exit area of the luminaire and is formed in absorbent or reflective fashion.

In accordance with at least one embodiment of a luminaire described here, the luminaire comprises at least one solar cell suitable for generating electric current upon irradiation with sunlight. By way of example, the at least one solar cell is arranged on a side of the luminaire which lies opposite the radiation exit area of the luminaire. The luminaire can furthermore comprise a rechargeable battery that can be charged with light of the solar cell. In this way, by way of example, a quantity of current generated during the day by means of the solar cell can serve for generating light in conditions of poor visibility.

In accordance with at least one embodiment of a luminaire described here, the luminaire is emergency lighting. By way of example, the emergency lighting can be operated by means of solar power generated by the luminaire.

In accordance with at least one embodiment of a luminaire described here, the luminaire forms at least part of a garment or of a bag. In this case, the luminaire can comprise at least one organic light-emitting diode with a retroreflector, such that the luminaire increases the visibility of the user of the luminaire even in the switched-off operating state.

In accordance with at least one embodiment of a luminaire described here, the luminaire is an umbrella. The umbrella can comprise an organic light-emitting diode and/or at least one inorganic light-emitting diode as light source. Furthermore, it is possible for the umbrella to comprise both inorganic and organic light-emitting diodes as light sources.

In accordance with at least one embodiment of a luminaire described here, the luminaire is integrated into the window of a motor vehicle. In this case, it is possible for only parts of the window to comprise an organic light-emitting diode. Furthermore, it is also possible, however, for the entire window of the motor vehicle to be formed by a transparent organic light-emitting diode. By way of example, all the windows of the motor vehicle can then be formed by organic light-emitting diodes.

In accordance with at least one embodiment of a luminaire described here, the luminaire forms an indicator device or a signal light of a motor vehicle. By way of example, the luminaire is a brake light, an indicator light, a rear light or the like. In this case, the luminaire can form at least part of a window of a motor vehicle.

In accordance with at least one embodiment of a luminaire described here, the luminaire forms a warning sign or a traffic sign.

BRIEF DESCRIPTION OF THE DRAWINGS

The organic light-emitting diodes described here and also the luminaires described here will be explained in greater detail below on the basis of exemplary embodiments in relation to the associated figures.

FIGS. 6A, 6B, 6C and 6D show, on the basis of schematic sectional illustrations, the construction of organic light-emitting diodes in accordance with different exemplary embodiments which give a desired colored impression in the switched-off operating state.

FIGS. 21 to 25 show, on the basis of schematic illustrations, the construction of organic light-emitting diodes having a directional emission profile in accordance with different exemplary embodiments.

FIGS. 26A, 26B and 27 show, on the basis of schematic sectional illustrations, the construction of exemplary embodiments of organic light-emitting diodes which are used for illuminating an element to be illuminated.

FIGS. 45A to 45C and 46A, 46B show, on the basis of schematic illustrations, one exemplary embodiment of a luminaire described here which forms a large-area ceiling light.

FIGS. 47A to 47D, 48 to 49A, 49B show, on the basis of schematic illustrations, one exemplary embodiment of a luminaire described here which serves for covering an object.

DETAILED DESCRIPTION OF THE DRAWINGS

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
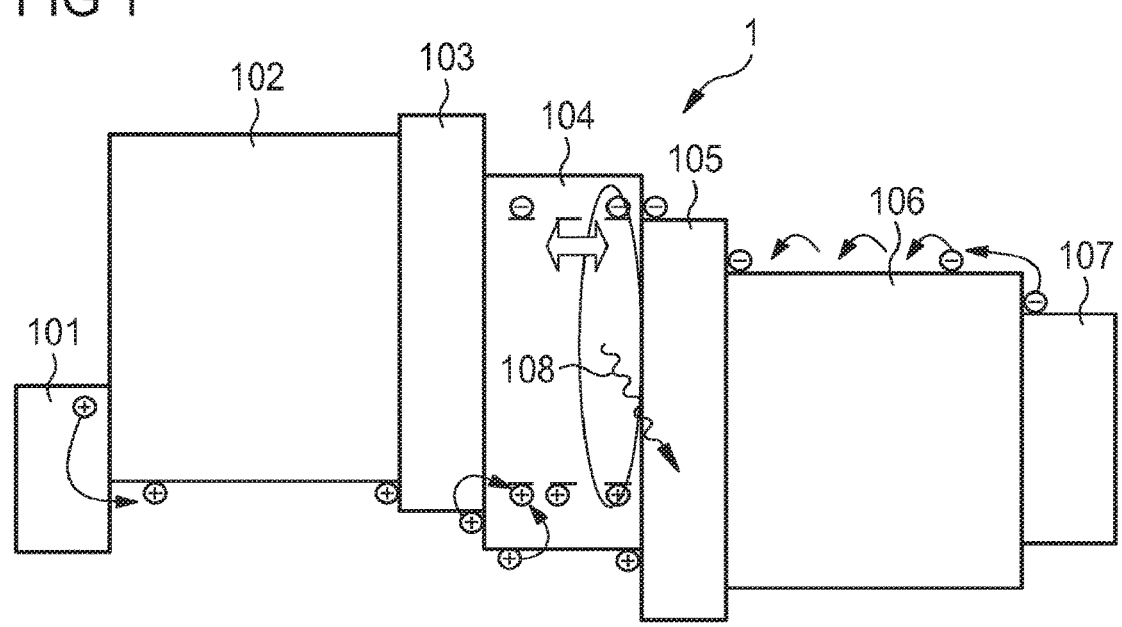
FIG. 1 shows, on the basis of a schematic band diagram, the construction of an organic light-emitting diode in accordance with one exemplary embodiment.

FIG. 1 shows, on the basis of a schematic band diagram, the construction of an organic light-emitting diode 1 in accordance with one exemplary embodiment.

The organic light-emitting diode 1 comprises a first electrode 101. The first electrode is an anode, for example. Via the first electrode 1, positive charge carriers—so-called holes—are impressed into the organic light-emitting diode.

The hole transport layer 102 adjoins the first electrode 101. The hole transport layer 102 transports the positive charge carriers toward the radiation-emitting region 104 of the organic light-emitting diode 1.

The hole transport layer 102 is succeeded by an electron barrier layer 103, which prevents the penetration of electrons from the radiation-emitting region 104 into the hole transport layer 102.

The electron barrier layer 3 is succeeded by the radiation-emitting region 104. During the operation of the organic light-emitting diode 1, electromagnetic radiation is generated in the radiation-emitting region. Therefore, the emission 108 of electromagnetic radiation occurs in the radiation-emitting region. Preferably, electromagnetic radiation in the spectral range of infrared radiation to UV radiation is generated in this case. The radiation-emitting region is explained in greater detail for example with reference to FIGS. 2 and 3.

The radiation-emitting region 104 is succeeded by a hole barrier layer 105, which prevents the penetration of positive charge carriers into the adjoining electron transport layer 106.

The electron transport layer 106 adjoins the hole barrier layer 105 and transports negative charge carriers—electrons—from the second electrode 107, embodied as a cathode, to the radiation-emitting region 104.

The hole transport layer 102 and the electron transport layer 106 are first and second charge carrier transport layers. The hole transport layer 102 and the electron transport layer 106 comprise, for example, a matrix material that is p- and n-doped, respectively.

Depending on the embodiment of the charge carrier transport layer as hole transport layer 102 or as electron transport layer 106, the matrix material can be selected from a group comprising phenanthroline derivatives, imidazole derivatives, triazole derivatives, oxadiazole derivatives, phenyl-containing compounds, compounds comprising condensed aromatics, carbazole-containing compounds, fluorene derivatives, spirofluorene derivatives and pyridine-containing compounds and also combinations of at least two or more of the materials mentioned.

For a charge carrier transport layer embodied as hole transport layer 102, the following matrix materials, in particular, are suitable:
N,N'-bis(naphthalen-1-yl)-N,N'-bis(phenyl)benzidine (NPB),
N,N'-bis(naphthalen-2-yl)-N,N'-bis(phenyl)benzidine (β-NPB),
N,N'-bis(3-methylphenyl)-N,N'-bis(phenyl)benzidine (TPD),
N,N'-bis(3-methylphenyl)-N,N'-bis(phenyl)-9,9-spirobifluorene (spiro-TPD),
N,N'-bis(naphthalen-1-yl)-N,N'-bis(phenyl)-9,9-spirobifluorene (spiro-NPB),
N,N'-bis(3-methylphenyl)-N,N'-bis(phenyl)-9,9-dimethylfluorene (DMFL-TPD),
N,N'-bis(naphthalen-1-yl)-N,N'-bis(phenyl)-9,9-dimethylfluorene (DMFL-NPB),
N,N'-bis(3-methylphenyl)-N,N'-bis(phenyl)-9,9-diphenylfluorene (DPFL-TPD),
N,N'-bis(naphthalen-1-yl)-N,N'-bis(phenyl)-9,9-diphenylfluorene (DPFL-NPB),
2,2',7,7'-tetrakis(N,N-diphenylamino)-9,9'-spirobifluorene (spiro-TAD),
9,9-bis[4-(N,N-bisbiphenyl-4-yl-amino)phenyl]-9H-fluorene (BPAPF),
9,9-bis[4-(N,N-bisnaphthalen-2-yl-amino)phenyl]-9H-fluorene (NPAPF),
9,9-bis[4-(N,N-bisnaphthalen-2-yl-N,N'-bisphenylamino)phenyl]-9H-fluorene (NPBAPF),
2,2',7,7'-tetrakis[N-naphthalenyl(phenyl)amino]-9,9-spirobifluorene (spiro-2NPB),
N,N'-bis(phenanthren-9-yl)-N,N'-bis(phenyl)benzidine (PAPB),
2,7-bis[N,N-bis(9,9-spirobifluorene-2-yl)amino]-9,9-spirobifluorene (spiro-S),
2,2'-bis[N,N-bis(biphenyl-4-yl)amino]-9,9-spirobifluorene (2,2'-spiro-DBP),
2,2'-bis(N,N-diphenylamino)-9,9-spirobifluorene (spiro-BPA).

The dopant for the hole transport layer 102 is a p-type dopant and can in this case comprise or be a metal oxide, an organometallic compound, an organic material or a mixture thereof. Additionally or alternatively, the dopant can comprise a plurality of different metal oxides and/or a plurality of different organometallic compounds and/or a plurality of different organic compounds. In particular, the dopant can have Lewis acid character or be a Lewis acid. Lewis acids, that is to say electron pair acceptors, can be particularly well suited to forming charge transfer complexes.

The dopant can comprise one or a plurality of metal oxides comprising one or a plurality of metals, wherein the metals are selected from tungsten, molybdenum, vanadium and rhenium. Particularly preferably, the dopant can comprise one or a plurality of the metal oxides $WO_3$, $MoO_3$, $V_2O_5$, $Re_2O_7$ and $Re_2O_5$. While rhenium pentoxide is suitable for enabling, as dopant, a hole transport layer 102 having a blue color impression, the other metal oxides mentioned are suitable for enabling a yellow to orange-colored color impression. Oxides of rhenium, in particular, are Lewis acids which can readily be evaporated at a temperature of less than 250° C. and at a pressure of $10^{-6}$ mbar and are therefore well suited to a p-type doping. It has been possible to show experimentally that the doping properties with regard to the electronic properties of the hole transport layer 102 of rhenium pentoxide and rhenium heptoxide differ only little, such that metal oxides of this type can be chosen depending on a predetermined color impression. The other metal oxides mentioned exhibit similar processing properties for p-type doping.

Furthermore, the dopant for the p-type doping of the hole transport layer 102 can also comprise organometallic compounds having Lewis acid character. Particularly in the case of organometallic compounds or complexes having an impeller structure, the Lewis acid character of the axial position is particularly pronounced.

Furthermore, the organometallic compounds can comprise ruthenium and/or rhodium. By way of example, the dopant can comprise as organometallic compound a trifluoroacetate (TFA), for example dirhodium tetratrifluoroacetate $(Rh_2(TFA)_4)$, which with (NPB) can give a bluish color impression or the isoelectronic ruthenium compound $Ru_2(TFA)_2(CO)_2$, which enables an orange-colored color impression.

Furthermore, the dopant for p-type doping can comprise organic materials which comprise aromatic functional groups or are aromatic organic materials. In particular, the dopant can comprise aromatic materials having a pronounced number of fluorine and/or cyanide (CN) substituents.

For a charge carrier transport layer embodied as electron transport layer 106, the following matrix materials, in particular, are also suitable:
8-hydroxyquinolinolato-lithium (Liq),
2,2',2"-(1,3,5-benzinetriyl)-tris(1-phenyl-1-H-benzamidazole) (TPBi),
2-(4-biphenylyl)-5-(4-tert-butylphenyl)-1,3,4-oxadiazole (PBD),
2,9-dimethyl-4,7-diphenyl-1,10-phenanthroline (BCP),
4,7-diphenyl-1,10-phenanthroline (BPhen),
bis(2-methyl-8-quinolinolate)-4-(phenylphenolato)aluminum (BAlq),
1,3-bis[2-(2,2'-bipyridin-6-yl)-1,3,4-oxadiazo-5-yl]benzene (Bpy-OXD),
6,6'-bis[5-(biphenyl-4-yl)-1,3,4-oxadiazo-2-yl]-2,2'-bipyridyl (BP-OXD-Bpy),
3-(4-biphenylyl)-4-phenyl-5-tert-butylphenyl-1,2,4-triazole (TAZ),
4-(naphthalen-1-yl)-3,5-diphenyl-4H-1,2,4-triazole (NTAZ),
2,9-bis(naphthalen-2-yl)-4,7-diphenyl-1,10-phenanthroline (NBphen),
2,7-bis[2-(2,2'-bipyridin-6-yl)-1,3,4-oxadiazo-5-yl]-9,9-dimethylfluorene (Bby-FOXD),
1,3-bis[2-(4-tert-butylphenyl)-1,3,4-oxadiazo-5-yl]benzene (OXD-7).

For an electron transport layer 106, the matrix material is n-doped. That can mean that the dopant enables an n-type doping of the matrix material of the first charge carrier transport layer. In particular, the dopant can be embodied as an electron donor having a low ionization potential, that is to say a high-level HOMO (Highest Occupied Molecular Orbital).

In this case, the dopant can comprise or be an alkali metal salt, an alkaline earth metal salt, an organometallic compound or a mixture thereof. Additionally or alternatively, the dopant can comprise a plurality of different alkali metal salts and/or a plurality of different alkaline earth metal salts and/or a plurality of different organometallic compounds. In particular, the dopant can comprise a carbonate. Furthermore, the dopant can particularly preferably comprise cesium. $Cs_2CO_3$, for example, can give a bluish color impression in BCP or in BPhen as matrix material.

Furthermore, the dopant for n-type doping can comprise a metallocene, that is to say an organometallic compound comprising a metal M and two cyclopentadienyl radicals (Cp) in the form $M(Cp)_2$. Alternatively or additionally, the dopant can also comprise a metal-hydropyrimidopyrimidine complex. The metal can comprise or be tungsten, molybdenum and/or chromium, for example.

By way of example, chromocene or decamethylchromocene can enable grey-colored color impressions for an n-doped electron transport layer 106, while organometallic compounds comprising 1,2,4,6,7,8-hexahydro-2H-pyrimido[1,2-a]pyrimidine (hpp) such as, for instance $W_2(hpp)_4$, $Mo_2(hpp)_4$ and $Cr_2(hpp)_4$ enable red to orange-colored color impressions.

The matrix materials of the charge carrier transport layers 102, 106 mentioned here and the dopants mentioned here for the matrix materials can form charge transfer complexes which absorb part of an electromagnetic radiation incident from outside on the organic light-emitting diode 1 with a first absorption spectrum and, in a switched-off electronic operating state, bring about a predetermined color impression of the component, which can be perceived by an external observer through the first electrode 101, for example. In this case, the matrix material and the dopant form electron-donor-acceptor complexes, the absorption bands of which preferably lie in the visible wavelength range. In this case, the absorption band of the charge transfer complexes is dependent on the respective energetic position of their HOMOs (Highest Occupied Molecular Orbital) and LUMOs (Lowest Unoccupied Molecular Orbital) relative to one another. Consequently, in addition to the charge carrier conductivity for holes and/or for electrons, the charge transfer complexes can have the first absorption spectrum, which can enable the predetermined color impression.

Through a suitable choice of the matrix material and of the dopant, at least of the charge carrier transport layer adjoining a radiation-transmissive or transparent electrode, it is possible to ensure electronic properties with regard to the electronic functionality of the organic light-emitting diode, such as, for instance, electrical conductivity and/or the charge carrier injection, and at the same time the predetermined color impression for the desired external appearance, at least in the switched-off electronic operating state (in this respect, also see the exemplary embodiments in FIGS. 6A to 6D).

The first electrode 101 is a transparent anode, for example. The first electrode 101 is therefore preferably at least partly transmissive to electromagnetic radiation generated in the radiation-emitting region 104. Preferably, the first electrode 101 is transparent to said radiation. In this case, the first electrode can, for example, comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds such as, for example $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

The second electrode 107 can be embodied as a cathode and therefore serve as electron-injecting material. The second electrode 107 can be a cathode which is configured in reflective fashion and which at least partly reflects electromagnetic radiation generated in the radiation-emitting region 104. Preferably, the reflectivity is then at least 70%, at least 80% or particularly preferably at least 90%.

Inter alia, in particular aluminum, barium, indium, silver, gold, magnesium, calcium or lithium and also compounds, combinations and alloys thereof can prove to be advantageous as cathode material. In addition, the second electrode 107 can have, on a side facing the radiation-emitting region 104, a layer comprising LiF, which has good electron injection properties. Alternatively or additionally, the second electrode can also comprise one of the abovementioned TCOs or a layer sequence composed of TCO layers and a metal layer. The second electrode 107 can then likewise be transparent.

Alternatively, the first electrode 101 can also be embodied as a cathode, and the second electrode 107 as an anode.

The electron barrier layer 103 can contain or consist of, for example, α-NPD (N,N'-di-1-naphthyl-N,N'-diphenyl-4,4'-diaminobiphenyl).

This material has a HOMO of −5±0.4 eV and a LUMO of more than −2.2 eV. The hole mobility is approximately $10^{-4}$ $cm^2/Vs$.

The hole barrier layer 105 can comprise BCP or BPhen as material. What is important here is the electron mobility of more than $10^{-6}$ $cm^2/Vs$, preferably more than $10^{-5}$ $cm^2/Vs$, given a very low to even no hole mobility.

Figure 2:
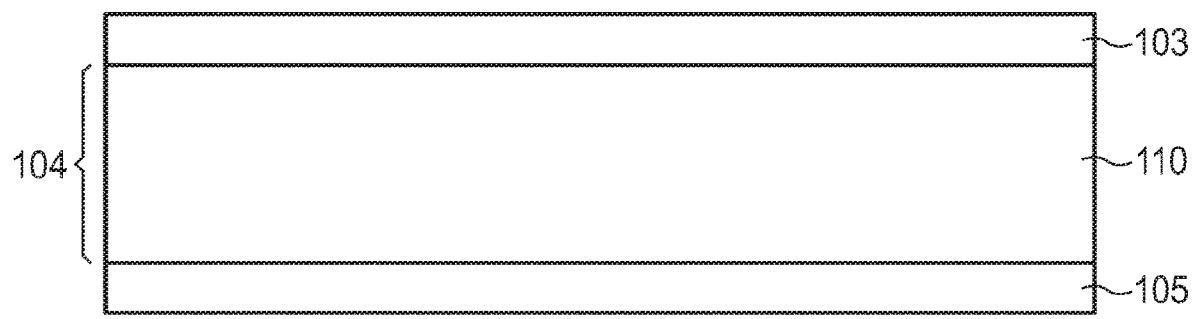
FIG. 2 shows, on the basis of a schematic sectional illustration, the construction of an organic light-emitting diode in accordance with one exemplary embodiment.

FIG. 2 shows, on the basis of a schematic sectional illustration, an enlargement of an excerpt from an organic light-emitting diode 1 described here. In this case, FIG. 2 shows the radiation-emitting region 104 adjoined by the electron barrier layer 103 and the hole barrier layer 105. In the present case, the radiation-emitting region 104 comprises an emission layer. The emission layer 101 comprises at least one organic material which is suitable for generating electromagnetic radiation upon energization.

By way of example, the material of the emission layer 101 can be suitable for generating infrared radiation. The emission layer 101 then contains, for example, at least one of the following materials: Yb-tris(8-hydroxyquinoline), Er-tris(8-hydroxyquinoline), YbQ3, ErQ3.

Furthermore, it is possible for the emission layer 101 to comprise emitter materials for generating red, green and/or blue light, which emitter materials can be embedded in matrix materials. By way of example, suitable emitter materials are described in conjunction with FIG. 3.

Figure 3:
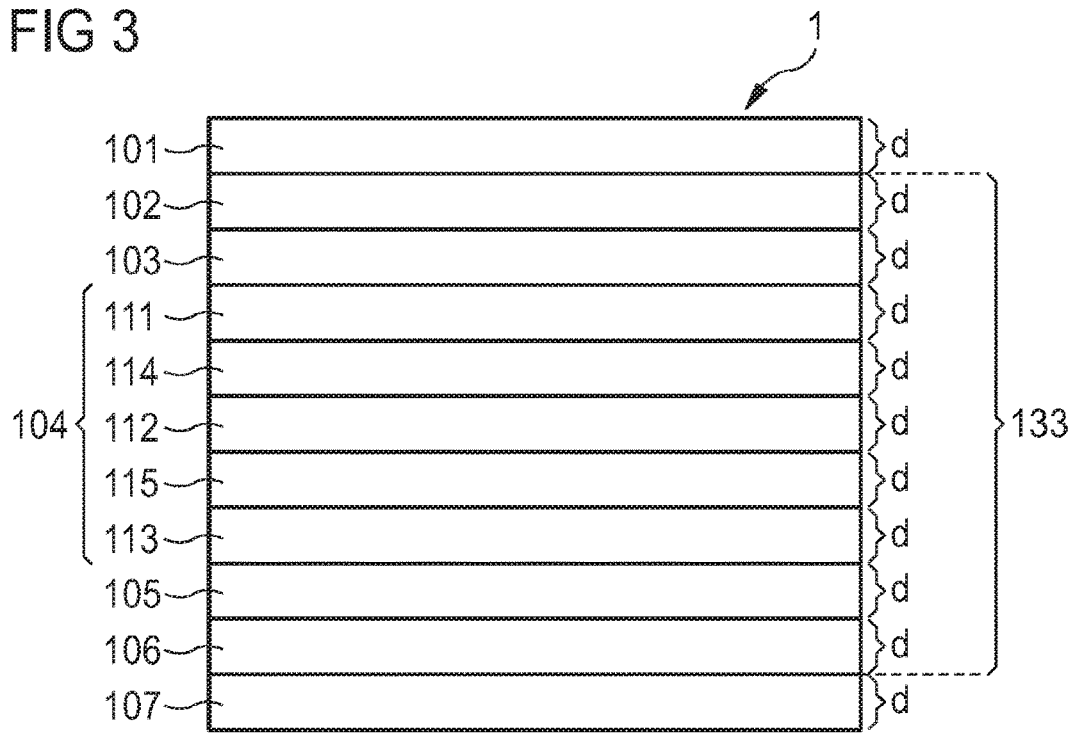
FIG. 3 shows, on the basis of a schematic sectional illustration, the construction of an organic light-emitting diode in accordance with one exemplary embodiment, wherein the organic light-emitting diode 1 emits white light during operation.

FIG. 3 shows, on the basis of a schematic sectional illustration, a further exemplary embodiment of an organic light-emitting diode 1 described here. It is clarified with reference to FIG. 3 that the radiation-emitting region 104 can have a plurality of emission layers 111, 112, 113.

The first emission layer 111 is, for example, an emission layer suitable for emitting red light. The emission layer 101 then contains, for example, the following phosphorescent emitter material: $Ir(DBQ)_2acac$ (iridium(III)bis(2-methyldibenzo[f.h]quinoxaline)(acetylacetonate)). This emitter material has a main emission wavelength of above 600 nm, and in the CIE diagram from 1931 an x value of >0.6 and a y value of <0.36.

The red emission layer 101 can comprise a matrix that transports holes. One suitable matrix material is α-NPD (N,N'-di-1-naphthyl-N,N'-diphenyl-4,4'-diaminobiphenyl). The material has a HOMO of −5.5±0.4 eV and a LUMO of −2.1±0.4 eV. The hole mobility is approximately $10^{-4}$ cm²/Vs and the triplet position T1 is above 1.8 eV.

The second emission layer 112 is, for example, an emission layer which emits green light during the operation of the organic light-emitting diode 1. The emission layer 112 then contains, for example, a green emitter material, which can be embedded in a first and second matrix material. By way of example, Irppy (fac-tris(2-phenylpyridyl)iridium) can be used as green emitter material. The material has a main emission wavelength at 500 to 570 nm, and in the CIE diagram from 1931 an x value of approximately 0.37 and a y value of approximately 0.6.

A hole transporting first matrix material in the second emission layer 112 can be, for example, TCTA (4,4',4"-tris(carbazol-9-yl)triphenylamine), or it can be CBP (4,4'-bis(carbazol-9-yl)biphenyl).

These materials have a HOMO of −6.0 to −5.3 eV and a LUMO of −2.3±0.1 eV, a T1 of above 2.5 eV and a hole mobility of approximately $10^{-4}$ cm²/Vs.

An electron conducting second matrix material in the second emission layer 112 is, for example, BCP or BPhen, where the electron mobility should be greater than $10^{-5}$ cm²/Vs, preferably $10^{-4}$ cm²/Vs.

The third emission layer 113 is then, for example, an emission layer which emits blue light during the operation of the organic light-emitting diode 1. The blue, third emission layer 113 can be a fluorescent emission layer, comprising the blue fluorescent emitter material DPVBi (4,4'-bis(2,2-diphenylethen-1-yl)diphenyl).

This material has a main emission wavelength at 450 to 770 nm, a full width at half maximum at approximately 60 nm, and in the CIE diagram from 1931 x values of 0.14 to 0.22 and y values of 0.11 to 0.20.

The blue emitter material can be present in an electron conducting matrix, which can comprise TBADN (2-tert-butyl-9,10-di(2-naphthyl)anthracene) as material. This material has a HOMO of −5.8 to −5.3 eV and LUMO of −2.5 to −1.8 eV. The band gap is more than 3 eV and the electron mobility is greater than $10^{-6}$ cm²/Vs, preferably greater than $10^{-5}$ cm²/Vs.

Overall, during the operation of the organic light-emitting diode 1, white mixed light is emitted by the three emission layers 111, 112 and 113 in the radiation-emitting region 104.

The first electrode 101 and the second electrode 107 can be chosen as specified in conjunction with FIG. 1. Furthermore, the hole transport layer 102, the electron barrier layer 103, the hole barrier layer 105 and the electron transport layer 106 can be chosen as described in conjunction with FIG. 1.

In the exemplary embodiment of FIG. 3, the use of at least one of the following matrix materials is advantageous, for example, for the hole transport layer 102: 1-TNATA (4,4',4"-tris(N-(naphth-1-yl)-N-phenylamino)triphenylamine), MTDATA (4,4',4"-tris(N-3-methylphenyl-N-phenylamino)triphenylamine), 2-TNATA (4,4',4"-tris(N-naphth-2-yl)-N-phenylamino)triphenylamine), α-NPB (N,N'-bis(naphthalen-1-yl)-N,N'-bis(phenyl)benzidine), β-NPB (N,N'-bis(naphthalen-2-yl)-N,N'-bis(phenyl)benzidine), TPD (N,N'-bis(3-methylphenyl)-N,N'-bis(phenyl)benzidine), spTAD (2,2',7,7'-diphenylaminospiro-9,9'-bifluorene), Cu—PC (phthalocyanine-copper complexes), further phthalocyanine-metal complexes, pentacene and TAPC (1,1-bis[(4-phenyl)-bis(4',4"-methylphenyl)amino]cyclohexane).

These materials have a HOMO of −5.2±0.4 eV and a LUMO of −2.2±0.4 eV. The hole mobility is approximately $10^{-4}$ cm²/Vs and the conductivity of a doped layer given 2 to 10% by volume of the dopant is approximately $10^{-5}$ S/cm.

By way of example, $F_4$-TCNQ (2,3,5,6-tetrafluoro-7,7,8,8-tetracyanoquinodimethane) serves as dopant in the hole transport layer 102. Further dopants are molybdenum oxide and rhenium oxide, for example.

The electron transport layer 106 can advantageously contain one of the following materials as matrix material or consist of one of the following materials: BPhen, Alq$_3$, (tris(8-hydroxyquinoline)aluminum), BAlq$_2$ (bis[2-methyl-8-quinolinato]-[4-phenylphenolato]aluminum(III)), BCP, TPBi (1,3,5-tris(1-phenyl-1H-benzimidazol-2-yl)benzene), TAZ (3-(4-biphenyl)-4-phenyl-5-(4-tert-butylphenyl)-1,2,4-triazole), TAZ2 (3,5-diphenyl-4-naphth-1-yl-1,2,4-triazole), t-Bu-PBD (2-(4-biphenylyl)-5-(4-tert-butylphenyl)-1,3,4-oxadiazole), triazine or triazine derivatives. The matrix material has a HOMO of −6.4 to −6.0 eV, a LUMO of −2.3 to −1.8 eV, an electron mobility of more than $10^{-6}$ cm²/Vs, preferably more than $10^{-5}$ cm²/Vs, and a conductivity in a doped layer (given 6 to 50% by volume of dopant) of $10^{-5}$ S/cm. By way of example, lithium, cesium or calcium can be used as dopant.

For all of the layers, of course, other matrix materials, dopants or emitter materials are possible, as are other compositions of the mixed matrix materials. Further materials for emitter materials, transport materials and dopants are possible and can be exchanged at any time.

In addition to the exemplary embodiment of an organic light-emitting diode described here, as described in conjunction with FIG. 1, the radiation-emitting region 104 in the exemplary embodiment in accordance with FIG. 3 has a first charge transporting layer 114 and a second charge transporting layer 115.

The first charge transporting layer 114 is arranged between the first, red-emitting emission layer 111 and the second, green-emitting emission layer 112.

The first charge transporting layer 114 comprises a first and second matrix material, for example.

The first matrix material of the first charge transporting layer 114 can comprise a hole transporting matrix material, which can be 1-TNATA or α-NPD, for example. These materials have a HOMO of −5.5±0.6 eV and a LUMO of −2.1±0.4 eV. The hole mobility is approximately $10^{-4}$ cm²/Vs and the triplet position T1 is >1.8 eV.

An electron conducting second matrix material in the first charge transporting layer 114 can be BCP (2,9-dimethyl-4,7-diphenyl-1,10-phenanthroline), for example. A further example is BPhen (4,7-diphenyl-1,10-phenanthroline).

These materials have the property that the HOMO is −6.4 to −5.7 eV and the LUMO is −2.3 to −1.8 eV, T1 is >2.5 eV, and the electron mobility is approximately $10^{-6}$ cm²/Vs.

A second charge transporting layer 115 is arranged between the second emission layer 112, which emits green light, and the third emission layer 113, which emits blue light.

The second charge carrier transporting layer 115 is composed of a first and a second matrix material. The first matrix material can be a hole transporting matrix material, which can be TCTA or CBP. The second electron conducting matrix material can be BCP or BPhen.

In the exemplary embodiment described in conjunction with FIG. 3, electromagnetic radiation is emitted through the transparent first electrode 101, which is embodied as an anode. In this case, the first electrode 101 has a thickness of between 80 nm and 140 nm, for example 120 nm.

The hole transport layer 102 preferably has a thickness of between 10 nm and 400 nm. The electron barrier layer 103 preferably has a thickness of between 5 nm and 10 nm. The first emission layer 111 preferably has a thickness of between 5 nm and 15 nm, and the first charge carrier transporting layer 114 preferably has a thickness of between 5 nm and 10 nm. The second emission layer 112 preferably has a thickness of between 5 nm and 15 nm. The second charge carrier transporting layer 115 preferably has a thickness of between 5 nm and 10 nm. The third emission layer 113 preferably has a thickness of between 5 nm and 10 nm. The hole barrier layer 105 preferably has a thickness of between 5 nm and 10 nm. The electron transport layer 106 preferably has a thickness of between 20 nm and 300 nm. The second electrode 107, embodied as a cathode, preferably has a thickness of between preferably 100 nm and 200 nm.

Furthermore, it is possible for first electrode 101 and second electrode 107 in each case to be embodied in transparent fashion. The organic light-emitting diode 1 is then a component which can emit electromagnetic radiation in at least two opposite directions. By way of example, a component which emits white light in two opposite directions can then be involved. Furthermore, such an organic light-emitting diode 1 can be a transparent organic light-emitting diode. In this case, transparent means that the organic light-emitting diode 1 is transmissive to electromagnetic radiation preferably in the visible frequency range, such that at least 50% of the radiation passing through can pass through the organic light-emitting diode 1, without being absorbed. In this case, the organic light-emitting diode 1 can also be pellucid. That is to say that the light passing through is not or hardly scattered by the organic light-emitting diode 1.

The organic light-emitting diode in accordance with FIG. 3 is therefore a radiation-emitting device in which a charge transporting layer is in each case arranged between two emission layers.

In this case, the charge transporting layers each comprise a matrix, which comprises a hole conducting and an electron conducting matrix material or is a mixture of a first, hole transporting matrix material and a second, electron transporting matrix material.

Figure 4:
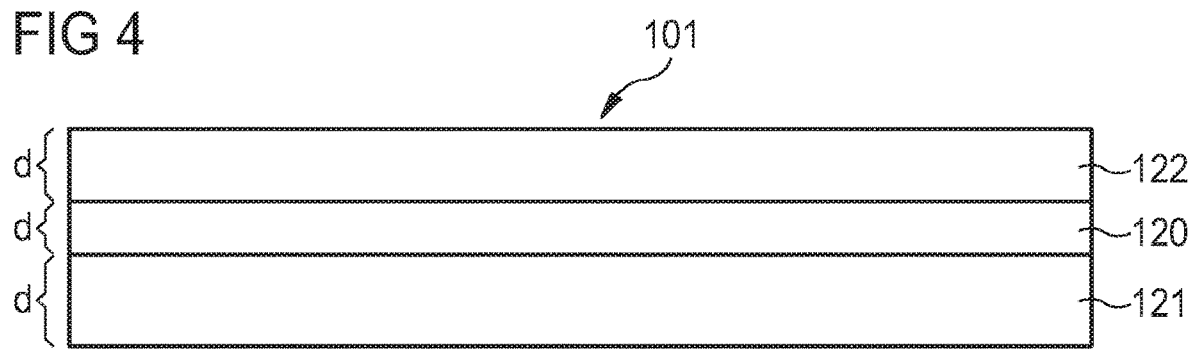
FIG. 4 shows a transparent first electrode for one exemplary embodiment of an organic light-emitting diode described here.
Figure 5:
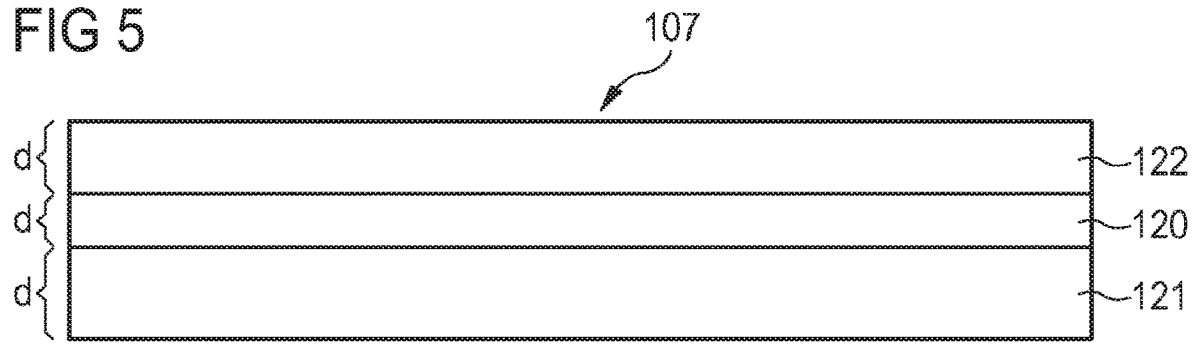
FIG. 5 shows a transparent second electrode for one exemplary embodiment of an organic light-emitting diode described here.

In conjunction with the schematic sectional illustrations in FIGS. 4 and 5, further exemplary embodiments are described in greater detail for the first electrode 101 (FIG. 4) and the second electrode (FIG. 5). These electrodes can be used in organic light-emitting diodes described here.

For this purpose, the first electrode 101 and second electrode 107 preferably both comprise a transparent, electrically conductive oxide (TCO) material.

In this case, at least one of the first electrode 101 and second electrode 107 can comprise a layer sequence having a first TCO layer 121 comprising a first transparent, electrically conductive oxide (TCO), a second TCO layer 122 comprising a transparent metal and a third metal layer 120 comprising a second TCO. The layer sequence having two layers each comprising a TCO and a layer in between, embodied as a transparent metal layer, can enable an electrode which has a high transverse conductivity owing to the transparent metal layer 120 and a reduced reflectivity owing to the high refractive index layers 121, 122 comprising TCO. For an organic optoelectronic component which is transparent on both sides, that is to say fully transparent, it is also possible for both electrodes 101, 107 each to comprise such a layer sequence. What can thereby be achieved, in particular, is that the two transparent electrodes precisely do not form an optical microresonator or form at least a microresonator having a low quality factor.

In this case, the first TCO and/or the second TCO can comprise one or more of the abovementioned materials for TCOs. In particular, the first TCO and/or the second TCO can comprise or be composed of ITO, indium zinc oxide, aluminum zinc oxide and/or zinc oxide. Furthermore, the first and/or the second TCO can be doped with aluminum, vanadium and/or gallium or a combination or mixture thereof. A thickness d of a TCO layer 121, 122 comprising a TCO can be, in particular, greater than or equal to 5 nm and less than or equal to 150 nm.

The transparent metal can comprise aluminum, chromium, molybdenum, nickel, silver, platinum, barium, indium, gold, magnesium, calcium or lithium and also compounds, combinations and alloys thereof or consist of one of the abovementioned materials or combinations or alloys thereof. In this case, a metal layer 120 comprising a transparent metal can have a thickness d of greater than or equal to 1 nm and less than or equal to 50 nm, in particular greater than or equal to 20 nm and less than or equal to 40 nm.

In particular, the first electrode 101 and/or the second electrode 107 can be embodied in areal fashion or alternatively in a manner structured into first and/or second electrode partial regions. By way of example, the first electrode 101 can be embodied in the form of first electrode strips arranged parallel alongside one another, and the second electrode 107 can be embodied as second electrode strips arranged parallel alongside one another and running perpendicularly to said first electrode strips. Overlaps of the first and second electrode strips can therefore be embodied as separately drivable luminous regions. Furthermore, it is also possible for only the first 101 or the second electrode 107 to be structured.

The combination of a transparent metal layer 120 and a transparent TCO layer 121, 122 makes it possible to realize a first 101 and/or a second electrode 107 having both good electrical and good optical properties.

In this case, "good electrical properties" can mean that the electrode 101, 107 has a low electrical resistance typical of metals and therefore also a good transverse conductivity, that is to say a high electrical conductivity, typical of a metal, along the extension direction of the electrode. In particular, the combination of a transparent metal layer 120 and a transparent TCO layer 121, 122 makes it possible to achieve a lower electrical resistance and hence a higher transverse conductivity than, for example, with a layer composed of a transparent, electrically conductive oxide alone.

"Good optical properties" can mean, in particular, that the electrode has a high transparency and furthermore a low reflectivity, in particular a lower reflectivity than a layer comprising a transparent metal alone. That can be achieved by virtue of the fact that the TCO layer 121, 122 can act as an antireflection coating. Materials having a high refractive index such as, for instance, dielectric oxides, for instance silicon oxide or tantalum oxide, and, in particular, transparent, electrically conductive oxides or mixtures thereof can be suitable for this purpose.

In this case, a high refractive index can be, for example, a refractive index of greater than or equal to 1.9. By way of example, TCOs can have refractive indices in the range of approximately 1.9 to approximately 2.1.

Alternatively or additionally, the first and/or second electrode can also have one or a plurality of layers suitable for antireflection coating and composed of a further material having a high refractive index, for instance from the region of the tellurides or sulfides, for instance ZnSe having a refractive index of approximately 2.5. Furthermore, the materials mentioned can also be present in combinations or mixtures in the first 101 and/or second electrode 107.

FIGS. 6A to 6D show further exemplary embodiments of organic light-emitting diodes 1 described here.

FIGS. 6A and 6B show an organic light-emitting diode 1 in a switched-off electronic operating state (FIG. 6A) and in a switched-on electronic operating state (FIG. 6B).

The organic light-emitting diode 1 has a first carrier 130, which is embodied in radiation-transmissive fashion. By way of example, the first carrier 130 consists of a glass. On the first carrier 130 are a transparent first electrode 101 and a second electrode 107 arranged. Between the transparent first electrode 101 and the second electrode 107 an organic layer sequence 133 is arranged. In the exemplary embodiment shown, the organic light-emitting diode 1 is therefore embodied as a bottom emitter since it can emit through the first carrier 130.

The organic layer sequence 133 has at least one radiation-emitting region 104 and also a hole transport layer 102. In this case, the hole transport layer 102 is arranged between the first electrode 101 and the radiation-emitting region 104.

In the exemplary embodiment shown, the transparent first electrode 101 is embodied from indium tin oxide (ITO) and serves as an anode, while the second electrode 107 has a 0.7 nm thick LiF layer and a 200 nm thick aluminum layer.

The hole transport layer 102 comprises a matrix material and a dopant, which form charge transfer complexes. In this case, the charge transfer complexes have a first absorption spectrum. Electromagnetic radiation having a wavelength in the absorption range can be absorbed by the charge transfer complexes with excitation thereof. That part of an electromagnetic radiation incident on the organic light-emitting diode 1 from outside, here indicated by means of the arrows 190, which corresponds to the absorption spectrum is therefore absorbed, while the non-absorbed part 191 of the electromagnetic radiation 190 can be scattered and reflected by the hole transport layer 102. As a result, the hole transport layer 102 can be perceived by an external observer and, in the switched-off electronic operating state of the organic light-emitting diode 1, brings about a predetermined color impression in the form of the electromagnetic radiation 191.

In the exemplary embodiment shown, the hole transport layer 102 consists of NPB as matrix material, which is p-doped with 5% $Re_2O_7$. In this case, the dopant is distributed homogeneously in the matrix material. This gives rise to a uniform yellowish color impression in the switched-off operating state.

The radiation-emitting region 104 has, for example, a 40 nm thick layer composed of tris(8-hydroxyquinoline)aluminum ($Alq_3$) as fluorescent electroluminescent material, which simultaneously serves as electron transport material. Arranged between the hole transport layer 102 and the active region 30 is a 10 nm thick NPB layer 123, which improves the hole injection from the hole transport layer 102 into the radiation-emitting region 104. As an alternative thereto, the hole transport layer 102 can also comprise the dopant with a thickness gradient in the matrix material, wherein the dopant concentration can decrease toward the radiation-emitting region 104 continuously or discontinuously.

As is indicated by the arrows 193 in FIG. 6B, the organic light-emitting diode 1 emits green-colored electromagnetic radiation through the radiation-emitting region 104, the first electrode 101 and the first carrier 1 in the switched-on operating state. In this case, the dashed arrows 190 and 191 indicate that although electromagnetic radiation which is incident on the organic light-emitting diode 1 from outside can still be scattered and reflected, the color impression brought about thereby is outshone by the electromagnetic radiation 193 generated in the radiation-emitting region and is therefore not perceptible.

In further exemplary embodiments, the hole transport layer 102 is embodied as a 50 nm thick layer comprising NPB as matrix material and comprising $Re_2O_5$ as dopant having dopant concentrations of 5%, 20% and 50%. In this case, it is found that the perceptible color impression of the light-emitting diodes 1 in the switched-off electronic operating state changes from light blue to deep blue as the concentration of the dopant increases. In the switched-on electronic operating state, by contrast, green electromagnetic radiation 193 is always emitted.

In a further exemplary embodiment, the hole transport layer 102 comprises NPB as matrix material and dirhodium tetratrifluoroacetate as dopant in the case of a thickness of 200 nm. While green electromagnetic radiation 193 is emitted in the switched-on electronic operating state, the hole transport layer 102 gives a bluish color impression in the switched-off electronic operating state.

An organic electronic component as a comparative component having a construction in accordance with FIGS. 6A and 6B, but an undoped hole transport layer 102 composed of NPB, likewise emits green electromagnetic radiation 193, but gives only a pale blue color impression with low color saturation in the switched-off electronic operating state.

The exemplary embodiments in FIGS. 6A and 6B, shown here purely by way of example, therefore show that a predetermined color impression can be set in the switched-off electronic operating state and can be chosen by means of the choice of matrix material and dopant, while the electromagnetic radiation emitted in the switched-on electronic operating state can always give the same luminous impression.

Figure 6C:
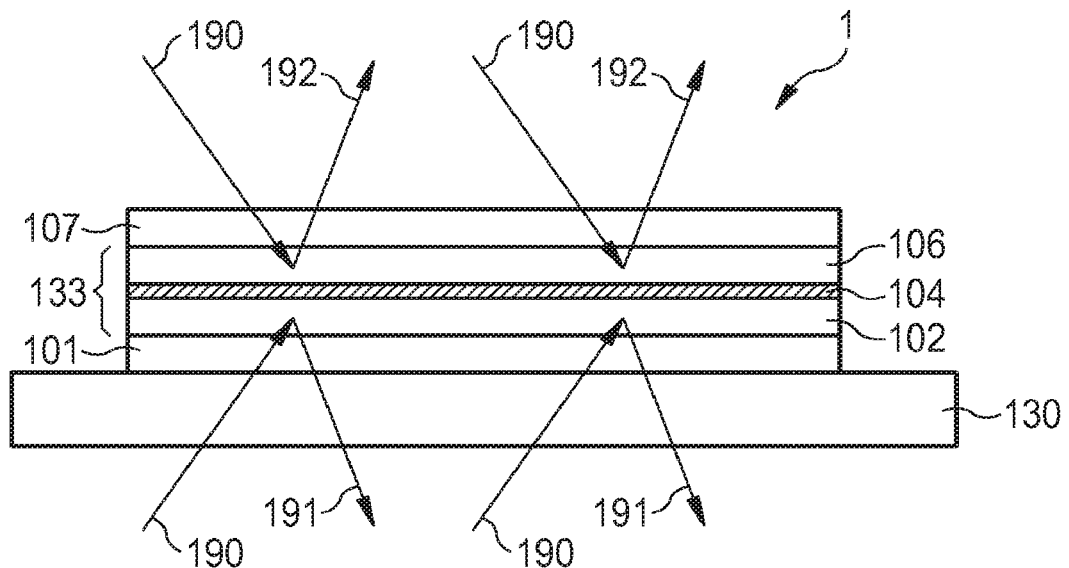
Figure 6D:
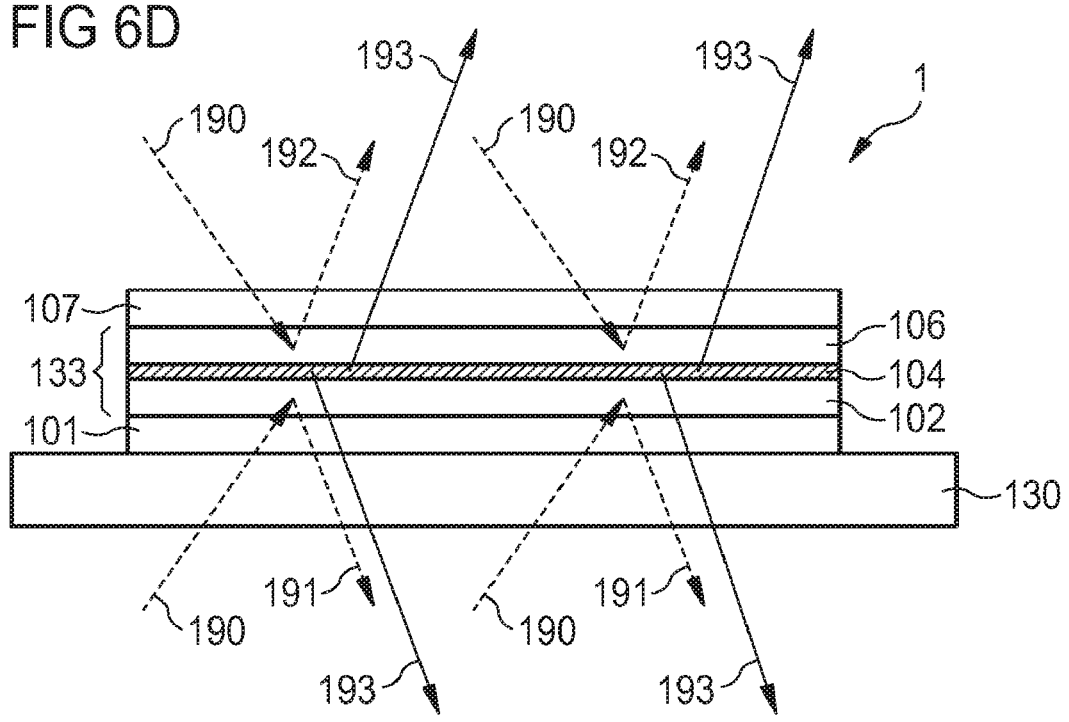

FIGS. 6C and 6D illustrate a further exemplary embodiment for an organic light-emitting diode 1 in a switched-off electronic operating state (FIG. 6C) and in a switched-on electronic operating state (FIG. 6D), which embodiment constitutes a modification of the previous exemplary embodiment.

In contrast to the organic light-emitting diode 1 in FIGS. 6A and 6B, the organic light-emitting diode 1 here additionally has a transparent second electrode 107 composed of a transparent metal film, and also an electron transport layer 106 between the radiation-emitting region 104 and the second electrode 107. Therefore, in the exemplary embodiment shown, the organic light-emitting diode 1 is embodied as an OLED which emits on both sides. The hole transport layer 107 can be embodied as described in connection with the previous exemplary embodiments and can give a light blue color impression, for example, in the switched-off electronic operating state.

The electron transport layer 106 comprises a matrix material and a dopant, which form charge transfer complexes which absorb part of the electromagnetic radiation 190 incident on the light-emitting diode 1 from outside with a second absorption spectrum. The non-absorbed electromagnetic radiation, here indicated by the arrows 192, can be perceived by an external observer as a predetermined color impression through the second electrode 102. In this case, the color impression which can be perceived through the electron transport layer 106 through the second electrode 107 in the switched-off electronic operating state can be different than the color impression which can be perceived through the first electrode 101 on account of the hole transport layer 102.

In the exemplary embodiment shown, the electron transport layer 106 is 150 nm thick and comprises BCP as matrix material and $Cs_2CO_3$ as dopant having a concentration of 10%. As a result, in the switched-off electronic operating state, the electron transport layer 106 gives a deep blue color impression for an external observer. In the switched-on operating state, as shown in FIG. 6D, this color impression is outshone by the electromagnetic radiation generated in the radiation-emitting region 104, which radiation gives a green luminous impression as in the previous exemplary embodiments.

While the organic light-emitting diode, in the switched-off electronic operating state, can give a different color impression through the hole transport layer 102 than through the electron transport layer 106, in the switched-on electronic operating state the same luminous impression is given on both sides through the electromagnetic radiation 193 generated in the radiation-emitting region 104.

In a further exemplary embodiment having a construction in accordance with FIGS. 6C and 6D, the electron transport layer 106, given a thickness of 150 nm, comprises Bpyppy as matrix material and $Cs_2CO_3$ with a concentration of 10% as dopant. The charge transfer band of the electron transport layer 106 is so intensive that it determines the color impression through the second electrode 107. As a result, the electron transport layer 106 can give a red color impression in the switched-off electronic operating state, while green electromagnetic radiation is once again emitted in the switched-on electronic operating state.

It is possible to combine the exemplary embodiments in accordance with FIGS. 1 to 6. Such a combination can result, for example, in a transparent organic light-emitting diode which emits on both sides and which appears colored in accordance with a desired color from both sides in the switched-off operating states and emits white light in the switched-on state.

The encapsulation and hermetic sealing of organic light-emitting diodes 1 described here is explained in greater detail below. The layer construction of the functional layers such as the electrodes 101, 107, and the organic layer sequence 133, can in this case be as described in conjunction with FIGS. 1 to 6. Furthermore, the layer construction can follow any desired combination of the layers and materials described in conjunction with FIGS. 1 to 6.

Figure 7:
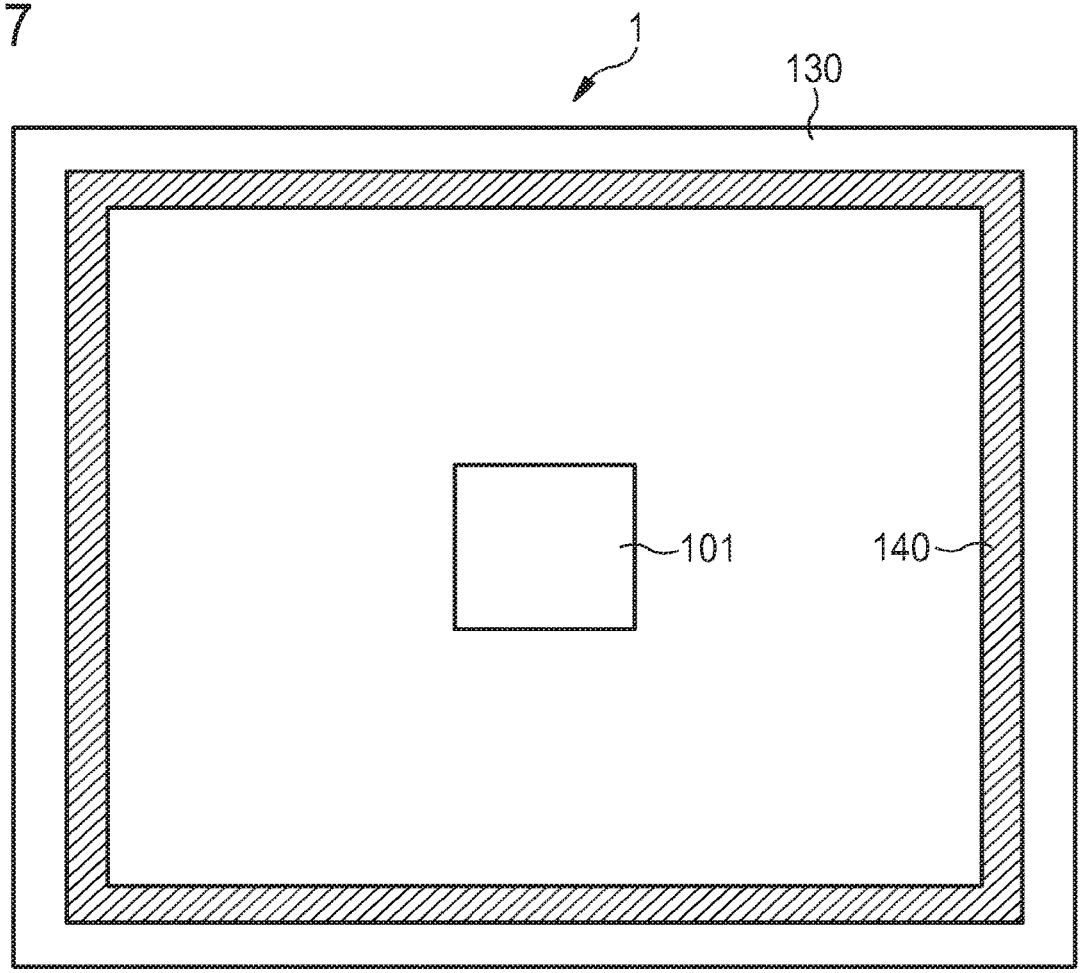
FIG. 7 shows, on the basis of a schematic plan view, one exemplary embodiment of an organic light-emitting diode encapsulated by means of a connecting means.
Figure 8:
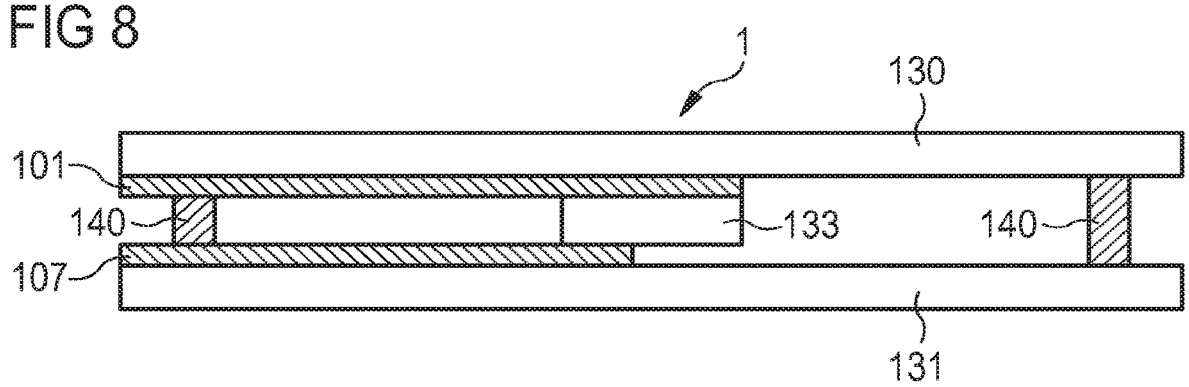
FIG. 8 shows, on the basis of a schematic sectional illustration, one exemplary embodiment of an organic light-emitting diode encapsulated by means of a connecting means.

A further exemplary embodiment of an organic light-emitting diode 1 described here is explained in greater detail in conjunction with FIG. 7, on the basis of a schematic plan view. FIG. 8 shows an associated sectional illustration.

The organic light-emitting diode 1 comprises a first carrier 130 and a second carrier 131. In this case, first carrier 130 and second carrier 131 are preferably embodied in plate-like fashion. That is to say that first carrier 130 and second carrier 131 are substantially planar sheets. The functional layers of the organic light-emitting diode 1 are arranged between first carrier 130 and second carrier 131. In this way, first carrier 130 and second carrier 131 serve for encapsulating the organic layer sequence 133.

First carrier 130 and second carrier 131 can be formed from the same material or from different materials. At least one of the two carriers is at least partly transmissive to electromagnetic radiation generated in the radiation-emitting region 104 of the organic light-emitting diode 1. Furthermore, it is possible for both carriers to be at least partly transmissive to said electromagnetic radiation.

By way of example, at least one of the carriers is formed with a glass. That is to say that this carrier contains a glass or preferably consists of a glass. The glass can be, for example, a borosilicate glass. Furthermore, it is possible for the glass to be a soda-lime glass (also: window glass). A soda-lime glass is distinguished by lower production costs by comparison with a borosilicate glass.

If one of the two carriers is embodied as a non-radiation-transmissive carrier, then said carrier can consist of a metal or contain a metal or consist of a ceramic material or contain a ceramic material.

Furthermore, it is possible for first carrier 130 and second carrier 131 each to consist of a glass. The two carriers can then also consist of the same glass.

The organic layer sequence 133 arranged between first carrier 130 and second carrier 131 can be electrically contact-connectable for example by means of the first electrode 101 and the second electrode 107, wherein first electrode 101 and second electrode 107 can be accessible from outside the organic light-emitting diode 1, as is indicated in FIG. 8, for example.

For the purpose of connecting first carrier 130 and second carrier 131, in the exemplary embodiments in FIGS. 7 and 8, a connecting means 140 is situated between first carrier 130 and second carrier 131. The connecting means encloses the organic layer sequence 133 in a frame-like manner. In this case, the expression "in a frame-like manner" does not relate to the geometrical form of the course of the connecting means 140. All that is important is that the connecting means 140 laterally completely encloses the organic layer sequence 133. The connecting means 140 is therefore led as a track around the organic layer sequence 133, wherein the connecting means 140 can be in direct contact with first carrier 130 and second carrier 131.

The connecting means 140 can be, for example, a glass solder material, a glass frit material or an adhesive. Furthermore, it is possible for the organic light-emitting diode 1 to have, alongside the connecting means 140, a further connecting means, which is likewise arranged around the organic layer sequence 133 in a frame-like manner. The materials of the two connecting means can then differ from one another. By way of example, one connecting means can be formed with an adhesive, and the other connecting means can then be formed with a glass solder or a glass frit material.

Figure 9:
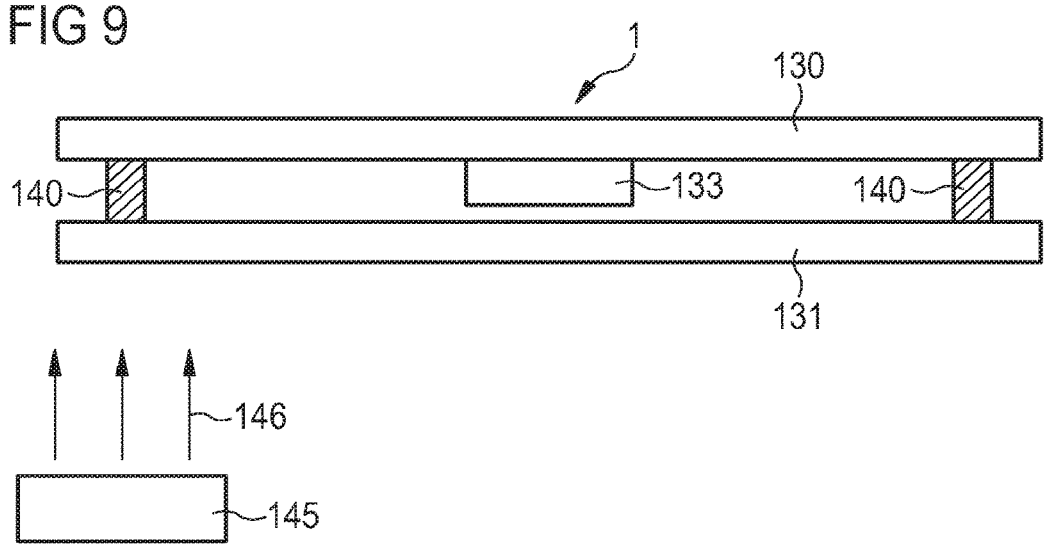
FIG. 9 shows, on the basis of a schematic sectional illustration, one exemplary embodiment for the encapsulation of an organic light-emitting diode.

An explanation is given, on the basis of the schematic sectional illustration in FIG. 9, of the fact that the connecting means 140 can be hardened or softened by means of a source 145 of electromagnetic radiation 146.

If the connecting means 140 is, for example, an adhesive such as Nagase or ThreeBond, then it is possible to use the source 145 for locally curing the adhesive. In this case, the source 145 is arranged in such a way that hardly any or no electromagnetic radiation 146 at all impinges on the organic layer sequence 133. That is to say that the organic layer sequence 133 cannot be damaged by the electromagnetic radiation 146 of the source 145.

If the connecting means 140 is a glass solder or a glass frit material, then the glass solder or the glass frit material 140 can be softened by means of the electromagnetic radiation 146. The softened glass solder or glass frit material then wets at least one of the carriers, thereby giving rise to a hermetically impermeable seal of the organic light-emitting diode 1. In particular, in this case, the source 145 can be a laser which emits infrared radiation 146, for example, which penetrates through the second carrier 131 and is only absorbed in the connecting means 140.

Figure 10:
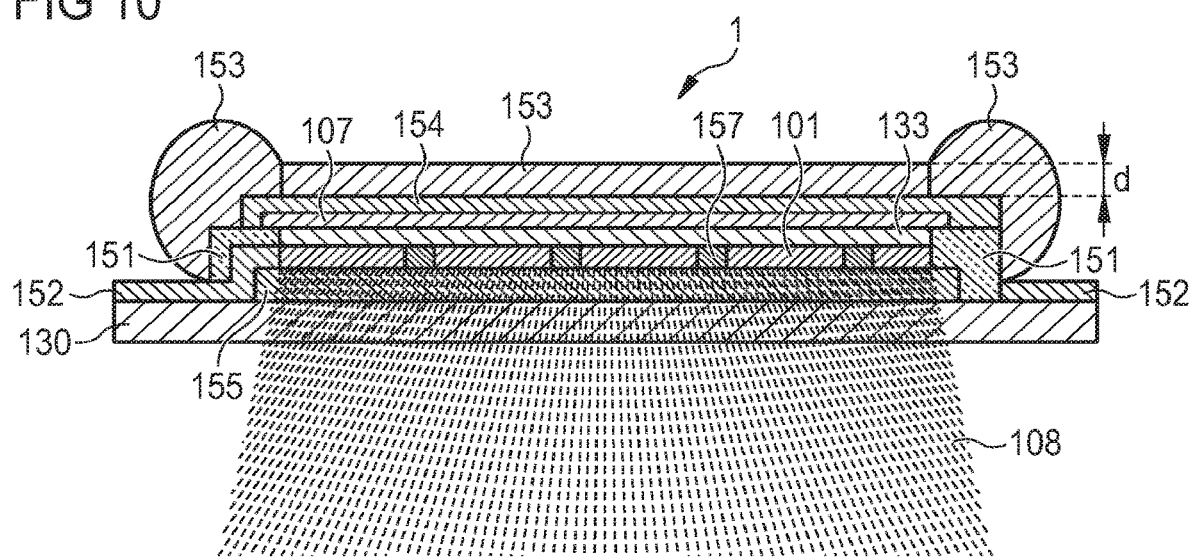
FIGS. 10 to 13, 14A and 14B show, on the basis of schematic sectional illustrations, exemplary embodiments of organic light-emitting diodes which are sealed by means of resist layers, insulation layers, diffusion barriers, thin-film encapsulations and/or pre-encapsulation layers.

FIG. 10 shows, on the basis of a schematic sectional illustration, a further exemplary embodiment of an organic light-emitting diode 1 described here. The organic light-emitting diode 1 comprises a first carrier 130, which can consist of a glass, for example. The glass is preferably at least partly transmissive to electromagnetic radiation generated in the radiation-emitting region 104 of the organic light-emitting diode 1.

The first carrier 130 is succeeded by a connection line 155. The connection line 155 is a radiation-transmissive, electrically conductive layer. The connection layer 155 can be formed, for example, by one of the transparent electrode materials presented above. The first electrode 101 is arranged on the connection line 155, said first electrode likewise being embodied in transparent fashion.

Busbars 157 can be arranged in or at the first electrode 101. The busbars can be formed by thin metal strips, for example. By way of example, a layer sequence having layers composed of chromium and aluminum is suitable for forming the busbars. Furthermore, the busbars can consist of aluminum, chromium, silver or mixtures of these materials. The busbars improve the transverse conductivity of the first electrode 101. They can be insulated from the overlying organic layer sequence 133 by an insulation layer, for example, such that current is not directly impressed from the busbars 157 into the organic layer sequence 133. The busbars 157 then serve only for the better distribution of electric current within the first, transparent electrode 101.

The organic layer sequence 133 is succeeded by the second electrode 107. The second electrode 107 is embodied in reflective fashion, for example, as described above.

The first electrode 101 can be electrically contact-connected from outside the organic light-emitting diode 1 by means of the connection location 152, which can be formed with a TCO material or a metal. The connection location 152 is electrically insulated from the second electrode 107 by means of an insulation layer 151 containing an electrically conductive material such as a resist, an epoxy resin or a silicon oxide.

During the operation of the organic light-emitting diode 1, an emission 108 of electromagnetic radiation generated in the organic layer sequence 133, in particular in the radiation-emitting region 104, is effected through the first carrier 130 toward the outside.

The organic light-emitting diode 1 furthermore has a thin-film encapsulation 154 serving for encapsulating the organic layer sequence 133. The thin-film encapsulation 154 produces a basic impermeability to environmental influences, such as moisture and atmospheric gases, for the organic layer sequence 133. The thin-film encapsulation 154 can be applied by means of a PECVD method (plasma enhanced chemical vapor deposition), for example. The thin-film encapsulation 154 can, for example, consist of oxide and/or nitride layers, such as SiO or SiN, or contain said materials. In this case, it is also possible for the thin encapsulation 154 to comprise a layer sequence which alternately has nitride and oxide layers.

Figure 19:
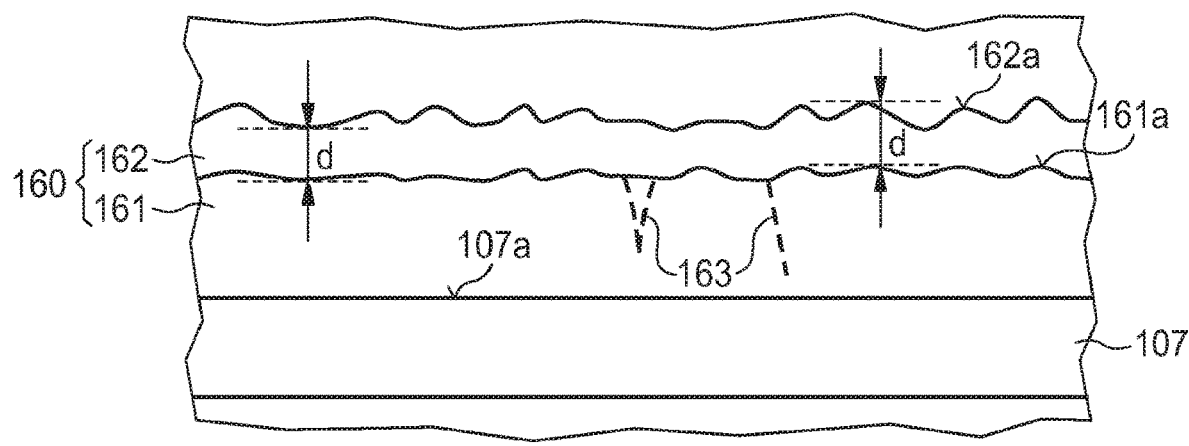

In this case, the thin-film encapsulation 154 can have lattice defects 163 (in this respect, also see FIG. 19). Said lattice defects 163 can result, for example, in so-called pinholes or other imperfections which lead to a permeability of the thin-film encapsulation 154 to atmospheric gases or moisture.

In the exemplary embodiment in FIG. 10, a diffusion barrier 153 is arranged on the thin-film encapsulation 154. The diffusion barrier 153 is formed from amorphous $SiO_2$, for example. In this case, the diffusion barrier 153 is deposited by means of atmospheric pressure plasma, for example. The diffusion barrier 153 can, in particular, also be deposited onto the side areas of the organic light-emitting diode 1. Thus, the diffusion barrier 153 can also cover the insulation layer 151 and the connection locations 152 at least in places. The organic light-emitting diode 1 is therefore encapsulated with the diffusion barrier 153 and protected from environmental protection influences both from its outer area facing away from the first carrier 130 and at its side areas.

The diffusion barrier 153 can also be applied by means of atmospheric pressure plasma in a plurality of individual layers. Consequently, the different partial regions of the diffusion barrier 153 can also have different thicknesses. In this way, a diffusion barrier 153 of increased thickness can be applied where the risk of formation of lattice defects 163 is highest—for example at edges of layers.

An atmospheric pressure plasma (also called AP plasma or normal pressure plasma) is understood in this case to mean the special case of a plasma in which the pressure approximately corresponds to that of the surrounding atmosphere. The use of an atmospheric pressure plasma has some advantages over the use of a low-pressure plasma encapsulation technique. The apparatus outlay for coating with an atmospheric pressure plasma is significantly less than in the case of the low-pressure plasma. In the case of the low-pressure plasma it is necessary, for example, for the component that is to be coated to be introduced into a chamber and for the pressure then to be reduced therein. After the deposition process, the pressure has to be adapted to normal pressure again and the component has to be removed from the chamber again. In the case where an atmospheric pressure plasma is used, by contrast, it is not necessary to introduce the component—here the organic light-emitting diode 1—into a closed chamber. The coating with the diffusion barrier 153 is therefore also possible on an assembly line, for example, using an atmospheric pressure plasma.

The diffusion barrier can have a thickness d of 50 nm to 1000 nm. Preferably, the diffusion barrier 153 has a thickness d of at least 100 nm and at most 250 nm. At the edges of the organic light-emitting diode 1, the thickness of the diffusion barrier 153 can also be chosen to be larger.

The diffusion barrier 153 can also be produced from individual layers. In this case, two or more individual layers can be deposited one above another. Each of the individual layers can have a thickness of, for example, at least 50 nm and at most 100 nm. The impermeability of the overall layer can be increased by applying individual layers.

The diffusion barrier 153 can comprise silicon dioxide or consist thereof. In this case, the silicon dioxide can only be formed in the gas phase. In order to form the silicon dioxide, it is possible to use a silane and a further compound serving as oxygen source. By way of example, $SiH_4$ can be used as silane and $N_2O$ as oxygen source.

Figure 11:
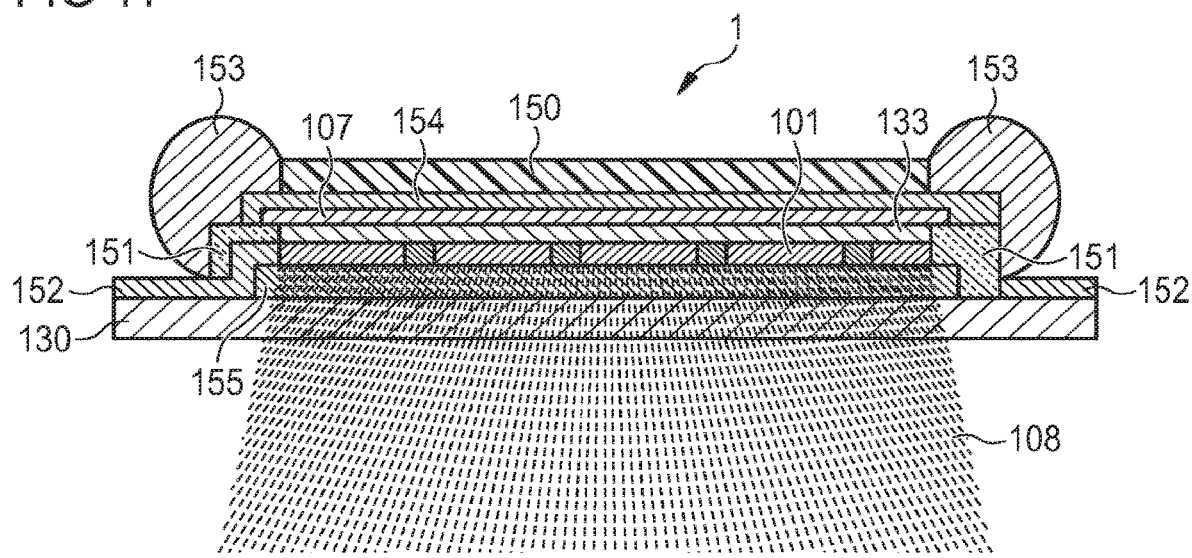

FIG. 11 shows, on the basis of a schematic sectional illustration, a further exemplary embodiment of an organic light-emitting diode described here. In contrast to the exemplary embodiment in FIG. 10, in this exemplary embodiment the diffusion barrier 153 is only arranged at the side areas of the organic light-emitting diode 1. Instead of a diffusion barrier 153, a resist layer 150 is applied to that outer area of the organic light-emitting diode which faces away from the first carrier 130. That is to say that, in this exemplary embodiment, the outer area facing away from the first carrier 130 is encapsulated by a combination of a thin-film encapsulation 154 with a resist layer 150.

Figure 12:
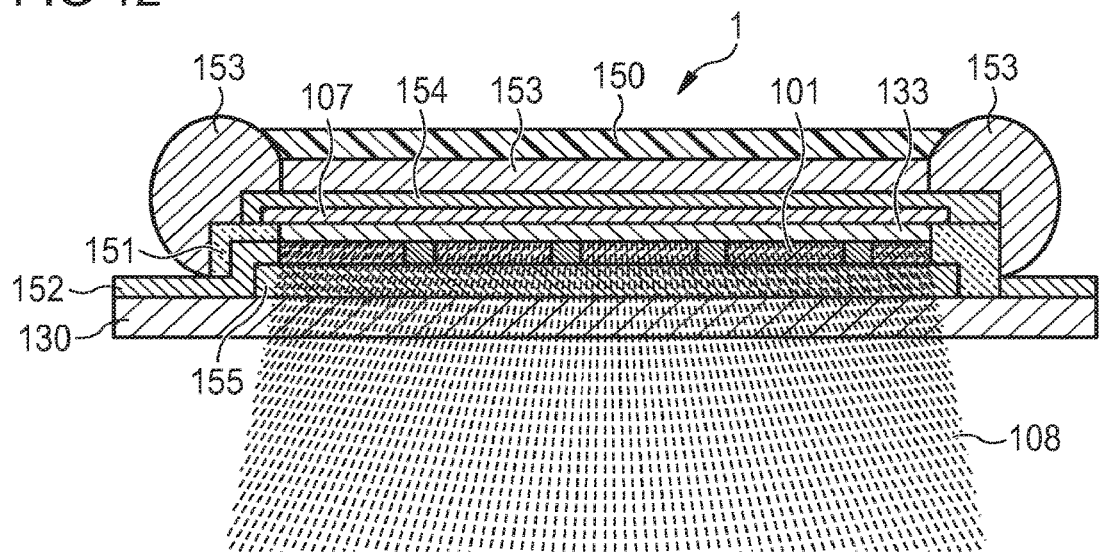

A further exemplary embodiment of an organic light-emitting diode 1 described here is explained in greater detail in conjunction with FIG. 12. In contrast to the exemplary embodiment in FIG. 11, in this exemplary embodiment a diffusion barrier 153 produced by means of an atmospheric pressure plasma is arranged between the thin-film encapsulation 154 and the resist layer 150. The resist layer covers the diffusion barrier 153 at least in places.

Figure 13:
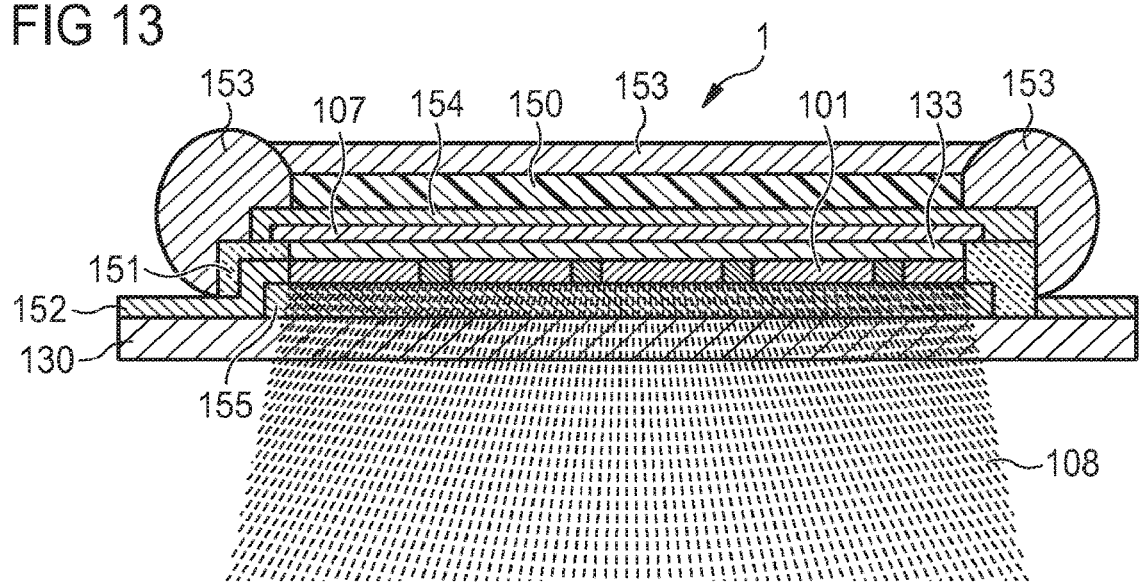

A further exemplary embodiment of an organic light-emitting diode 1 described here is explained in greater detail in conjunction with FIG. 13. In contrast to the exemplary embodiment in FIG. 11, in this exemplary embodiment a diffusion barrier 153 produced by means of an atmospheric pressure plasma is additionally applied to the resist layer 150. The diffusion barrier 153 covers the resist layer 150 at all exposed surfaces. A particularly impermeable encapsulation of the organic layer sequence 133 against external environmental influences is realized as a result.

Figure 14A:
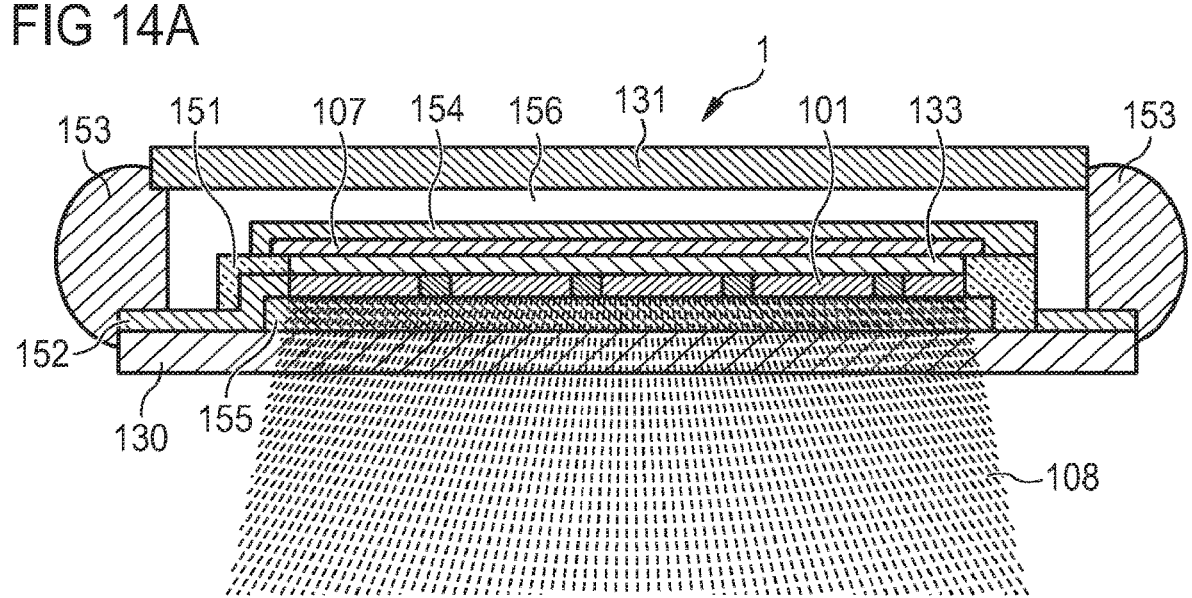

A further exemplary embodiment of an organic light-emitting diode described here is explained in greater detail in conjunction with FIG. 14A. In this exemplary embodiment, the insulation layer 151, the connection location 152 and also the thin-film encapsulation 154 are covered at least in places by a pre-encapsulation layer 156, which serves for encapsulating the organic layer sequence 133 and as a planarization layer for the thin-film encapsulation 153 at the side areas of the organic light-emitting diode 1. The pre-encapsulation layer 156 can comprise, for example, a transparent epoxide or a radiation-transmissive adhesive. A second carrier 131 is applied to the pre-encapsulation layer 156, onto the outer area thereof which faces away from the first carrier 130. The second carrier 131 can be a glass plate, for example. It is then possible for an emission 108 to be effected both through the first carrier 130 and through the second carrier 131. The organic light-emitting diode 1 can then be an organic light-emitting diode 1 which emits on both sides. In this case, the diffusion barrier 153 produced by means of atmospheric pressure plasma serves substantially for laterally sealing the organic light-emitting diode 1.

In this case, it is furthermore possible that first carrier 130 and second carrier 131 can be formed by mutually different materials. By way of example, one of the two carriers can be formed by a non-radiation-transmissive material, such as a metal plate, for example.

Figure 14B:
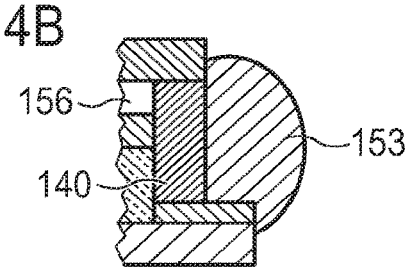

Furthermore, it is possible for first carrier 130 and second carrier 131, as described in conjunction with FIGS. 7 and 8, for example, to be connected to one another by means of a connecting means 140. The connecting means can then be a glass solder or a glass frit material or an adhesive. The connecting means 140 is additionally sealed by the diffusion barrier 153 at the side areas of the organic light-emitting diode 1. Such a organic light-emitting diode 1 is elucidated in greater detail in FIG. 14B on the basis of a schematic sectional illustration.

In conjunction with FIGS. 15, 16, 17, 18 and 19, exemplary embodiments of organic light-emitting diodes 1 described here are explained in greater detail wherein at least parts of the organic light-emitting diode 1 are encapsulated by at least two encapsulation layers 161, 162 forming an encapsulation layer sequence 160. That is to say that the encapsulation layer sequence 160 has at least one first encapsulation layer 161 and a second encapsulation layer 162, as a result of which an efficacious and effective encapsulation is made possible. In this case, the effective encapsulation can be brought about precisely by the combination of the two encapsulation layers 161, 162.

The first encapsulation layer 161 and the second encapsulation layer 162 can each comprise materials suitable for protecting the organic light-emitting diode 1 against harmful influences of the surroundings, such as atmospheric gases and moisture, through the combination of the first encapsulation layer 161 and the second encapsulation layer 162. In this case, the first encapsulation layer 161 and the second encapsulation layer 162 can each comprise an inorganic material or consist of an inorganic material.

The first encapsulation layer 161 can comprise or consist of an oxide, a nitride or an oxynitride. By way of example, the oxide, nitride or oxynitride can comprise aluminum, silicon, tin, zinc, titanium, zirconium, tantalum, niobium or hafnium. Particularly preferably, the first layer can comprise silicon nitride, such as, for instance, $Si_2N_3$, silicon oxide ($SiO_x$), such as, for instance, silicon dioxide, aluminum oxide, such as, for instance, $Al_2O_3$, and/or titanium oxide, such as $TiO_2$. Furthermore, the first encapsulation layer 161 can also consist of a TCO material or contain such a TCO material. Furthermore, it is possible for the first encapsulation layer 161 to comprise or consist of a metal or a metal alloy. In this case, the first encapsulation layer 161 can comprise aluminum and/or aluminum alloys, for example.

The abovementioned materials can be applied by means of plasma enhanced chemical vapor deposition (PECVD), for example, in order to produce the first encapsulation layer 161. In this case, a plasma can be generated in a volume above and/or around the radiation-emitting layer sequence 133 and the electrodes 101, 107, wherein at least two gaseous starting compounds are fed to the volume, which starting compounds can be ionized in the plasma and excited to react with one another. The generation of the plasma can make it possible that the temperature to which the at least one surface of the component has to be heated in order to make it possible to produce the first encapsulation layer 161 can be lowered in comparison with a plasmaless CVD method.

As an alternative thereof, the first encapsulation layer 161 can be applied by means of physical vapor deposition, such as sputtering, for instance.

Furthermore, the first encapsulation layer 161 can also comprise a glass or consist of a glass. In this case, the glass can, for example, comprise one or a plurality of the abovementioned oxides and be able to be applied by means of plasma spraying.

In the case of plasma spraying, an arc can be generated in a so-called plasma torch between at least one anode and at least one cathode by means of high voltage, through which arc a gas or gas mixture can be conducted and thereby ionized. The gas or gas mixture can comprise argon, nitrogen, hydrogen and/or helium, for example. By way of example, pulverulent material for the first encapsulation layer 161 can be sprayed into the plasma flow generated by the arc and the gas or gas mixture flow. The pulverulent material can be melted by the temperature of the plasma and applied to the top side 107a of the second electrode 107, for example, by means of the plasma flow. The pulverulent material can be provided, for example, with an average grain size of less than or equal to a few hundred micrometers, preferably less than or equal to 100 µm, and furthermore greater than or equal to 100 nm, preferably greater than or equal to 1 µm. The more finely the material is provided, that is to say the smaller the average grain size, the more uniformly the first encapsulation layer 161 can be applied. The more coarsely the material is provided, that is to say the larger the average grain size, the more rapidly the first encapsulation layer 161 can be applied. Furthermore, the structure and also the quality of the first encapsulation layer 161 can depend on the speed, the temperature and/or the composition of the plasma gas.

As an alternative to plasma spraying, a first encapsulation layer 161 comprising glass can also be applied by means of flame spraying or by means of a thermal evaporation method.

The abovementioned methods for applying the first encapsulation layer 161 enable the latter to be applied cost-effectively with a high growth rate. In particular, after application, the first encapsulation layer 161 can have a thickness d of greater than or equal to 50 nm, and particularly preferably a thickness d of greater than or equal to 100 nm. Furthermore, the first encapsulation layer 161 can have a thickness d of less than or equal to 1 µm. By means of such a thick first encapsulation layer, the encapsulation arrangement, alongside the encapsulation, can also enable a mechanical protection of the organic light-emitting diode 1 against damaging external influences.

The abovementioned methods, in particular at temperatures of the component of less than 120° C., and particularly preferably of less than 80° C., enable the first encapsulation layer 161 to be able to be applied directly on the component, without the component or parts thereof being damaged.

The volume structure of the first encapsulation layer 161 can be present, for example, in crystalline and/or polycrystalline form. In this case, it can be possible for the volume structure of the first encapsulation layer to have, for example, structural and/or lattice defects 163 such as, for example, dislocations, grain boundaries and/or stacking faults.

Furthermore, the first encapsulation layer 161 can have, on the side which faces away from the organic layer sequence 133 and on which the second encapsulation layer 162 is arranged, a surface structure in the form of macroscopic topographical structures such as, for instance, slopes, elevations, angles, edges, corners, depressions, trenches, grooves, microlenses and/or prisms and/or in the form of microscopic topographical structures such as, for instance, a surface roughness and/or pores (in this respect, see FIG. 19, in particular). In this case, structures of the surface structure which are resolvable by means of visible light are ascribed to the macroscopic structures, while microscopic structures are precisely no longer resolvable by means of visible light. That can mean that here structures designated as macroscopic have dimensions of greater than or equal to approximately 400 nm, while microscopic structures have dimensions which are less than approximately 400 nm.

The surface structure can be governed by the abovementioned application methods themselves or else be producible, in particular in the case of macroscopic structures, by suitable further method steps such as, for instance, the deposition through a mask and/or subsequent processing by means of mechanical and/or chemical removing methods. Macroscopic structures can be suitable for light refraction and/or scattering, for example, in the case of a transparent encapsulation layer sequence 160.

In particular both the abovementioned structural and lattice defects of the volume structure of the first encapsulation layer 161 and pores in the surface structure of the first encapsulation layer 161 can form undesirable permeation paths for moisture and/or oxygen, which can enable or at least facilitate diffusion through the first encapsulation layer.

The second encapsulation layer 162 can be suitable for enabling, in combination with the first encapsulation layer 161, the hermetically impermeable encapsulation of the organic light-emitting diode 1. For this purpose, the second encapsulation layer 162 can be suitable, in particular, for sealing the abovementioned permeation paths that can occur in the first encapsulation layer.

For this purpose, the second encapsulation layer 162 can be arranged directly on the first encapsulation layer 161 and in direct contact with the first encapsulation layer 161. That can mean that the second encapsulation layer 162 has a common interface with the first encapsulation layer 161, and furthermore an upper surface facing away from the common interface. The common interface is arranged, for example, at the top side 161a of the first encapsulation layer 161.

The second encapsulation layer 162 can be embodied in such a way that it can at least partly or approximately follow the surface structure of the first encapsulation layer 161, which can mean that, in particular, the top side of the second encapsulation layer 162 also at least partly or approximately follows the topographical structure of the interface.

The fact that the upper surface of the second encapsulation layer 162 at least partly follows the interface between the first 161 and second encapsulation layer 162 and hence the surface structure of the first encapsulation layer 161 can mean here and hereinafter that the upper surface of the second encapsulation layer 162 likewise has a topographical surface structure. In this case, the topographical surface structure at the top side 162a of the second encapsulation layer 162 can preferably be embodied identically or similarly to the topographical surface structure at the top side 161a of the first encapsulation layer 161. "Identically" or "similarly" can mean in connection with two or more topographical surface structures, in particular, that the two or more topographical surface structures have identical or similar height profiles with mutually corresponding structures, such as elevations and depressions, for instance. By way of example, the two or more topographical surface structures in this sense can each have elevations and depressions arranged laterally alongside one another in a specific characteristic sequence which, for example, apart from relative height differences between the elevations and depressions, are identical for the two or more topographical surface structures.

In other words, one surface which at least partly follows the topographical surface structure of another area can have an elevation, arranged above an elevation of the topographical surface structure of the other area, or a depression, arranged above a depression of the topographical surface structure of the other area. In this case, the relative height difference between adjacent elevations and depressions of said one surface can also be different than the relative height difference between the corresponding elevations and depressions of the topographical surface structure of the other area.

In other words, that can mean that the upper surface of the second encapsulation layer and the interface between the first and second encapsulation layers run parallel or at least approximately parallel. Thus, the second encapsulation layer can have a thickness which is independent or approximately independent of the surface structure of that surface of the first encapsulation layer which faces away from the component. "Approximately parallel", "approximately independent" and "approximately constant" can mean, with regard to the thickness of the second encapsulation layer, that the latter has a thickness variation of less than or equal to 10%, and particularly preferably of less than or equal to 5%, measured in relation to the total thickness of the second encapsulation layer. Such an embodiment of the second encapsulation layer with such a small thickness variation can also be designated as so-called "conformal coating".

Furthermore, the second encapsulation layer 162 can have a thickness d which is smaller than the dimensions of at least some structures and, in particular, the abovementioned macroscopic structures of the surface structure of the first encapsulation layer. In particular, the second encapsulation layer can also follow those microscopic structures of the surface structure of the first encapsulation layer whose dimensions are larger than the thickness of the second encapsulation layer.

The thickness of the second encapsulation layer 162 can furthermore be independent of a volume structure of the first encapsulation layer. That can mean that the first encapsulation layer has no thickness variation of greater than 10% and particularly preferably no thickness variation of greater than 5% even over the partial regions of the first encapsulation layer in which abovementioned lattice and/or structural defects 163 of the volume structure of the first encapsulation layer 161 are situated and which extend, in particular, as far as the common interface 161a with the second encapsulation layer 162.

Furthermore, the thickness d of the second encapsulation layer 162 can, in particular, also be independent of openings, elevations, depressions and pores in that surface of the first encapsulation layer which faces the second encapsulation layer. In the case where such surface structures are greater than the thickness d of the second encapsulation layer 162 with regard to their dimensions, they can be covered by the second encapsulation layer with uniform and, in the sense above, at least virtually identical thickness by virtue of the second encapsulation layer 162 following the surface structure. In the case where the surface structures are less than or equal to the thickness of the second encapsulation layer 162 with regard to their dimensions, the second encapsulation layer 162 can cover the structure structures without following the latter, and in this case, however, likewise have an, in the above sense, at least virtually constant thickness.

In particular, the second encapsulation layer 162 can seal openings and/or pores in the first encapsulation layer which have a depth-to-diameter ratio of greater than or equal to 10, and particularly preferably of greater than or equal to 30. The encapsulation layer sequence 160 can have the at least approximately identical thickness d of the second encapsulation layer 162, as described here, in particular also when the first encapsulation layer 161 has a surface structure having overhanging structures, in particular overhanging macroscopic structures, having negative angles.

Furthermore, the second encapsulation layer 162 can have a volume structure which is independent of the surface structure of the top side 161a of the first encapsulation layer 161 facing the second encapsulation layer 162. In addition, the second encapsulation layer 162 can have a volume structure which is independent of the volume structure of the first encapsulation layer 161. That can mean that surface- and/or volume-specific properties and features of the first encapsulation layer 161 such as, for instance, the abovementioned surface structures and/or lattice and/or structural defects in the volume structure of the first encapsulation layer 161 have no influence on the volume structure of the second encapsulation layer.

The second encapsulation layer 162 can comprise an oxide, a nitride and/or an oxynitride as described in connection with the first encapsulation layer. Particularly preferably, the second encapsulation layer can comprise aluminum oxide, for instance $Al_2O_3$, and/or tantalum oxide, for instance $Ta_2O_5$.

In particular, the second encapsulation layer 162 can have a volume structure having a higher amorphicity, that is to say irregularity in the sense of short-range and/or long-range order of the materials contained, than the first encapsulation layer. That can mean, in particular, that the second encapsulation layer has such a high amorphicity that no crystallinity or crystal structure can be ascertained. In this case, the second encapsulation layer 162 can be completely amorphous, such that the materials forming the second encapsulation layer 162 have no measurable short-range and/or long-range order, but rather have a purely statistical, irregular distribution.

As a reference for ascertaining the amorphicity of the second encapsulation layer 162 and also of the first encapsulation layer 161, in this case a shallow angle measurement in an X-ray diffractometer can be used, for example, in which no crystallinity in the form of a crystalline, partly crystalline and/or polycrystalline structure can be ascertained for the amorphous second encapsulation layer 162.

Although encapsulation layers having a crystalline, that is to say non-amorphous, volume structure often have a higher density than encapsulation layers having an amorphous volume structure, it was surprisingly ascertained in conjunction with the device comprising the encapsulation layer sequence 160, as described here, that the second encapsulation layer 162, if it has a high amorphicity, nevertheless enables, in combination with the first encapsulation layer 161, a hermetically impermeable encapsulation layer sequence 160. In particular, it can be advantageous in this case that the amorphous second encapsulation layer 162 does not continue structural and/or lattice defects 163 of the first encapsulation layer 161, such that, as a result, no continuous permeation paths for moisture and/or oxygen through the encapsulation arrangement can form either. Precisely through the combination of the first encapsulation layer 161 with the amorphous second encapsulation layer 162 it is possible to achieve an encapsulation layer sequence 160 which has a hermetic impermeability with respect to moisture and/or oxygen and at the same time a sufficiently large total thickness also to ensure a mechanical protection of the component.

The second encapsulation layer 162 can be producible on the first encapsulation layer 161 by a method in which the surface structure and/or the volume structure of the first encapsulation layer 161 have no influence on the volume structure of the second encapsulation layer 162 to be applied. The second encapsulation layer 162 can be producible, in particular, by means of a method such that the material or materials to be applied for the second encapsulation layer 162 can be applied without long-range order, that is to say with an irregular distribution for producing an amorphous volume structure. In this case, the second encapsulation layer 162 can be applied, for example, in the form of individual layers of the material or materials to be applied, so-called monolayers, wherein each of the monolayers follows the surface structure of the area to be coated. In this case, the constituents and materials of a monolayer can be distributed and applied in a statistically and distributed manner and independently of one another on the entire area to be coated, wherein, particularly preferably, the entire area is covered continuously with the monolayer. In this case, the area to be coated can be that surface of the first encapsulation layer 161 which faces away from the organic layer sequence 133 or a monolayer already applied on the first encapsulation layer 161.

A method which enables such individual layers to be applied can be designated as a variant of atomic layer deposition. Atomic layer deposition (ALD) can designate a method in which, in comparison with an above-described CVD method for producing an encapsulation layer 162 on a surface, firstly a first of at least two gaseous starting compounds is fed to a volume, in which the component is provided. The first starting compound can adsorb on the surface. For the encapsulation layer sequence 160 described here it can be advantageous if the first starting compound adsorbs irregularly and without a long-range order on the surface. After preferably complete or virtually complete covering of the surface with the first starting compound, a second of the at least two starting compounds can be fed in. The second starting compound can react with the first starting compound adsorbed at the surface as irregularly as possible but preferably with complete area coverage, as a result of which a monolayer of the second encapsulation layer 162 can be formed. As in the case of a CVD method, it can be advantageous if the at least one surface is heated to a temperature above room temperature. As a result, the reaction for forming a monolayer can be thermally initiated. In this case, the surface temperature, which, for example, can also be the component temperature, that is to say the temperature of the component, can depend on the starting materials, that is to say the first and second starting compounds. By repeating these method steps, a plurality of monolayers can successively be applied one on top of another. In this case, for the production of the encapsulation layer sequence 160 described here it is advantageous if the arrangements of the materials or starting compounds of the individual monolayers are independent of one another from monolayer to monolayer, such that an amorphous volume structure can form not only laterally along the extension plane of the surface to be coated, but also into the height.

The first and second starting compounds can be, for example, in connection with the materials mentioned further above for the second encapsulation layer, organometallic compounds such as, for instance, trimethyl metal compounds and also oxygen-containing compounds. In order to produce a second encapsulation layer comprising $Al_2O_3$, it is possible to provide, for example, trimethylaluminum and also water or $N_2O$ as starting compounds.

A plasmaless variant of atomic layer deposition ("plasmaless atomic layer deposition", PLALD) can in this case designate an ALD method for which no plasma is generated, as described below, but rather in which, in order to form the monolayers, the reaction of the abovementioned starting compounds is initiated only by means of the temperature of the surface to be coated.

The temperature of the at least one surface and/or of the component can be, for example, greater than or equal to 60° C. and less than or equal to 120° C. in the case of a PLALD method.

A plasma enhanced variant of atomic layer deposition ("plasma enhanced atomic layer deposition", PEALD) can designate an ALD method in which the second starting compound is fed in with simultaneous generation of a plasma, as a result of which, as in the case of PECVD methods, it can be possible for the second starting compound to be excited. As a result, in comparison with a plasmaless ALD method, the temperature to which the at least one surface is heated can be reduced and the reaction between starting compounds can nevertheless be initiated by the generation of plasma. In this case, the monolayers can be applied, for example, at a temperature of less than 120° C. and preferably less than or equal to 80° C. In order to produce further monolayers, the steps of feeding in the first starting compound and then feeding in the second starting compound can be repeated.

The degree of amorphicity of the second encapsulation layer 162 can be implemented by the choice of suitable starting compounds, temperatures, plasma conditions and/or gas pressures.

After application, the second encapsulation layer 162 can be applied in a thickness d of greater than or equal to 1 nm, particularly preferably of greater than or equal to 10 nm, and less than or equal to 30 nm. That can mean that the second encapsulation layer 162 has greater than or equal to 1 monolayer, particularly preferably greater than or equal to 10 monolayers, and less than or equal to 50 monolayers of the materials of the second encapsulation layer. By virtue of the high density and quality of the second encapsulation layer 162, such a thickness can be sufficient to ensure an effective protection against moisture and/or oxygen for the underlying component in combination with the first encapsulation layer 161. On account of the small thickness d of the second encapsulation layer 162, a short process time and hence a high economic viability of the encapsulation arrangement described here can be ensured. The encapsulation layer sequence 160 can, in particular, be arranged directly and immediately on an electrode 107, 101. That can mean that the first encapsulation layer 161 of the encapsulation layer sequence 160 is arranged directly and immediately for example on the second electrode 107.

Furthermore, the encapsulation layer sequence 160 can have a third encapsulation layer, which is arranged between the first encapsulation layer 161 and the organic layer sequence 133. In this case, the third encapsulation layer can comprise, in particular, an inorganic material as described in connection with the second encapsulation layer 162. Furthermore, the third encapsulation layer can be amorphous. Furthermore, the third encapsulation layer can have one or a plurality of further features as described in connection with the second encapsulation layer 162. Furthermore, the second and third encapsulation layers can be embodied identically.

The first encapsulation layer 161 can be arranged directly and immediately on the third encapsulation layer. Furthermore, the third encapsulation layer can be arranged directly on the component. In this case, the third encapsulation layer can enable, for the first encapsulation layer, a homogeneous application surface independently of the surface of the component.

Furthermore, the encapsulation layer sequence 160 can have a plurality of first 161 and a plurality of second encapsulation layers 162 which are arranged alternately one above another, wherein the encapsulation layer arranged the closest to the organic layer sequence 133 is a first encapsulation layer 161. The first 161 and second encapsulation layers 162 of the plurality of the first 161 and second encapsulation layers 162, respectively, can each be embodied identically or differently. In this case, here and hereinafter, a "plurality" can mean at least a number of two.

By means of such repetition of the encapsulation layer construction comprising the first and second encapsulation layers, the encapsulation of the organic light-emitting diode 1 can be improved. Furthermore, the mechanical robustness of the encapsulation layer sequence 160 can be increased. The optical properties of the encapsulation arrangement can be adapted through a suitable choice of the materials of the respective first and second encapsulation layers.

Figure 15:
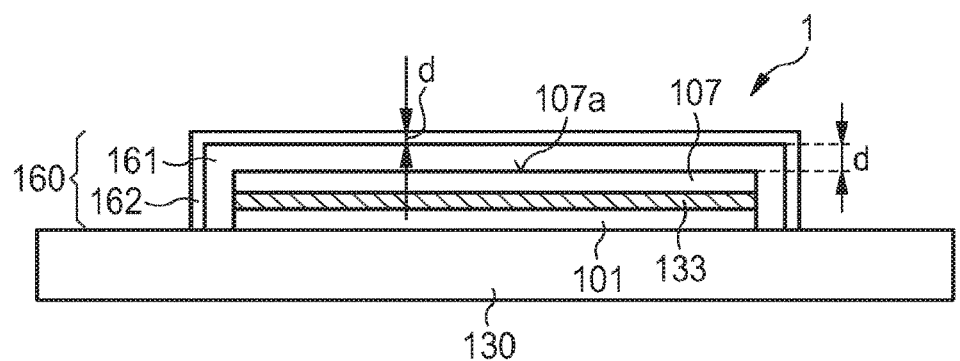
FIGS. 15 to 19 show, on the basis of schematic sectional illustrations, exemplary embodiments of organic light-emitting diodes which are sealed by means of an encapsulation layer sequence.

The following can also be explained in concrete terms with respect to the individual FIGS. 15 to 19:

A further exemplary embodiment of an organic light-emitting diode 1 described here is explained in greater detail in conjunction with FIG. 15, on the basis of a schematic sectional illustration. The organic light-emitting diode 1 comprises a first carrier 130. The first carrier can be formed from a radiation-transmissive material, such as a glass, for example, or a non-radiation-transmissive material, such as a metal or a ceramic material, for example. The functional layers 180, that is to say the first electrode 101, the organic layer sequence 133 and also the second electrode 107, are arranged on the first carrier 130. A first encapsulation layer 161, as has just been explained in greater detail, is applied to the side areas and also at the top side 107*a* of the second electrode 107. The exposed outer area of the first encapsulation layer 161 is completely covered by the second encapsulation layer 162, which is likewise constructed in the manner just explained. The first encapsulation layer 161 and the second encapsulation layer 162 form the encapsulation layer sequence 160.

Figure 16:
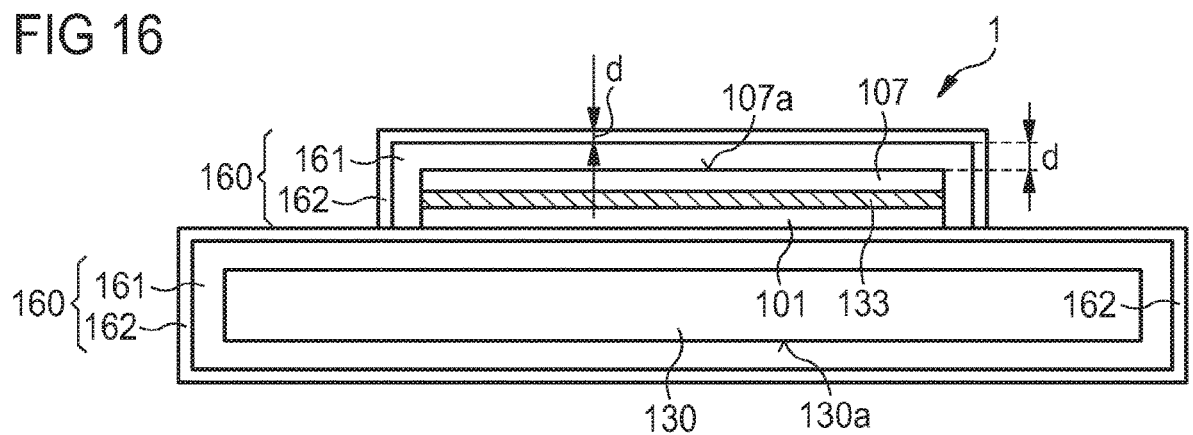

A further exemplary embodiment of an organic light-emitting diode 1 described here is explained in greater detail in conjunction with FIG. 16, on the basis of a schematic sectional illustration. In contrast to the exemplary embodiment described in conjunction with FIG. 15, the first carrier 130 in this exemplary embodiment is embodied as a flexible carrier. In this case, the flexible carrier is hermetically sealed all around by an encapsulation layer sequence 60 described above. As an alternative to the first carrier 130 being encapsulated all around, it is also possible for only the top side of the flexible carrier facing the organic layer sequence 133 to be provided with the encapsulation layer sequence 160. At all events, a carrier which is flexible and at the same time sealed hermetically impermeably against external influences such as moisture and atmospheric gases is realized in this way. The first carrier 130 can, in this way, be formed for example by an inherently gas- and/or moisture-permeable plastic film which can hermetically terminate the organic light-emitting diode 1 on account of the encapsulation with the encapsulation layer sequence 160.

Figure 17:
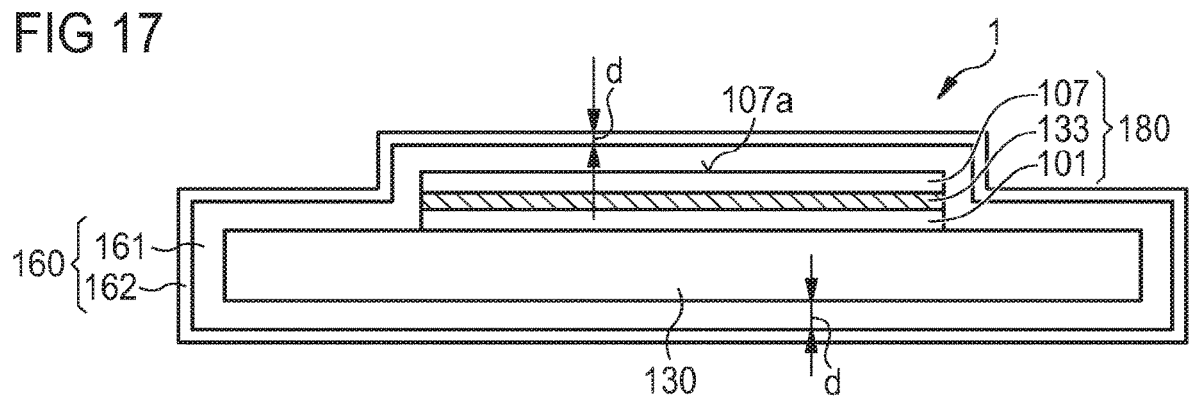

A further exemplary embodiment of an organic light-emitting diode 1 described here is explained in greater detail in conjunction with FIG. 17, on the basis of a schematic sectional illustration. In this exemplary embodiment, the first carrier 130 and the functional layers 180 arranged on the first carrier 130 are enclosed jointly, all around by the encapsulation layer sequence 160. Such an embodiment is particularly well suited to the formation of a flexible organic light-emitting diode 1. In this case, the first carrier 130 can be configured in flexible fashion, for example as a film. The functional layers 180 are encapsulated jointly with the first carrier 130, thus resulting in a certain flexibility for the entire organic light-emitting diode. That is to say that the organic light-emitting diode is pliable and suitable for withstanding a multiplicity of bending cycles without being damaged.

Figure 18:
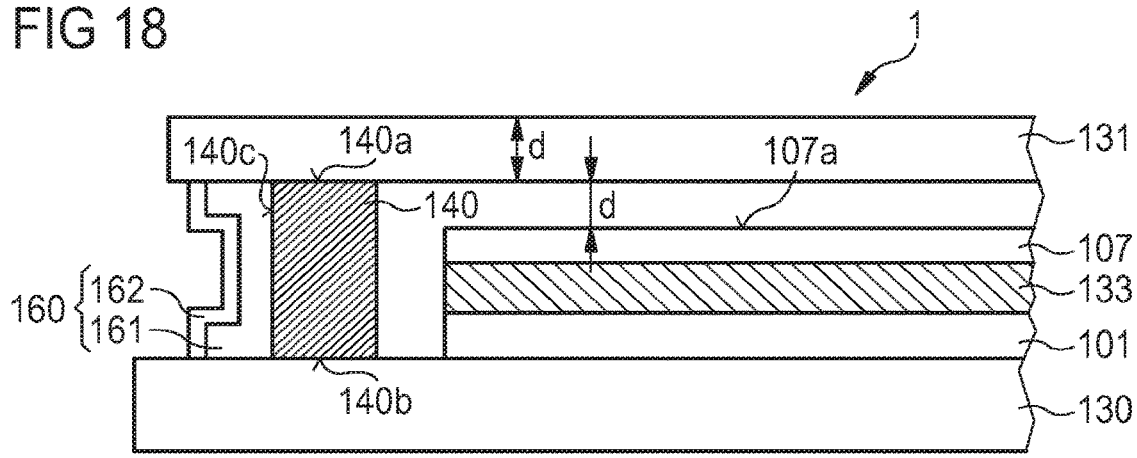

A further exemplary embodiment of an organic light-emitting diode described here is explained in greater detail in conjunction with FIG. 18. In this exemplary embodiment, the organic light-emitting diode comprises two carriers 130, 131. Both carriers 130, 131 can be embodied as rigid carriers. By way of example, the carriers 130, 131 are each formed with a glass or consist of a glass. The carriers 130, 131 are connected to one another by a connecting means 140 such as is described further above with FIG. 7 or 8, for example. The connecting means 140 is, for example, a glass solder or a glass frit material. The connecting means 140 adjoins the second carrier 131 and the first carrier 130 at least in places at its top side 140*a* and its underside 140*b*, respectively. The side areas 140*c* of the connecting means 140 are sealed with the encapsulation layer sequence 160. In this case, the encapsulation layer sequence 160 can also extend over the side areas of first carrier 130 and second carrier 131 (not illustrated).

FIG. 18 represents a general example of the fact that the sealing and encapsulation techniques described here can be combined with one another. Thus, the encapsulation layer sequence 160 described in conjunction with FIGS. 15 to 19 can also be combined in combination with the connecting means 140 described here, the diffusion barrier 153, the thin-film encapsulation 154, the pre-encapsulation layer 156 and/or the resist layer 150. Depending on the requirements made of the organic light-emitting diode 1, therefore, it is possible to choose an encapsulation which enables a longest possible lifetime of the organic light-emitting diode 1 in the respective environment in which the organic light-emitting diode 1 is intended to be used.

In conjunction with FIG. 19, the encapsulation layer sequence 160 having the first encapsulation layer 161 and the second encapsulation layer 162 is illustrated in an enlarged fashion. As can be seen from FIG. 19, the top side 161*a* of the first encapsulation layer, on which the second encapsulation layer 162 is applied, has a surface structure in the form of a roughness brought about, for example, by the application method by which the first encapsulation layer 161 is produced. Furthermore, the volume structure of the first encapsulation layer 161 has structural or lattice defects 163, such as pores or dislocations, for instance, which are indicated merely schematically and purely by way of example. In this case, the structural and lattice defects 163 can extend—as shown—as far as the top side 161*a* of the first encapsulation layer 161, that is to say as far as the interface between the first 161 and the second encapsulation layer 162. The second encapsulation layer 162 is embodied in such a way that structural and lattice defects 163 of this type have no influence on the volume structure of the second encapsulation layer 162. The second encapsulation layer 162 is therefore embodied with a uniformly amorphous volume structure and covers the first encapsulation layer 161 over the whole area, as a result of which possible permeation paths for moisture and/or atmospheric gases which are formed by lattice and structural defects 163 of the volume structure of the first encapsulation layer 161 are also sealed. As a result, a hermetic encapsulation of the organic light-emitting diode 1, in particular against moisture and/or oxygen, can be made possible by means of the encapsulation layer sequence 160 and, in particular, by means of the combination of the first 161 and the second encapsulation layer 162.

In particular the encapsulation techniques described in conjunction with FIGS. 10 to 19 and combinations of these encapsulation techniques are particularly well suited to the formation of a flexible organic light-emitting diode. A flexible organic light-emitting diode 1 is distinguished, inter alia, by the fact that it is pliable to a certain degree, without being damaged in the process. Preferably, the organic light-emitting diode 1 embodied in a flexible fashion is repeatedly pliable without being damaged in the process. The organic light-emitting diode 1 is then suitable, therefore, for withstanding a plurality of bending cycles without being damaged. Particularly preferably, the organic light-emitting diode 1 can be embodied, for example, flexibly such that it can be wound up onto a roll and can be unwound from the roll, without being damaged in the process.

In particular the encapsulation layer sequence 160 described here enables such a flexible organic light-emitting diode 1. In order to form a flexible organic light-emitting diode 1, the encapsulation of the organic light-emitting diode is also embodied in a flexible fashion. In this case, flexible means, inter alia, that the encapsulation is pliable to a certain degree, without the encapsulation being damaged in the course of bending.

Furthermore, in the case of a flexible organic light-emitting diode 1, the first 130 and the second carrier 131 are also embodied in a flexible fashion. By way of example, the carriers 130, 131 are a thin glass layer, a laminate or a film. By way of example, the flexible carrier 130, 131 can be a plastic-glass-plastic laminate or a plastic-metal-plastic laminate.

Figure 20:
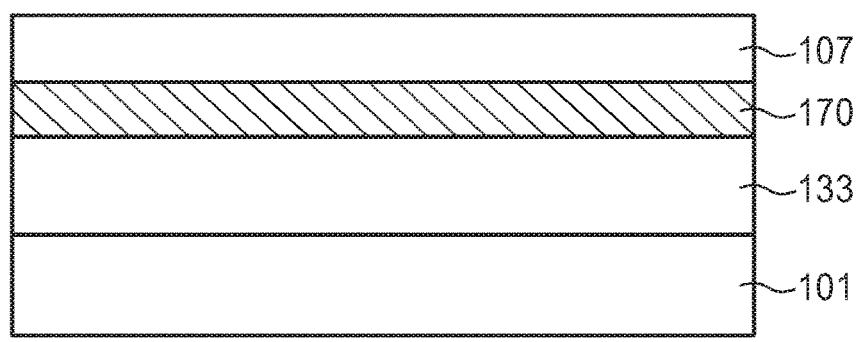
FIG. 20 shows, on the basis of a schematic sectional illustration, one exemplary embodiment of an organic light-emitting diode with a sputtering protective layer.

A further exemplary embodiment of an organic light-emitting diode 1 described here is explained in greater detail in conjunction with FIG. 20. In this case, the organic light-emitting diode comprises at least a first electrode 101, an organic encapsulation layer sequence 133 and a second electrode 107. A sputtering protective layer 170 is applied between the organic layer sequence 133 and the second electrode 107. The sputtering protective layer 170 is an electrically conductive, inorganic protective layer.

The organic layer sequence 133 is protected against impairment and/or damage, in particular during the production of the organic light-emitting diode 1, by means of the electrically conductive, inorganic sputtering protective layer 170. Such impairment or damage can occur, for instance, during the production of the organic light-emitting diode 1. Such impairment or damage of the organic layer sequence 133 can then result in a shorter lifetime of the organic light-emitting diode 1 or in a lower luminance of the electromagnetic radiation generated by the organic light-emitting diode 1.

By way of example, the second electrode 107 is deposited onto the organic layer sequence 133 by means of a high-energy process, such as sputtering. Such a high-energy process can lead, in the absence of the sputtering protective layer 170, to damage to the organic layer sequence 133 as a result of the bombardment of the organic layer sequence 133 with gas ions and/or the material to be applied by sputtering. By means of the high-energy process, by way of example, a second electrode 107 consisting of a TCO material or a metal can be applied to the organic layer sequence 133.

The sputtering protective layer 170 can comprise for example a transition metal oxide, which can comprise for example tungsten oxide, vanadium oxide, molybdenum oxide, rhenium oxide, nickel oxide or combinations or mixtures thereof or consists of these materials. Furthermore, the sputtering protective layer 170 can also comprise metals, such as magnesium or silver, for instance.

In the exemplary embodiment in accordance with FIG. 20, the sputtering protective layer 170 contains or consists of a transition metal oxide, such as $WO_3$, $V_2O_5$, $MoO_3$, $Re_2O_7$ or NiO. The second electrode 107 is applied above the sputtering protective layer 170. The second electrode 107 is applied directly to the sputtering protective layer 170 for example by means of a high-energy deposition process, such as sputtering.

The possibilities for encapsulation, sealing and for protection of the organic layer sequence 133 against damage and external influences, as described in conjunction with FIGS. 7 to 20, can be used for all of the organic light-emitting diodes and luminaires described here. In particular, any combination of the organic light-emitting diodes 1 described in conjunction with FIGS. 1 to 6 can be combined by means of one or a combination of the organic light-emitting diodes 1 described in conjunction with FIGS. 7 to 20. In this way, it is possible to produce, for example, organic light-emitting diodes 1 which emit white light, are transparent, emit on both sides and are protected against external influences particularly well by means of diffusion barriers, thin-film encapsulations, encapsulation layer sequences, and/or connecting means. Combinations of the protection methods for organic light-emitting diodes 1, as described in conjunction with FIGS. 7 to 20, can result for example in a organic light-emitting diode 1 which has an organic layer sequence 133 hermetically sealed by means of an encapsulation layer sequence 160, wherein the organic layer sequence 133 encapsulated in this way is arranged between a first carrier 130 and a second carrier 131. In this case, first carrier 130 and second carrier 131 can be connected to one another by means of a connecting means 140, such as a glass solder, for example. The organic light-emitting diode 1 is then distinguished by a particularly good encapsulation which allows the organic light-emitting diode to be used, for example, in particularly moist rooms, such as a bathroom. Such an organic light-emitting diode 1 can then even be used in the vicinity of or in sanitary installations such as a bath tub or a shower.

In the case of the exemplary embodiments described in conjunction with FIGS. 1 to 20, the radiation exit areas of the organic light-emitting diode 1 are in each case embodied in flat fashion. Such organic light-emitting diodes 1 generally have a Lambertian emission characteristic. In conjunction with FIGS. 21 to 25, exemplary embodiments of organic light-emitting diodes 1 described here will now be described in greater detail, wherein the organic light-emitting diode 1 has a directional emission profile.

In conjunction with FIG. 21, a first exemplary embodiment of an organic light-emitting diode 1 having a directional emission profile as described here is explained in greater detail on the basis of a schematic perspective illustration. The organic light-emitting diode 1 comprises functional layers 180 having, for example, a first electrode 101, a second electrode 107 and an organic layer sequence 133 arranged between first electrode 101 and second electrode 107.

The organic light-emitting diode 1 furthermore has a second carrier 131. The second carrier 131 comprises a structured radiation exit area 175. The structured radiation exit area 175 has a multiplicity of first areas 175a and second areas 175b. The first areas 175a are inclined by an angle α relative to a plane running, for example, parallel to the main extension plane (xy plane) of the organic layer sequence 133. The second areas 175b are inclined by an angle β relative to said plane.

The emission of electromagnetic radiation generated in the organic layer sequence 133 is effected through the second carrier 131 and the radiation passage area 175. In this case, the structured radiation exit area 175 can be applied in the form of a separate layer onto the top side of the second carrier 131 facing away from the organic layer sequence 133. Furthermore, it is possible for the structured radiation exit area 175 to be formed by a structuring of the second carrier 131. Furthermore, it is possible that, instead of the second carrier 131, for example, an encapsulation layer sequence 160 such as is described in greater detail in conjunction with FIGS. 15 to 19 is arranged on the second electrode 107. In this case, for example, the second encapsulation layer 162 can be embodied as a structured radiation exit area. In this case, the second encapsulation layer can be arranged directly on the first encapsulation layer 161. This is indicated by the dashed line in FIG. 21.

In the exemplary embodiment in FIG. 21, the structured radiation exit area 175 is structured into a multiplicity of prisms arranged parallel to one another, wherein the first areas 175a and the second areas 175b form the top area of the organic light-emitting diode 1 facing away from the organic layer sequence 133. For reasons of clarity, in each case only two of the multiplicity of first areas 175a and second areas 175b are illustrated in FIG. 21.

Neither the first areas 175a nor the second areas 175b are arranged parallel to the organic layer sequence 133. Consequently, these areas are also not arranged parallel to the plane (xy plane) in which the organic light-emitting diode 1—that is to say for example the organic layer sequence—is embodied in planar fashion.

In this case, the extent of the prisms in the y direction is preferably of macroscopic orders of magnitude, that is to say for example in the range of millimeters to decimeters. For example, the extent of the prisms in the y direction can extend over the entire length of the organic light-emitting diode 1. The width of the prisms in the x direction is preferably greater than the wavelength of the light generated by the organic light-emitting diode 1, such that diffraction effects at the prisms hardly or do not take place. The width of the prisms is preferably of microscopic orders of magnitude, for example in the submillimeters range, such that a structuring in the x direction of the radiation exit area 175 is not visible to the human observer. The width b of a prism can be 500 μm or less, preferably 250 μm or less. The length l of a prism can be 1 cm or more, preferably 5 cm or more.

The first areas 175a of the structured radiation exit area 175 are embodied as transparent or at least radiation-transmissive, whereas the second areas 176 are reflective to the electromagnetic radiation generated in the organic light-emitting diode. The second areas 175b can be made reflective at a shallow angle of incidence for example by vapor deposition with metal particles.

In this way, in the exemplary embodiment of FIG. 21, only the first areas 175a constitute radiation exit areas of the organic light-emitting diode 1. That is to say that electromagnetic radiation can leave the organic light-emitting diode 1 only through the first areas 175a. In this way, the organic light-emitting diode 1 has an emission profile which has a main emission direction inclined relative to the z axis in the direction of the x axis. In this case, the inclination angle of the main emission direction of the organic light-emitting diode 1 is substantially determined by the angle α.

Electromagnetic radiation which is generated by the organic layer sequence 133 and which is reflected at the second areas 175b can likewise emerge from the light-emitting device through the radiation-transmissive first areas 175a after one or more internal reflections. Alternatively, it is possible for the organic light-emitting diode 1 to be an organic light-emitting diode 1 which emits on both sides and in which the organic layer sequence 133 and also the electrodes 101, 107 are embodied in radiation-transmissive fashion. In this way, reflected radiation can emerge from the organic light-emitting diode 1 for example on the opposite side of the radiation exit area 175 illustrated. In this case, the opposite radiation exit area can also be structured in the manner described, thus resulting in an organic light-emitting diode 1 which emits electromagnetic radiation directionally on both sides.

The angles α and β at which the first 175a and second areas 175b are arranged influence the angular distribution of the emitted electromagnetic radiation and the frequency of the internal reflections.

The structured radiation exit area 175 can be, for example, a separate, correspondingly structured film applied to the second carrier 131. Furthermore, it is possible—as already discussed above—for the structured radiation exit area 175 to be structured directly into the second carrier 131 or to be formed by part of an encapsulation layer sequence 160.

Different emission profiles (angle-dependent distribution of the emitted intensity) of organic light-emitting diodes 1 having a structured radiation exit area 175 are illustrated in conjunction with FIG. 22. Firstly, the underlying coordinate system is illustrated in FIG. 22a. The organic light-emitting diode 1 forms, with its lateral organic layer sequence 133 embodied in planar fashion, the xy plane of the coordinate system. In the case of a non-structured radiation exit area 175, a Lambertian emission profile in the direction of the z axis generally arises for the organic light-emitting diode 1. Directional emission profiles can then be achieved by means of the structuring of the radiation exit area 175.

By way of example, in conjunction with FIGS. 22b and 22c, a type A-1 and type A-2 emission profile, respectively, is shown, which is distinguished by a symmetrical, cardioid radiation direction distribution having two maxima both in the x direction and in the y direction (type A-1) or in one of the two directions (type A-2). Such emission patterns are particularly well suited for example to general lighting in rooms.

The emission profile shown in FIG. 22d, called type B, is greatly asymmetrical in at least one of the directions x and y and is particularly well suited for example to directional lighting. By way of example, such an emission profile can be used for desk lighting in which a work area is illuminated in a directional fashion without dazzling the user. Such an emission profile can be achieved with the exemplary embodiment of an organic light-emitting diode 1 described here as described in conjunction with FIG. 21.

Figure 23:
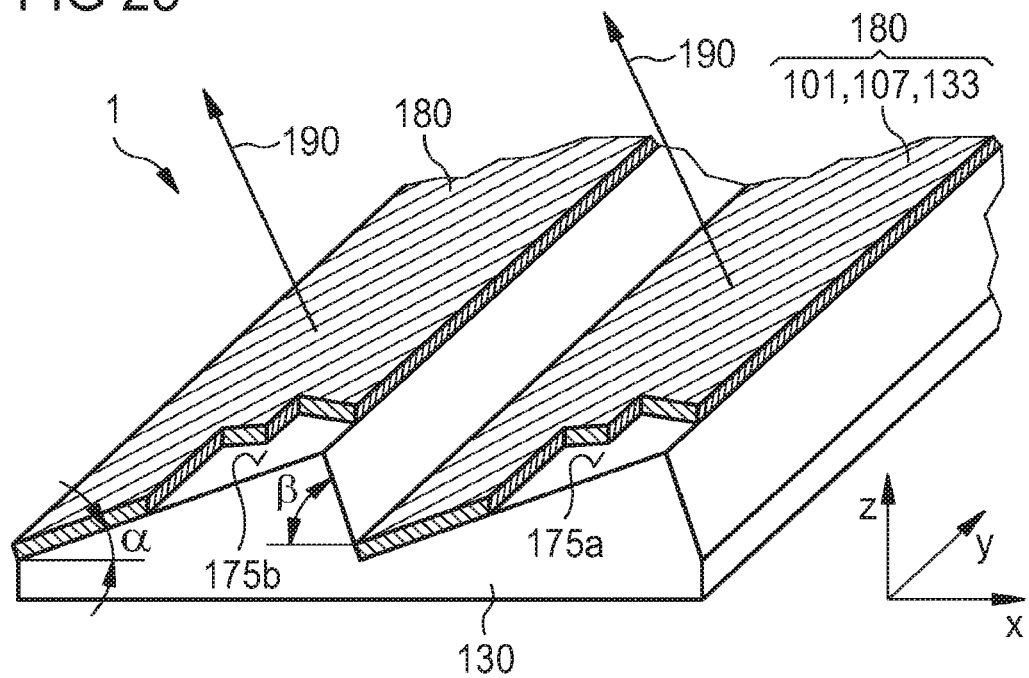

In conjunction with FIG. 23, a further exemplary embodiment of an organic light-emitting diode 1 described here is explained in greater detail on the basis of a perspective schematic illustration.

In this exemplary embodiment, the top side of the first carrier 130 facing the functional layers 180 is structured into parallel prisms having first areas 175a and second areas 175b. The lateral, planar extent of the organic light-emitting diode 1 and thus of the first carrier 130 lies in the xy plane. Relative to this xy plane, the first areas 175a are inclined by the angle α and the second areas 175b by the angle (3. The functional layers 180 are applied to the first areas 175a. The second areas 175b are free of functional layers. In this case, the first carrier 130 can be formed for example with a metal, with a glass, with a ceramic material or with a plastic material. In this case, the first carrier can, in particular, also be embodied in flexible fashion and is formed by a film or a laminate.

An encapsulation and hermetic sealing of the organic light-emitting diode 1 described in conjunction with FIG. 23 can be effected for example by means of an encapsulation layer sequence 160 or by other encapsulation methods described in conjunction with FIGS. 7 to 19.

Advantageously and in contrast to the exemplary embodiment illustrated in conjunction with FIG. 21, the functional layers 180 in the exemplary embodiment in FIG. 23 can be separately drivable. In this way, the brightness of the light generated by the organic light-emitting diode 1 can be regulated particularly well by more or fewer of the functional layers 180 being energized—depending on the desired brightness. Furthermore, it is possible for the functional layers 180 to differ particularly with regard to the construction of the organic layer sequence 133, such that different functional layers can emit electromagnetic radiation having different wavelengths.

Figure 24:
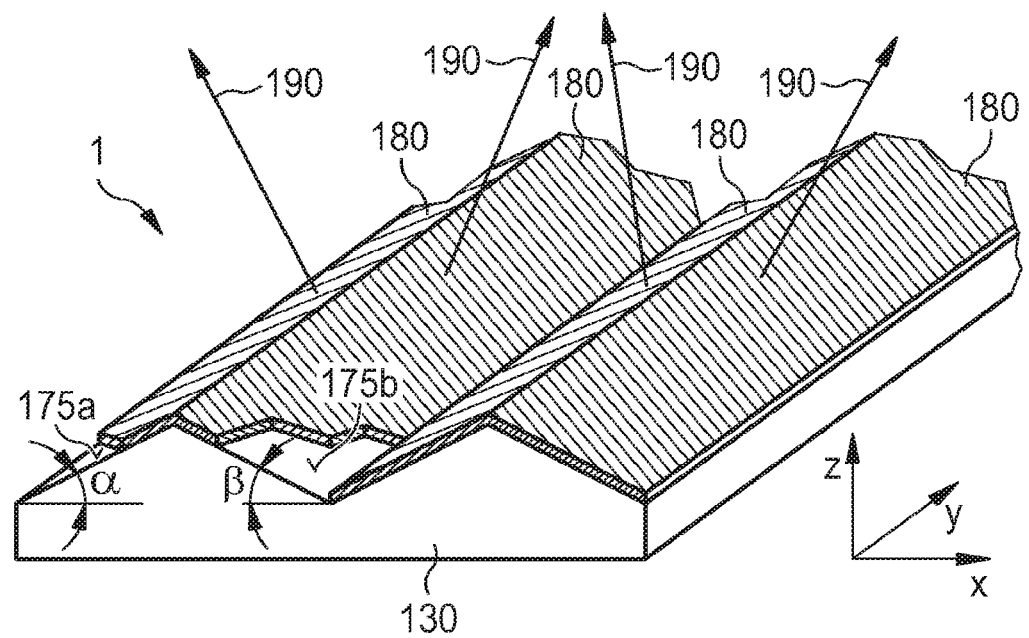

In conjunction with FIG. 24, a further exemplary embodiment of an organic light-emitting diode 1 described here is explained in greater detail on the basis of a schematic perspective illustration. In this exemplary embodiment, the first carrier 130 is structured into a multiplicity of parallel prisms. In contrast to the exemplary embodiment in FIG. 23, not only the first areas 175a are covered with functional layers 180, but also the second areas 175b are covered with functional layers 180.

In the case of the exemplary embodiment in FIG. 24, the structured radiation exit area 175 is structured in the form of prisms having the cross section of an isosceles triangle. The arrangement shown results in a symmetrical emission characteristic of the type A-2, with two main radiation directions which are inclined from the z axis by the angle $\alpha=\beta$ in positive and negative x directions. In the y direction, to a first approximation a Lambertian emission profile arises given a sufficient extent of the organic light-emitting diode 1. If the angles $\alpha$ and $\beta$ are chosen not to be identical, the two main radiation directions are inclined from the z axis by different angles. At the same time, the intensity with which emission is effected in the main emission direction differs on account of the resultant areas of the functional layers 180 having different magnitudes.

Further possibilities for the structuring of the first carrier 130 or generally for the structuring of the radiation exit area 175 are described in conjunction with FIGS. 25a, b, c on the basis of schematic sectional illustrations. In the exemplary embodiment described in conjunction with FIG. 25a, the angles $\alpha$ and $\beta$ are chosen to have different magnitudes. This results in a distribution of the type A-2 with different intensities in both main emission directions. For an organic light-emitting diode 1 which emits on both sides, for example, the underside of the first carrier 130 can also be correspondingly structured, as is indicated by the dashed line in FIG. 25a.

With reference to FIGS. 25b and 25c it is clarified that the structuring of the radiation exit area 175 need not necessarily be effected by the formation of plane areas 175a, 175b arranged at specific angles with respect to one another, rather that a structuring can be effected in any desired way, for example in the manner of cylinder sections and the like.

Overall, with reference to FIGS. 21 to 25 it is clarified that an organic light-emitting diode 1 having a directional emission characteristic can be specified by means of the structuring of carriers, encapsulation layers and/or functional layers. In this case, the beam directing can be effected for example by reflection, refraction and/or corresponding orientation of the functional layers 180.

Corresponding structurings can be used for all of the encapsulation and sealing techniques described in conjunction with FIGS. 7 to 20. Furthermore, it is possible to use all of the radiation-emitting layer sequences described in conjunction with FIGS. 1 to 6 for organic light-emitting diodes 1 having a directional emission characteristic. Any desired combinations of the organic light-emitting diodes 1 described in conjunction with FIGS. 1 to 25 are also possible.

A further exemplary embodiment of an organic light-emitting diode 1 described here is explained in greater detail in conjunction with the schematic sectional illustrations in FIGS. 26A and 26B. The organic light-emitting diode 1 described in conjunction with FIGS. 26A and 26B is particularly well suited to the illumination of an area 185a to be illuminated of an element 185 to be illuminated.

The area 185a to be illuminated of the element 185 is, for example, part of an outer area of the element 185 to be illuminated.

By way of example, the element 185 to be illuminated can be a tile, a poster, a slab, a traffic sign, an information board, a sign, an image or any other element. The element 185 to be illuminated can also be a mirror, for example, which has a reflective mirror area as area 185a to be illuminated.

The organic light-emitting diode 1 is applied at least indirectly to the element 185 to be illuminated. The organic light-emitting diode 1 can be fixed for example directly on the element 185 to be illuminated. By way of example, the organic light-emitting diode 1 can be adhesively bonded by means of a transparent adhesive onto the element 185 to be illuminated. Other fixing methods such as hook and loop fasteners, screw connections, clamping connections, press-fit connections or the like are also possible.

The organic light-emitting diode 1 is a radiation-transmissive, preferably a transparent organic light-emitting diode 1 such as is described here.

In the exemplary embodiment in FIGS. 26A and 26B, the organic light-emitting diode 1 comprises a first carrier 130 and a second carrier 131. The functional layers 180, that is to say for example the first electrode 101, the second electrode 107 and also the organical layer sequence 133, are arranged between first carrier 130 and second carrier 131. In this case, the organic light-emitting diode 1 can be encapsulated as described here. That is to say that the organic light-emitting diode 1 need not have two carriers 130, 131, rather it can, for example, also be encapsulated by means of a diffusion barrier 153, a thin-film encapsulation 154, a pre-encapsulation layer 156 and/or an encapsulation layer sequence 160. In this case, it is also possible, in particular, for the organic light-emitting diode 1 with the encapsulation layer sequence 160 to be applied, for example adhesively bonded, onto the area 185a to be illuminated of the element 185 to be illuminated. Furthermore, it may be advantageous if the organic light-emitting diode 1 is embodied in flexible fashion. It can then be adapted particularly well to the course of the area 185a to be illuminated.

FIG. 26a shows the organic light-emitting diode 1 in a switched-off operating state. That is to say that no electromagnetic radiation is generated in the radiation-emitting region 104 of the organic light-emitting diode 1. Electromagnetic radiation 190 impinging from outside on the area 185a to be illuminated can penetrate through the transparent organic light-emitting diode 1 and is reflected from the area 185a to be illuminated. In this way, an observer sees only the area 185a to be illuminated, for example an image, a traffic sign, an information board, a mirror or the like.

FIG. 26b illustrates the organic light-emitting diode 1 schematically in a switched-on operating state. In this switched-on operating state, the radiation-emitting region 104 of the organic light-emitting diode 1 emits electromagnetic radiation 191, which impinges on the area 185a to be illuminated and is at least partly reflected there. Furthermore, electromagnetic radiation 193 can also emerge directly from the organic light-emitting diode 1, without impinging beforehand on the area 185a to be illuminated. The relative ratio of the intensities of indirectly emerging electromagnetic radiation 192 and directly emerging electromagnetic radiation 193 can be adjustable and selectable for example by means of an optical cavity or else by means of first electrodes 101 and second electrodes 107 having different degrees of transparency.

In this case, an "optical cavity" can mean, here and hereinafter, in particular, that the organic light-emitting diode 1 forms an optical resonator in which electromagnetic radiation having one or more specific wavelengths and/or one or more specific emission directions can preferably be generated, which can also be designated as resonances or modes. For this purpose, by way of example, the first electrode 101, the organic layer sequence 133 and the second electrode 107 can be embodied as an optical cavity. That can mean that the at least partly transparent first electrode 101 and the at least partly transparent second electrode 107 additionally also have a reflectivity for the electromagnetic radiation generated in the radiation-emitting region 104. Alternatively or additionally, the first electrode 101, the organic layer sequence 133 and the second electrode 107 can be arranged between partly reflective layers, which additionally are also partly transparent. The following description of the optical cavity is explained purely by way of example for partly reflective electrodes 101, 107.

The first electrode 101 and/or the second electrode 107 can have a reflectance R and/or R', respectively, and the organical layer sequence 133 can have a refractive index n for the electromagnetic radiation generated in the radiation-emitting region 104. Since the first 101 and second electrode 107 are partly transparent, R<1 and R'<1 hold true in this case. The refractive index n can be constant over the organic layer sequence 133 or can be constant at least in partial regions, for example in different organic layers. Furthermore, the refractive index n can also vary over the organic layer sequence 133. The radiation-emitting region 104 of the organic layer sequence can have a thickness d and can be arranged in a manner spaced apart with an average distance L from the first electrode 101 and with an average distance L' from the second electrode 107. In this case, the average distance L and the average distance L' designate the distances from the first electrode 101 and from the second electrode 107, respectively, which are averaged over the thickness d of the radiation-emitting region 104. In this case, the parameters R, R', n, d, L and L' can be chosen in such a way that the organic layer sequence has a specific emission characteristic.

By way of example, the reflectances R and R' of the first and second electrodes and the refractive index n of the organic layer sequence 133 can be predetermined on account of the respective choice of material, such that the desired emission characteristic can be made possible by the choice of the average distances L and L' and the thickness d of the radiation-emitting region 104. As an alternative thereto, the dimensions of the organic layer sequence 133 and of the radiation-emitting region 104, that is to say the average distances L and L' and the thickness d can be predetermined, for example by the construction or the method for production of the organic light-emitting diode 1. In this case, the desired emission characteristic can be made possible by the choice of the material for the first 101 and second electrode 107 by way of the reflectance R and R' thereof.

By way of example, the average distances L and L' can be of the order of magnitude of the wavelength of the electromagnetic radiation generated in the radiation-emitting region 104, or smaller. If the electromagnetic radiation has a spectral distribution of a plurality of wavelengths and/or wavelength ranges, the electromagnetic radiation can in this case also be characterized by an average wavelength and the dimensions of the organic layer sequence 133, here and hereinafter, can be related to the average wavelength of the electromagnetic radiation.

Furthermore, the average distances L, L' can also be less than or equal to half the wavelength of the electromagnetic radiation, or less than or equal to a quarter of the wavelength of the electromagnetic radiation, or even less than or equal to an eighth of the wavelength of the electromagnetic radiation. Furthermore or additionally, the average distances L and L' can be greater than or equal to $\frac{1}{20}$ of the wavelength of the electromagnetic radiation or else greater than or equal to $\frac{1}{10}$.

Such average distances L and L' can bring about, in conjunction with the partly reflective first 101 and second electrode 107, the formation of an at least semilaterally reflective cavity in the radiation-emitting layer sequence. In this case, a photon or wave packet emitted by an excited state (exciton) in the radiation-emitting region 104 can be reflected at the first electrode 101 and at the second electrode 107. By virtue of the fact that the average distances L and L' can be of the order of magnitude of the wavelength of the electromagnetic radiation or smaller, when expressed in a simplified way, a feedback of the emitted wave packet with the excited state can still be possible during the emission of the wave packet, such that the excited state, during the emission of the wave packet, can be influenced by the electromagnetic field of its "own" reflected wave packet. Depending on the phase angle of the reflected wave packet, an amplification or attenuation of the emission of the excited state can thus be made possible. In this case, the phase angle can be dependent on the refractive index n of the organic layer sequence 133, the reflectivities R, R' of the first 101 and second electrode 107 in conjunction with the penetration depth of the electromagnetic radiation into the first 101 and second electrode 107, and also on the distances between the excited state and the first 101 and second electrode 107 in conjunction with the emission direction of the wave packet. As a result, a mode structure which can foster and/or bring about an emission of the electromagnetic radiation in specific directions can be formed in the organic layer sequence. Furthermore, the thickness d of the radiation-emitting region 104 can also influence the formation of emission modes.

The organic light-emitting diode 1 can have an emission characteristic of the electromagnetic radiation generated in the radiation-emitting region 104, such that the electromagnetic radiation is emitted with a first intensity in the direction of the element 185 to be illuminated and is emitted with a second intensity in the direction of the radiation exit area 174. In this case, the first intensity and the second intensity can be defined at outer areas of the organic light-emitting diode 1, that is to say, for example, at surfaces of the first 101 or second electrode 107, of a carrier 130, 133, or of an encapsulation layer sequence 160, which face away from the organic layer sequence 133. "Intensity in the direction" of the element 185 to be illuminated and of the radiation exit area 174 can respectively denote, for the first and second intensities, the respective total intensity into the half-spaces on that side of the organic light-emitting diode 1 which faces and respectively faces away from the element 185 to be illuminated.

In this case, the electromagnetic radiation having the first intensity, which is emitted from the organic light-emitting diode 1 in the direction of the element 185 to be illuminated, can illuminate the at least partly non-transparent area 185a to be illuminated. By virtue of the fact that the area 185a to be illuminated is at least partly non-transparent, at least part of the electromagnetic radiation having the first intensity can be reflected in the direction of the radiation exit area 174 and be perceptible by an external observer through the radiation exit area 174. In other words, that can mean that, for an external observer, the area 185a to be illuminated of the carrier element can be illuminated and thus perceptible in a switched-on operating state of the organic light-emitting diode 1. This can be the case, in particular, if the first intensity is greater than the second intensity.

In this case, such an emission characteristic can be made possible, for example, by the optical cavity as described above.

Alternatively or additionally, the first 101 and second electrode 107 can have mutually different transmissivities. If, for instance, the first electrode 101 is arranged on that side of the organic layer sequence 133 which faces the element 185 to be illuminated, and has a greater transmissivity than the second electrode 107, it can be possible that the electromagnetic radiation generated in the radiation-emitting region 104 is emitted with a first intensity in the direction of the element 185 to be illuminated, said first intensity being greater than the second intensity.

As an alternative thereto, the second intensity can be greater than the first intensity. Such an emission characteristic can be made possible, in turn, by means of an optical cavity, for example. Alternatively or additionally, by way of example, the second electrode 107 can be arranged on that side of the organic layer sequence 133 which faces away from the element 185 to be illuminated, and can have a greater transmissivity than the first electrode 101. In this case, it can be possible that the area 185a to be illuminated is perceptible less clearly in comparison with the switched-off operating state of the organic light-emitting diode 1 since an external observer can perceive the reflected electromagnetic radiation having the first intensity and the electromagnetic radiation having the second intensity that is emitted directly via the radiation exit area of the radiation-emitting arrangement, as a superimposition. Furthermore, in the switched-on operating state, the area 185a to be illuminated can be no longer perceptible at all if the electromagnetic radiation having the first intensity that is reflected at the at least partly non-transparent main surface is outshone in the above sense by the electromagnetic radiation having the second intensity.

Thus, the organic light-emitting diode 1 and the radiation exit area 174 can appear transparent in the switched-off operating state and can appear non-transparent or likewise at least transparent in the switched-on operating state, depending on the ratio of the first intensity to the second intensity.

The organic light-emitting diode 1 can be embodied such that it is structured for example in such a way that, in the switched-on operating state, the area 185a to be illuminated is perceptible through first regions of the radiation exit area 174 and not through second regions. In this case, the organic light-emitting diode 1 can, for example, emit electromagnetic radiation only in partial regions or else emit electromagnetic radiation over a large area. As a result of such segmented illumination and/or segmented emission of the electromagnetic radiation in the direction of an external observer, it can be possible that, for example, different illumination patterns can be generated or indications or information can be inserted temporarily. In the switched-off operating state, these patterns, indications and/or information are not visible and do not impair the appearance and the perceptibility of the area to be illuminated.

On account of the adjustable intensity ratio it is possible, therefore, that an observer perceives directly emitted light 193, for example only from the organic light-emitting diode 1. Furthermore, it is possible that the observer perceives principally the area 185a to be illuminated of the element 185 to be illuminated. This is possible when the electromagnetic radiation 193 emitted directly toward the outside has a lower intensity than the electromagnetic radiation 191 directed onto the area 185a to be illuminated.

Furthermore, the impression of the area 185a to be illuminated which is perceived by the observer can also be achieved by an alteration of the wavelength of the light generated by the organic light-emitting diode 1 during operation. For a particularly realistic rendering of the area 185a to be illuminated, however, it may be desirable for the organic light-emitting diode 1 to be a organic light-emitting diode 1 which emits white light and which is transparent. One of the organic light-emitting diodes 1 described here can be used for this purpose.

Figure 27:
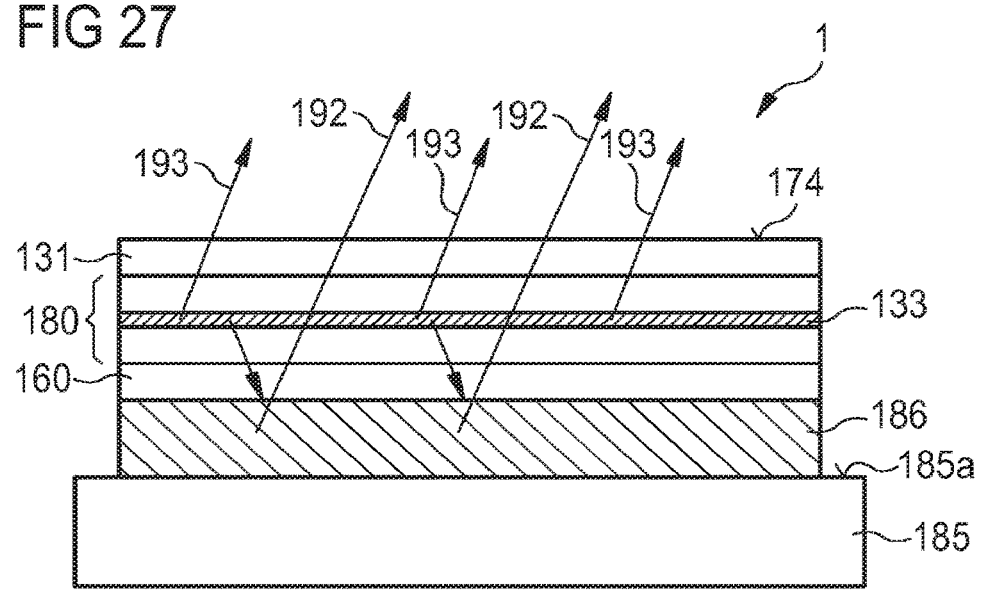

In conjunction with FIG. 27, a further exemplary embodiment of an organic light-emitting diode 1 described here is explained in greater detail on the basis of a schematic sectional illustration. In this exemplary embodiment, in contrast to the exemplary embodiment in FIGS. 26a and 26b, the first carrier 130 is replaced by an encapsulation layer sequence 160 such as is described here. The organic light-emitting diode 1 is once again a transparent organic light-emitting diode 1, which preferably emits white light. An electrically switchable optical element 186 is arranged between the organic light-emitting diode 1 and the element 185 to be illuminated. By way of example, said electrically switchable optical element can be an electrically switchable diffuser. Said diffuser can have two functional states: firstly it can be switched to be diffusely scattering, that is to say opaque; secondly the diffuser can be switched to be transparent.

By way of example, the diffuser can be formed by an electrode pair having planar, transparent electrode layers, between which a liquid crystal layer is arranged. By applying an external voltage, it is possible to influence the transmission of electromagnetic radiation through the diffuser in a targeted manner.

If the electrically switchable optical element 186 is switched to be diffuse, as is illustrated in FIG. 27, electromagnetic radiation 192 generated by the organic light-emitting diode 1 is diffusely scattered in the electrically switchable optical element 186. To the observer, therefore, the area to be illuminated can be perceived only in a blurred fashion or is no longer perceptible at all. In this way, it is possible for the arrangement of organic light-emitting diode 1, electrically switchable optical element 186 and element 185 to be illuminated to be used in the sense of a luminaire for general lighting.

When the electrically switchable optical element 186 is switched to be transparent, the area 185a to be illuminated is visible.

In the exemplary embodiment in FIG. 27, it can be expedient when the area 185a to be illuminated and the element 185 to be illuminated are themselves transparent. In this way, the arrangement constitutes a transparent luminaire which can be switched to be diffuse as necessary. Such luminaires can be used, for example, as changing cubicles, room dividers or similar elements. Even in the state switched to be diffuse, electromagnetic radiation can still pass through the switchable optical element 186 and thus through the element 185. In this way, the organic light-emitting diode 1 with the switchable optical element 186 and the element 185 to be illuminated serves as a luminaire which emits on both sides and which is visually impenetrable.

Furthermore, it is possible for the electrically switchable optical element 186 to be an electrochromic element which can change its color when an external voltage is applied. In this way, by way of example, the light reflected back from the area 185a to be illuminated can be dimmed—depending on the magnitude of the applied voltage.

Overall, in the case of the exemplary embodiment in FIG. 27, it is also possible for the area 185a to be illuminated to be a mirror. In this case, by means of the electrically switchable optical element 186, the mirror can be switched from a reflective operating state to a diffusely scattering and hence illuminating operating state.

In the case of the exemplary embodiment in FIG. 27, it is furthermore also possible for the electrically switchable optical element 186 to be structured in such a way that there are regions in which no electrically switchable optical element 186 is arranged between the organic light-emitting diode 1 and the area 185*a* to be illuminated. In this way, by way of example, patterns or spatially delimited color shadings can be produced by means of the electrically switchable optical element 186.

Figure 28:
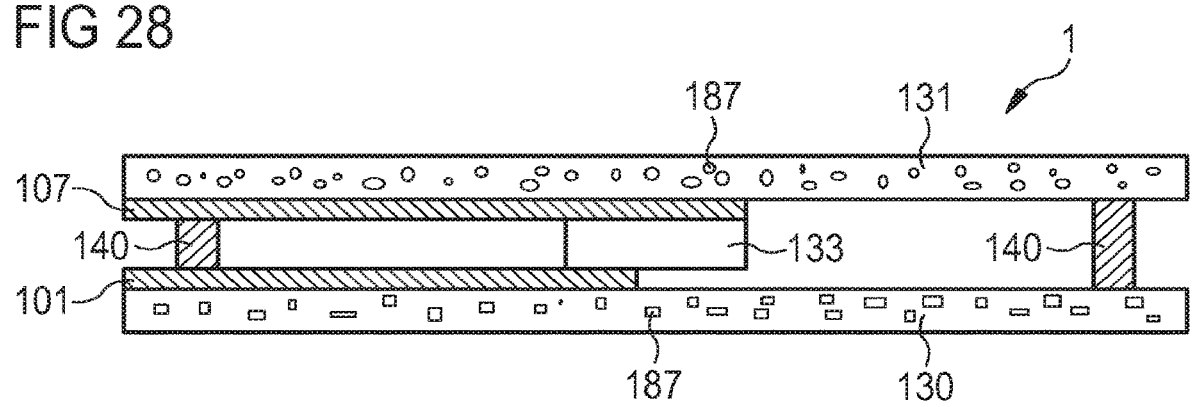
FIG. 28 shows, on the basis of a schematic sectional illustration, the construction of one exemplary embodiment of an organic light-emitting diode 1 with a wavelength conversion substance disposed downstream thereof.

A further exemplary embodiment of an organic light-emitting diode 1 is explained in greater detail in conjunction with FIG. 28. In this exemplary embodiment, a wavelength conversion substance 187 is disposed downstream of the organic layer sequence 133 at least in an emission direction. In this case, it is possible—as illustrated in FIG. 28—for the organic light-emitting diode 1 to be a organic light-emitting diode 1 which emits on both sides, wherein a wavelength conversion substance 187 is disposed downstream of the organic light-emitting diode 1 in both main emission directions. For different main emission directions it is possible to use different wavelength conversion substances 187.

By way of example, blue light is emitted in the radiation-emitting region 104 of the organic light-emitting diode 1. The organic light-emitting diode 1 which emits on both sides can then emit white light in one direction and colored light, for example, in the other direction. In this case, the desired color impression can respectively be set by the choice of a suitable wavelength conversion substance 187. By way of example, the following wavelength conversion substances 187 are appropriate for this purpose: garnets of rare earths and of the alkaline earth metals, for example YAG:$Ce^{3+}$, furthermore also nitrides, nitridosilicates, sions, sialons, aluminates, oxides, halophosphates, orthosilicates, sulfides, vanadates, perylenes, cumarin and chlorosilicates, or mixtures of these substances.

In the exemplary embodiment in FIG. 28, the wavelength conversion substance 187 is introduced into the first carrier 130 and also the second carrier 131. However, the wavelength conversion substance 187 can also be applied into a matrix material as a layer onto an outer area of the first carrier 130 and/or of the second carrier 131. Furthermore, it is possible for the organic light-emitting diode 1 to have no or only one carrier and to be encapsulated differently. On the basis of the exemplary embodiment in FIG. 28, all that is elucidated in more specific detail is that the electromagnetic radiation emitted by the organic light-emitting diode 1 during operation can also be determined or concomitantly determined by the use of wavelength conversion substances with regard to its color impression.

Figure 29:
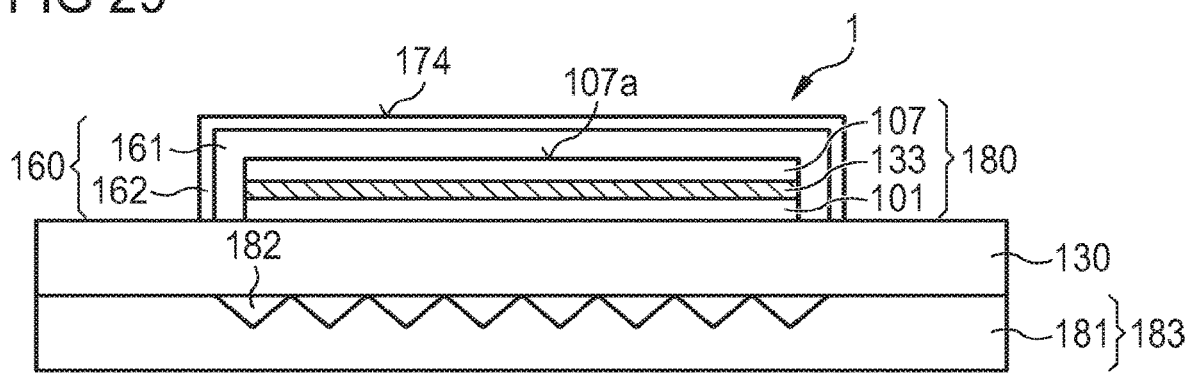
FIGS. 29 and 30 show, on the basis of schematic sectional illustrations, exemplary embodiments of organic light-emitting diodes which each have a retroreflector.
Figure 30:
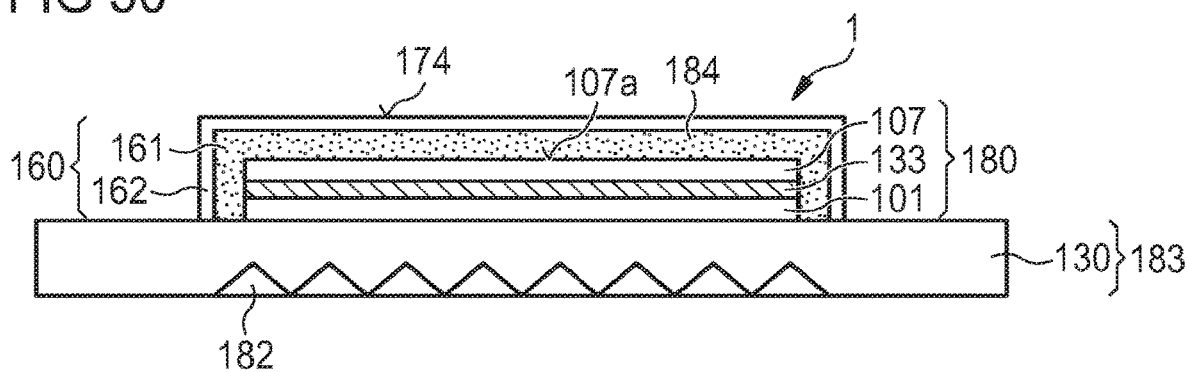

FIGS. 29 and 30 show, on the basis of schematic sectional illustrations, exemplary embodiments of organic light-emitting diodes which in each case have a retroreflector 183.

A retroreflector is a reflective optical element which, for a large range of angles of incidence, reflects incident ambient light back substantially in the same direction from which it comes. To put it another way, a part of a light beam that is incident on the retroreflector 183 and a part of said light beam that is reflected by the retroreflector run substantially parallel. In this case, the angle of incidence is the angle between the incident part of the light beam and the normal to the surface of a main extension plane of the retroreflector 183.

In particular, the incident and reflected parts form an angle of less than or equal to 15°, preferably of less than or equal to 10°, particularly preferably of less than or equal to 5°. An upper limit for the angle of incidence is, for example, greater than or equal to 45°, preferably greater than or equal to 60°, particularly preferably greater than or equal to 75°.

In this case, the retroreflector 183 preferably exhibits slight scattering. To put it another way, the incident part of the light beam is reflected back into a narrow, divergent beam cone. The beam cone has a central axis that runs substantially parallel to the incident part of the light beam, that is to say forms therewith for example an angle of less than or equal to 15°, preferably of less than or equal to 10°, and particularly preferably of less than or equal to 5°. The beam cone can have an aperture angle of 5° or less.

The retroreflection by the retroreflector 183 into a narrow, divergent beam cone is advantageous if the light beam incident from an external light source—such as a headlight of a vehicle—is not intended to be reflected back directly into the external light source, but rather is intended to be perceived for example by an observer in the vicinity of the external light source—for instance by the vehicle driver.

In the exemplary embodiment in accordance with FIG. 29, the electrodes 101, 107 and also the organic layer sequence 133 are embodied as at least radiation-transmissive, preferably transparent. In this case, the functional layers 180 are applied to a first carrier 130, which can be formed for example by a transparent film or with a glass. At all events, the first carrier 130 is preferably embodied in transparent fashion. Purely by way of example, the organic light-emitting diode 1 in the exemplary embodiment in FIG. 29 is encapsulated with an encapsulation layer sequence 160 composed of first encapsulation layer 161 and second encapsulation layer 162, as described here. Alternatively, all other encapsulation methods and combinations of these encapsulation methods as described here are also possible for forming the organic light-emitting diode 1.

The organic light-emitting diode 1 can be, in particular, a organic light-emitting diode 1 that is transparent, emits white light and is embodied in flexible fashion. The organic light-emitting diode 1 is applied to the retroreflector 183 at its outer area facing away from the organic layer sequence 133, that is to say with the first carrier 130.

In the present case, the retroreflector 183 is formed from a reflective plate 182, into which radiation shaping elements 182 are introduced. By way of example, the radiation shaping elements 182 are pyramidal depressions. In this case, the radiation shaping elements 182 can constitute so-called triple mirrors. To put it another way, each radiation shaping element 182 preferably has exactly three side areas. In this case, the side areas can each form an angle of approximately 90°, for example an angle of between 85° and 95°, with one another, inclusive of the limits.

The radiation shaping elements 182 can be impressed into the reflective plate 181. Preferably, the reflective plate 181 consists of a reflective metal for this purpose.

In contrast to the exemplary embodiment in FIG. 29, in the exemplary embodiment in FIG. 30 the retroreflector is formed by a part of the first carrier 130. By way of example, the first carrier 130 is embodied as a transparent plastic film or as a glass substrate. The radiation shaping elements 182 are situated as depressions on that side of the first carrier 130 which faces away from the organic layer sequence 133. The radiation shaping elements are coated from said side preferably with a reflective layer, for example a metal layer applied by vapor deposition.

Furthermore, a color filter 184 is disposed downstream of the organic layer sequence 133, which color filter can be formed for example by color filter particles introduced into the first encapsulation layer 161. Furthermore, it is possible for a color filter 184 as a separate component to be disposed downstream of the organic layer sequence 133 or to be applied as a separate layer onto the encapsulation layer sequence 160.

The color filter 184 has a high transmission for a first spectral subrange of the visible wavelength spectrum and high absorption for a second spectral subrange of the visible wavelength spectrum. An intensity maximum of the electromagnetic radiation generated by the radiation-emitting region 104 during operation lies within the first spectral subrange transmitted by the color filter 184. As an alternative to a color filter, it is also possible for the retroreflector 183 itself to contain a wavelength-selective mirror layer for reflecting the ambient light, which layer reflects the first subrange and absorbs and/or transmits the second subrange.

Advantageously, that portion of the ambient light which is reflected back by the retroreflector 183 to the radiation exit area 174 and is coupled out from the organic light-emitting diode 1 produces in this way substantially the same color impression as the light emitted by the organic light-emitting diode 1. Advantageously, therefore, the organic light-emitting diode 1 brings about the same color impression independently of the operating state.

For embodiments in which only the color impression is of importance, the retroreflector 183 can in this case also be replaced by any other layer embodied in reflective fashion, or some other element embodied in reflective fashion, which need not have retroreflective properties.

Figure 31A:
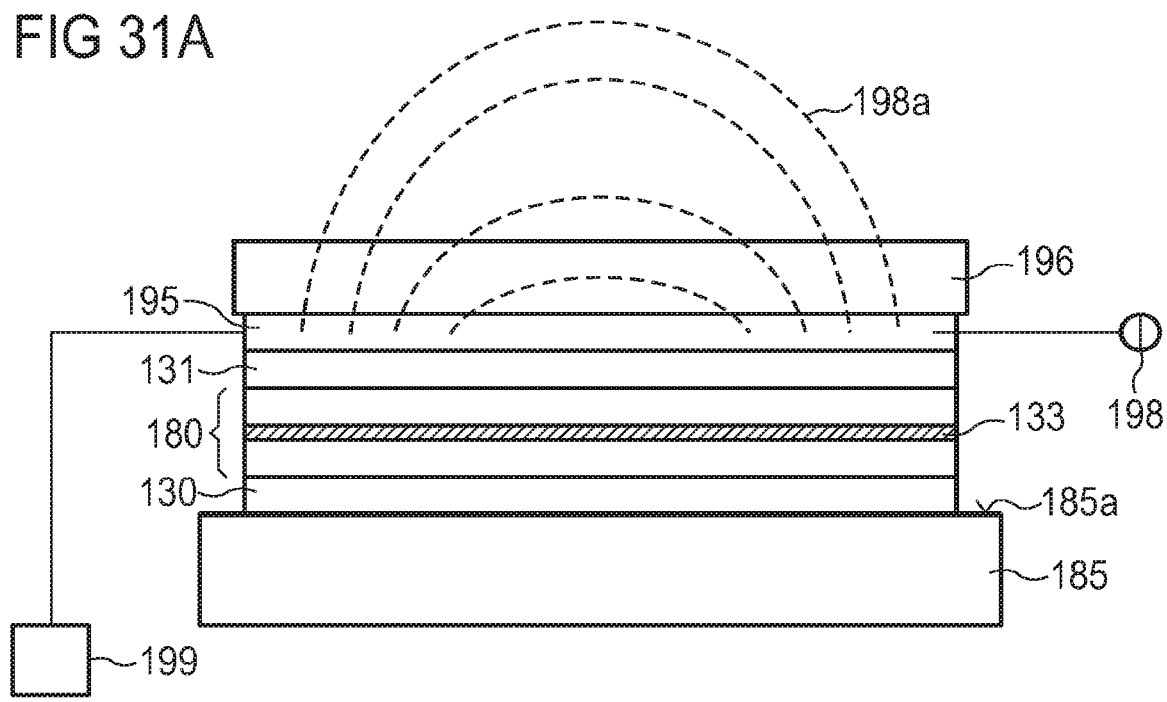
FIGS. 31A and 31B show, on the basis of schematic sectional illustrations, one exemplary embodiment of an organic light-emitting diode described here wherein the organic light-emitting diode comprises a touch sensor.
Figure 31B:
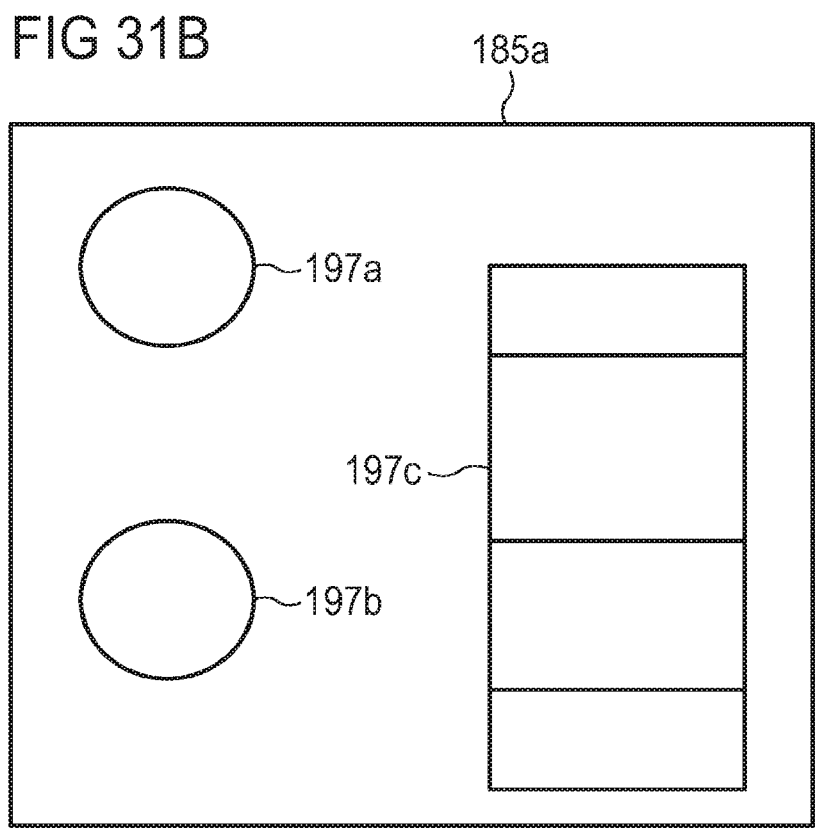

In conjunction with FIGS. 31A and 31B, an exemplary embodiment of an organic light-emitting diode 1 described here is explained in greater detail on the basis of schematic sectional illustrations, the organic light-emitting diode comprising a touch sensor in this exemplary embodiment. By way of example, functions of the organic light-emitting diode 1 or of other devices can be controlled by means of the touch sensor.

In the exemplary embodiment in FIGS. 31A and 31B, the organic light-emitting diode comprises a first carrier 130, a functional layer sequence 180 arranged onto the first carrier, and also a second carrier 131. In this case, the encapsulation of the organic light-emitting diode can be effected as described here. With that side of the first carrier 130 which faces away from the functional layers 180, the organic light-emitting diode 1 is applied to an element 185 to be illuminated, said element comprising an area 185*a* to be illuminated.

FIG. 31B illustrates the fact that pictorial representations of operating elements 197*a*, 197*b*, 197*c* are applied to the area 185*a* to be illuminated. During the operation of the organic light-emitting diode, said operating elements can be illuminated by electromagnetic radiation generated in the radiation-emitting region 104.

A third electrode 195 is arranged at that side of the second carrier 131 which faces away from the functional layers 180. The third electrode 195 is succeeded by a covering plate 196. The covering plate can be, for example, a transparent film, sheet or layer. The covering plate 196 can serve as anti-scratch protection. Furthermore, it is possible for the covering plate 196 to increase the light coupling-out of electromagnetic radiation generated in the organic light-emitting diode 1.

The third electrode 195 is electrically conductively connected to a current source 198, which can be operated with DC current or in a pulsed manner. Field lines 198*a* are thereby generated by the organic light-emitting diode 1. By way of example, a finger or a pen that touches the covering plate 196 alters the profile of the electric field lines 198*a*. With the aid of an evaluation circuit 199, it is possible to determine the position of the finger, for example, and in this way to effect the assignment to the operation of one of the operating elements 197*a*, 197*b*, 197*c*.

In this case, it is also possible for some other touch sensor to be used instead of the above-described capacitively operating touch sensor integrated into an organic light-emitting diode described here.

Such touch sensors are for example also described in the documents DE 10332956 A1 and DE 10308514 A2, the disclosure content of which is hereby incorporated by reference.

Furthermore, it is also possible for the operating elements 197*a*, 197*b*, 197*c* not to be represented by images on an area 185*a* to be illuminated, but rather for the organic light-emitting diode 1 to be constructed at least in places in the manner of a simple organic display suitable for representing simple images or pictograms.

Luminaires 2 are explained in greater detail below. The luminaires 2 can be luminaires 2 for general lighting such as lamps or lights which have further functions—besides their use for general lighting. Thus, the luminaires 2 can form a concealing screen, noise protection, protection against rain or a splash guard, solar protection or the like. In the luminaires 2 described below, in each case at least one organic light-emitting diode 1 as described in conjunction with FIGS. 1 to 31 can be used as light source. Furthermore, combinations of the organic light-emitting diodes 1 described in conjunction with FIGS. 1 to 31 can also be used as light source.

The luminaire 2 described in conjunction with FIGS. 32A to 32G has a wake-up function besides its function for general lighting. That is to say that the luminaire 2 forms a light—for example for room lighting, and an alarm clock. By means of the wake-up function, a user of the luminaire 2 can be woken up at a time of day that can be set, by means of the brightness of the luminaire being increased.

Figure 32A:
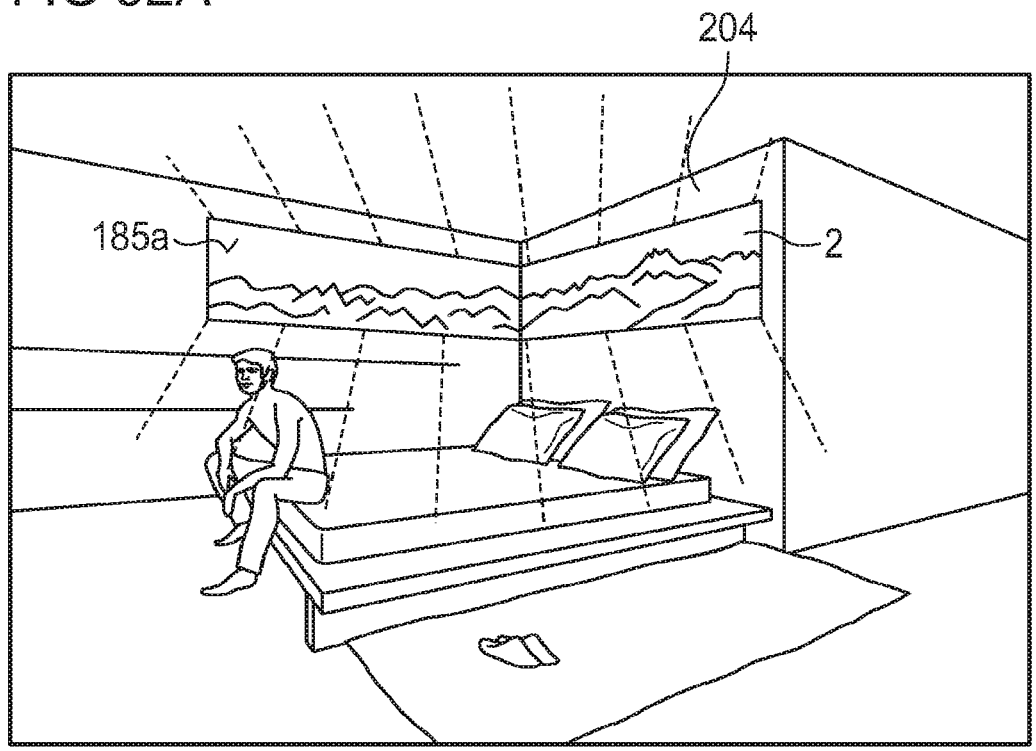
FIGS. 32A to 32I show, on the basis of schematic illustrations, exemplary embodiments of a luminaire described here which has a wake-up function.

FIG. 32A shows an exemplary embodiment of such a luminaire 2 on the basis of a schematic perspective illustration. In this case, the luminaire 2 is fixed in the manner of a picture on a wall 204. In this case, FIG. 32A shows the luminaire 2 in a switched-off operating state.

The luminaire 2 comprises, for example, an organic light-emitting diode 1 as explained in greater detail in conjunction with FIGS. 26 and 27. That is to say that the organic light-emitting diode 1 of the luminaire 2 can be transparent and disposed downstream in an area 185*a* to be illuminated. The area 185*a* to be illuminated of the organic light-emitting diode 1 is, for example, a picture, a poster, wallpaper, tiles or the like. Furthermore, the area 185*a* to be illuminated can be the reflective surface of a mirror.

As can be seen from FIG. 32A, in the switched-off state of the luminaire 2, the area 185*a* to be illuminated is visible through the transparent layers of the organic light-emitting diode 1.

Figure 32B:
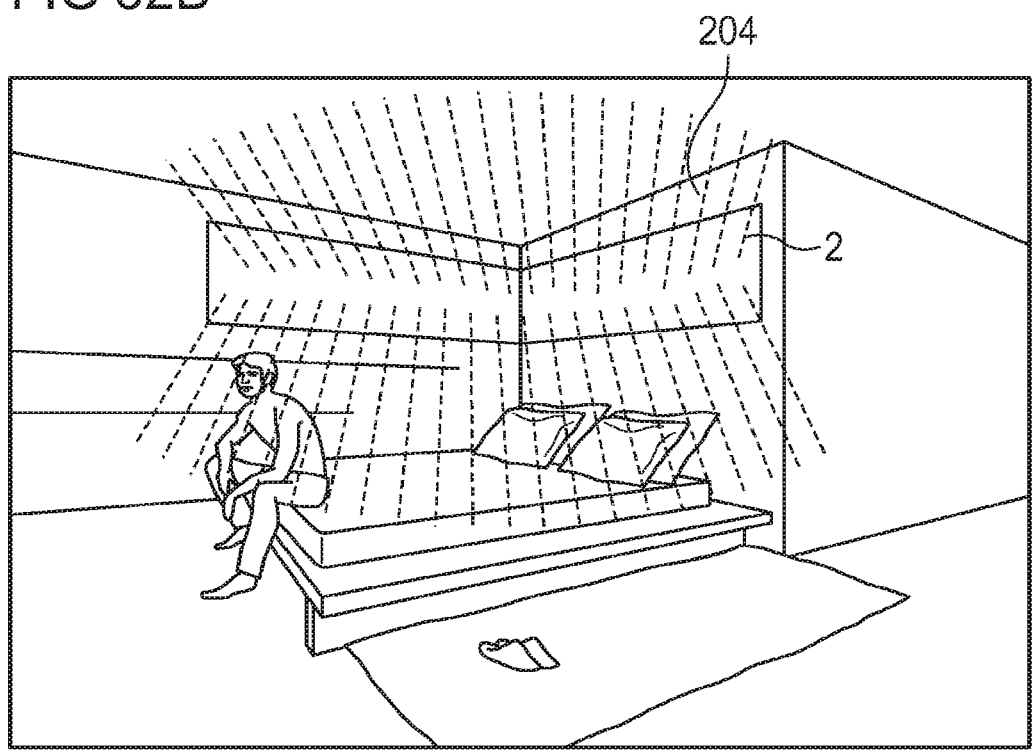

FIG. 32B shows the luminaire 2 in a switched-on operating state. In this operating state, the area 185*a* to be illuminated is no longer discernible. This can be achieved, for example, by utilizing an optical cavity, as described in conjunction with FIGS. 26A and 26B. Furthermore, this can be achieved by means of an electrically switchable optical element 186, as described for example in conjunction with FIG. 27. The luminaire 2 therefore has at least two operating states: in a first operating state, the area 185*a* to be illuminated is discernible; in a second operating state, the luminaire 2 serves only for general lighting.

Figure 32C:
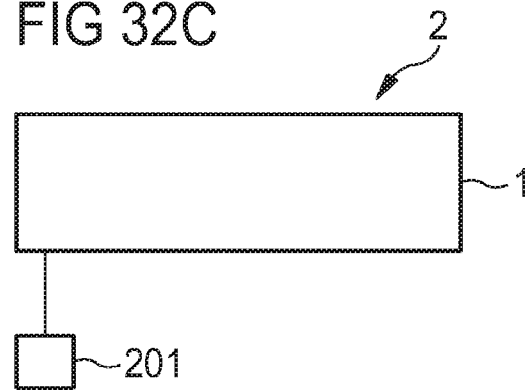

An exemplary embodiment of the luminaire 2 is explained in greater detail with reference to the basic schematic diagram in FIG. 32C. In this case, the luminaire 2 comprises the organic light-emitting diode 1 and also a driving device 201. An activation time for the luminaire 2 can be set by means of the driving device 201. Said activation time can be a desired wake-up time t1, for example.

It is possible in this case for the driving device 201 to regulate only two operating states of the organic light-emitting diode 1. Thus, by means of the driving device 201, the organic light-emitting diode 1 can be switched from the switched-off operating state into the switched-on operating state with maximum light intensity Imax at the desired wake-up time t1.

In another embodiment of the luminaire 2, as explained with reference to the graphical plot in FIG. 32D, however, a slow, continuous increase in the light intensity I up to the maximum light intensity Imax takes place at the wake-up time t1.

Figure 32D:
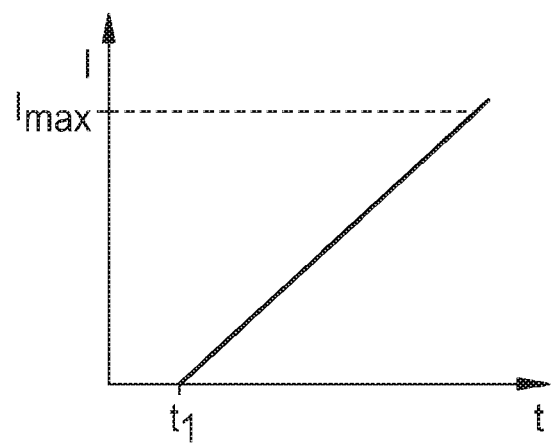

In this case, it can be seen from the graphical plot in FIG. 32D that the light intensity generated by the organic light-emitting diode 1 assumes a finite value as a result of the organic light-emitting diode 1 being switched on at the wake-up time t1 and rises slowly from there. Such a rise can take place, for example, by means of a correspondingly slow increase in the current intensity with which the organic light-emitting diode 1 is operated. Furthermore, it is possible for the light intensity I to be increased by means of pulse width modulation. A combination of these two possibilities can also prove to be advantageous.

An alternative possibility for slowly increasing the light intensity I is described in greater detail with reference to the graphical illustration in FIG. 32E. Here, starting from the wake-up time t1, the light intensity I is increased in steps, the light intensity in each case being kept constant for certain time intervals t2.

Figure 32E:
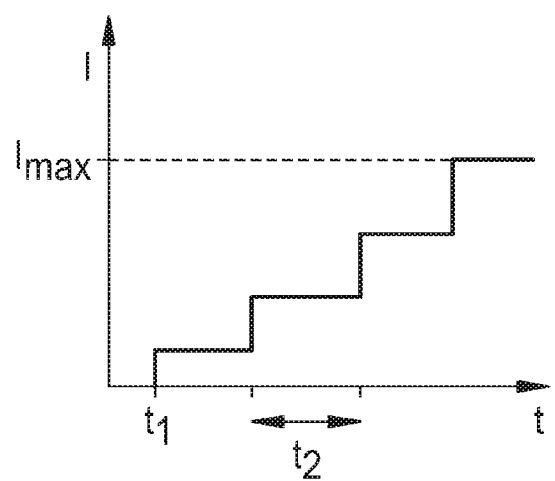

Overall, the temporal profiles of the light intensity as described in conjunction with FIGS. 32D and 32E enable the user of the luminaire to be woken up particularly gently. The light intensity increases from a light intensity I=0 up to a light intensity Imax over a time period of 5 minutes, for example.

In this case, the light intensity Imax is preferably at least 1000 cd, particularly preferably at least 5000 cd. In the extreme case it is possible for the light intensity Imax to be 10 000 cd.

Such high light intensities are possible in particular with the phosphorescent emitter materials described in conjunction with FIGS. 1 to 6. On account of their high efficiency, these materials allow particularly bright light to be generated. A possible temporal delay of the radiation emission by said phosphorescent emitter materials is not of importance in the case of the luminaire 2 in accordance with the exemplary embodiments in FIGS. 32D and 32E, since the light intensity I is intended to be increased relatively slowly.

By way of example, the luminaire 2 can comprise an organic light-emitting diode 1 as described in conjunction with FIG. 3. The organic light-emitting diode 1 then preferably emits white light.

Figure 32F:
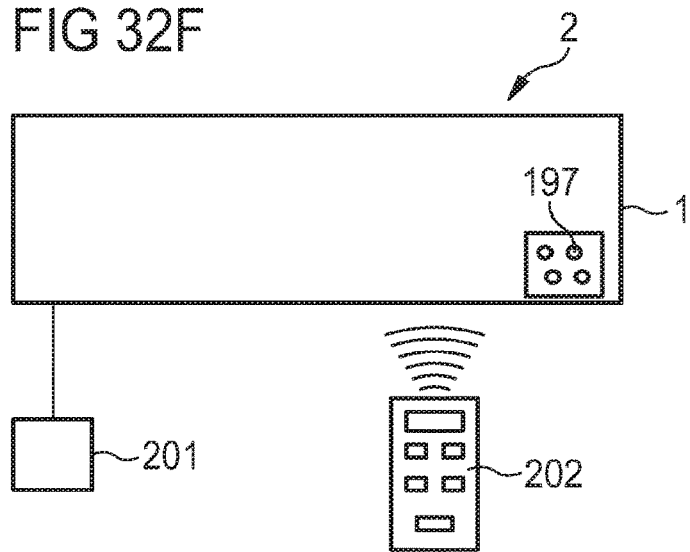

An exemplary embodiment of a luminaire which can be controlled and/or regulated in different ways by the user is described in conjunction with FIG. 32F. Firstly, the luminaire 2 can comprise operating elements 197 for example in the region of a corner of the luminaire. The operating elements 197 can be operated by the user by means of a touch sensor, for example, as described in conjunction with FIGS. 31A and 31B. That is to say that the luminaire 2 comprises, for example, an organic light-emitting diode 1 with a capacitively operating touch sensor.

Alternatively or additionally, it is possible for the luminaire 2 to be operated by means of a remote control 202.

By means of the operating elements 197, the operating state of the luminaire can be set, for example. Thus, the desired wake-up time can be predetermined by means of the operating elements 197 and/or the remote control 202. Furthermore, the operating state of the luminaire can be selected by means of the operating elements 197 and/or the remote control 202. By way of example, the luminaire 2 can thereby be switched from the switched-off operating state, in which the area 185a to be illuminated is visible, to a luminous operating state, in which the luminaire 2 serves for room lighting.

Figure 32G:
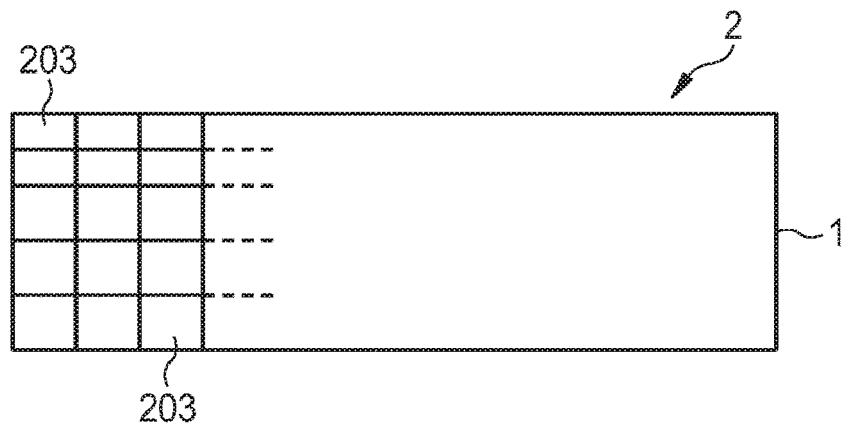

A further exemplary embodiment of a luminaire described here is explained in greater detail in conjunction with the schematic illustration in FIG. 32G. In this exemplary embodiment, the organic light-emitting diode 1 of the luminaire 2 is subdivided into a multiplicity of segments 203. The segments 203 are individually drivable functional layers 180, which can differ from one another, for example by virtue of different emitter materials. Furthermore, the segments can be individual organic light-emitting diodes 1. Such a luminaire 2 makes it possible to realize, alongside or as an alternative to a temporal profile of the light intensity I, also a temporal profile of the color locus and/or of the color temperature T.

By way of example, firstly warm-white, reddish light having a color temperature T of approximately 4000 K can be generated at the wake-up time t1, wherein, for example, segments 203 that generate a reddish white light are principally operated.

In the temporal profile, it is then possible for the color temperature to rise up to a maximum color temperature Tmax of approximately 25 000 K. At this color temperature, cold, bluish, white light is generated by the organic light-emitting diode 1 of the luminaire 2.

In this way, therefore, the luminaire 2 is designed to generate white light having color temperatures T of at least 4000 K to at most 25 000 K, wherein the light intensity I can simultaneously rise from 0 cd to 10 000 cd. In the temporal profile, therefore, a sunrise in time lapse is simulated by the luminaire 2. In this way, the luminaire 2 enables the user of the luminaire to be woken up particularly naturally and gently.

Figure 32H:
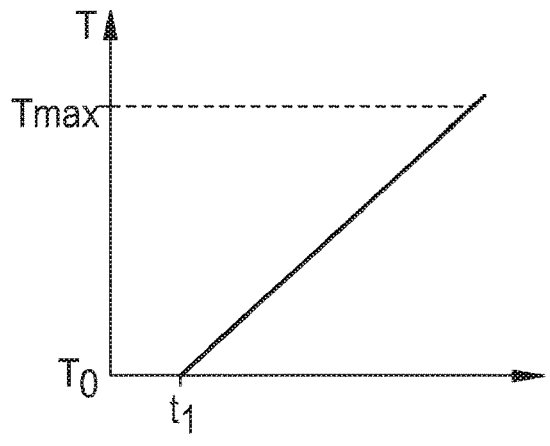
Figure 32I:
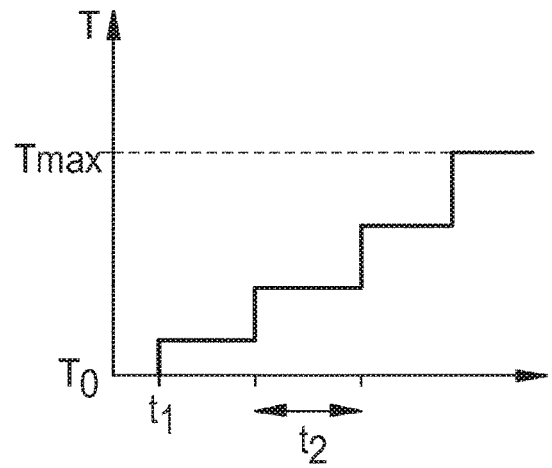

In FIGS. 32H and 32I, two possibilities for temporally varying the color temperature T are illustrated graphically on the basis of graphical plots. In this case, the color temperature T can be increased from T0 approximately 4000 K to Tmax approximately 25 000 K continuously (see FIG. 32H) or in steps (see FIG. 32I). The increase in the light intensity I as described in conjunction with FIGS. 32D and 32E can simultaneously be effected.

Overall, exemplary embodiments of a luminaire which also comprises a wake-up function besides its function for general lighting are described in conjunction with FIGS. 32A to 32E. The organic light-emitting diode 1 of the luminaire 2 can be embodied in transparent and flexible fashion. The luminaire can be suitable for generating white light having different color temperatures and can be provided for generating light having different color temperatures and light intensities. Behind the organic light-emitting diode 1 of the luminaire 2, an area 185a to be illuminated can be arranged, which can be exchanged by the user. In this way, the luminaire 2 can be combined with any desired posters, wall tiles, pictures, mirrors or the like, which allows particularly diverse use of the luminaire. In this case, the luminaire 2 contains at least one organic light-emitting diode 1 as described in greater detail in conjunction with FIGS. 1 to 31, or an organic light-emitting diode 1 that constitutes a combination of the organic light-emitting diodes 1 described in conjunction with FIGS. 1 to 31.

A further exemplary embodiment of a luminaire 2 described here is explained in greater detail in conjunction with the schematic illustrations in FIGS. 33A to 33D.

Figure 33A:
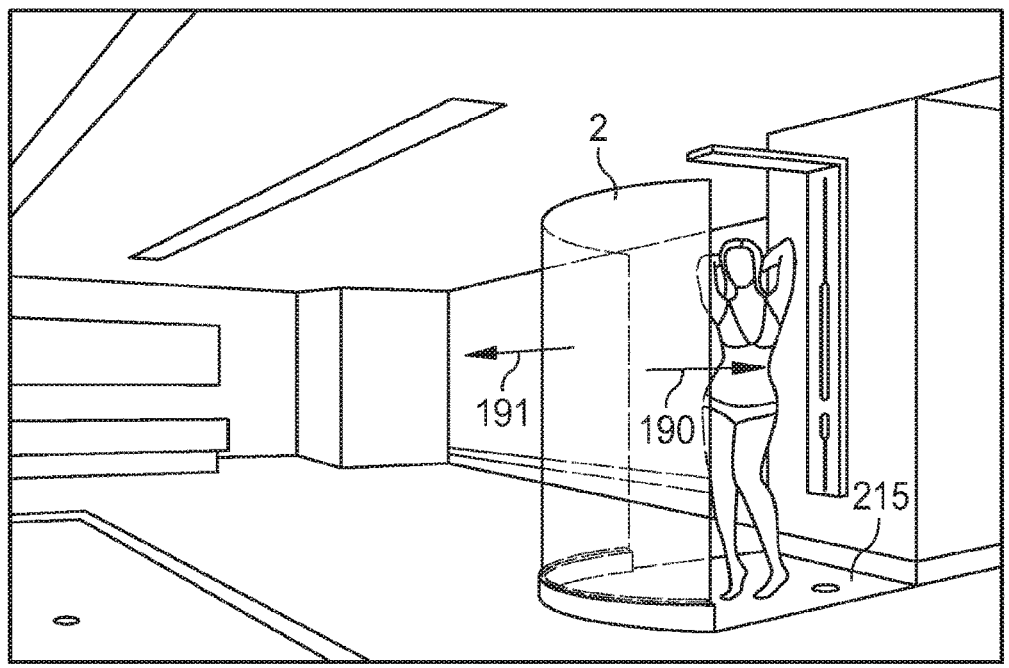
FIGS. 33A to 33D show, on the basis of schematic illustrations, exemplary embodiments of a luminaire described here which constitutes a splash guard.

FIG. 33A shows, on the basis of a schematic perspective illustration, a further exemplary embodiment of a luminaire 2 described here. In this case, the luminaire 2 forms large-area room lighting that can be utilized as part of a shower cubicle 215. That is to say that the luminaire 2 performs a double function: firstly it serves as a light for general lighting, and secondly it constitutes a splash guard.

In this case, the luminaire 2 is emissive on both sides, such that electromagnetic radiation 190 from the luminaire 2 can be directed into the interior of the shower cubicle 215. Furthermore, electromagnetic radiation 191 is emitted in opposite directions from the shower cubicle into the room to be illuminated.

Figure 33B:
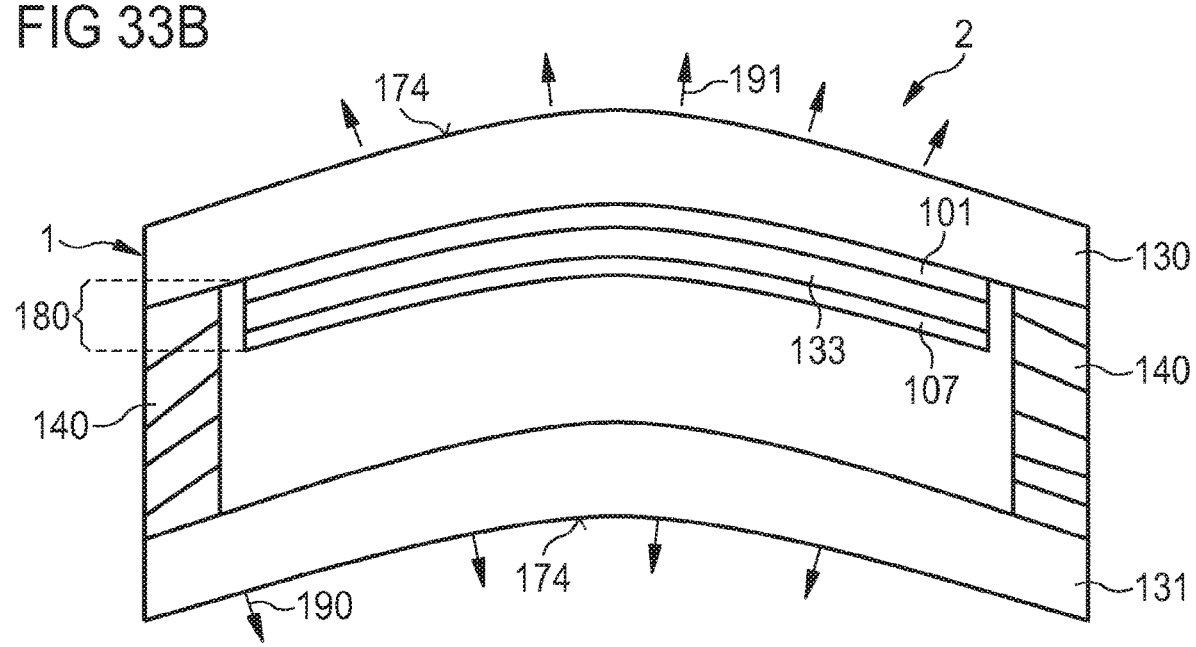

An exemplary embodiment of a luminaire 2 which can be utilized as part—for example as a boundary wall—of a shower cubicle 215 is explained in greater detail in conjunction with the schematic sectional illustration in FIG. 33B. The luminaire 2 comprises at least one organic light-emitting diode 1 as explained in greater detail in conjunction with or in the combination of FIGS. 1 to 32.

In this case, the organic light-emitting diode 1 comprises a first carrier 130 and also a second carrier 131, which are arranged parallel or substantially parallel to one another. First carrier 130 and second carrier 131 are preferably each formed from a radiation-transmissive material. In this case, first carrier 130 and second carrier 131 are not necessarily transparent; it is sufficient if one of the carriers, or both carriers, is or are embodied as diffusely radiation-transmissive, for example. In this case, the functional layers 180 of the organic light-emitting diode need not necessarily be embodied in transparent fashion; it is sufficient if the functional layers 180 are emissive on both sides.

A first and/or second carrier 130, 131 embodied in diffuse fashion has the advantage in this case that the luminaire 2 also functions as a concealing screen of the shower cubicle besides its properties for lighting and for a splash guard. First carrier 130 and second carrier 131 can, for example, be formed with an opalescent glass or consist of an opalescent glass. Furthermore, it is possible for at least one of the two carriers to have a surface structuring or a patterning which—in addition to light scattering—can also serve for the artistic decoration of the outer area of the luminaire 2 and/or for beam directing of the electromagnetic radiation 190, 191.

First carrier 130 and second carrier 131 can be embodied as planar plates. Furthermore, it is possible for the carriers—as illustrated in FIGS. 33A and 33B—to be bent in the manner of a cylinder lateral surface segment and for the luminaire 2 thus to have curved radiation exit areas 174.

The functional layers 180 of the organic light-emitting diode 1 can be encapsulated, in the cavity formed by the first carrier 130 and the second carrier 131, by means of the carriers 130, 131 and a connecting means 140 arranged marginally. Furthermore, other techniques for encapsulating and sealing the functional layers 180, as described for example in conjunction with FIGS. 7 to 20, are also possible. Furthermore, combinations of said sealing and encapsulation techniques are also possible.

In this case, the use of an organic light-emitting diode in a bathroom makes stringent requirements of the hermetic sealing of the organic light-emitting diode 1. The organic light-emitting diode 1 has to withstand a room climate having high air humidity and relatively high temperatures for long times.

Figure 33C:
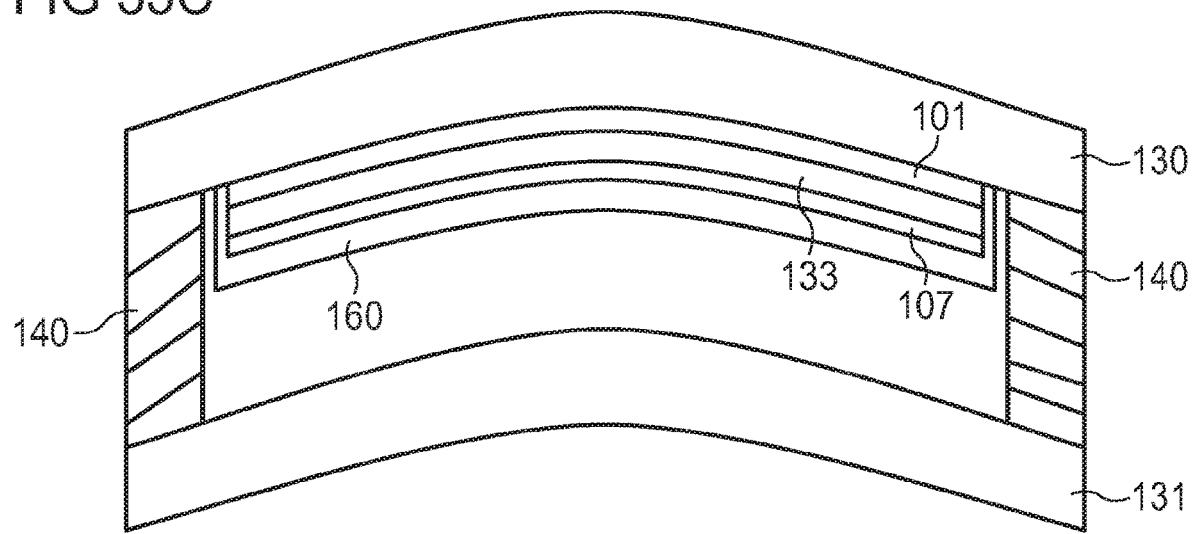

FIG. 33C, for example, shows a schematic sectional illustration of an exemplary embodiment of the luminaire 2 in which such a good hermetic sealing can be achieved particularly efficiently. In this case, the sealing by means of the first carrier 130 and the second carrier 131 and also the connecting means 140 is combined with an encapsulation of the functional layers 180 by an encapsulation layer sequence 160. That is to say that the organic light-emitting diode 1 has a double encapsulation in this case: first, it is protected by the carriers 130, 131 and the connecting means 140, and secondly by the particularly impermeable encapsulation layer sequence 160. This enables particularly efficient encapsulation of the luminaire and therefore use in a bathroom in conjunction with long lifetimes of the luminaire 2.

The connecting means 140 can be, for example, a glass solder or a glass frit material, which is led in a frame-like manner around the functional layers 180 and also the encapsulation layer sequence 160.

Furthermore, one of the further encapsulation techniques described in conjunction with FIGS. 7 to 20, such as, for example, a diffusion barrier or a thin-film encapsulation, can be used for encapsulation purposes.

Figure 33D:
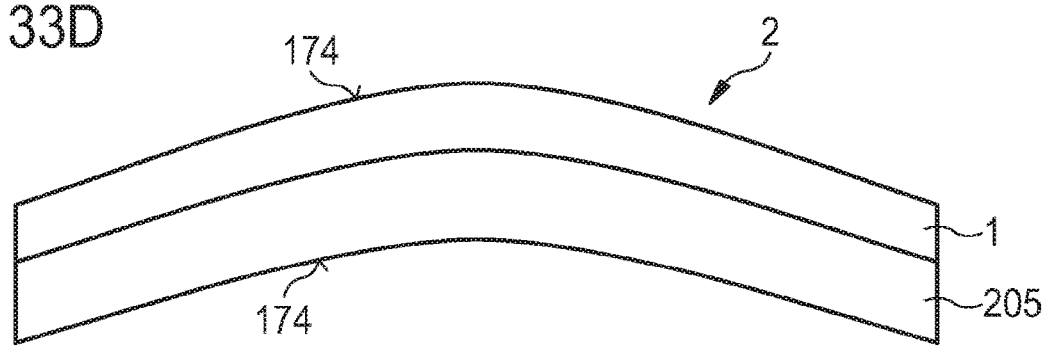

In conjunction with FIG. 33D, a further exemplary embodiment of the luminaire 2, in which the organic light-emitting diode 1 is well protected at least against splash water from the shower, is explained on the basis of a schematic sectional illustration. In this exemplary embodiment, the organic light-emitting diode 1 is applied to the outer area of a radiation-transmissive plate 205 that faces away from the shower.

The organic light-emitting diode 1 can then be, for example, a flexibly embodied organic light-emitting diode 1 which emits on both sides. Such a organic light-emitting diode 1 can have a flexible film as carrier. Furthermore, it is possible for the organic light-emitting diode 1 to be applied to the outer area of the radiation-transmissive plate 205 in the sense of a transfer.

Overall, applying the organic light-emitting diode 1 to an outer area of the radiation-transmissive plate 205 enables the organic light-emitting diode 1 to be rapidly removed and thus rapidly exchanged. Therefore, the demands with regard to encapsulation that have to be placed on such a light-emitting diode 1 are not as stringent as in the case of luminaires in accordance with FIGS. 33B and 33C, for example. That is to say that in the exemplary embodiment in FIG. 33D, the lifetime of the organic light-emitting diode 1 does not limit the lifetime of the shower cubicle, rather the organic light-emitting diode 1 can be replaced by a new organic light-emitting diode 1 after it has been damaged.

In the exemplary embodiments in FIGS. 33B to 33D, the organic light-emitting diode 1 of the luminaire 2 is illustrated as a large-area organic light-emitting diode 1. However, the organic light-emitting diode 1 can also be divided into a multiplicity of segments 203, which can be suitable, for example, for generating electromagnetic radiation having differing wavelengths. Furthermore, it is possible for the luminaire 2 to comprise a multiplicity of organic light-emitting diodes 1 which, for example, can each have a common first carrier 130. In order to form the organic layer sequence 133 and also the electrodes 101 and 107 of the organic light-emitting diode 1, it is possible to use, for example, the materials described in conjunction with FIGS. 1 to 6 and the layer constructions described in conjunction with said figures. Overall, therefore, the organic light-emitting diode 1 can be—depending on the embodiment—a organic light-emitting diode 1 that is transparent, emits on both sides, emits white light, and/or is flexible.

Figure 34A:
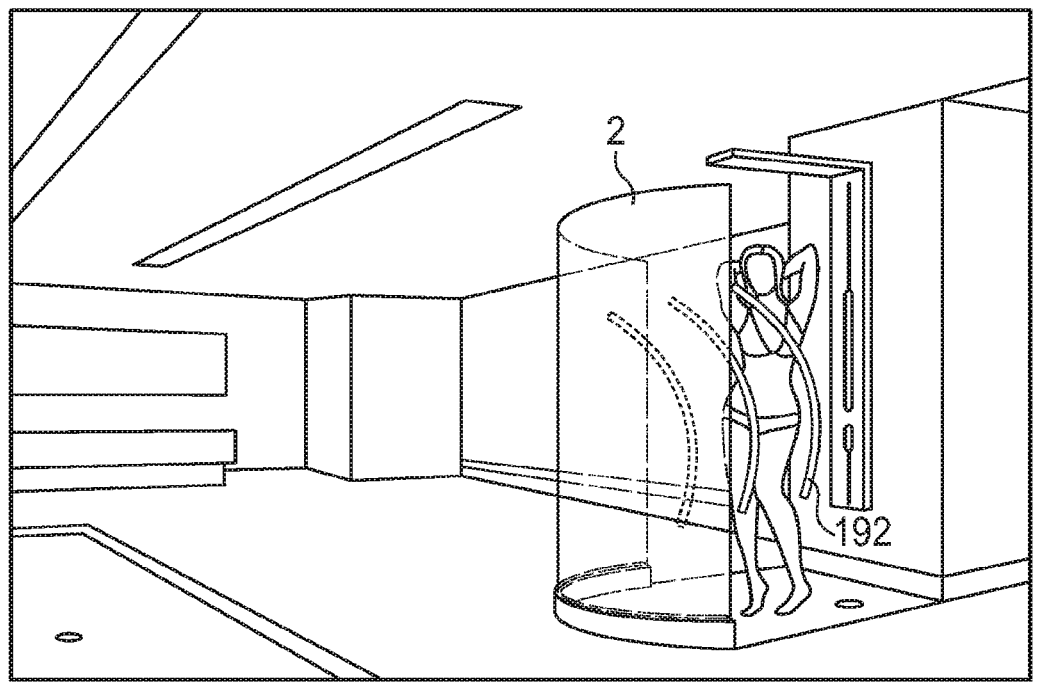
FIGS. 34A, 34B, 34C and 35 show, on the basis of schematic illustrations, further exemplary embodiments of a luminaire which constitutes a splash guard.
Figure 34B:
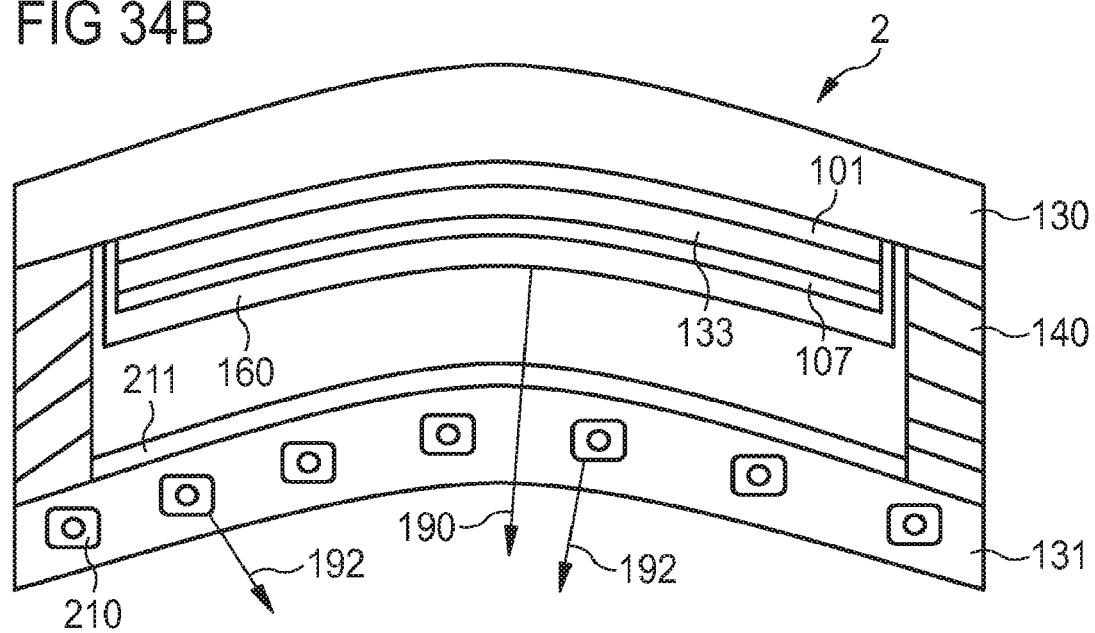
Figure 34C:
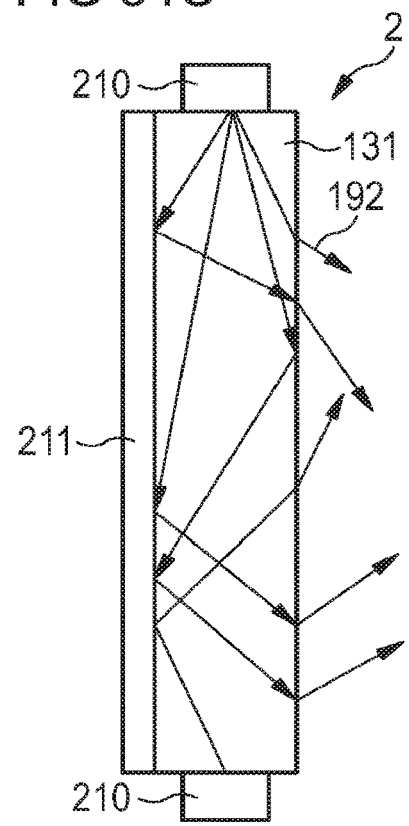

A further exemplary embodiment of a luminaire 2 described here is explained in greater detail in conjunction with the schematic illustrations in FIGS. 34A to 34C. In this exemplary embodiment, too, the luminaire 2 constitutes large-area room lighting and also part, for example the wall, of a shower cubicle 215.

To supplement, for example, the exemplary embodiment described in conjunction with FIG. 33C, the luminaire 2 has, in addition to the at least one organic light-emitting diode 1, at least one second light source, which is embodied as a light-emitting diode 210 in the present case (in this respect, cf. FIG. 34B, for example). The light-emitting diodes 210 are arranged for example at the top area and/or the bottom area of the second carrier 131. However, they can also be applied on the top and/or bottom area of a radiation-transmissive plate 205, as described in conjunction with FIG. 33D. Generally, at least one inorganic light-emitting diode 210 can be arranged at a side area of a radiation-transmissive carrier or a radiation-transmissive plate, wherein the carrier or the plate can serve as a large-area optical waveguide for electromagnetic radiation generated by the light-emitting diode.

As explained in conjunction with the schematic sectional illustration in FIG. 34C, the second carrier 131 forms for example an optical waveguide for electromagnetic radiation 192 generated by the light-emitting diodes 210. In this case, a reflective layer or coating 211, which is transmissive to electromagnetic radiation 190 generated in the organic layer sequence 133, is preferably applied to the inner side of the second carrier 131 facing the organic layer sequence 133. By contrast, the reflective layer 211 is embodied such that it is reflective for electromagnetic radiation 192 generated by the light-emitting diodes 210. In this case, the reflective layer 211 and/or the second carrier 131 can have structurings that allow the electromagnetic radiation 192 to be distributed as uniformly as possible over the entire area of the second carrier 131. The second carrier 131 therefore serves as a planar optical waveguide that permits the electromagnetic radiation generated by the inorganic light-emitting diodes 210 to be emitted homogeneously into the interior of the shower.

The light-emitting diodes 210 are preferably inorganic light-emitting diodes suitable for generating UV radiation, infrared radiation and/or visible light. In this case, it is possible for the luminaire to comprise light-emitting diodes 210 for generating infrared radiation and also UV radiation and/or visible light.

The luminaire 2 can comprise, for example, an operating mode in which infrared radiation 192 is generated by the light-emitting diodes 210. Said infrared radiation is conducted by the second carrier 131 and the reflective layer 211 into the interior of the shower cubicle, where it is used firstly for warming a user; secondly, the radiation can be used for faster drying of the shower cubicle after the shower cubicle has been used.

In a further operating state, only the light-emitting diodes 210 of the luminaire 2 which emit UV light are activated. In this operating state, the emitted radiation 192 is used for tanning a user and/or for disinfecting the shower after the end of the use thereof.

In a third operating state, light-emitting diodes 210 that emit infrared light and UV light can be operated simultaneously, as a result of which combinations of the functions mentioned are possible. Furthermore, it is also possible for the luminaire 2 to comprise organic light-emitting diodes 1 that are suitable for generating infrared radiation. Suitable emitter materials are described for example in conjunction with FIGS. 1 to 6.

Furthermore, it is possible for the luminaire to generate, at least during the operation of the shower, white light with which, depending on the water temperature, red light components (for hot water) or blue light components (for cold water) are admixed for example by means of corresponding inorganic light-emitting diodes 210 or organic light-emitting diodes 1.

Finally, exemplary embodiments are possible in which, during the operation of the luminaire 2, color profiles of the emitted light are generated or a desired color temperature can be set. This can be realized for example by means of corresponding organic light-emitting diodes 1 and/or inorganic light-emitting diodes 210.

Overall, the luminaire 2 described in conjunction with FIGS. 33 and 34 realizes particularly variable, large-area room lighting that simultaneously serves as a splash guard in a shower. In this case, the light color, the light temperature and also the light intensity can be adjustable according to the user's wishes. Furthermore, the luminaire 2 can serve as an indicator device for the water temperature, as a result of which, by way of example, it is possible to prevent use of the shower at excessively cold or excessively hot water temperatures.

Furthermore, it is possible for the light functions such as color, color temperature and/or color intensity to be changed temporally, as explained in greater detail for example in conjunction with the luminaire in accordance with FIGS. 32A to 32I.

Figure 35:
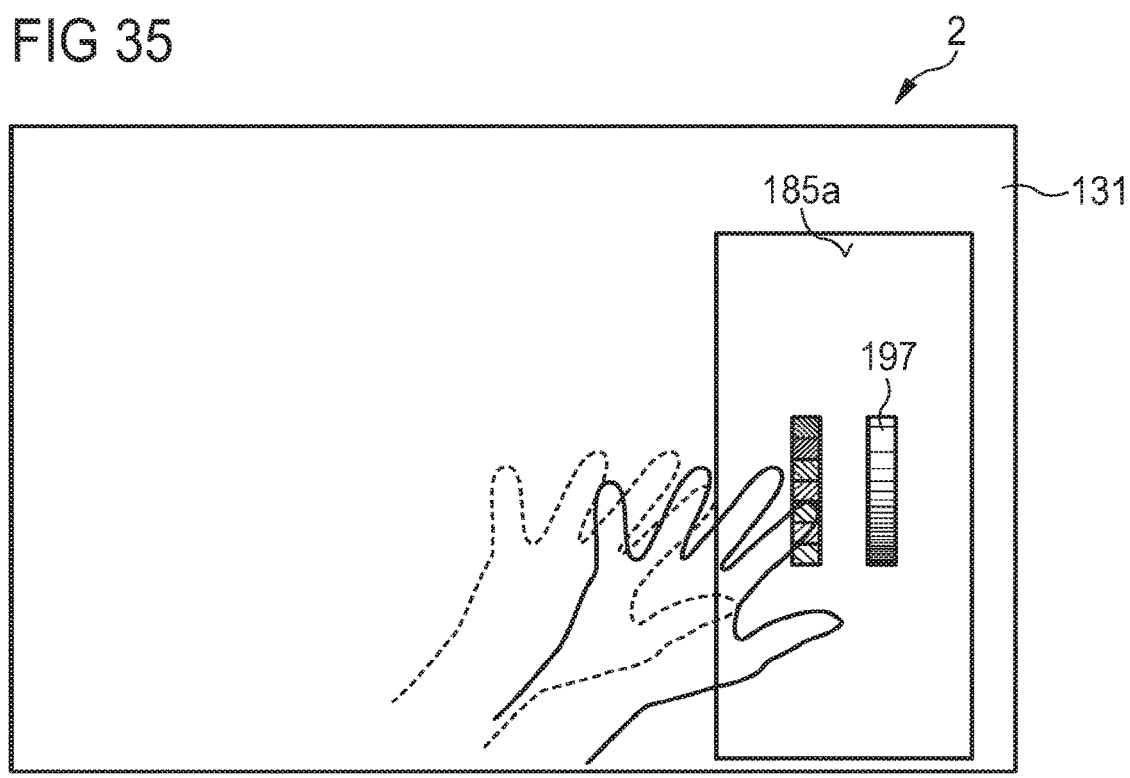

In conjunction with FIG. 35 an explanation is given, with reference to a basic schematic diagram, of the fact that the luminaire 2 can be operated by means of operating elements 197 that are addressed by means of a touch sensor. For this purpose, it is possible to use a touch sensor as explained in greater detail for example in conjunction with FIGS. 31A and 31B. In this case, the operating element can be accessible both from the inner side of the shower and from the outer side of the shower.

Furthermore, it is possible for not only the light function of the luminaire 2 but, for example, also the mixing faucet of the shower and hence the water temperature and the water strength to be regulated by means of the operating element 197.

On the other hand, it is also possible, however, for, for example, the color of the emitted light of the luminaire 2 to be regulated by means of the mixing faucet during the operation of the shower. That is to say that, by way of example, the color of the light emitted by the luminaire 2 can be adapted by means of the setting of the water temperature.

Figure 36:
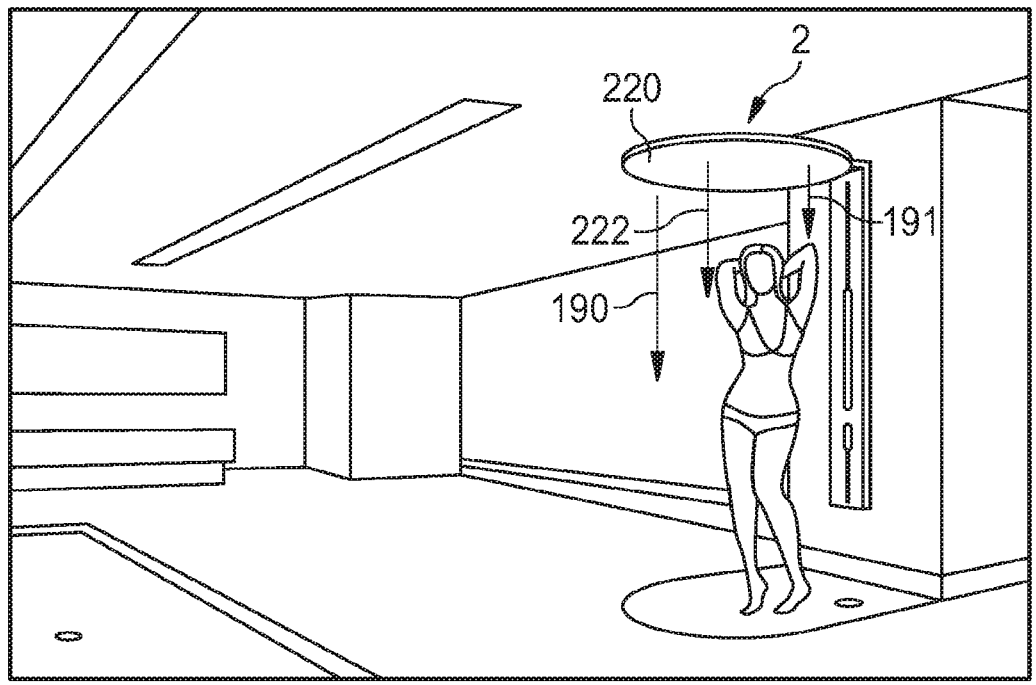
FIGS. 36, 37A, 37B, 38, 39A, 39B, 40A, 40B show, on the basis of schematic illustrations, exemplary embodiments of a luminaire described here with a shower head.

A further exemplary embodiment of a luminaire 2 described here is explained here in greater detail in conjunction with the perspectively schematic illustration in FIG. 36. In this exemplary embodiment, the luminaire 2 is accorded a double function:

Firstly, the luminaire 2 serves for general lighting. By way of example, it can constitute the main light in a bathroom.

Secondly, the luminaire 2 comprises a shower head for a shower.

That is to say that firstly the luminaire 2 emits electromagnetic radiation 190, 191, and secondly the luminaire 2 distributes water via the shower head 220. In this case, the luminaire 2 can be suitable for emitting electromagnetic radiation 190, 191 having different electromagnetic wavelengths simultaneously or successively. For this purpose, the luminaire 2 can comprise, for example, a plurality of organic light-emitting diodes 1 suitable for generating electromagnetic radiation having mutually different wavelengths. The luminaire 2 can then emit light of different colors for example simultaneously or sequentially. Furthermore, the luminaire can be suitable for emitting white light. For this purpose, the luminaire can comprise one or a plurality of organic light-emitting diodes 1 which each emit white light during operation. Furthermore, it is possible for the luminaire 2 only to emit light of a single color. For this purpose, the luminaire can comprise one or a plurality of organic light-emitting diodes 1 which each emit colored light, for example green or red light, during operation.

Figure 37A:
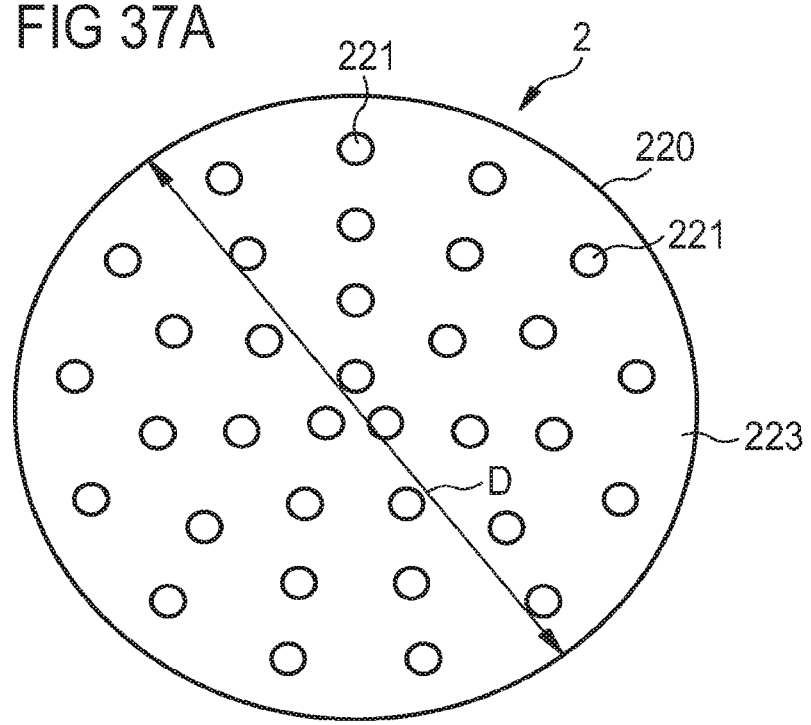
Figure 37B:
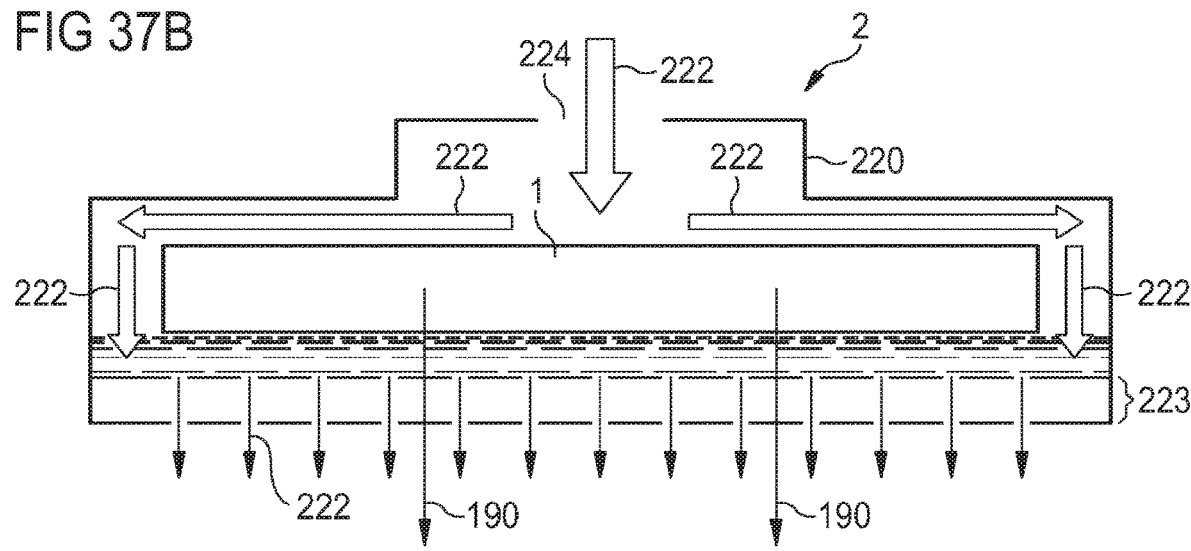

An exemplary embodiment of a luminaire 2 comprising a shower head 220 is described in greater detail in conjunction with the schematic plan view in FIG. 37A and also the schematic sectional illustration in FIG. 37B.

The luminaire 2 comprises the shower head 220. The shower head 220 can be embodied for example as circular, square or in some other shape in the plan view. The shower head 220 can be, on the one hand, the shower head of a handheld shower unit, said shower head having a diameter D of at least 5 cm and at most 20 cm. Furthermore, it is possible for the shower head 220 to be a large-area shower head having, for example, a diameter D of at least 50 cm, preferably at least 80 cm, particularly preferably at least 100 cm. Such a shower head 220 is then preferably fitted directly to the ceiling of a bathroom, for example. Water 222 from such a shower head 220 falls like rain from a relatively large height and in a manner distributed over a relatively large area onto the user of the luminaire 2.

In this exemplary embodiment, the shower head 220 comprises at least one organic light-emitting diode 1 suitable, for example, for emitting white light 190. For this purpose, the organic light-emitting diode 1 can have a layer construction as described in greater detail in conjunction with FIGS. 1 to 6. Furthermore, the organic light-emitting diode has an encapsulation as explained in greater detail in conjunction with FIGS. 7 to 20. Combinations of the layer sequences described in the figures and of the encapsulations described in the figures are also possible.

By way of example, the organic light-emitting diode 1 has a double or triple seal. Thus, the organic light-emitting diode 1 can be sealed by means of a first carrier 130, a second carrier 131 and also a connecting means 140. Furthermore, the organic light-emitting diode 1 can comprise an encapsulation layer sequence 160. Overall, a particularly good encapsulation is preferably chosen for the organic light-emitting diode 1 since the organic light-emitting diode 1 is in direct contact with water 222 at least in places. That is to say that, for example, at least one of the carriers 130, 131 is wetted with water 222 during the operation of the shower head 220 of the luminaire 2.

The luminaire 2 comprises the shower head 220, which has a passage opening 224, by which said shower head is connected to the water supply. Water 222 passes into the shower head 220 via the passage opening 224. The water 222 flows around the organic light-emitting diode 1 at the outer areas thereof and in this way passes to the cover plate 223 of the shower head. The cover plate 223 has openings 221 through which the water 220 can pass from the shower head.

In this exemplary embodiment, the cover plate 223 is in this case embodied as radiation-transmissive, for example transparent. Electromagnetic radiation 190 from the organic light-emitting diode 1 can leave the cover plate both through the openings 221 and through the other, non-water-pervious regions of the cover plate 223.

Overall, the organic light-emitting diode 1 is integrated into the shower head 220 in the exemplary embodiment in FIGS. 37A and 37B.

In conjunction with FIG. 38, a further exemplary embodiment of a luminaire 2 with shower head 220 as described here is explained in greater detail with reference to a schematic sectional illustration. In this exemplary embodiment, in contrast to the exemplary embodiment in FIGS. 37A and 37B, the organic light-emitting diode 1 is divided into segments 203. In this case, light having mutually different colors is emitted in the segments 203 during the operation of the organic light-emitting diode 1.

The segments 203 are jointly encapsulated for example by a common carrier pair 130, 131 and a connecting means 140 arranged marginally and in frame-like fashion. The segments 203 can furthermore be sealed jointly, or each segment can be sealed by itself, by means of an encapsulation layer sequence 160. The segments 203 can be individually drivable, such that light of different colors can be generated simultaneously or sequentially. Alongside the described segmentation of the organic light-emitting diode 1, however, it is also possible for the luminaire 2 to comprise a plurality of organic light-emitting diodes 1 suitable for generating light of mutually different colors.

As a further, optional difference with respect to the exemplary embodiment explained in greater detail in conjunction with FIGS. 37A and 37B, the cover plate 223 of the shower head 220 can in this case be embodied as non-radiation-transmissive. That is to say that electromagnetic radiation 190, 191 can then leave the shower head 220 only together with the water 222 through the openings 221. In this case, the water jets 222 that leave the shower head 220 can serve as a kind of optical waveguide for the electromagnetic radiation 190, 191 generated in the segments 203 of the organic light-emitting diode 1.

That is to say that, during operation, the shower head 220 can emit differently colored water jets 220 at different locations. The non-radiation-transmissive embodiment of the cover plate 223 can result in a particularly good separation of the different light colors. By way of example, with the shower head 220 it is possible in this way to produce a shower of water which is similar in appearance to a rainbow when viewed from a distance.

In conjunction with FIG. 39A, a further exemplary embodiment of a luminaire 2 described here is explained in greater detail with reference to a schematic sectional illustration. FIG. 39B shows a schematic plan view of the luminaire 2 from that side of the shower head 220 which faces away from the openings 221.

In this exemplary embodiment, the organic light-emitting diode 1 is provided with the passage opening 224, which is arranged for example at a central location through the organic light-emitting diode 1. That is to say that the organic light-emitting diode has a hole through which water is flushed during the operation of the shower head 220 of the luminaire 2.

At the edges 224a of the passage opening 224, the organic light-emitting diode 1 can be sealed for example by means of a glass solder or a glass frit as connecting means 140. Furthermore, the connecting means 140 can be provided with an encapsulation layer sequence 160, which additionally seals the connecting means. Such a construction is explained in greater detail by way of example in conjunction with FIGS. 14B and 18.

The functional layers 180 of the organic light-emitting diode 1 can additionally once again be sealed by an encapsulation layer sequence 160, a diffusion barrier 153, a thin-film encapsulation 154, a resist layer 150 or further measures.

Water 222 passes through the passage opening 224 into a gap arranged between the cover plate 223 of the shower head 220 and the organic light-emitting diode 1. The cover plate 223 once again comprises openings 221 through which the water 220 can pass. In this case, the cover plate 223 can be embodied as radiation-transmissive, then transparent for example, or non-radiation-transmissive. The organic light-emitting diode 1 can emit white light, colored light or light of different colors—as explained for example in conjunction with FIG. 38.

Figure 38:
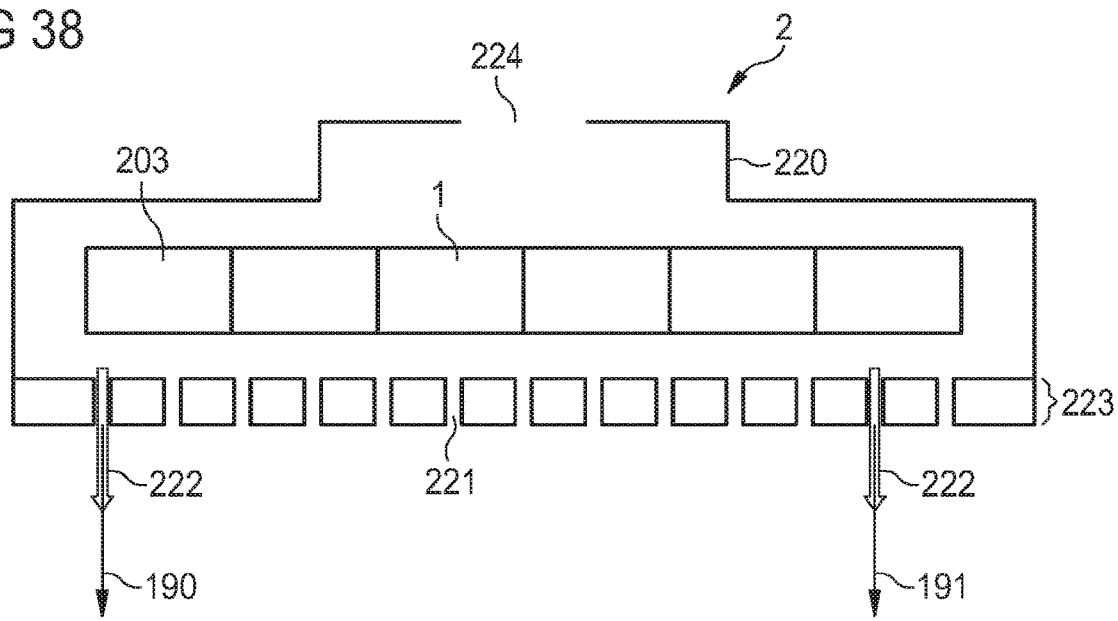
Figure 39A:
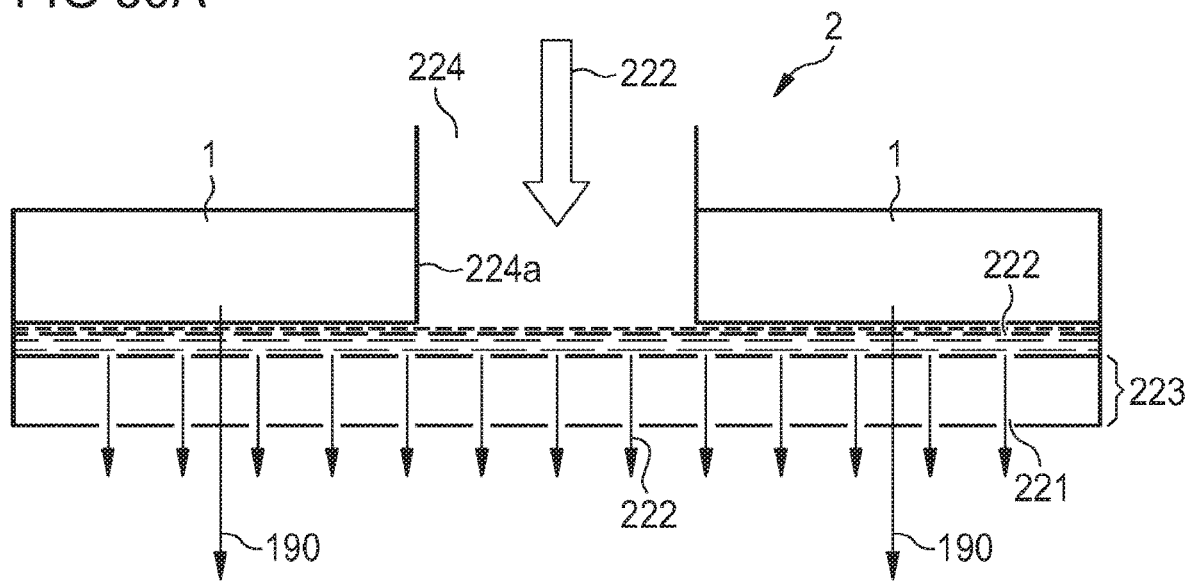
Figure 39B:
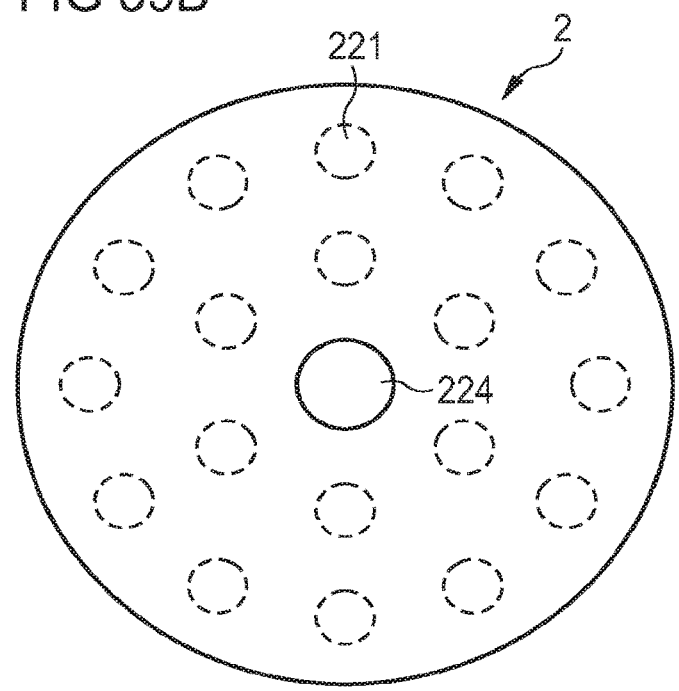

In comparison with the exemplary embodiment in FIGS. 37 and 38, in the exemplary embodiment of FIG. 39, only the underside—facing the cover plate 223—of the organic light-emitting diode 1 and also the side areas of the organic light-emitting diode 1 in the region of the edge 224 of the passage opening are directly exposed to the water 222. On the other hand, in order to encapsulate the organic light-emitting diode 1, special carriers 130, 131 having a passage opening 224 have to be provided. This can make it more expensive to produce the luminaire 2 as explained in conjunction with FIGS. 39A and 39B.

In conjunction with FIGS. 40A and 40B, the driving of the luminaire 2 is explained in greater detail with reference to schematic illustrations.

Figure 40A:
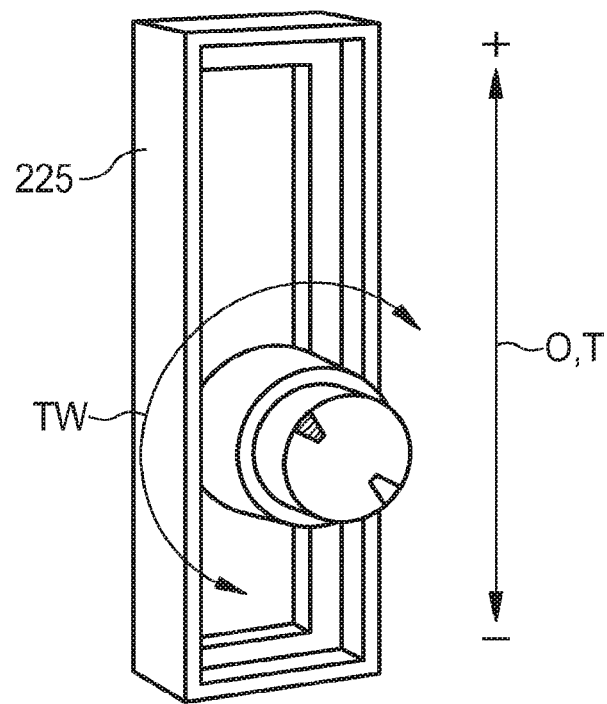

FIG. 40A schematically shows a mixing faucet which can be used to set the water temperature TW by means of a rotary movement of the faucet 22*a*. In this case, it is possible for the color, that is to say the color locus O and/or the color temperature T, of the light emitted by the organic light-emitting diode 1 simultaneously to be set by way of the water temperature TW. Furthermore, it is possible for the setting of the color locus O and/or of the color temperature T to be effected by means of a translational movement of the mixing faucet. Overall, the mixing faucet 225 described in conjunction with FIG. 40A is therefore used in exemplary embodiments of the luminaire 2 in which the color locus and the color temperature of the light generated by the organic light-emitting diode 1 can also be set by means of the mixing faucet of the shower.

Furthermore, it is also possible for the shower head 1 to be driven by means of touch-sensitive operating elements 197 as explained in greater detail for example in conjunction with FIG. 35. Said operating elements can be integrated as touch-sensitive organic light-emitting diodes, for example, into a wall tile, a tile or into a shower cubicle. In particular, the luminaire 2 with shower head 220 can also be combined with the luminaire 2 embodied as part of a shower cubicle 215. That is to say that the exemplary embodiments described in conjunction with FIGS. 33 to 35 can be combined with a luminaire 2 in accordance with the exemplary embodiments in FIGS. 36 to 40 in one and the same shower.

Figure 40B:
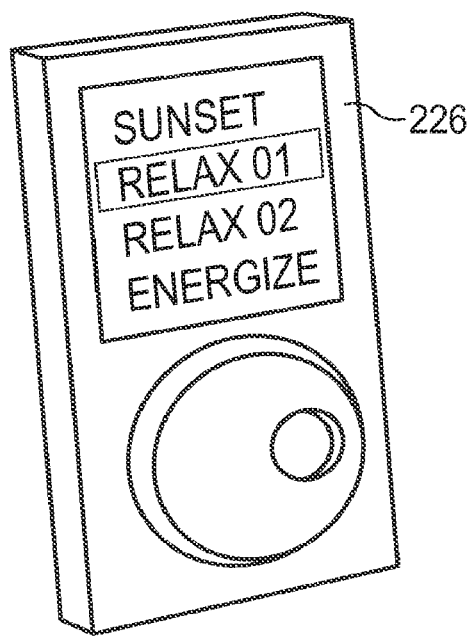

FIG. 40B shows, on the basis of a schematic illustration, a further possibility for driving the luminaire 2 as explained in greater detail in conjunction with FIGS. 36 to 39. By way of example in a manner supplementing a mixing faucet 225, for driving purposes it is possible to use the regulating device 226, by means of which a specific shower program can be preset. By way of example, a temporal profile of the water temperature and also of the light emitted by the luminaire 2 can be preset by means of the shower program.

In this case, a luminaire 2 with shower head 220 and at the same time a luminaire 2 with a shower cubicle 215 can be driven. In this case, water temperature, pressure of the water jet, color temperature and/or color locus can be changed in a manner coordinated with one another by the regulating device 226 in temporal succession. By way of example, in this case a simulated sunrise as described in conjunction with FIGS. 32H and 32I, can be simulated by the luminaire 2, wherein at the same time for example the water temperature is increased or decreased continuously or in steps.

A further exemplary embodiment of a luminaire 2 described here is explained in greater detail in conjunction with the schematic illustrations in FIGS. 41A to 41D. In this exemplary embodiment, the luminaire 2 comprises the functions of a mirror, a light for general lighting and also a display device for simple graphical elements.

Figure 41A:
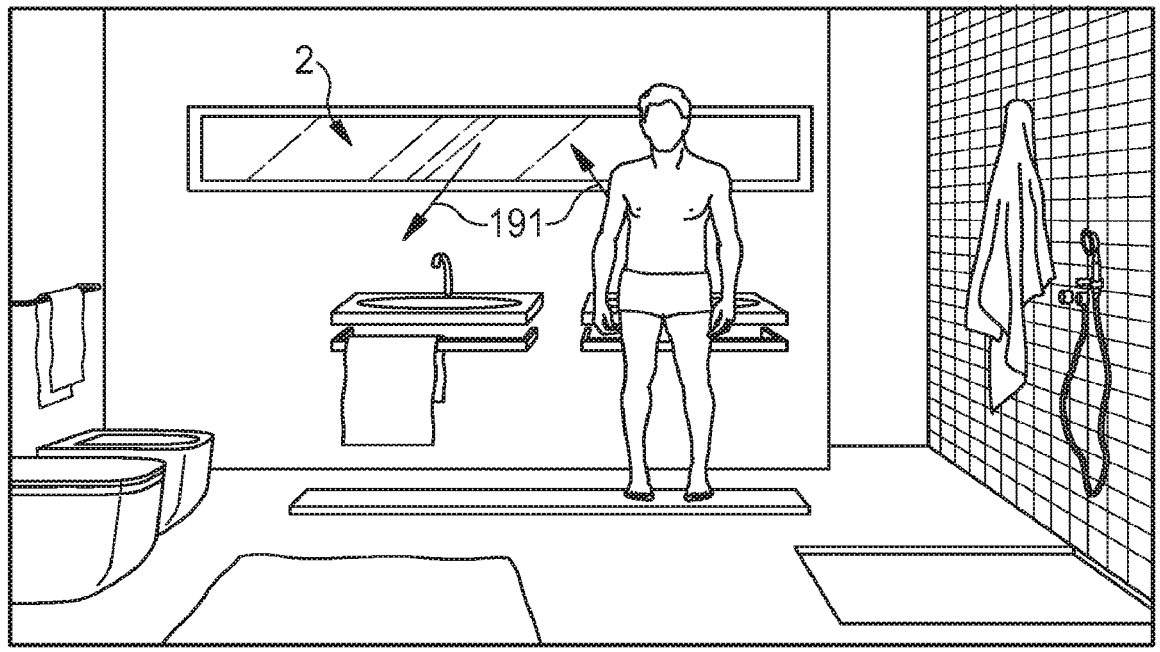
FIGS. 41A to 41D and 42A to 42C show, on the basis of schematic illustrations, one exemplary embodiment of a luminaire described here which can be utilized as a mirror.

In this case, FIG. 41A shows a first operating state of the luminaire 2. In this operating state, the luminaire 2 is not actively radiation-generating. The luminaire 2 appears like a normal mirror that reflects back electromagnetic radiation 191 impinging on it. Such a luminaire 2 can be used for example as a bathroom mirror or wardrobe mirror.

Figure 41B:
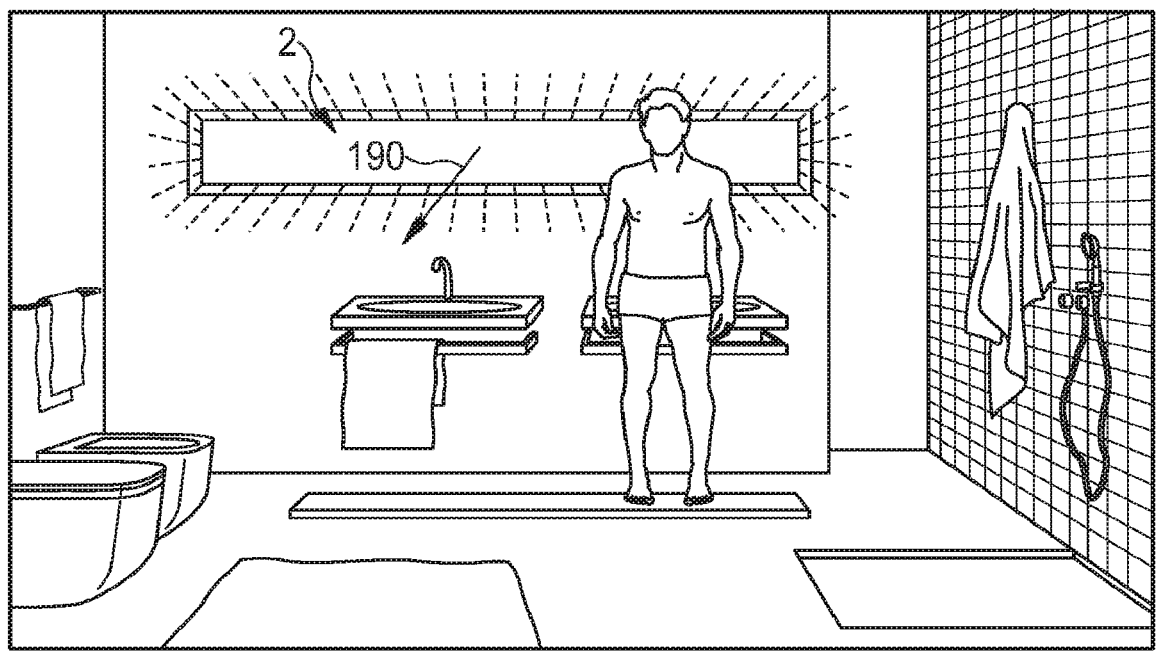

A second operating state of the luminaire 2 is illustrated graphically in conjunction with FIG. 41B. In this operating state, the luminaire 2 serves as a light for general lighting. In this operating state, the luminaire 2 principally emits electromagnetic radiation 190 that is generated for example by an organic light-emitting diode 1 of the luminaire 2 during the operation of the luminaire. The luminaire 2 does not serve as a mirror in this operating state. That is to say that electromagnetic radiation 191 impinging on the luminaire 2 externally is in this case outshone by the generated electromagnetic radiation 190.

Figure 41C:
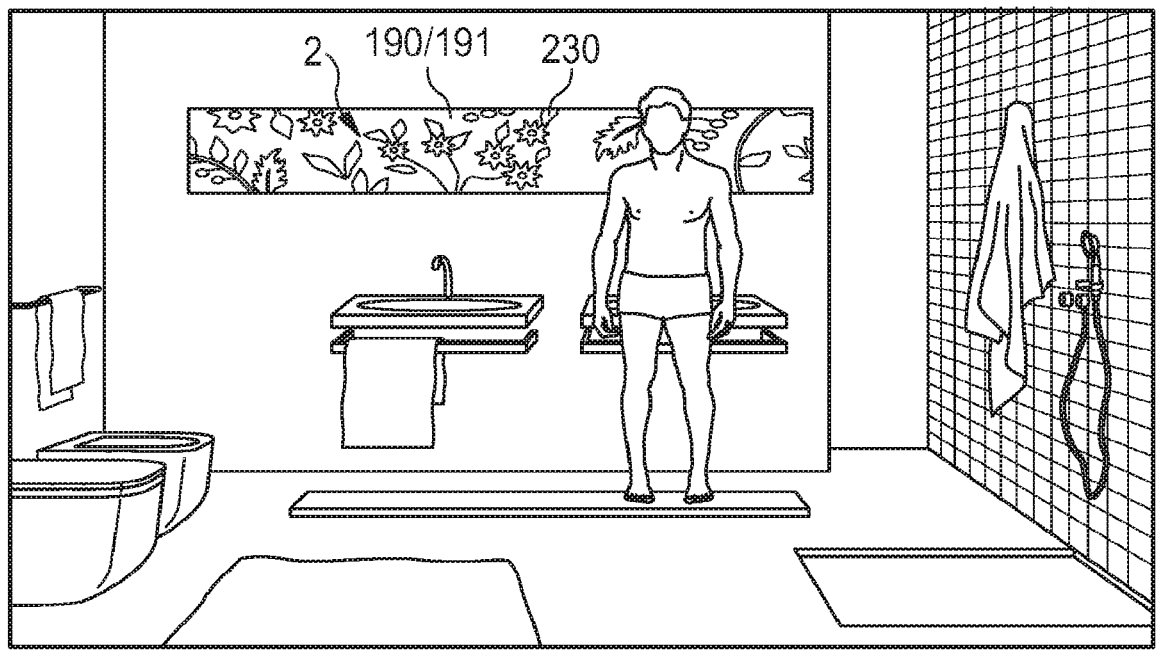

A third operating state of the luminaire 2 is illustrated schematically in conjunction with FIG. 41C. In this operating state, patterns 230 are represented by the luminaire 2. Furthermore, the luminaire 2 can reflect impinging electromagnetic radiation 191 and/or actively emit electromagnetic radiation 190. The fact of whether the luminaire 2 has recognizable reflective properties, that is to say whether electromagnetic radiation 191 that impinges on the luminaire 2 is reflected by the latter in a manner perceptible to the user, is dependent on the light intensity with which electromagnetic radiation 190 is actively generated by the luminaire 2. The light intensity of the electromagnetic radiation 190 that is actively generated by the luminaire 2 can be set for example by means of the current intensity with which the luminaire 2 is energized.

Figure 41D:
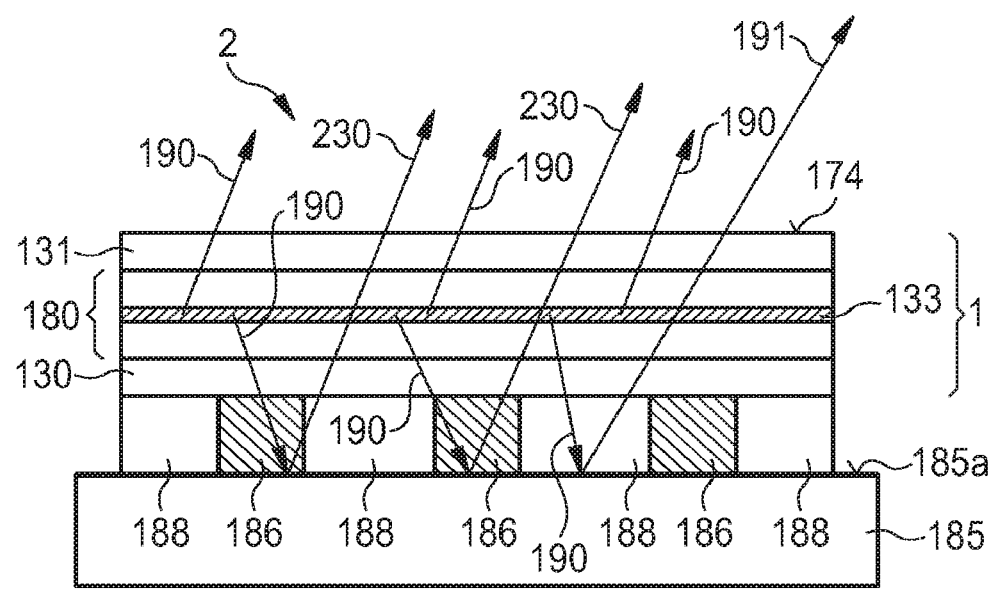

In conjunction with FIG. 41D, an exemplary embodiment of a luminaire 2 which has the operating states described in conjunction with FIGS. 41A to 41C is explained in greater detail with reference to a schematic sectional illustration. In this case, the construction of the luminaire 2 is similar to the construction of the organic light-emitting diode 1 explained in greater detail in conjunction with FIG. 27.

In this case, the luminaire 2 comprises a transparent organic light-emitting diode 1. The transparent organic light-emitting diode 1 can comprise functional layers 180 arranged between a first carrier 130 and a second carrier 131. Preferably, the organic light-emitting diode 1 comprises a radiation-emitting region 104 suitable for generating white light. The organic light-emitting diode 1 emits electromagnetic radiation 190 from its two main areas.

Any exemplary embodiment and also any combination of exemplary embodiments described in conjunction with FIGS. 1 to 6 can be used for forming the organic layer sequence 133. Preferably, embodiments as described in conjunction with FIGS. 7 to 20 or combinations of said embodiments are used for encapsulating and hermetically sealing the organic light-emitting diode 1. All that is important in the exemplary embodiment of the luminaire 2 in FIG. 41D is that the organic light-emitting diode 1 is embodied in transparent fashion.

The luminaire 2 furthermore comprises an area 185a to be illuminated of an element 185 to be illuminated. The element 185 to be illuminated is a mirror, and the area 185a to be illuminated constitutes the reflective surface of the mirror.

An electrically switchable optical element 186 is arranged in a structured manner between the organic light-emitting diode 1, that is to say between the first carrier 130 and the illuminating surface 185a. In the present case, the electrically switchable optical element 186 forms the pattern 230 to be represented. However, it is also possible for the electrically switchable optical element 186 to be a negative image of the pattern 230 to be represented. A transparent material 188 formed from a transparent plastic or glass, for example, is arranged at locations where no electrically switchable optical element 186 is situated between element 185 to be illuminated and first carrier 130. That is to say that the space between the organic light-emitting diode 1 and the area 185a to be illuminated is filled with the transparent material 188 and the electrically switchable optical element 186.

The electrically switchable optical element 186, then, has two operating states, for example: in a first operating state, the electrically switchable optical element 186 is transparent. In this operating state, the luminaire 2 can, as shown in FIG. 41A, be operated as a mirror or, as illustrated in FIG. 41B, be operated as a light, no pattern 230 being discernible.

On the other hand, the electrically switchable optical element 186 has at least one second operating state in which, for electromagnetic radiation 190 generated by the luminaire, said electrically switchable optical element is either absorbent, attenuating or acts as a color filter. In this way, in this operating state, a pattern 230 can be generated by illumination of the structured, electrically switchable optical element 186.

Depending on the embodiment of the electrically switchable optical element 186, the pattern can appear dark—for example black—or colored. The electrically switchable optical element 186 is an electrochromic element, for example, such as is also used in electrically tintable glass panes.

As already described in conjunction with FIGS. 26 and 27, the proportion of the electromagnetic radiation 190 which passes directly from the luminaire toward the outside without in the process previously reaching the area 185a to be illuminated can be set by means of an optical cavity. In this way, the manufacturer of the luminaire 2 can preset the contrast with which the pattern 230 is intended to appear in the third operating state.

Figure 42A:
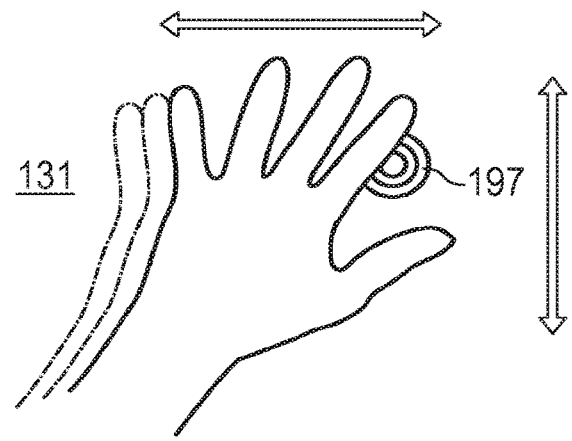
Figure 42B:
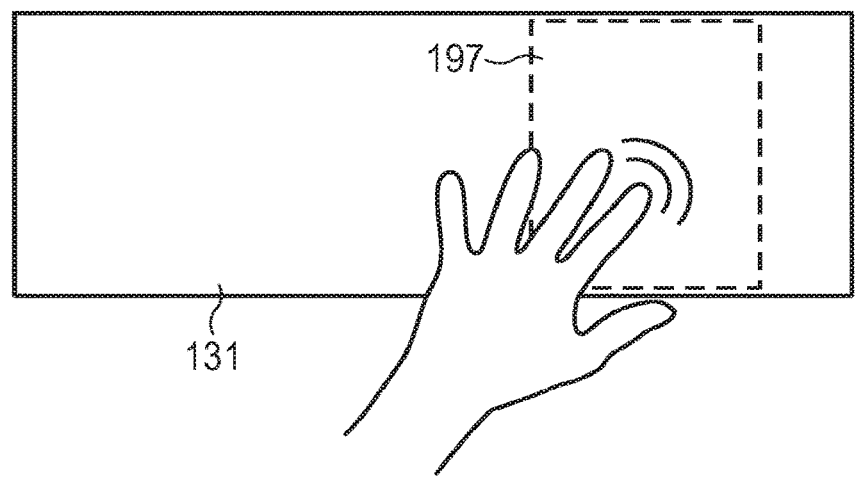
Figure 42C:
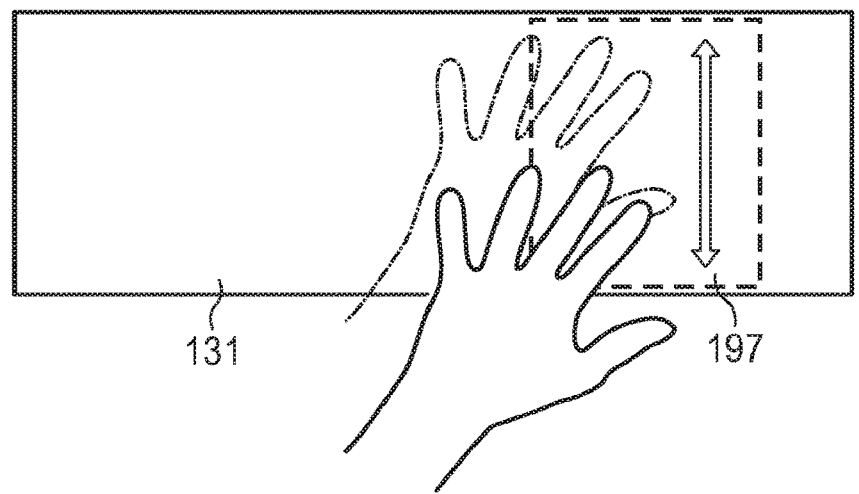

In conjunction with FIGS. 42A to 42C, an explanation is given, on the basis of schematic illustrations, of the fact that the luminaire 2 can be operated with a touch-sensitive operating element 197. By way of example, by means of translational movements of the hand on a region of the second carrier 131 of the organic light-emitting diode 1, it is possible to change the operating state or to increase or decrease the brightness of the emitted light (see FIGS. 42A and 42C).

By means of tapping, as illustrated schematically in FIG. 42B, on the operating element 197, it is possible, for example, for the luminous function to be switched off and on, that is to say for switching between the first and second operating states to be effected. Overall, a touch-sensitive organic light-emitting diode 1 as explained in greater detail in conjunction with FIG. 31 can again be used for forming the operating element 197.

As an alternative to a touch-sensitive control of the luminaire 2, however, it is also possible for gesture control of the luminaire 2 to be effected. In this case, the user of the luminaire 2 does not have to touch the radiation exit area 174 of the luminaire. Rather, a camera is fixed to or in the vicinity of the luminaire 2. By means of an evaluation circuit, a specific command—for example a change of operating state—can be calculated from images recorded by the camera. This construction—which is more complicated in comparison with touch control—affords the advantage that the radiation exit area 174 is not smeared, for example by fingerprints of the user.

Figure 43:
FIGS. 43 and 44A, 44B show, on the basis of schematic illustrations, one exemplary embodiment of a luminaire described here which can be utilized as a tile.

A further exemplary embodiment of a luminaire described here is explained in greater detail in conjunction with the schematic illustrations in FIGS. 43 and 44. In this exemplary embodiment, the luminaire 2 is part of a tile 235.

As illustrated schematically in conjunction with FIG. 43, the luminaire 2 can be used both as a wall tile and as a floor tile.

Figure 44A:
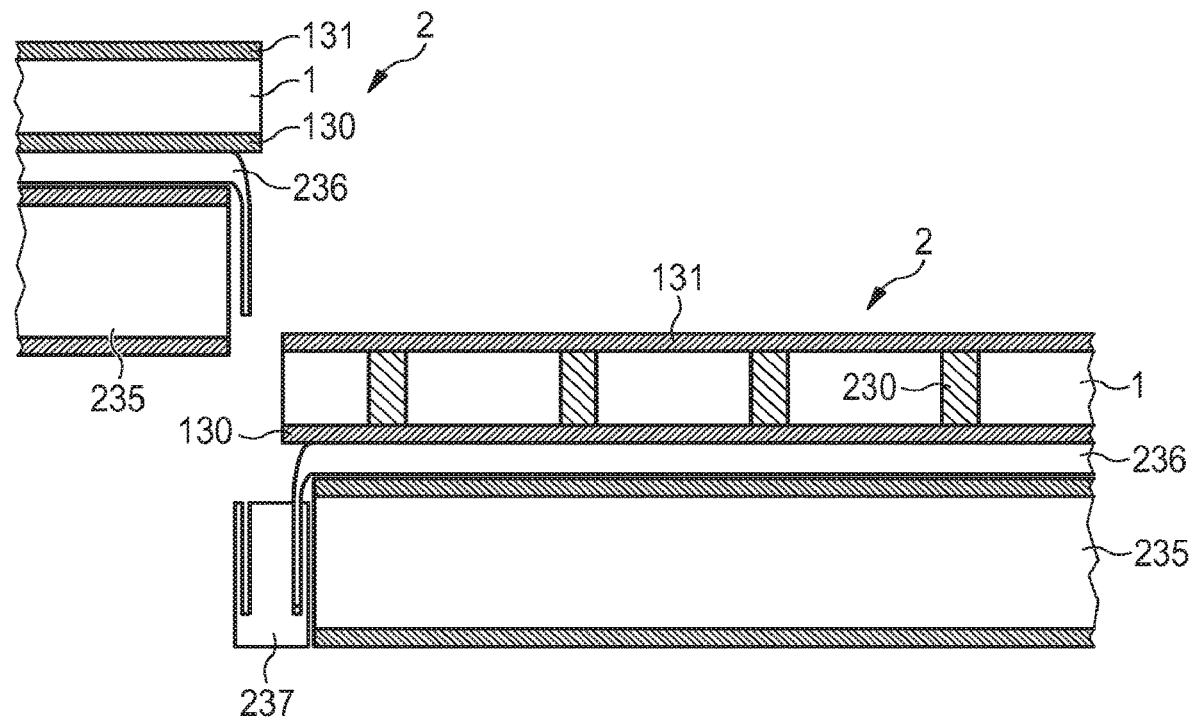
Figure 44B:
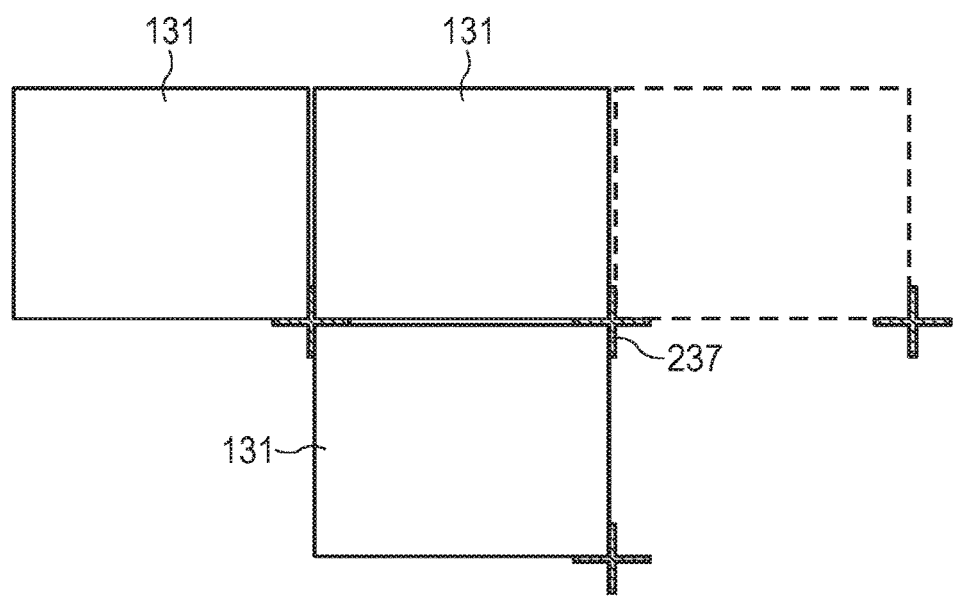

An exemplary embodiment of such a luminaire is schematically explained in greater detail in conjunction with FIGS. 44A and 44B. The luminaire comprises an organic light-emitting diode 1, which is preferably embodied in non-slip fashion. For this purpose, the first carrier 130 and the second carrier 131 of the organic light-emitting diode 1 can be formed from a shatter-resistant glass. Spacers 238 are arranged at regular distance between the carriers 130, 131, which spacers can, for example, likewise be formed from a glass material. Thus, the spacers 238 can be, for example, posts or dams which are formed with a glass solder or a glass frit material. In this case, the spacers 238 prevent the second carrier 131 from being pressed onto the functional layers 180 of the organic light-emitting diode 1.

The organic light-emitting diode 1 is preferably embodied as a transparent organic light-emitting diode. The organic light-emitting diode can be provided, for example, as described in conjunction with FIGS. 26 and 27, for illuminating the tile 235. In this case, the connection conductors 236 for making electrical contact with the organic light-emitting diode 1 are arranged at the edge side of the organic light-emitting diode 1, where joints of the tiles 235 extend. In this way, the connection conductors 236 do not disturb the visual impression of the tiles.

As is illustrated schematically in FIGS. 44A and 44B, adjacent luminaires 2 can be electrically connected to one another via electrical connectors 237 and in this way be connected in series or in parallel with one another, for example. However, it is also possible for each of the luminaires 2 to be individually drivable. Electrical connecting conductors for driving the luminaires 2 extend below the tiles 235, for example.

Besides or in addition to the generation of white light or colored light, the organic light-emitting diode 1 of the luminaire 2 can also be designed for generating infrared radiation. By way of example, an organic light-emitting diode 1 as explained in greater detail in conjunction with FIGS. 1 to 6 can be used for this purpose. A luminaire 2 comprising such an organic light-emitting diode 1 generates heat during the operation of the organic light-emitting diode 1, and can thus be used as an alternative to a wall or floor heating system.

In a simple embodiment of the luminaire 2 described in conjunction with FIGS. 43 and 44, the organic light-emitting diode 1 can be a transparent organic light-emitting diode 1 that is adhesively bonded in a simple manner onto a wall, ceiling or floor tile that has already been laid. Such an organic light-emitting diode 1 can be embodied in flexible fashion, for example, and can be fixable on a tile 235 in the manner of a transfer. By way of example, the functional layers are sealed with an encapsulation layer sequence 160 as described further above. The organic light-emitting diode 1 can then be adhesively bonded onto the tile 235 in particular at the outer area of the encapsulation layer sequence 160. In this way, the luminaire can be used in a simple and cost-effective manner for tiles that have already been laid.

Besides energization of the luminaire 2 via connection conductors 236, inductive or capacitive driving of the luminaire 2 is also conceivable, for example. In this case, the connection conductors 236 can be dispensed with; the energization can be effected by means of a transmitter of electromagnetic radiation, for example. What can disadvantageously arise in this case is that the luminous intensity of the luminaire 2 is reduced by comparison with a luminaire 2 energized by means of electrical connection conductors 236.

Figure 45A:
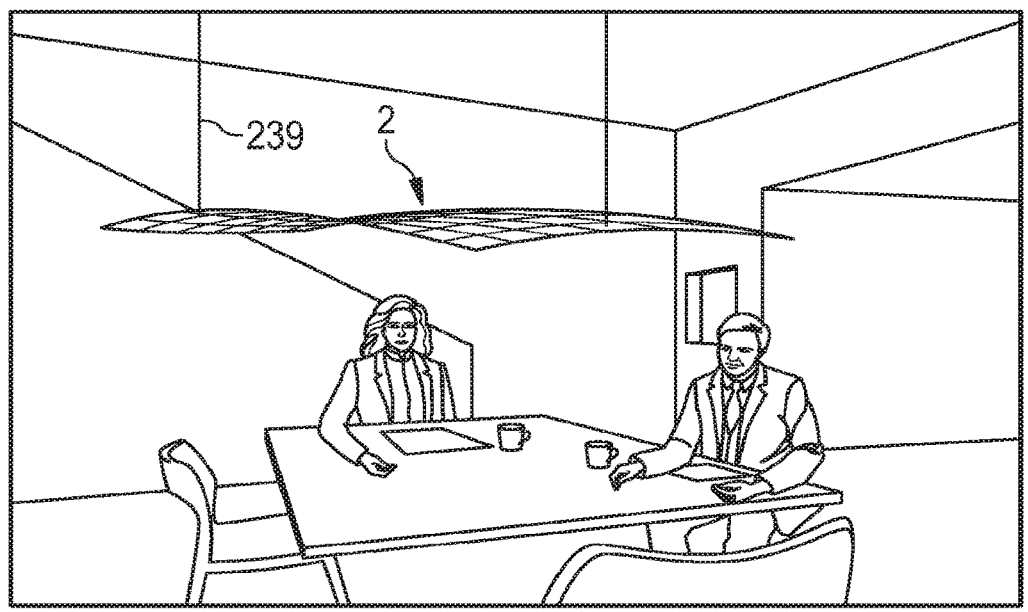

FIG. 45A shows an exemplary embodiment of a luminaire 2 described here on the basis of a schematic perspective illustration. The luminaire 2 is a large-area, segmented luminaire 2.

The luminaire 2 is fixed to the ceiling of a room in the manner of a ceiling light by means of holding devices 239. The holding devices 239 are, for example, power cables, metal wires or rods containing an electrically conductive material. The holding devices 239 are used to effect—besides mechanical fixing of the luminaire 2—also electrical contact-connection and thus energization of the luminaire 2.

Figure 45B:
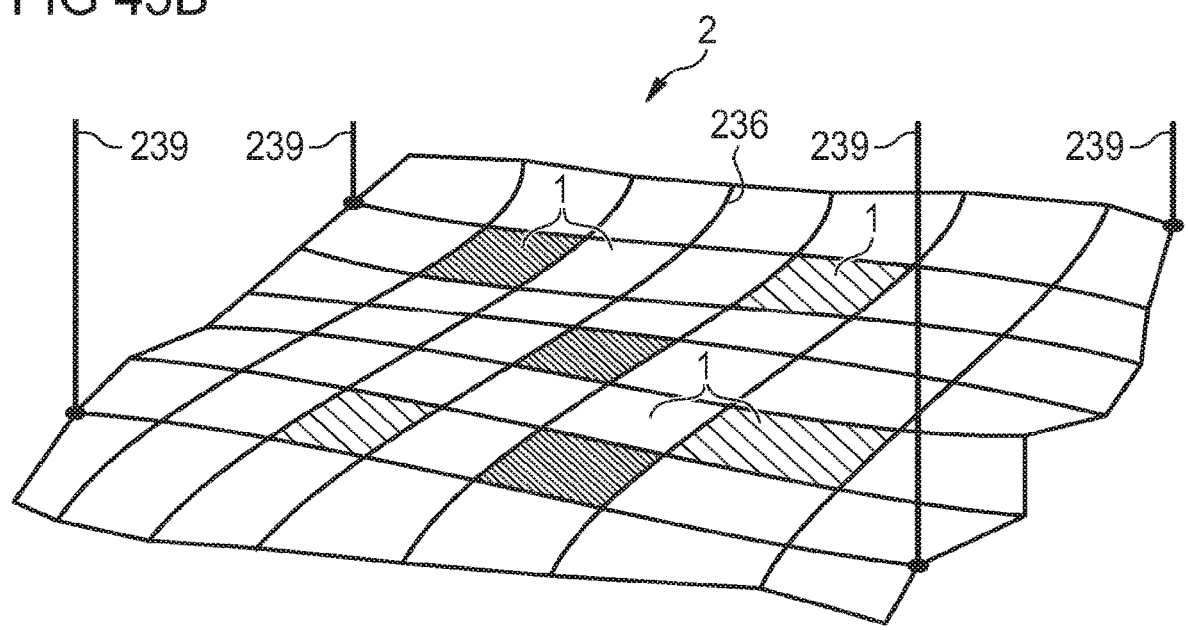

As is evident in particular from the schematic illustration in FIG. 45B, the luminaire 2 comprises a multiplicity of organic light-emitting diodes 1. That is to say that the luminaire 2 is segmented into a multiplicity of organic light-emitting diodes 1. The organic light-emitting diodes 1 can be embodied in flexible or rigid fashion, for example.

Different organic light-emitting diodes 1 of the luminaire 2 can be provided for generating light of different colors. In this way, the luminaire 2 is suitable for emitting light of different colors and/or different color temperatures during operation. The light emitted by the luminaire 2 can thus be flexibly adapted to the requirements of its use. By way of example, the luminaire 2 can generate light similar to daylight, which is particularly well suited to work. Furthermore, it is possible for reddish light to be generated by means of the same luminaire 2 at another time, said reddish light being particularly well suited as evening lighting, for example.

The organic light-emitting diodes 1 are preferably embodied as described in conjunction with FIGS. 1 to 31, or constitute combinations of the organic light-emitting diodes 1 described there.

Besides the organic light-emitting diodes 1, the luminaire 2 comprises connection conductors 236. The connection conductors 236 extend, for example, in the manner of a wire-netting fence, such that they delimit—for example rectangular-sections, in each of which an organic light-emitting diode 1 can be arranged. The connection conductors 236 serve for making electrical contact with the organic light-emitting diodes 1 and also for mechanically connecting the individual organic light-emitting diodes 1. In this way, the organic light-emitting diodes 1 can be arranged in a combined series and parallel circuit.

Furthermore, it is possible for each of the organic light-emitting diodes 1, or groups of the organic light-emitting diodes 1 which are provided for generating the same light color, to be drivable separately by means of the connection conductors 236. In this case, the connection conductors 236 are embodied for example as cable assemblies having a multiplicity of individual power lines.

Besides their property for energizing the organic light-emitting diodes 1, the connection conductors 236 form a framework or a matrix for mechanically fixing the organic light-emitting diodes 1. For this purpose, the connection conductors 236 preferably have a certain rigidity corresponding, for example, to the rigidity of a copper wire. The organic light-emitting diodes 1 themselves can be embodied in flexible fashion, and do not have to serve for mechanically stabilizing the luminaire 2. If the connection conductors 236 are embodied as metal wires, then it is furthermore possible that a desired form of the luminaire 2, for example the wavy form illustrated in FIG. 45A, can be set in a simple manner by the user or by the manufacturer of the luminaire 2 by means of flexure of the connection conductors 236.

The luminaire 2 described in conjunction with FIGS. 45 and 46 is preferably a relatively large-area luminaire. That is to say that the luminaire 2 can have sizes in the range of a plurality of square meters. By way of example the luminaire 2 has a luminous area of at least 0.5 m$^2$, preferably at least 1 m$^2$. The luminous area is in this case formed by the sum of the radiation exit areas 174 of the individual organic light-emitting diodes 1. In this case, each individual organic light-emitting diode 1 preferably has an area content of its radiation exit area 174 of at least 0.5 dm$^2$.

In conjunction with the schematic illustration in FIG. 45C it is shown that an insulator 240 is arranged at crossover points of the connection conductors 236, said insulator electrically insulating the connection conductors 236 from one another. By way of example, the connection conductors 236 extending from left to right in FIG. 45B are at negative electrical potential. The connection conductors 236 extending from the bottom to the top in FIG. 45B are then at positive potential. An insulator 240 at least in the region of the crossover points of the connection conductors 236 prevents the connection conductors 236 from being short-circuited.

Figure 46A:
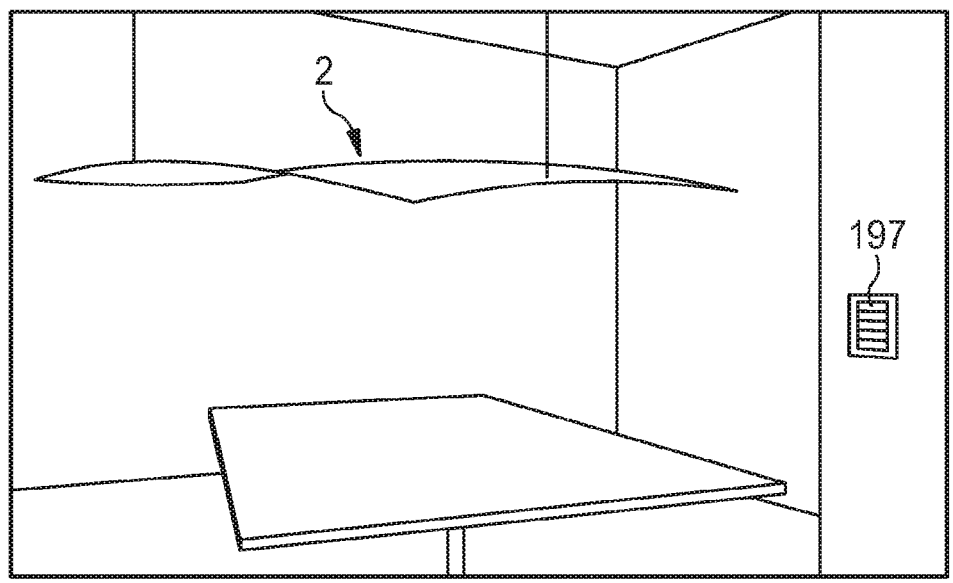
Figure 46B:
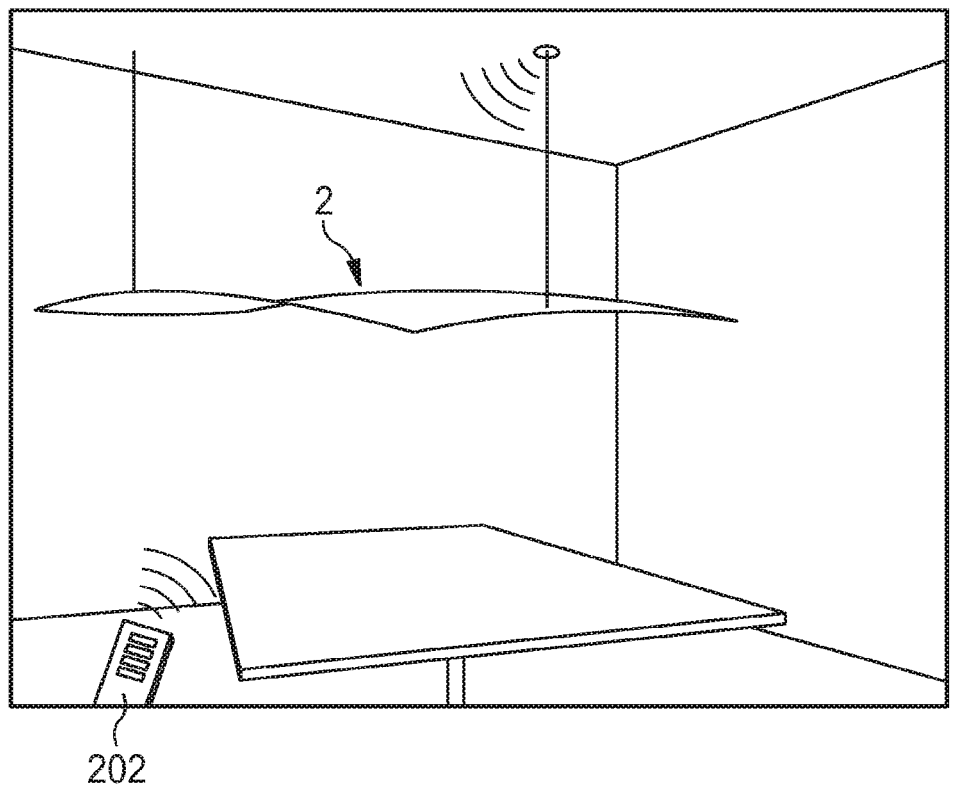

Two alternative possibilities for driving the luminaire 2 are briefly explained in conjunction with the schematic illustrations in FIGS. 46A and 46B. Thus, the luminaire 2 can be driven for example by means of an operating element 197 arranged at a wall (cf. FIG. 46A). Alternatively or additionally, it is possible for the luminaire 2 to be operated by means of a remote control 202 (cf. FIG. 46B). Furthermore, it is possible for the luminaire 2 to be drivable by means of a touch sensor or gesture control.

Figure 47A:
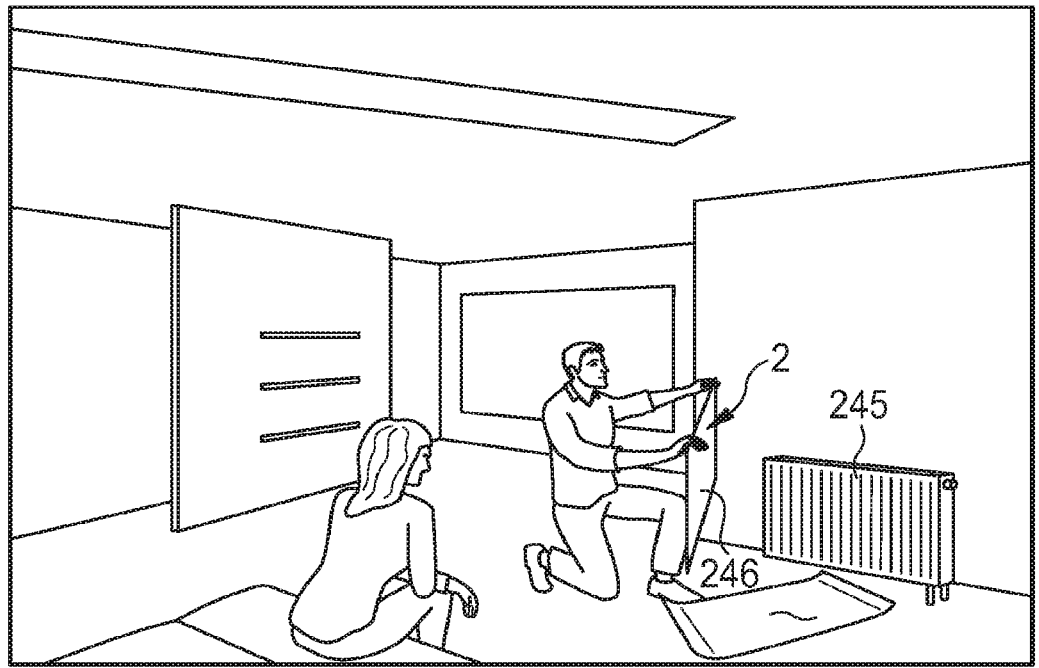
Figure 47B:
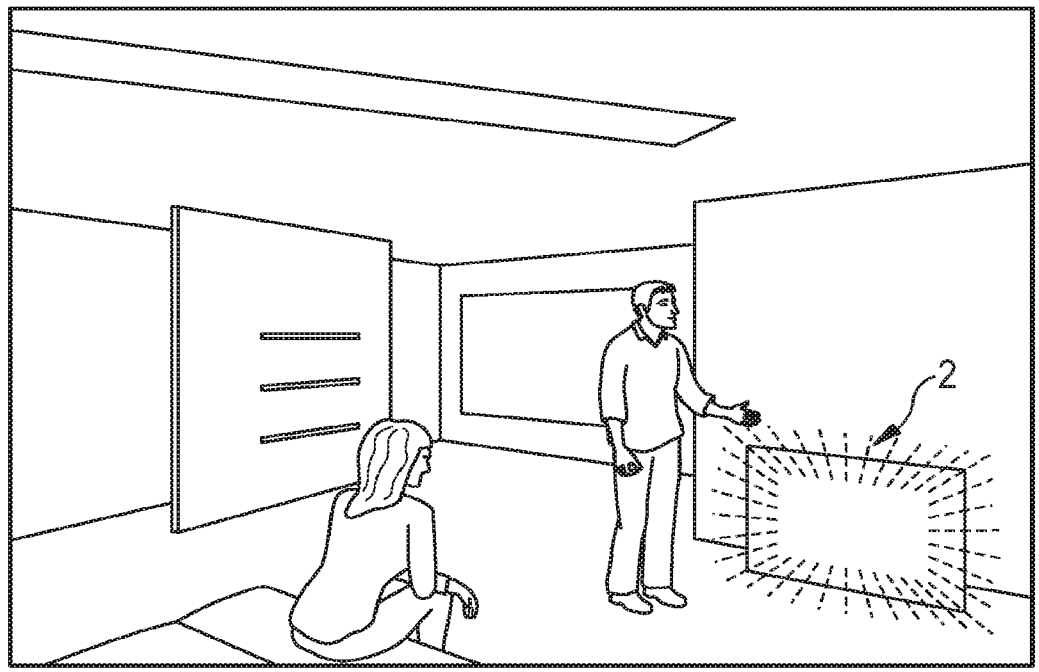
Figure 47C:
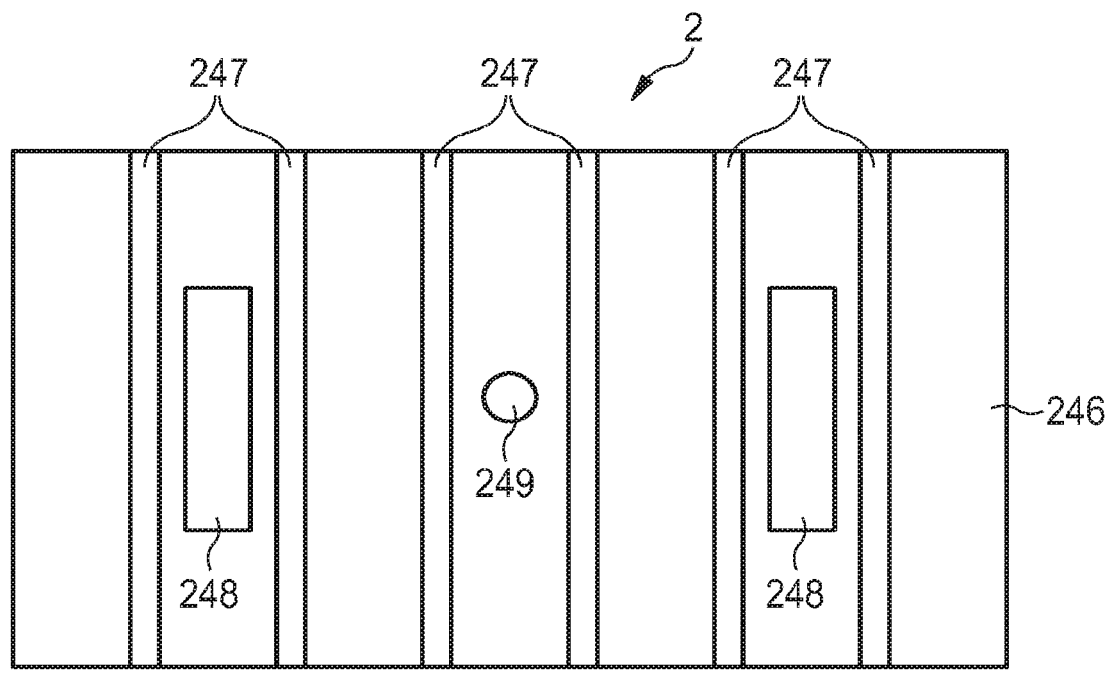
Figure 47D:
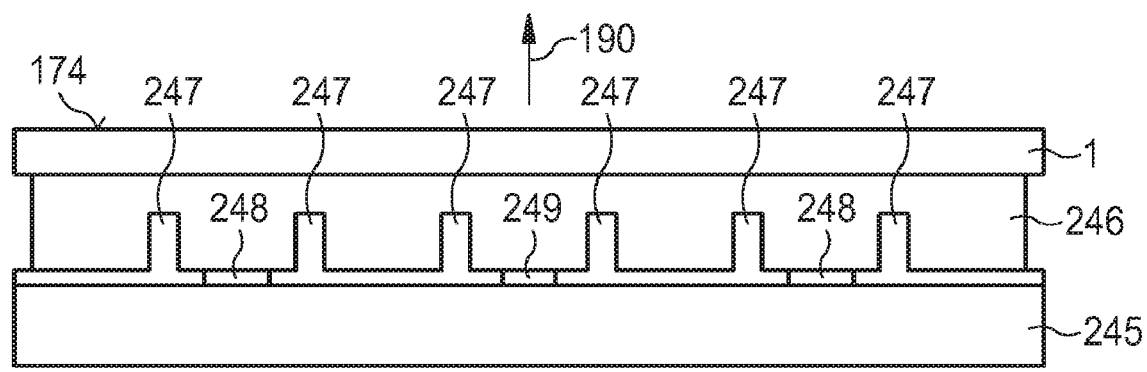
Figure 48:
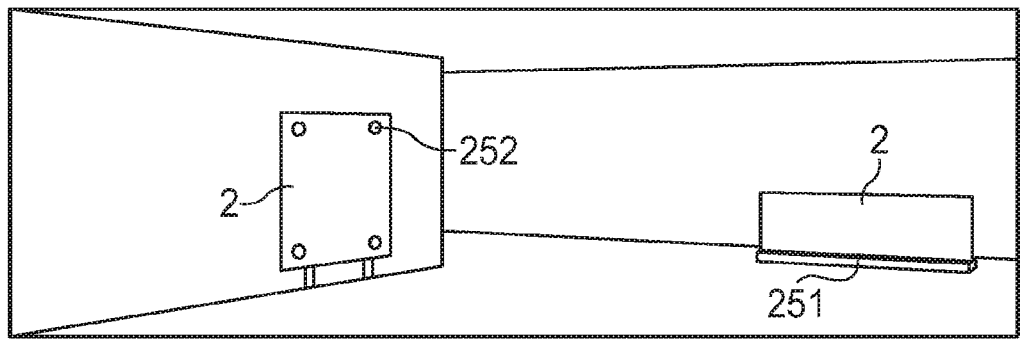

An exemplary embodiment of a luminaire 2 described here which serves for covering an object is explained in greater detail in conjunction with the schematic illustrations in FIGS. 47 to 49. By way of example, the luminaire 2 serves for covering the radiator 245.

A radiator 245 generally has a non-smooth surface, for example a surface having heating lamellae, in which dust can settle particularly easily. The dust-sensitive regions of the radiator 245 can be clad with the luminaire 2 that can be used for covering the radiator. Furthermore, the luminaire 2 enhances the visual impression of the radiator 245. The visible exterior area of the radiator 245 is replaced by the luminaire 2, which can serve as a light for the general lighting of the room in which the radiator is arranged.

The mounting of the luminaire 2 on the radiator 245 in accordance with an exemplary embodiment of the luminaire 2 that can serve for covering is explained in further detail in conjunction with FIGS. 47A and 47B. FIG. 47C shows, on the basis of a schematic view, a rear wall 246 of the luminaire 2, said rear wall facing the radiator 245 when the luminaire 2 is in the mounted state. The rear wall 246 is pervaded by a plurality of cooling channels 247, for example, which can extend along the entire width of the rear wall 246.

As is evident from the schematic plan view of the top side of the radiator 245 with luminaire 2 in FIG. 47D, the cooling channels 247 are embodied as indentations in the rear wall 246 of the luminaire 2. That is to say the thickness of the rear wall 246 is reduced in the region of the cooling channels 247.

If the radiator 245 is operated, then, along the cooling channels 247 convection of air takes place, which upon flowing through the cooling channels 247 cools the rear wall 246 of the luminaire 1. In this way, the organic light-emitting diode 1 is also cooled during operation, such that no permissible heating of the organic light-emitting diode 1 can arise. In addition, the rear wall 246 and the organic light-emitting diode 1 of the luminaire 2 can be thermally insulated from one another by a thermal insulation layer (not illustrated). The thermal insulation layer can be formed for example with a material having poor thermal conductivity, such as styropor.

Alongside the cooling channels 247, fixing means 248 are provided at the rear wall 246. The fixing means 248 are, in a simple exemplary embodiment, adhesive strips by means of which the luminaire 2 can be fixed to the radiator 245.

However, it is also possible for the fixing means 248 to be magnets, such that the luminaire 2 adheres to the radiator 245 by means of magnetic forces. Other types of fixtures such as screwing or clamping, for example, are also possible.

Furthermore, a temperature sensor 249 is arranged at the rear wall 246 of the luminaire 2. The temperature of the radiator 245 is measured by means of the temperature sensor 249. Depending on the measured temperature, it is possible to set, for example, the light intensity and/or the light locus and/or the light temperature of the light emitted by the luminaire 2, that is to say by the organic light-emitting diode 1. That means that there is a correlation between the temperature of the radiator 245 and the electromagnetic radiation 190 emitted by the luminaire 2 through the radiation exit area 174 of the organic light-emitting diode 1. In this way, therefore, the luminaire 2 also serves as a temperature indicator for the heat generated by the radiator 245 during operation.

Further exemplary embodiments of the luminaire 2 that serves for cladding a heating system are explained in greater detail in conjunction with the schematic perspective illustration in FIG. 48. In these cases, the luminaire 2 is arranged in front of a radiator 245 for example by means of a stand 251 or a screw connection 252, such that said radiator is covered by the respective luminaire 2. In these cases, there is not necessarily a connection composed of condensed matter between the radiator and the luminaire 2. Therefore, the luminaire 2 can be arranged at a distance from the radiator 245, wherein the gap between radiator 245 and luminaire 2 is filled with air. In such a case, by way of example, the cooling channels 249 described in conjunction with FIGS. 47A to 47D can be dispensed with since sufficient cooling by means of convection takes place via the gap.

Figure 49A:
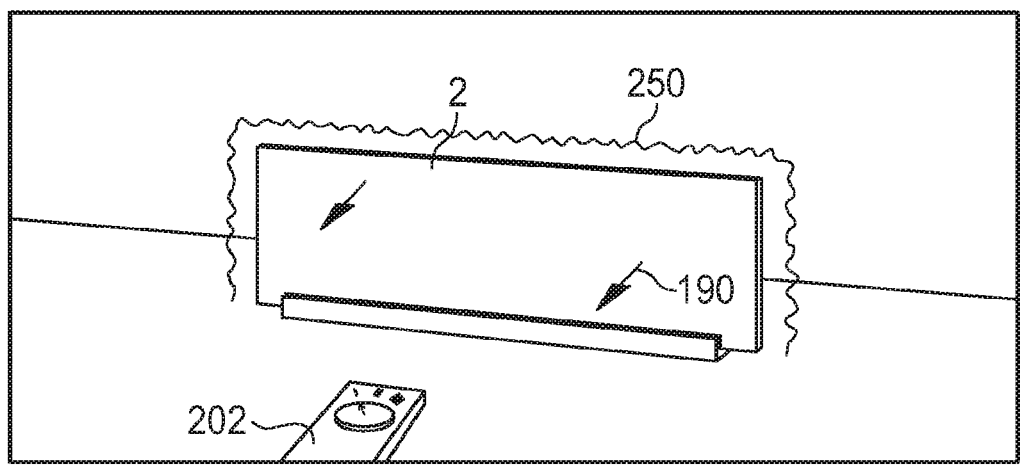
Figure 49B:
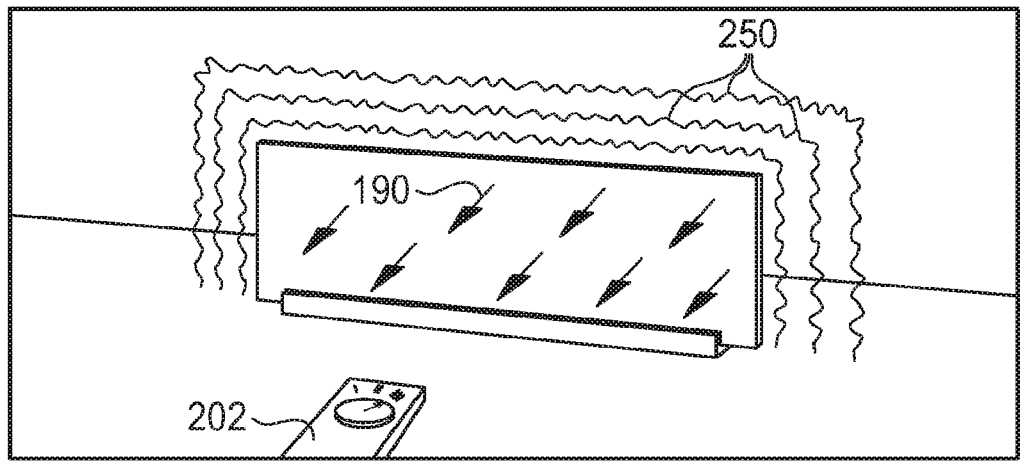

In conjunction with FIGS. 49A and 49B, a further exemplary embodiment of a luminaire 2 which is used for covering a radiator 245 is described in greater detail with reference to schematic sectional illustrations. In this exemplary embodiment, by way of example, a temperature sensor 249 can be dispensed with. Instead, a regulation of the heat 250 emitted by the radiator 245 is effected simultaneously with a regulation of the electromagnetic radiation 190 emitted by the luminaire 2. That is to say that, with an increase in the temperature generated by the radiator 245, for example the color temperature T of the light 190 emitted by the luminaire 2 is decreased or increased. Such a regulation can be effected by means of a remote control 202, by means of touch-sensitive operating elements 197 and/or by means of the valve control of the radiator 245.

Overall, any combination of the organic light-emitting diodes 1 described here can be used for the luminaire described in conjunction with FIGS. 47 to 49. In this case, it is also possible, for example, for the rear wall 245 to have an area 185a to be illuminated which is illuminated by the organic light-emitting diode 1 of the luminaire, as described in greater detail for example in conjunction with FIGS. 26 and 27. By way of example, the area 185a to be illuminated is the pictorial reproduction of an open fire. By means of the organic light-emitting diode 1 of the luminaire 2, the area 185a to be illuminated can then be illuminated in flickering fashion in the manner of a candle. In this way, the impression of a blazing fire arises in the region of the radiator 245. Such flickering can be effected, for example, by operation of the organic light-emitting diode 1 of the luminaire 2 with temporally varying current intensities. This can be achieved in a simple manner by means of a pulse width modulation circuit.

It is also possible for the luminaire 2 to comprise segmented organic light-emitting diodes 1 or a multiplicity of organic light-emitting diodes 1 which can be suitable for generating light of mutually different colors.

Besides a covering for a radiator 245, the luminaire 2 can, for example, also be used for covering an air-conditioning system or a ventilation shaft in a low-energy house. In this case, particularly if a temperature sensor 249 is present, the luminaire 2 is particularly well suited to covering and cladding elements which are intended to be used for cooling and/or for heating a room. In this case, the luminaire 2 serves as an esthetically appealing temperature indicator which brightens the room.

A further exemplary embodiment of a luminaire 2 described here is explained in greater detail in conjunction with FIGS. 50A to 50D.

Figure 50A:
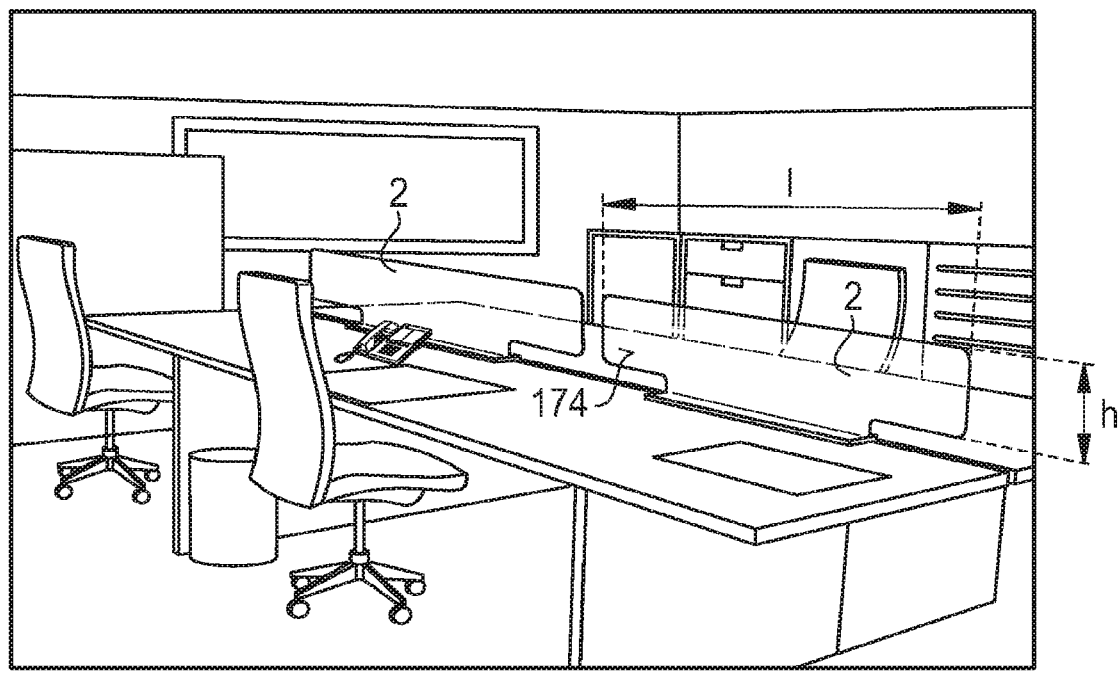
FIGS. 50A to 50D show, on the basis of schematic illustrations, exemplary embodiments of luminaires 2 described here which can be used as large-area desk lights.

FIG. 50A shows the luminaire 2 in a schematic perspective illustration. The luminaire 2 is a light having a large-area radiation exit area 174, which can be used for example as a desk lamp for illuminating a work area.

The luminaire 2 comprises as light source preferably at least one organic light-emitting diode 1 as described in greater detail in conjunction with FIGS. 1 to 31.

The luminaire 2 has a radiation exit area 174, which can comprise an area of 0.1 $m^2$ or more. By way of example, the radiation exit area 174 has a rectangular basic shape having a length l of at least 50 cm and a height h of at least 20 cm.

In this case, the luminaire 2 can be embodied such that it emits on both sides, and so, during operation, it can illuminate, for example, two workstations arranged opposite each other. In this case, the luminaire 2 can also comprise a transparent organic light-emitting diode 1 and, in this way, itself be embodied in transparent fashion.

Furthermore, it is possible for the luminaire 2 to have an area 185*a* to be illuminated which is arranged on the opposite side of the luminaire 2 to the radiation passage area 174. In this way, in the switched-off state, the luminaire 2 can represent for example an image, a calendar or a company logo.

Figure 50B:
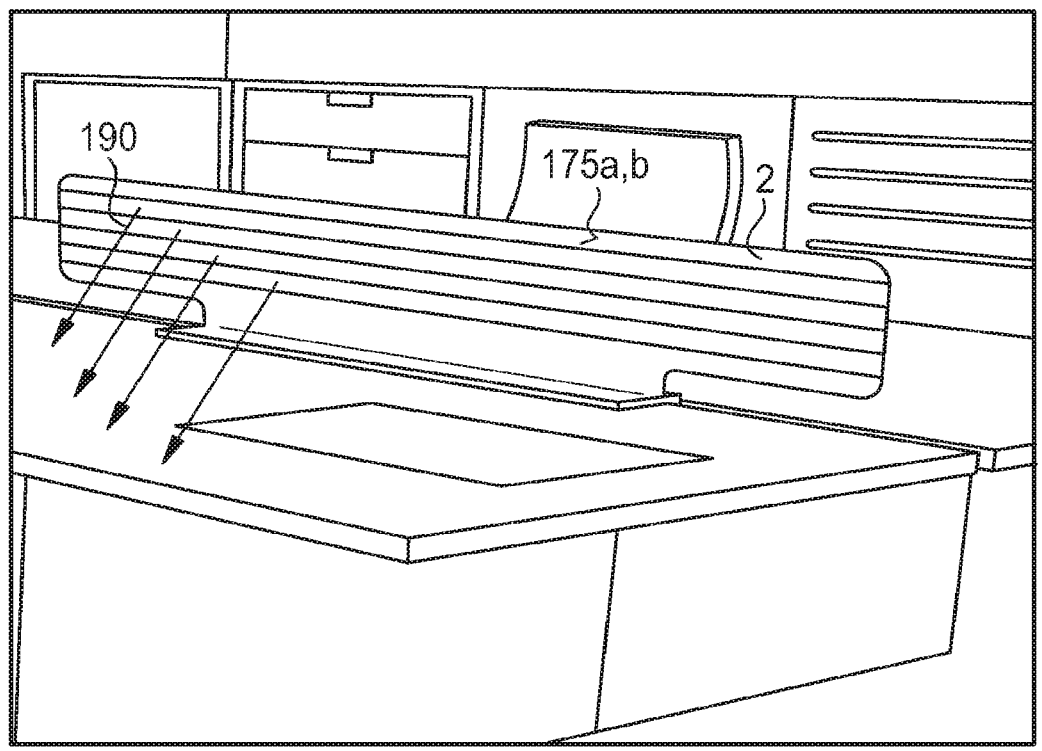

In conjunction with FIG. 50B it is schematically illustrated that the luminaire 2 can emit electromagnetic radiation 190 in a directional manner. For this purpose, the luminaire 2 comprises for example at least one organic light-emitting diode 1 embodied for example as described in conjunction with FIGS. 21 to 25. That is to say that the organic light-emitting diode 1 comprises a structured radiation exit area 175, which is structured into areas 175*a* and 175*b*, in such a way that electromagnetic radiation 190 is emitted downward, for example toward a desk surface. Advantageously, therefore, no electromagnetic radiation 190 is emitted upward, for example away from a desk surface, into the face of the user of the luminaire 2. The luminaire 2 is therefore a dazzle-free luminaire which can be used particularly well for desk work.

Furthermore, it proves to be advantageous that the luminaire 2 is embodied with a particularly large area. In this way, a relatively low luminance at the radiation exit area 174 is sufficient for sufficient illumination of the work area. That is to say that, in the luminaire 2, a high luminance does not have to be concentrated on a relatively small radiation exit area, as is the case, for example, in a conventional desk lamp with an incandescent bulb or halogen lamp. Rather, the emitted light can be distributed over a large area and the luminance can therefore be reduced. This results in a luminaire 2 which is particularly dazzle-free and yields light similar to daylight—at least in the region of the work area.

Figure 50C:
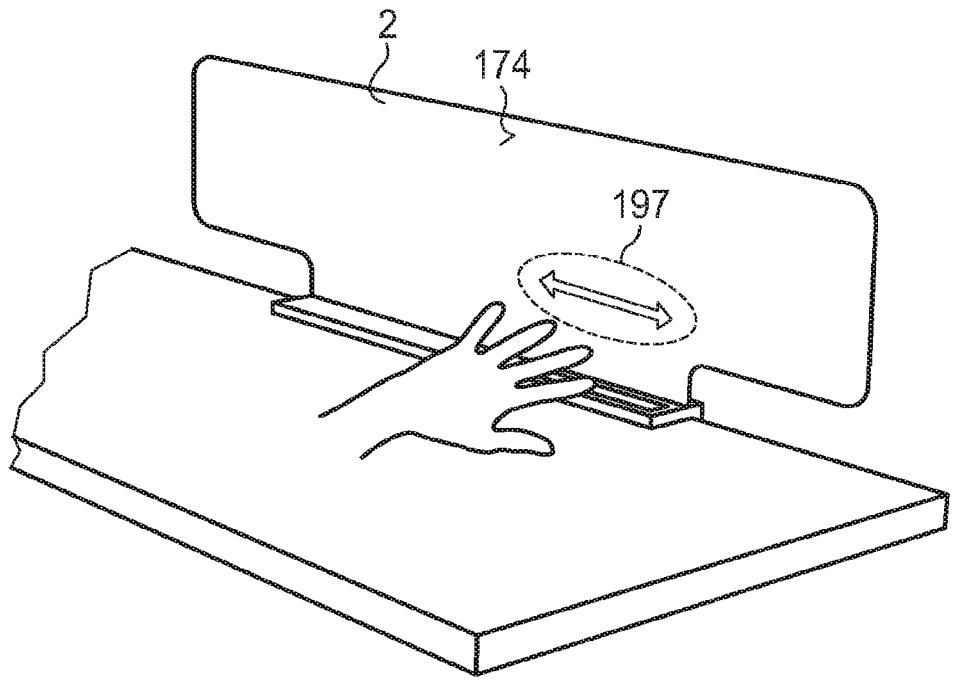

An example for the operation of the luminaire 2 is explained in greater detail in conjunction with FIG. 50C. By way of example, in this case it is possible to integrate a touch-sensitive organic light-emitting diode 1 with a touch-sensitive operating element 197 in the luminaire. By moving over part of the radiation exit area 174 of the luminaire 2, it is then possible for the luminaire 2 to be switched on or dimmed.

Figure 50D:
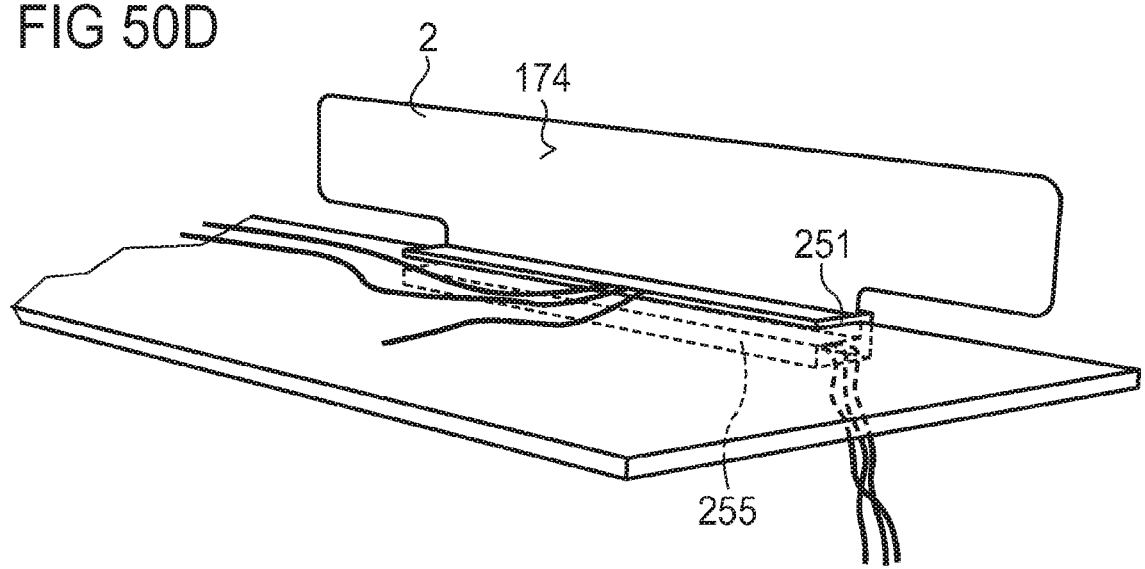

In conjunction with FIG. 50D it is shown that the luminaire 2, on account of its relatively large length l of at least 50 cm, for example, can also serve for guiding electrical cables. In this case, a cable shaft 255 is integrated into the luminaire 2, which cable shaft can be embodied integrally for example with a stand 251 of the luminaire 2.

In this case, besides its properties for general lighting, the luminaire 2 also serves as an ordering system.

Figure 52A:
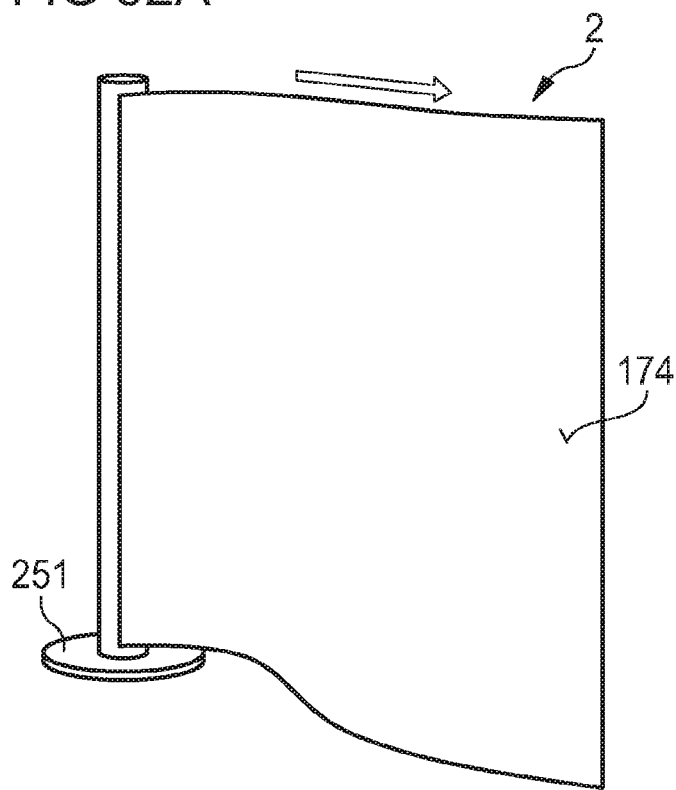
Figure 52B:
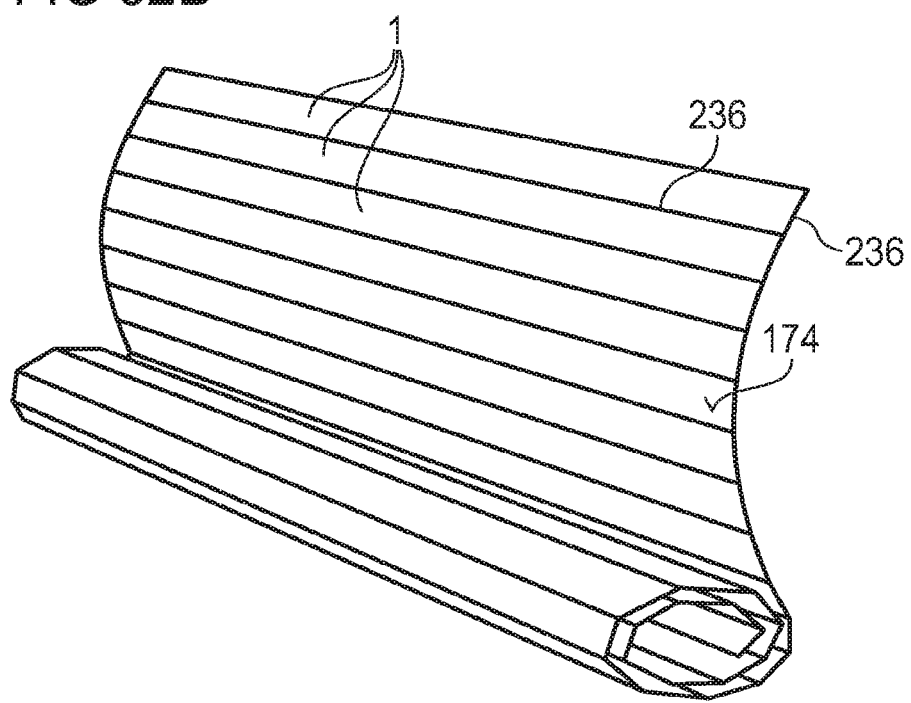
Figure 52C:
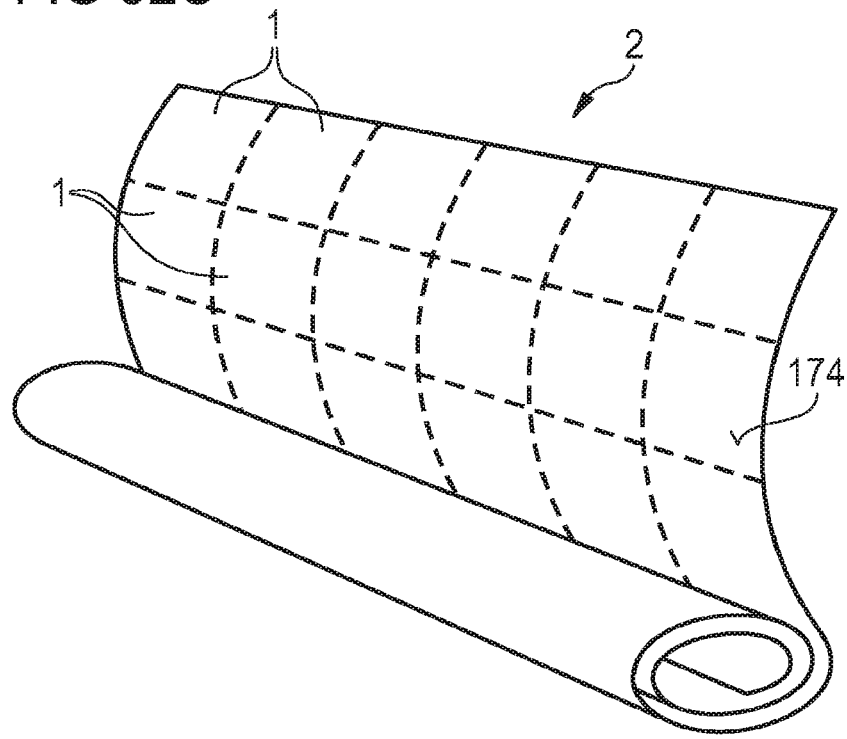
Figure 53:
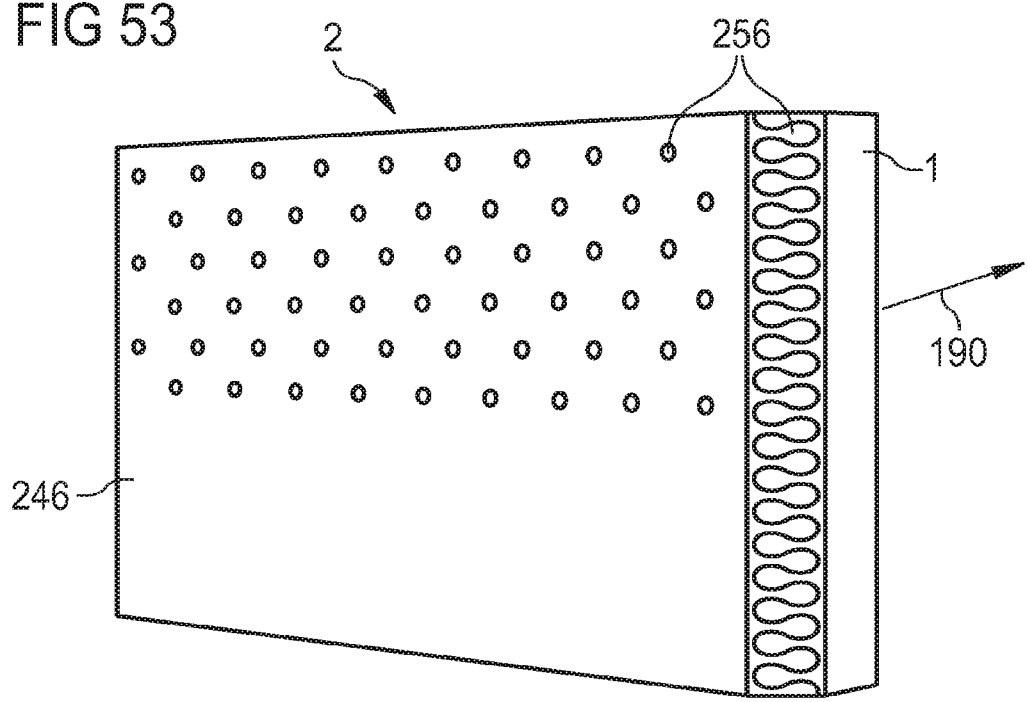

Further exemplary embodiments of a luminaire 2 described here are explained in greater detail in conjunction with FIGS. 51 to 53. In this case, the luminaire 2 serves for general lighting and as a room divider.

Figure 51A:
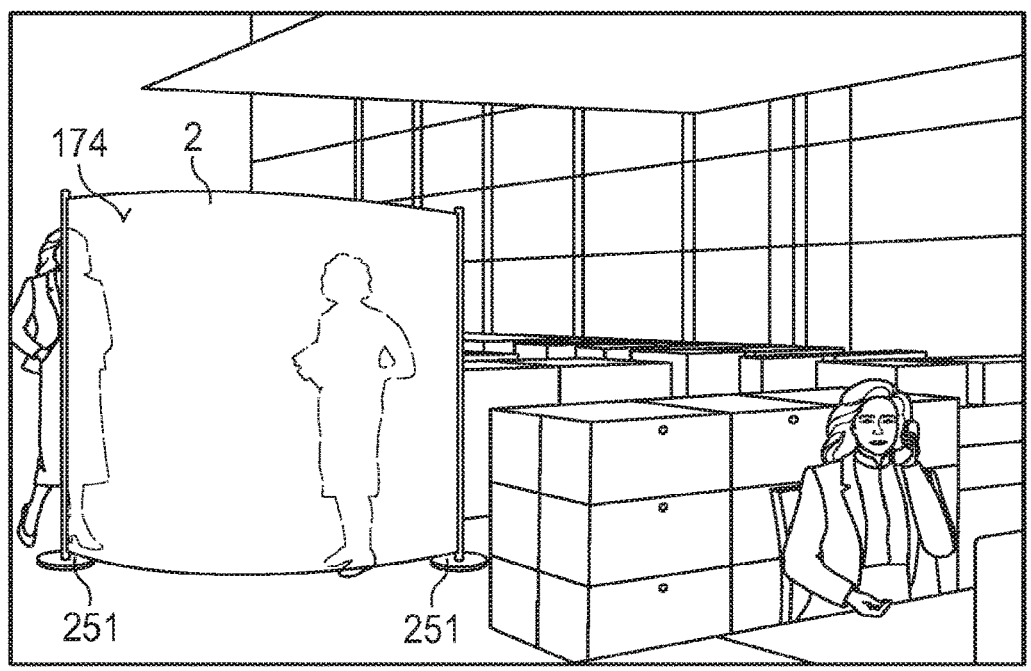
FIGS. 51A, 51B, 52A to 52C and 53 show, on the basis of schematic illustrations, exemplary embodiments of luminaires 2 described here which can be used as room dividers.
Figure 51B:
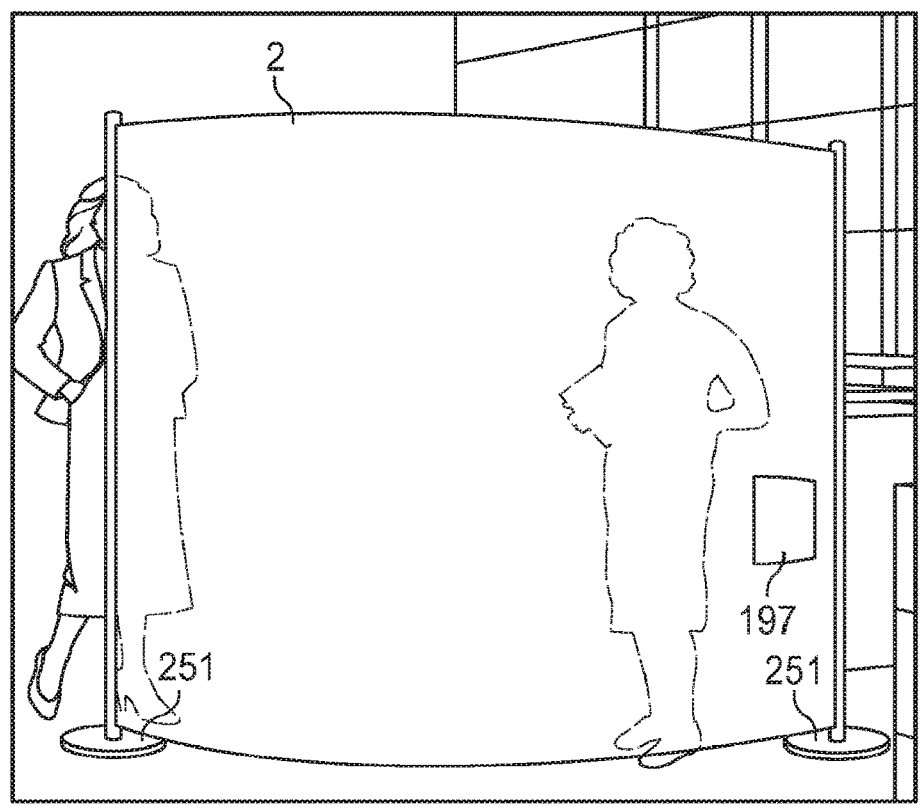

The luminaire 2 as shown in conjunction with the schematic illustrations in FIGS. 51A and 51B is a large-area light. The luminaire has a radiation exit area 174 of preferably at least 0.5 m², particularly preferably of at least 1 m². The radiation exit area 174 of the luminaire is arranged between two stands 251, which can also serve for making electrical contact with the luminaire 2.

The luminaire 2 comprises at least one organic light-emitting diode 1; preferably, the luminaire 2 comprises a multiplicity of organic light-emitting diodes 1 which are connected in parallel and/or in series with one another, for example. The at least one organic light-emitting diode can then be embodied as described in conjunction with FIGS. 1 to 31.

The luminaire 2 can comprise a touch-sensitive organic light-emitting diode 1 with an operating element 197. By means of the operating element 197, the luminaire 2 can be switched on or off and/or dimmed, for example. Furthermore, it is possible that the selection of a color temperature T or of a color locus O for the electromagnetic radiation emitted by the luminaire 2 can be effected by means of the operating element 197.

The luminaire 2 can be a luminaire which emits on both sides and which is embodied such that it scatters light diffusely. That is to say that, in this case, the luminaire 2 is not embodied in transparent fashion, but rather merely in radiation-transmissive fashion in the manner of an opalescent glass pane, for example. In this way, besides its properties for general lighting, the luminaire 2 also serves as a room divider affording a concealing screen. Furthermore, it is possible for the luminaire 2 to emit electromagnetic radiation 190 only from one side and to appear like a customary room divider from the other side.

By means of the luminaire 2 it is possible, on account of the large radiation exit area 174, to generate dazzle-free light since relatively low luminances are necessary in order to illuminate a room by means of the luminaire 2.

In conjunction with FIGS. 52A to 52C it is illustrated that the luminaire 2, embodied as a room divider, can have a radiation exit area 174 of variable size. This can be achieved, for example, by virtue of the fact that the luminaire 2 has a radiation passage area 174 that can be rolled up and unrolled.

For this purpose, by way of example, as illustrated in conjunction with FIG. 52B, the luminaire 2 is subdivided into individual lamellae, which can each be formed by rigid organic light-emitting diodes 1. The lamellae, that is to say the individual organic light-emitting diodes 1, are mechanically and electrically connected to one another by connection conductors 236. The connection conductors 236 themselves are embodied in flexible fashion, for example in the sense of a power cable that can be unrolled and rolled up. In this case, the luminaire 2 comprises a multiplicity of organic light-emitting diodes 1 arranged in a series one after another.

Furthermore, it is possible for the luminaire 2, as illustrated in conjunction with FIG. 52C, to have a radiation exit area 174 that is not subdivided into individual lamellae. By way of example, the luminaire 2 comprises for this purpose exactly one, large-area organic light-emitting diode 1. Furthermore, it is possible for the luminaire 2 to comprise a multiplicity of organic light-emitting diodes 1 arranged in the manner of a matrix. The organic light-emitting diodes 1 can be flexible organic light-emitting diodes that are introduced between two films. In this way, a large-area luminaire 2 that can be rolled up and unrolled can be constructed from a multiplicity of smaller, flexible organic light-emitting diodes 1.

In conjunction with FIG. 53 it is illustrated that the luminaire 2, which forms a room divider, can also involve sound protection. In this case, the luminaire 2 has a rear wall 246 formed with at least one insulating material 256 suitable for acoustic insulation. In a simple case, the rear wall 246 can be a styropor panel. As light source of the luminaire 2, at least one organic light-emitting diode 1 is then connected to the insulating material 256 forming the rear wall 246.

Figure 54A:
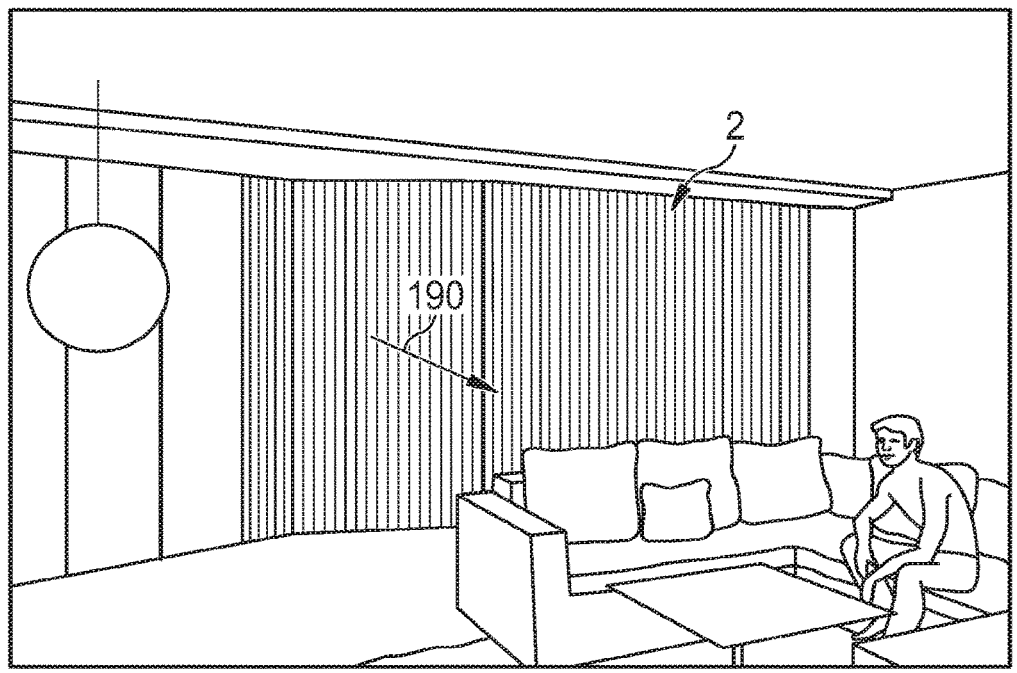
FIGS. 54A to 54C show, on the basis of schematic illustrations, exemplary embodiments of luminaires 2 described here which can be used as louvers.
Figure 54B:
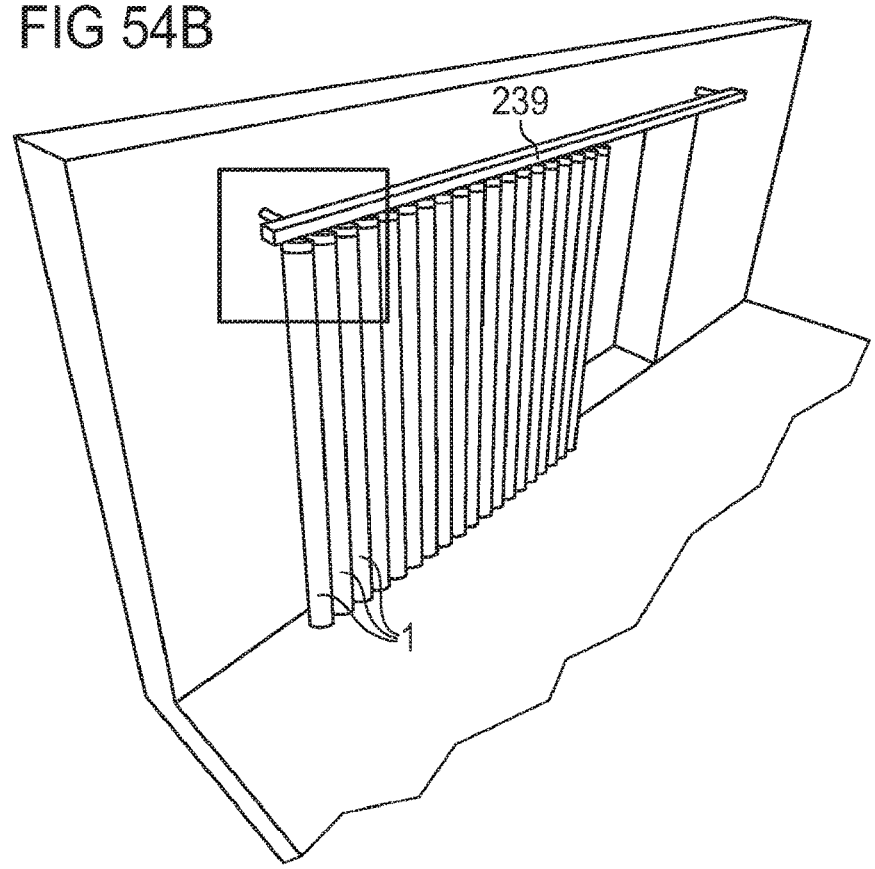
Figure 54C:
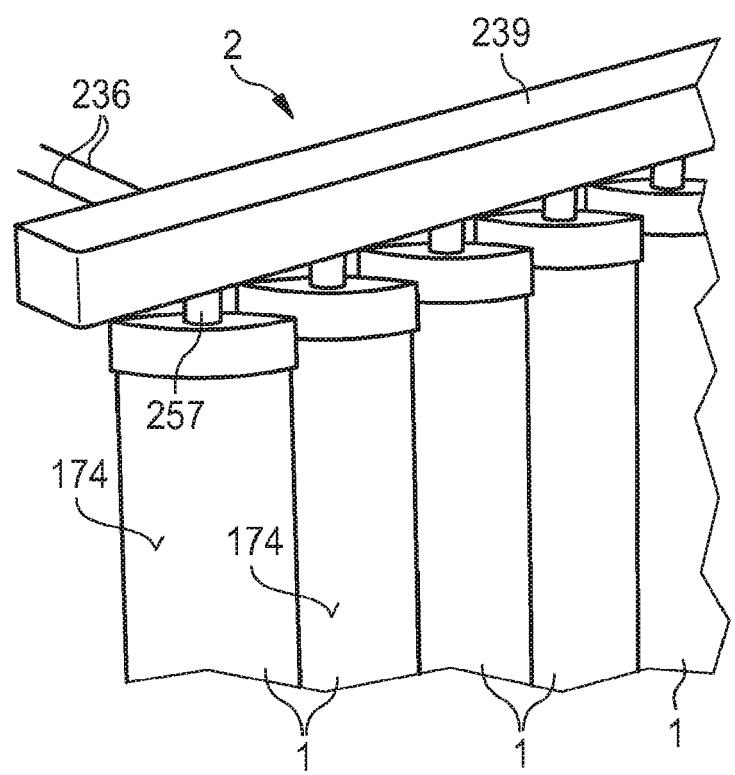

An exemplary embodiment of a luminaire described here in which the luminaire is embodied as a louver is explained in greater detail in conjunction with FIGS. 54A to 54C. In this case, the luminaire 2 comprises a multiplicity of organic light-emitting diodes 1 which are electrically contact-connected and mechanically held by means of a holding device 239. At one end face, the organic light-emitting diodes 1 comprise a connection plug 257, which engages into the holding device 239. The luminaire 2 can be electrically connected by means of connection conductors 236, for example. The holding device 239 is a rail, for example, in which the individual organic light-emitting diodes 1 are fixed by means of the connection plug. The organic light-emitting diodes 1 can be displaced in the rail.

In this case, the organic light-emitting diodes 1 can be embodied in flexible or rigid fashion. By way of example, the organic light-emitting diodes 1 have, as first carrier 130, a metal sheet having reflective properties. In this way, that side of each organic light-emitting diode 1 which faces away from the radiation exit area 174 is embodied in reflective fashion. In this case, besides its properties for room lighting, the luminaire 2 also serves for room darkening and/or as a concealing screen.

The luminaire 2 can comprise different organic light-emitting diodes 1, such that light of different colors or having different color effects can be generated by means of the luminaire 2. The luminaire 2 is arranged in front of a window for example in the sense of a curtain or louver, and in this way generates, even under poor outside light conditions, daylight-like illumination of the room in which the luminaire 2 is arranged. That is to say that the main light of the room is situated for example in the region of the window in which the luminaire 2 is arranged. In this way, when the luminaire 2 is switched on, illumination of the room similar to that through the window takes place. In this case, the luminaire 2 can form the main light source of a room, such that it is possible to dispense with further light sources in the room.

In this case, the organic light-emitting diodes 1 used as light sources of the luminaire 2 are preferably embodied as described in one of FIGS. 1 to 31 or as a combination of the organic light-emitting diodes 1 described there.

A further exemplary embodiment of a luminaire 2 described here is explained in greater detail in conjunction with FIGS. 55A to 55D. In this exemplary embodiment, the luminaire, besides its function for general lighting, also serves as a concealing screen. The luminaire 2 has, for example, at least three radiation exit areas 174 embodied as walls.

Figure 55A:
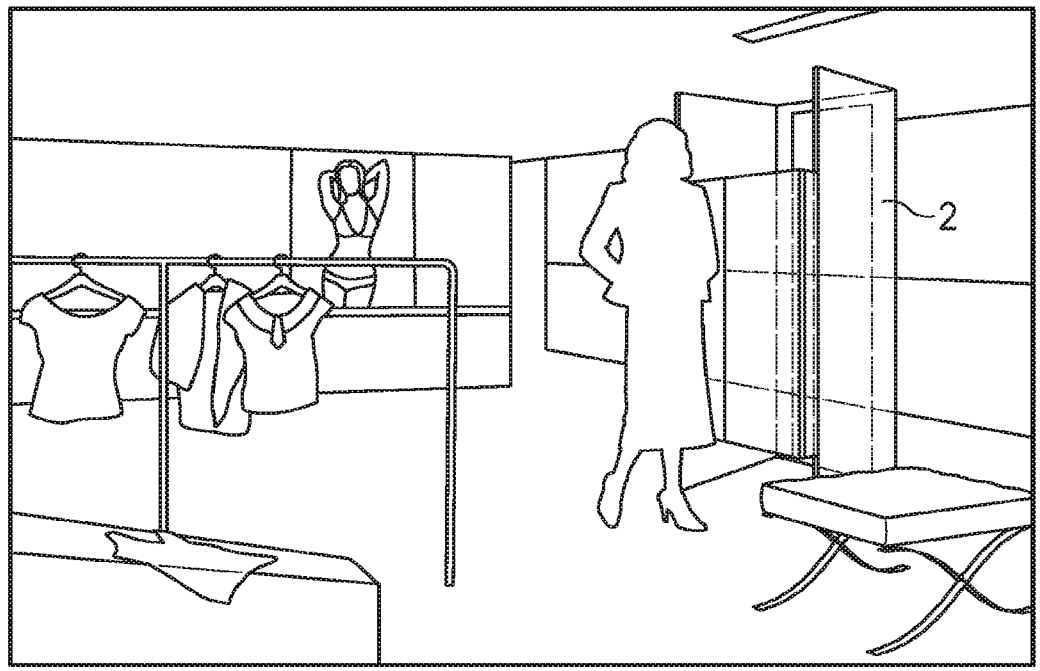
FIGS. 55A to 55D show, on the basis of schematic illustrations, exemplary embodiments of luminaires 2 described here which can be used as changing cubicles.

The schematic perspective illustration in FIG. 55A shows the luminaire 2 in a switched-off operating state. In this switched-off operating state, the luminaire 2 is transparent. For this purpose, the luminaire 2 comprises, for example, at least one organic light-emitting diode 1 as light source which is embodied in transparent fashion.

Figure 55B:
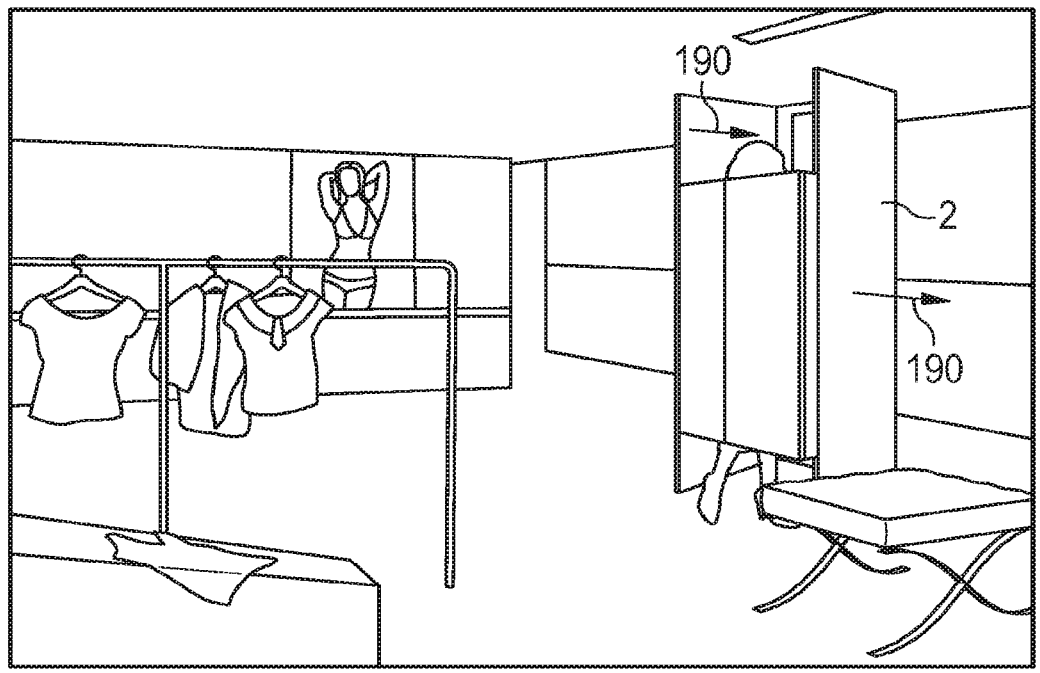
Figure 55C:
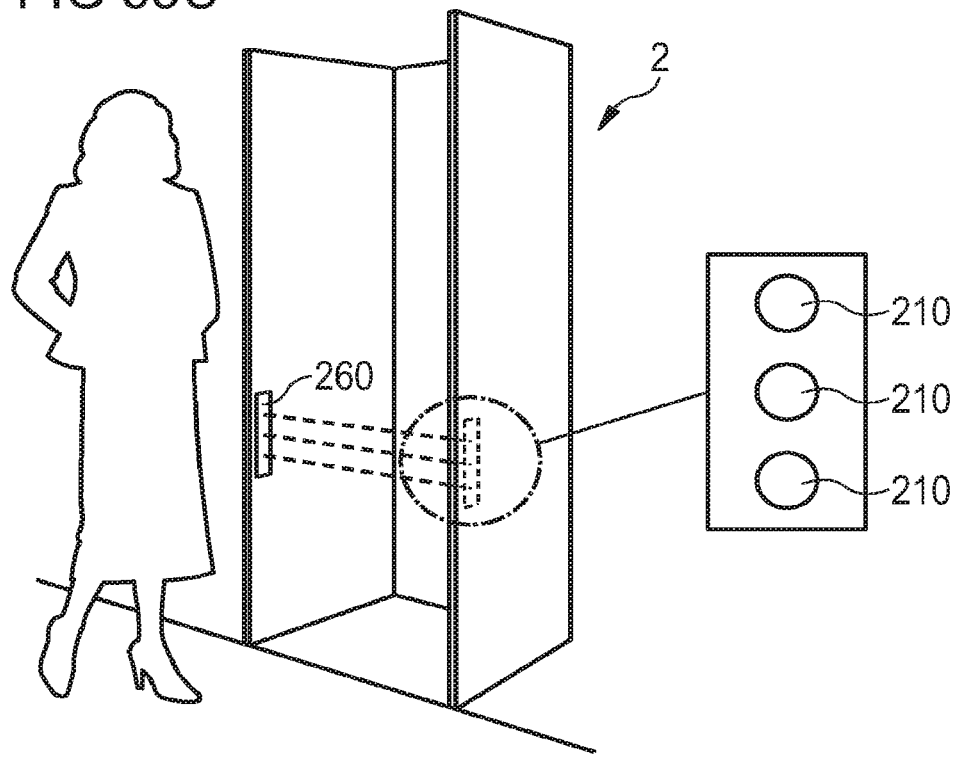
Figure 55D:
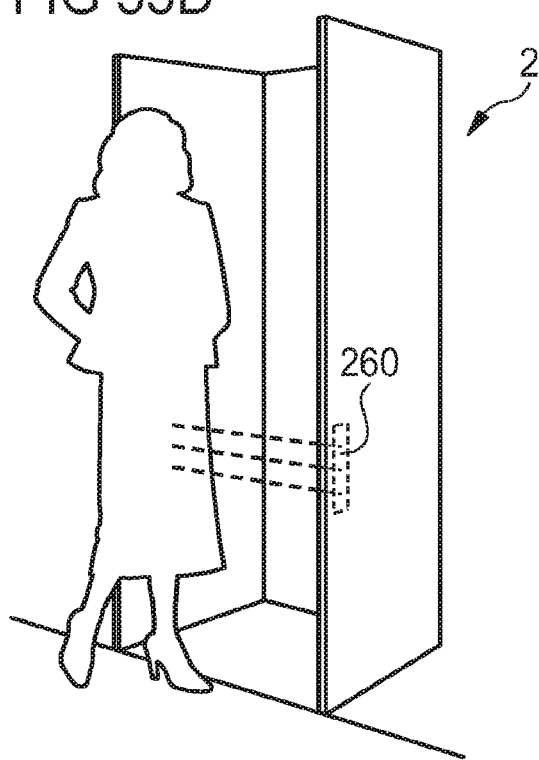

In conjunction with the basic perspective schematic diagram in FIG. 55B, the luminaire 2 is shown in a switched-on operating state. In this switched-on operating state, the luminaire 2 emits electromagnetic radiation 190. In this case, it is possible for the electromagnetic radiation to be emitted both outward, into the room, and inward, into the cubicle enclosed by the walls of the luminaire 2. In this case, the luminaire 2 serves both for lighting the interior of the cubicle and as an indicator device for indicating that the cubicle is occupied by a user.

Furthermore, in the switched-on operating state, the luminaire 2 no longer appears transparent, but rather is visually impenetrable. This is achieved, for example, by virtue of the fact that the luminaire 2 comprises an electrically switchable optical element 186 as described in greater detail in conjunction with FIG. 27. The electrically switchable optical element 186 is then an electrically switchable diffuser or an electrochromic material. The switching of the luminaire 2 into the switched-on, luminous and visually impenetrable operating state, as illustrated in greater detail in FIG. 55B, can in this case be effected for example by the cubicle being entered.

By way of example, a switch can be actuated by means of the actuation of doors at the luminaire 2. Furthermore, it is possible for the luminaire 2 to comprise a light barrier 260, as is explained in greater detail for example in conjunction with FIGS. 55C and 55D. In the event of said light barrier being crossed, said light barrier comprising a plurality of light-emitting diodes 210, laser diodes and/or optical sensors, for example, the luminaire 2 is switched on.

In this case, the luminaire described can be used for example as a changing cubicle. In this case, it is also possible that the color temperature T and/or color locus O of the light generated by the luminaire 2 can be set by the user of the luminaire 2. In this way, the clothing being tried on by the user can be checked by the user under different lighting conditions. The user can thereby check for example the effect of the clothing in daylight, office lighting, twilight and the like.

Furthermore, the luminaire described can be used as a separating wall in an open-plan office. The light emitted by the luminaire then serves as an office light and signals that the workstation at which the luminaire 2 is situated is occupied. Switching between transparent and diffuse can also be effected independently of the light emission by the luminaire, such that the user of the luminaire can switch the latter to be non-radiation-transmissive, in diffusely scattering fashion, as necessary, in order to create a more private working atmosphere.

Figure 56A:
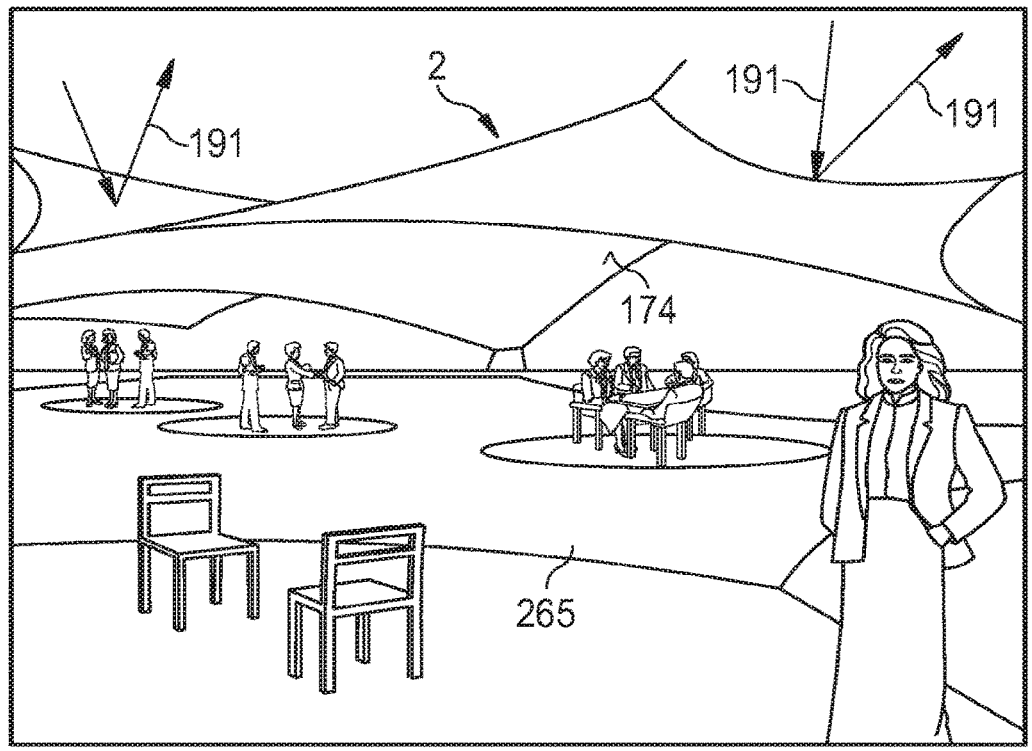
FIGS. 56A to 56C show, on the basis of schematic illustrations, an exemplary embodiment of a luminaire described here which can be used as solar protection.
Figure 56B:
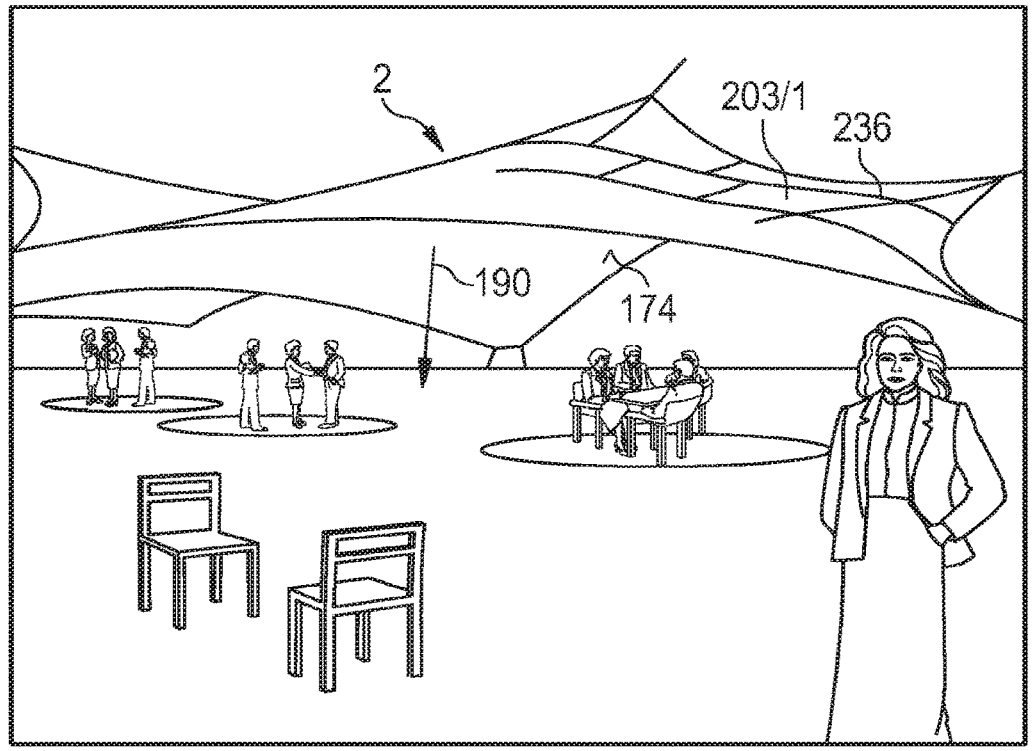
Figure 56C:
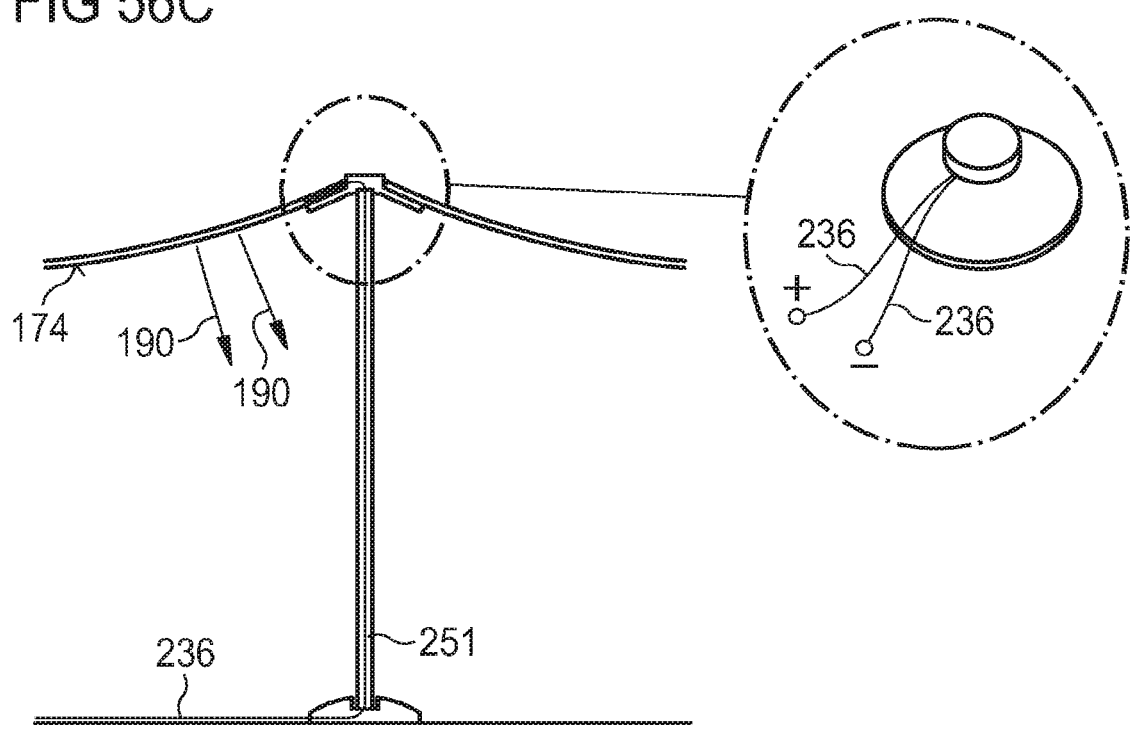

FIGS. 56A to 56C show, on the basis of schematic illustrations, a further exemplary embodiment of a luminaire 2 described here. In this exemplary embodiment, the luminaire 2 forms solar protection—besides its properties for general lighting.

FIG. 56A shows the luminaire 2 on the basis of a schematic sectional illustration in a switched-off operating state. The luminaire 2 is in this switched-off operating state for example during the day, upon insolation. In this operating state, the luminaire 2 serves for light protection and casts a shadow 265. For this purpose, the luminaire 2 has a, for example, reflective surface at its top side facing away from the radiation exit area 174, said reflective surface reflecting the impinging radiation 191. Furthermore, it is possible for the luminaire 2 to be embodied, at its top side facing away from the radiation exit area 174, as a solar cell which, for example upon insolation, generates current by means of which the luminaire 2 can be operated later, for example at night. By way of example, the document U.S. Pat. No. 7,317,210 discloses a combination of organic light-emitting diode and solar cell which can be used in this case.

In conjunction with the schematic illustration in FIG. 56B, the luminaire 2 is shown in a switched-on operating state. In the switched-on operating state, the luminaire 2 emits electromagnetic radiation 190 from its radiation exit area 174. In this case, the luminaire 2 preferably comprises a multiplicity of organic light-emitting diodes 1 or at least one organic light-emitting diode 1 subdivided into a multiplicity of segments 203. Each of the segments, or each organic light-emitting diode 1, can be suitable for generating light of a different color or having a different color temperature than other segments 203, or light-emitting diodes 1, of the luminaire 2. Depending on the operation of the organic light-emitting diodes 1 or of the segments 203, it is thus possible to generate different light moods by means of different color loci and/or color temperatures of the emitted light. In this case, the different color loci and/or color temperatures can also be generated in different regions of the luminaire 2. That is to say that, for example, regions of the radiation exit area 174 can, for example, rather emit reddish light, whereas other regions of the radiation exit area 174 rather emit bluish light, for example. In this case, the regions of the radiation exit area 174 preferably each comprise a multiplicity of organic light-emitting diodes 1 or segments 203.

The construction of the luminaire and also the contact-connection of the individual organic light-emitting diodes 1, or of the segments 203, can be as described in conjunction with FIG. 45.

Organic light-emitting diodes 1 as described in conjunction with FIGS. 1 to 31 are preferably used as organic light-emitting diodes 1.

The luminaire 2 is a large-area luminaire preferably having an area content of a radiation exit area 174 of at least 5 m$^2$, particularly preferably of at least 10 m$^2$. In this case, the radiation exit area 174 of the luminaire 2 is composed of the radiation exit areas of the organic light-emitting diodes 1 or of the segments 203.

In conjunction with FIG. 56C it is schematically illustrated that power can be supplied to the luminaire 2 via a stand 251, in which connection conductors 236 are laid.

Figure 57A:
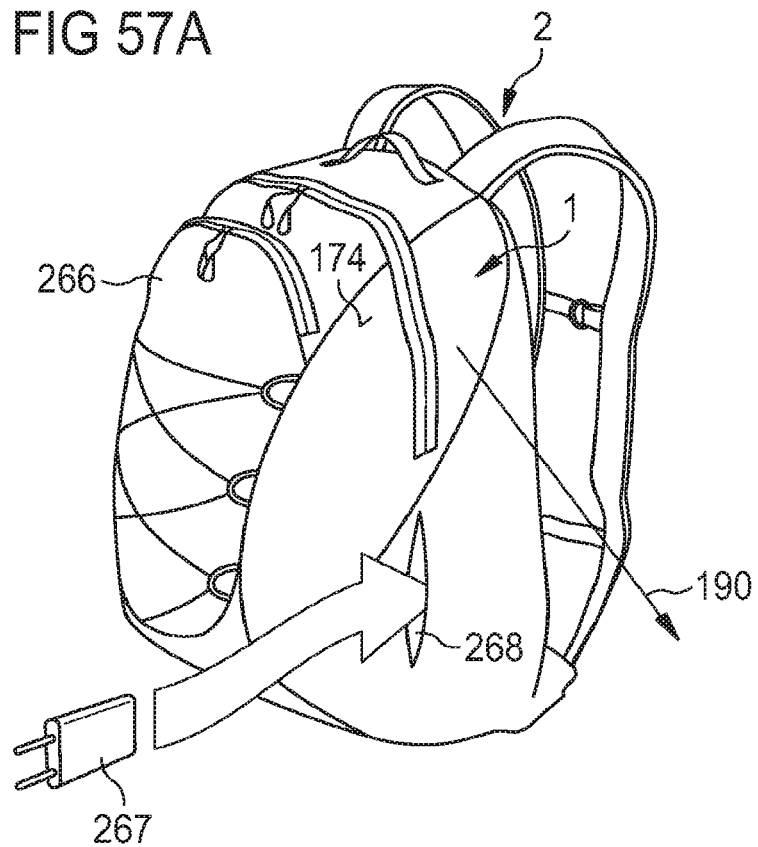
FIGS. 57A and 57B show, on the basis of schematic illustrations, one exemplary embodiment of a luminaire described here which forms a bag.
Figure 57B:
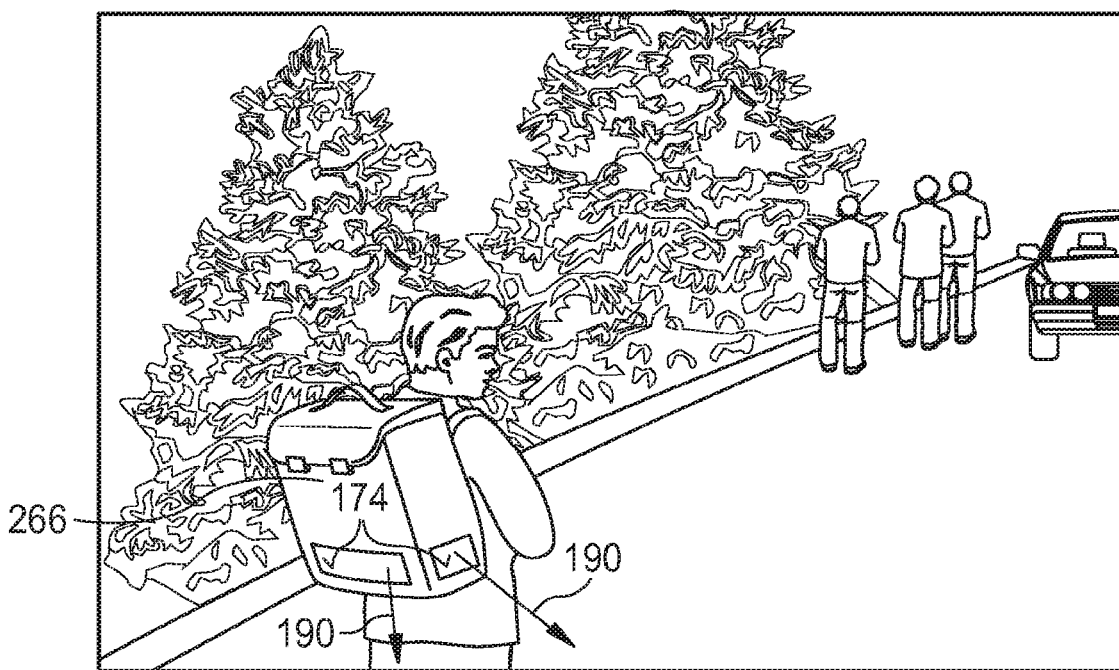

Further exemplary embodiments of luminaires described here are shown in conjunction with FIGS. 57A and 57B. In these exemplary embodiments, the luminaire 2 is embodied as a bag 266. The luminaire 2 can be used for example as a rucksack or as a school satchel.

For this purpose, organic light-emitting diodes 1 are applied or integrated at least on places of the bag 266. The organic light-emitting diodes 1 are preferably embodied in flexible fashion, such that they can adapt to the contours of the bag 266. That is to say that the bag 266 has at least one radiation entrance area 174, through which electromagnetic radiation 190, preferably light, leaves the luminaire.

In this case, the luminaire 2 comprises at least one organic light-emitting diode 1 which—as described by way of example in conjunction with FIGS. 29 and 30—comprises a retroreflector. In this way, even when the organic light-emitting diode 1 is not switched on, the luminaire 2 reflects impinging electromagnetic radiation and therefore serves, in this case, too, for better visibility of the user of the luminaire 2.

In conjunction with the schematic illustration in FIG. 57A it is furthermore explained that the bag 266 can have a slot 286, for example, in which is arranged a rechargeable battery 267 by means of which the organic light-emitting diode 1 of the luminaire 2 is supplied with electric current.

As an alternative or in addition to the embodiment of the luminaire 2 as a bag, it is furthermore conceivable for the luminaire 2 to be embodied as protective clothing, work clothing, headband, head covering or the like. At all events the luminaire 2 comprises at least one organic light-emitting diode 1 having a retroreflector. The luminaire 2 thus serves for improved visibility of its user both in the switched-on and in the switched-off operating state.

Figure 58A:
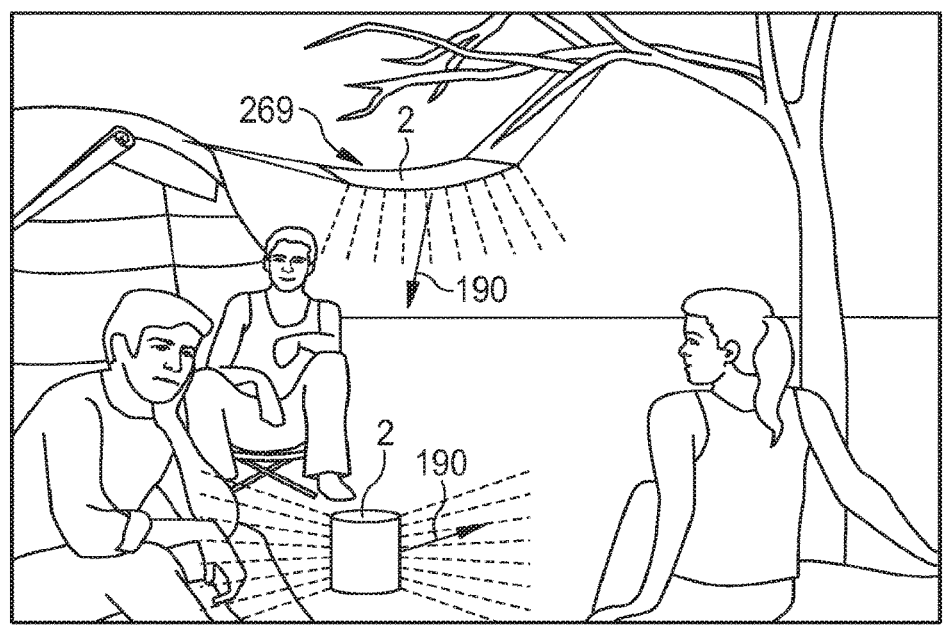
FIGS. 58A and 58B show, on the basis of schematic illustrations one exemplary embodiment of a luminaire described here which serves as an emergency light.
Figure 58B:
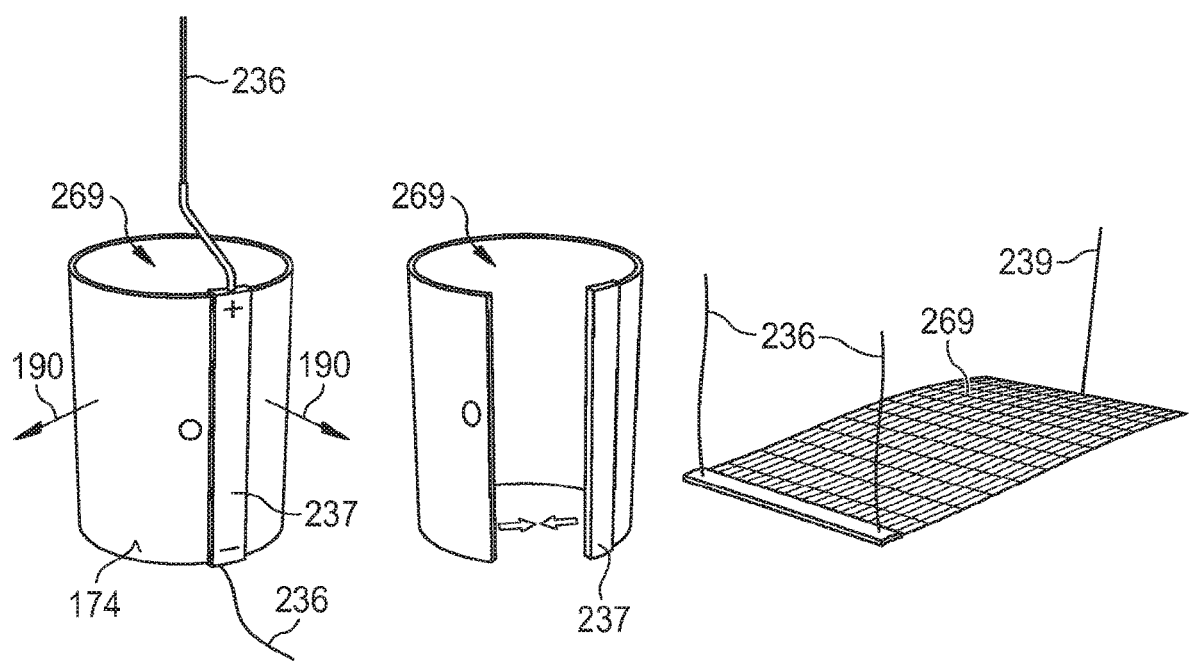

Further exemplary embodiments of a luminaire 2 described here are explained in greater detail in conjunction with the schematic illustrations in FIGS. 58A and 58B. In these exemplary embodiments, the luminaire 2 serves as emergency lighting, for example as a camping light.

The luminaire 2 has a radiation exit area 174. Furthermore, the luminaire 2 has a solar cell 269 at the side lying opposite the radiation exit area 174. The solar cell 269 can be a flexible inorganic or organic solar cell embodied in film-like fashion. At least one organic light-emitting diode 1 that is flexible and preferably emits white light serves as light source of the luminaire 2.

The luminaire 2 can be operated in two different operating states. Firstly, the luminaire 2 can be rolled to form a cylinder, which is closed by a connector 237. Connection locations for making contact with the luminaire 2 via connection conductors 236 can be situated at the connector 237.

In another operating state, the luminaire 2 can be rolled out. In this case, the luminaire 2 can be operated in suspended fashion, for example, by means of the connection conductors 236 and, if appropriate, a holding device 239, which can likewise be embodied in the manner of a wire or cable. In conjunction with FIG. 58A it is illustrated, for example, that the luminaire 2 is suspended from the branches of a tree. In this case, the radiation exit area 174 faces the ground, and the solar cell 269 is directed away from the ground.

Such a luminaire 2 can be charged by insolation, during the day, for example in the suspended state. At night, the luminaire 2 then continuously emits electromagnetic radiation 190 through the radiation exit area 174. In this case, the luminaire 2 is preferably operated as emergency or camping lighting, such that relatively low luminances are sufficient.

As an alternative to solar operation, which can be realized for example by means of a rechargeable battery integrated into the luminaire 2, the luminaire 2 can also be connected to an external power source, such as an automobile battery, for example, via the connection conductors 236.

Figure 59:
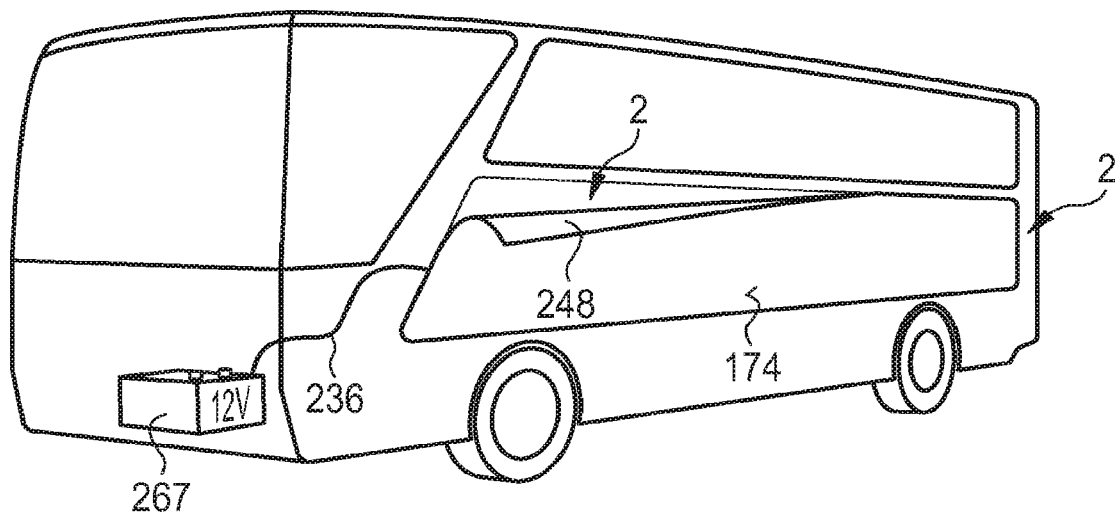
FIG. 59 shows, on the basis of a schematic illustration, one exemplary embodiment of a luminaire described here which can be used as advertising means on vehicles.

In conjunction with FIG. 59, a further exemplary embodiment of a luminaire 2 described here is explained in greater detail with reference to a schematic perspective illustration. The luminaire 2 is a large-area luminaire which can be operated for example by means of a rechargeable battery 267—in the present case an automobile battery. The luminaire has a radiation exit area 174. The luminaire is fixed to a motor vehicle such as an automobile or a bus by means of the fixing means 248, for example. The fixing means 248 can be a magnet or an adhesive connection.

The luminaire 2 preferably comprises at least one organic light-emitting diode 1 as described here. The organic light-emitting diode 1 can be a flexible organic light-emitting diode 1 that illuminates an area 185a to be illuminated. The area 185a to be illuminated is, for example, a billboard or a company logo. The luminaire 2 can thus be used for advertising purposes on motor vehicles.

A further exemplary embodiment of a luminaire described here is explained in greater detail in conjunction with FIGS. 60A to 60D. In this case, the luminaire 2 forms an umbrella 270. The umbrella 270 emits electromagnetic radiation 190 from its inner area.

This can be realized, firstly, by virtue of the luminaire 2 comprising at least one organic light-emitting diode 1 embodied in flexible fashion. The organic light-emitting diode 1 can then be situated on the inner side of the crown of the umbrella 270 or form the crown of the umbrella 270.

By way of example, electrical contact is made with the at least one organic light-emitting diode 1 by means of the struts or paragon rods 270a of the umbrella 270. The organic light-emitting diode 1 of the umbrella 270 can then be energized by means of at least one rechargeable battery 267, which can be arranged in the grip or handle 270*d* of the umbrella 270 (cf. FIG. 60D, for example).

As an alternative or in addition to at least one organic light-emitting diode 1, it is possible for the umbrella 270 to comprise at least one inorganic light-emitting diode 210 as light source. The at least one inorganic light-emitting diode 210 is fixed for example to or in the tube 270*a* of the umbrella 270. By way of example, the inorganic light-emitting diodes 210 are fixed to the slide 270*b* or below the slide 270*b* of the umbrella 270. The inorganic light-emitting diodes 210 emit onto the inner side of the crown 270*e* of the umbrella 270, which is embodied as a reflector 271 or organic light-emitting diode 1 having a reflective layer.

In this case, the reflector 271 can be embodied in such a way that it emits electromagnetic radiation 190 in a directional fashion. It is thereby possible for the umbrella to emit radiation when being held vertically in the direction of movement of the user and, in this way, to illuminate the path ahead of the user.

Preferably, the inorganic light-emitting diodes 210 are fixedly connected to the slide 270*b* of the umbrella 270, such that, in the event of the umbrella 270 being open, they are conveyed into a position lying closely below the crown 270*e* of the umbrella 270. The lighting by the inorganic light-emitting diodes 210 can then be switched on at the same time as the slide 270*b* is slid up. However, it is also possible that the lighting can be switched on separately, such that it is activated for example only under poor visibility conditions.

Figure 60A:
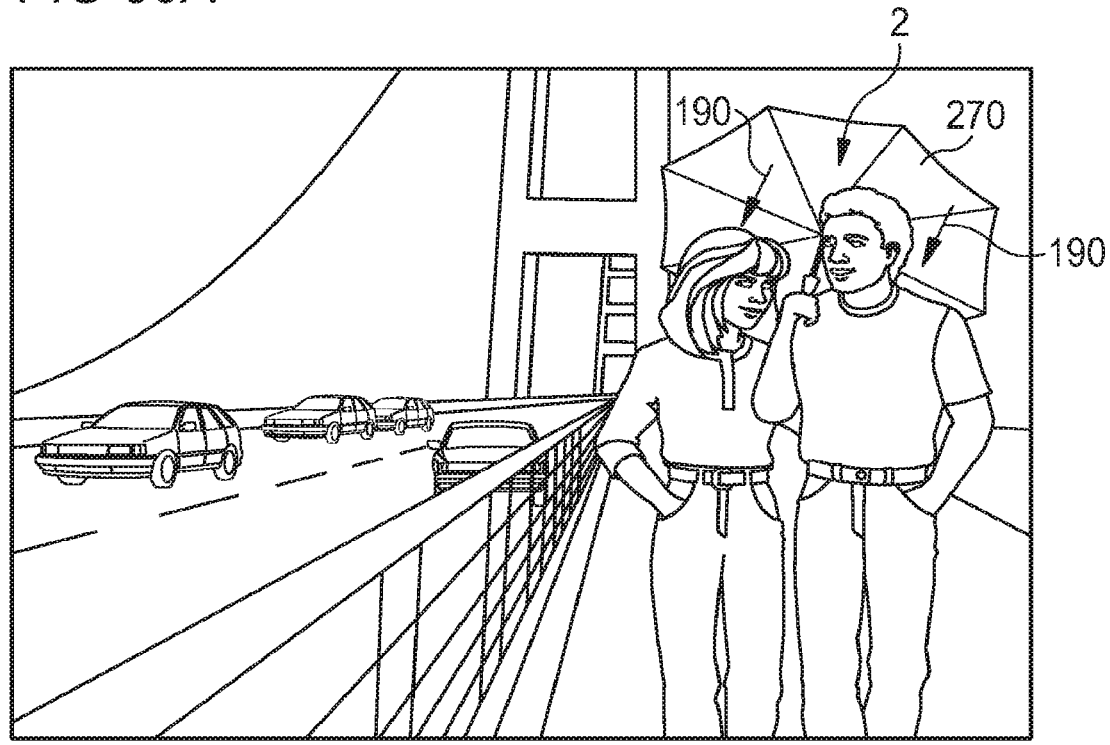
FIGS. 60A to 60D show, on the basis of schematic illustrations, one exemplary embodiment of a luminaire described here which serves as an umbrella.
Figure 60B:
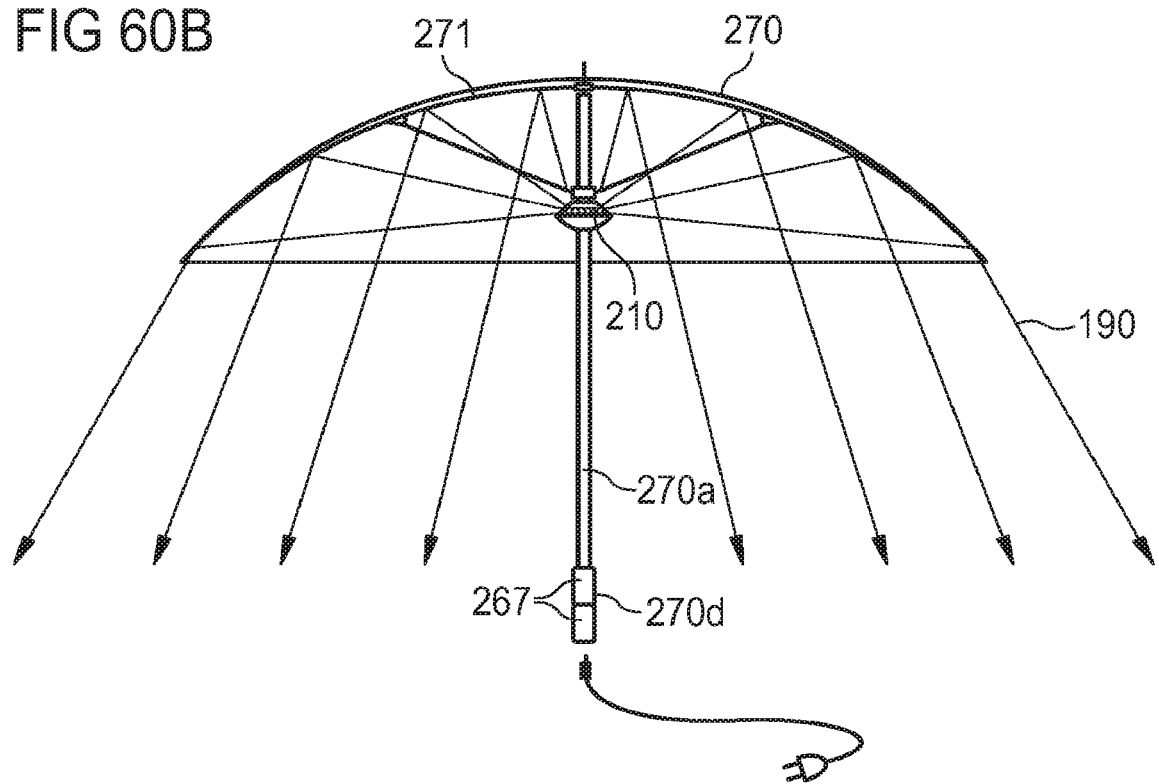
Figure 60C:
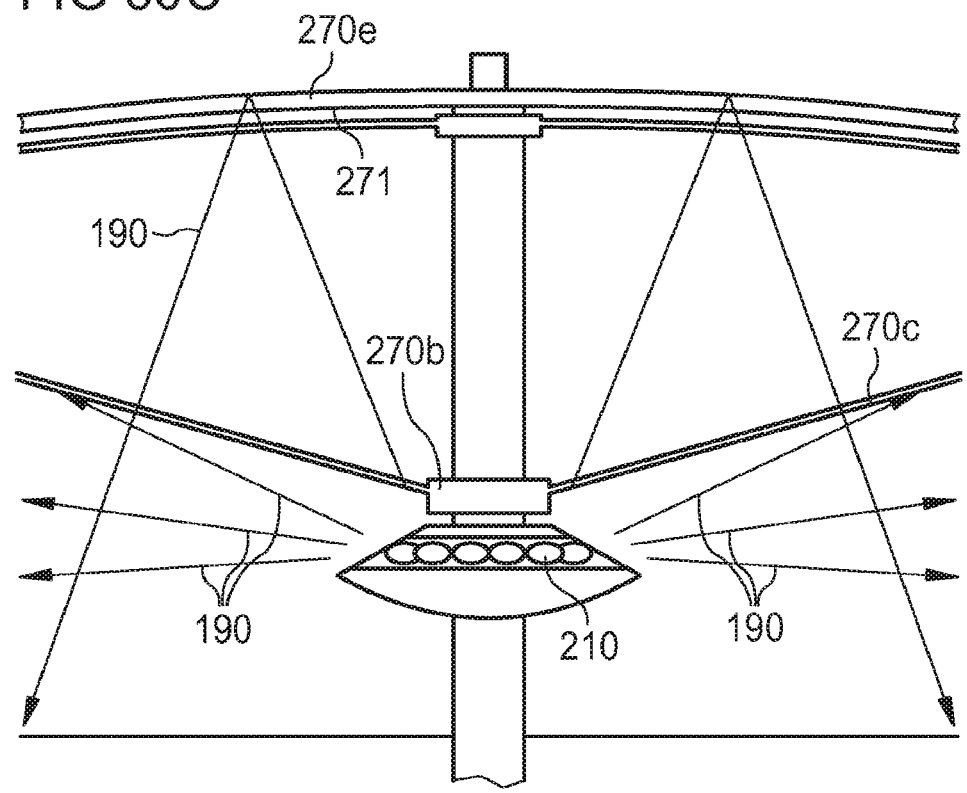
Figure 60D:
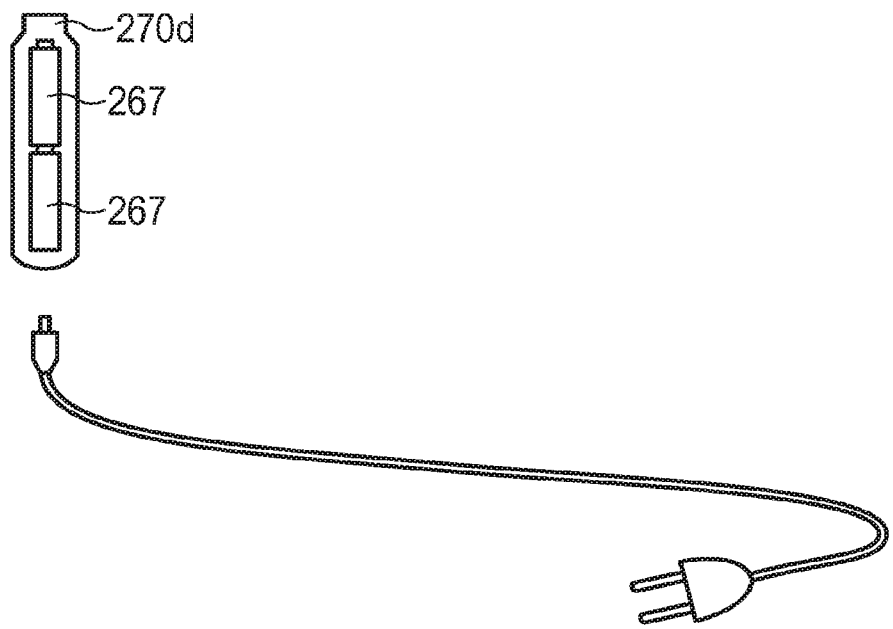

In conjunction with FIG. 60D it is schematically illustrated that at least one rechargeable battery 267 as power supply for the light sources of the luminaire 2 forming an umbrella 270 can be arranged in the handle 207*d* of the umbrella. This can be charged, for example, by connection to an electrical power supply. Overall, the luminaire 2 in the exemplary embodiment in FIGS. 60A to 60D constitutes a mobile light which enables improved visibility and an improved view for the user under poor visibility conditions including in road traffic.

Figure 61A:
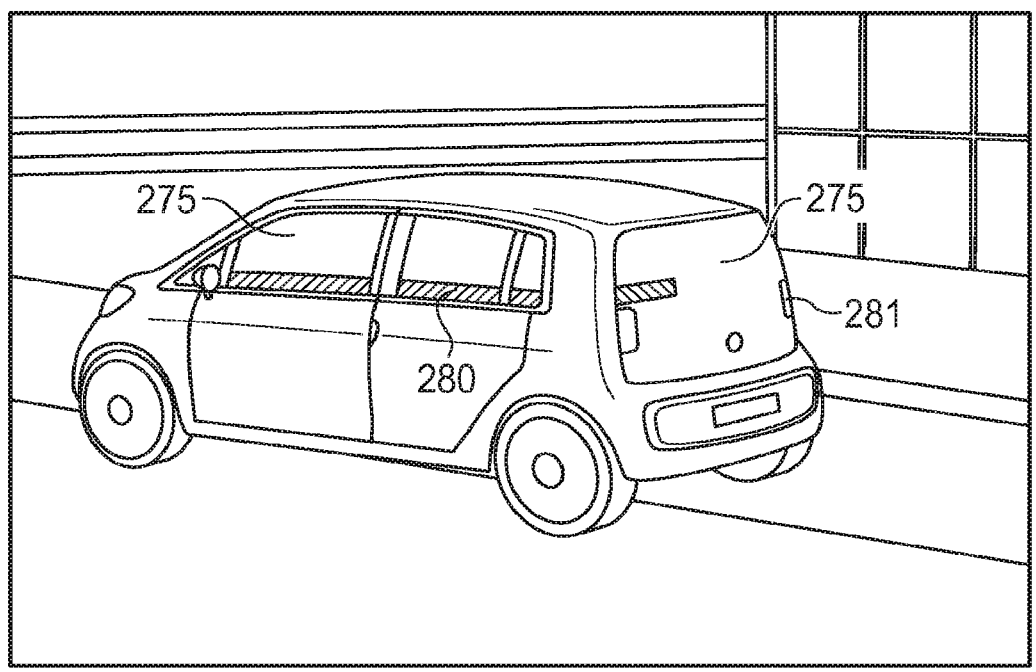
FIGS. 61A to 61C show, on the basis of schematic illustrations, exemplary embodiments of luminaires which are used as signal lamps in a motor vehicle.
Figure 61B:
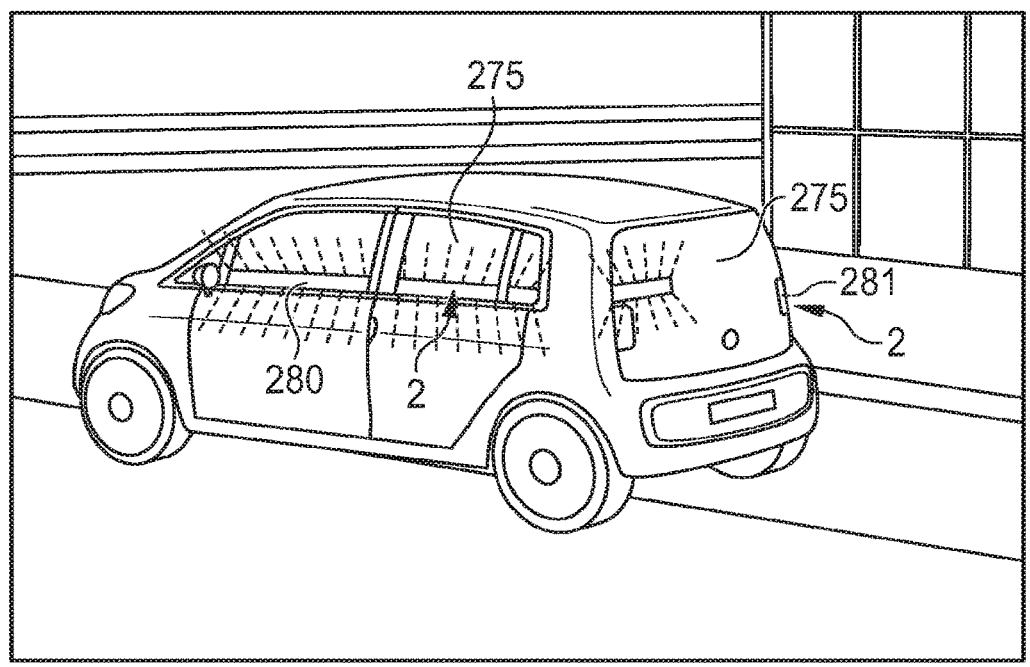
Figure 61C:
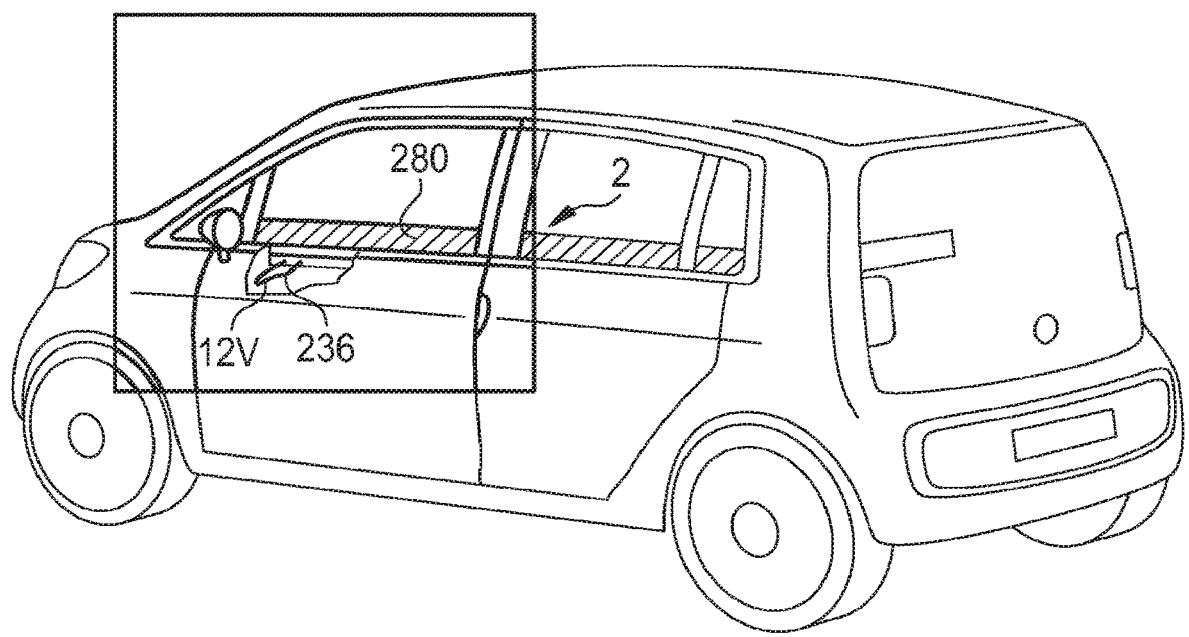

FIGS. 61A to 61C show a further exemplary embodiment of a luminaire 2 described here in schematic illustrations.

The luminaire 2 in the present case is a vehicle light such as, for example, a brake light, an indicator light 280 and/or a rear light 281. What is common to the vehicle lights mentioned in this case is that they are integrated in a vehicle window 275. The luminaires 2 comprise, for example, a transparent organic light-emitting diode, the first carrier 130 and second carrier 131 of which are in each case formed with a glass. The organic light-emitting diodes 1 are therefore integrated as transparent organic light-emitting diodes into parts of the vehicle windows 275. In this way it is possible to form an indicator light 280, for example, which can extend over the entire length of the vehicle. This increases the noticeability of the vehicle in road traffic.

By way of example, the organic light-emitting diodes 1 described in conjunction with FIGS. 1 to 31 are used as organic light-emitting diode 1 for the luminaire 2 embodied as a vehicle light.

If the luminaire 2 is a rear light 281 or a brake light, then the luminaire can comprise an organic light-emitting diode 1 having a retroreflector, as explained in greater detail for example in conjunction with FIGS. 29 and 30. In this case, even in the switched-off operating state, the luminaire 2 can reflect back red light, for example when irradiated by an automobile headlight.

As explained in conjunction with the schematic illustration in FIG. 61C, the luminaire 2 can be connected to the automobile battery of the motor vehicle for power supply via connection conductors 236.

Figure 62:
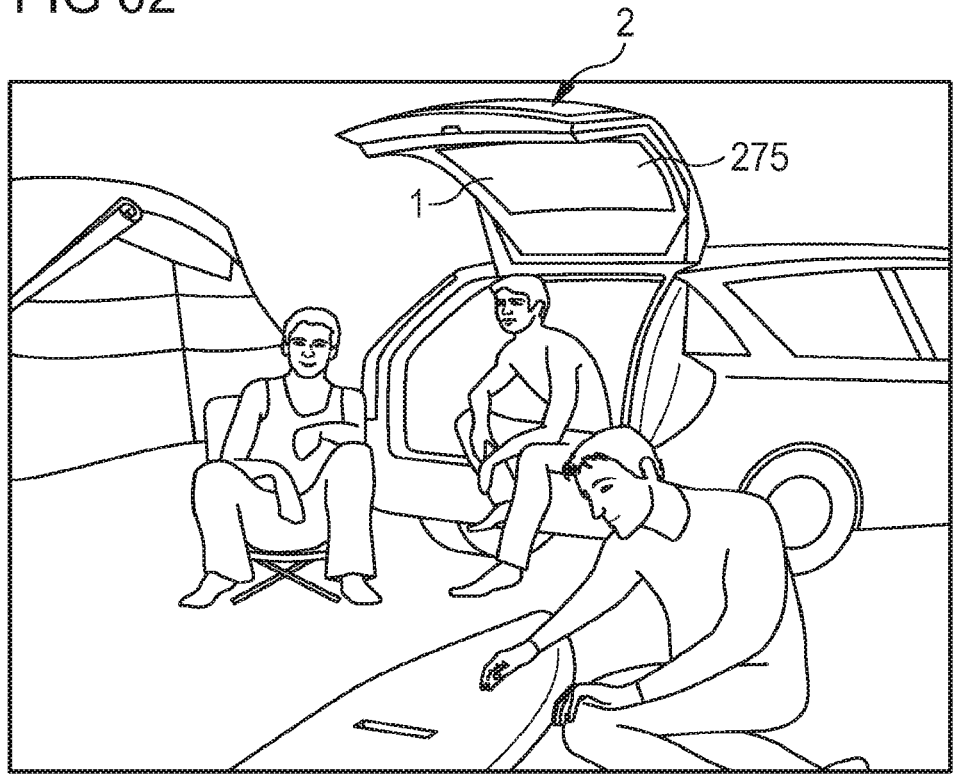
FIGS. 62 and 63 show, on the basis of a schematic illustration, exemplary embodiments of a luminaire which is used for illumination in a motor vehicle.

In conjunction with FIG. 62, a further exemplary embodiment of a luminaire described here is explained in greater detail with reference to a schematic perspective illustration. In this exemplary embodiment, for the purpose of forming the luminaire 2, a transparent organic light-emitting diode is integrated over the whole area into a vehicle window 275—here into the rear window. That is to say that the rear window 275 is formed by a transparent organic light-emitting diode 1. Such a luminaire 2 can serve for example for illuminating the interior of a trunk when the vehicle is not being driven.

Furthermore, it is possible for the organic light-emitting diode 1 to contain an emitter material suitable for generating infrared electromagnetic radiation. In this case, the organic light-emitting diode 1 can also be used for deicing a vehicle window 275. The organic light-emitting diode 1 then need not necessarily also be suitable for generating visible light. In particular, it is possible in this case for all the vehicle windows 275 of the motor vehicle to be formed by transparent organic light-emitting diodes which are suitable for generating infrared electromagnetic radiation during operation. In this way, it is also possible, for example, to heat a front window of the motor vehicle, without heating wires threading through the window or without having to arrange in the vehicle a fan that blows hot air onto the vehicle window 275. In this way, it is also possible to prevent the vehicle windows 275 from steaming up.

By means of an optical cavity as explained in greater detail in conjunction with FIGS. 26 and 27, it is possible for the entire or at least a majority of the infrared radiation generated to be directed toward the outside, out of the vehicle. In this case, by way of example, snow lying on the vehicle windows 275 can be melted away particularly efficiently.

Figure 63:
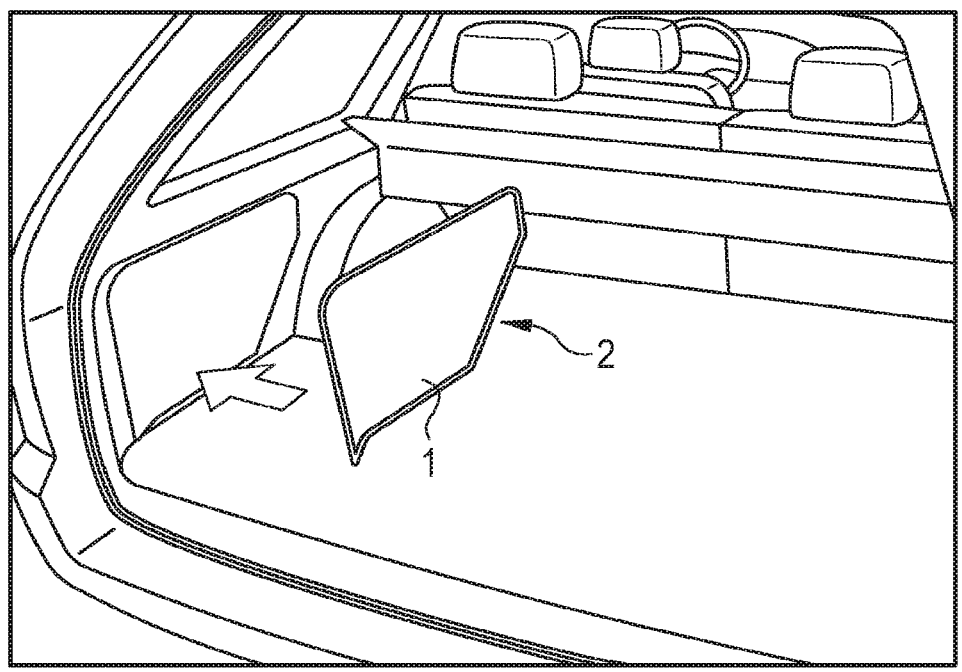

In conjunction with FIG. 63, a further exemplary embodiment of a luminaire 2 described here is explained in greater detail with reference to a schematic perspective illustration. In this case, in order to form the luminaire 2, an organic light-emitting diode 1 is integrated in side areas of a trunk. The organic light-emitting diode 1 is integrated into the side areas of a trunk purely by way of example. In principle, it is possible for an organic light-emitting diode 1 to be fitted at any location in the interior of the motor vehicle. In particular, an organic light-emitting diode 1 can also be integrated onto the inner side of the vehicle roof or into the base of the trunk. The organic light-emitting diode 1 allows large-area illumination of the interior of the motor vehicle, without high luminances having to be used for this purpose—on account of the relatively large area of the light exit area 175 of the organic light-emitting diode 1. That means that the organic light-emitting diode 1 allows illumination of the interior of the motor vehicle with relatively low luminances, thus resulting in dazzle-free lighting.

Figure 64A:
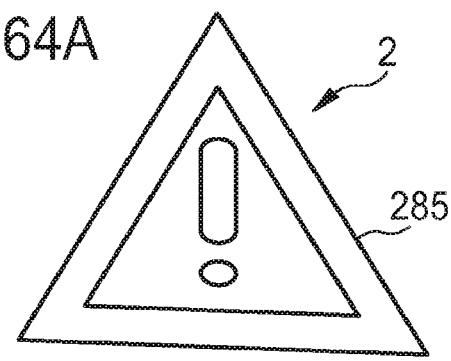
FIGS. 64A to 64C show, on the basis of schematic illustrations, exemplary embodiments of a luminaire which is used as a warning sign.
Figure 64B:
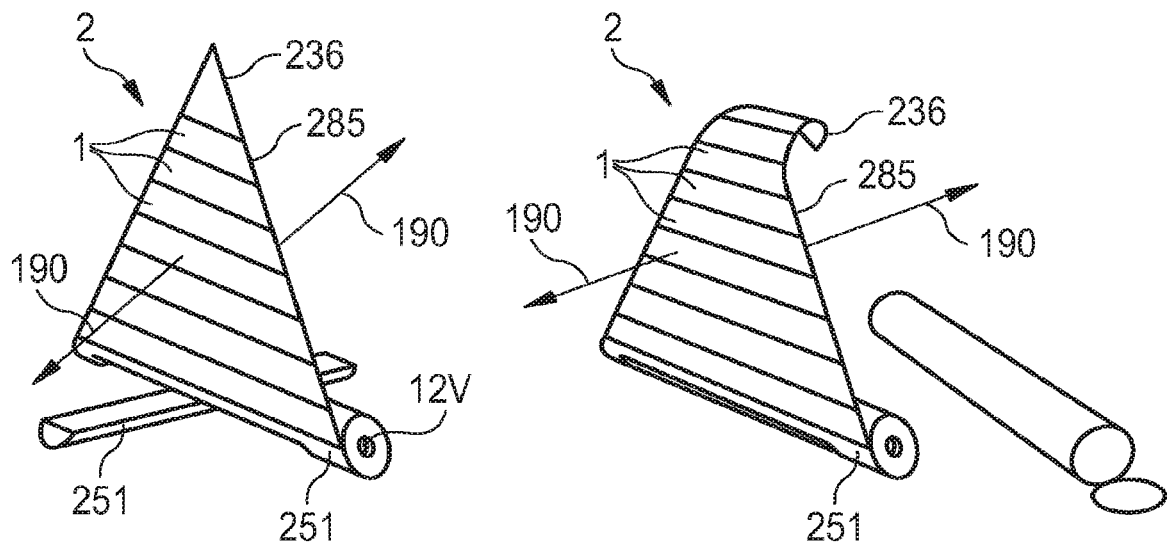
Figure 64C:
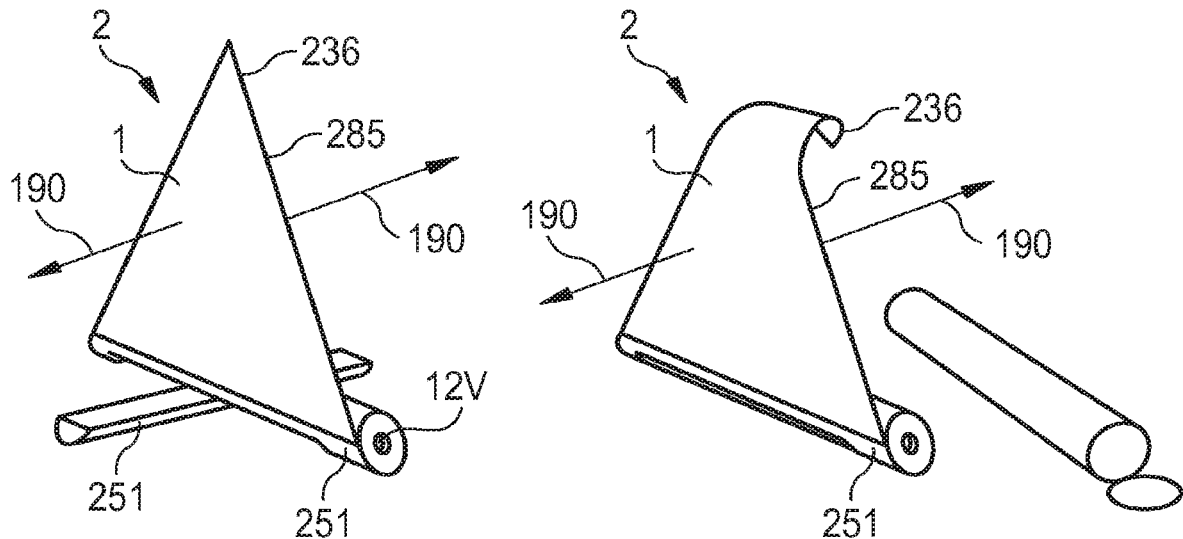

In conjunction with FIGS. 64A to 64C, a further exemplary embodiment of a luminaire described here is explained in greater detail with reference to schematic illustrations. In this exemplary embodiment, the luminaire 2 forms a warning sign 285 such as can be used in road traffic, for example. In this case, as shown in FIGS. 64B and 64C, the warning sign 285 is embodied in flexible fashion, such that it can be rolled up and unrolled. In FIG. 64B it is explained that the warning sign 285 can, for this purpose, be divided into individual organic light-emitting diodes 1 that are connected to one another by means of flexible connection conductors 236 that can be rolled up and unrolled.

In conjunction with FIG. 64C it is shown that the warning sign 285 can also be formed by one fully flexible organic light-emitting diode 1.

In both embodiments of the warning sign 285 it can be expedient for the warning sign 285 to emit electromagnetic radiation from two main areas. That is to say that the warning sign 285 is actively luminous from two sides, for example. By way of example, at least one organic light-emitting diode 1 with retroreflector as explained in greater detail in FIGS. 29 and 30 is employed for forming the warning sign 285. In particular, it is possible for the warning sign 285 to have such organic light-emitting diodes 1 at both sides, such that it actively emits and reflects electromagnetic radiation 190 from both sides.

Figure 65A:
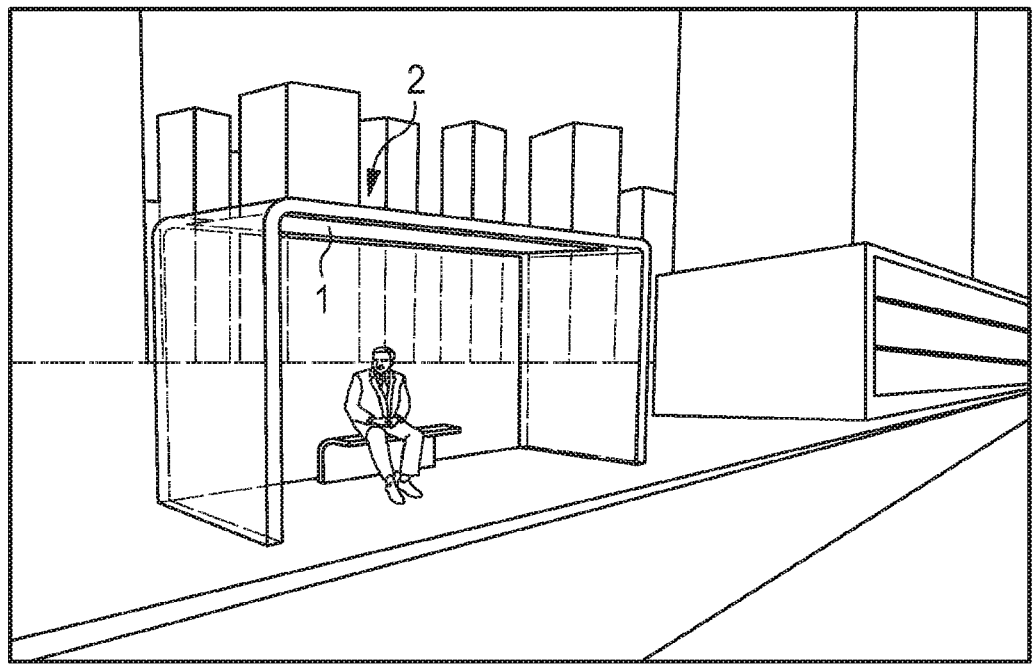
FIGS. 65A to 65C show, on the basis of schematic illustrations, exemplary embodiments of a luminaire which forms rain protection.
Figure 65B:
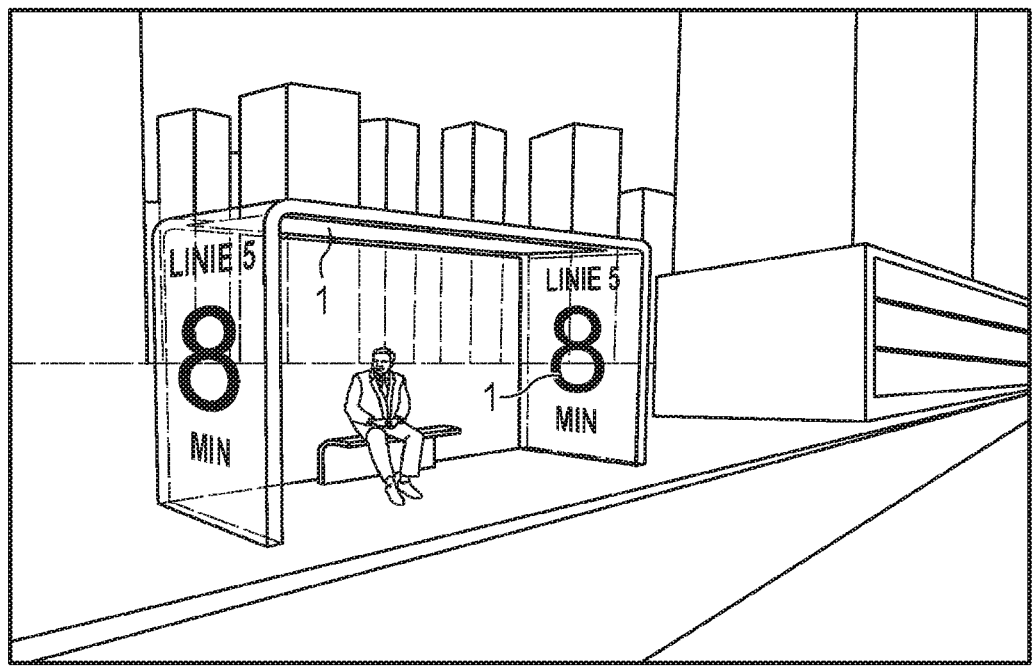
Figure 65C:
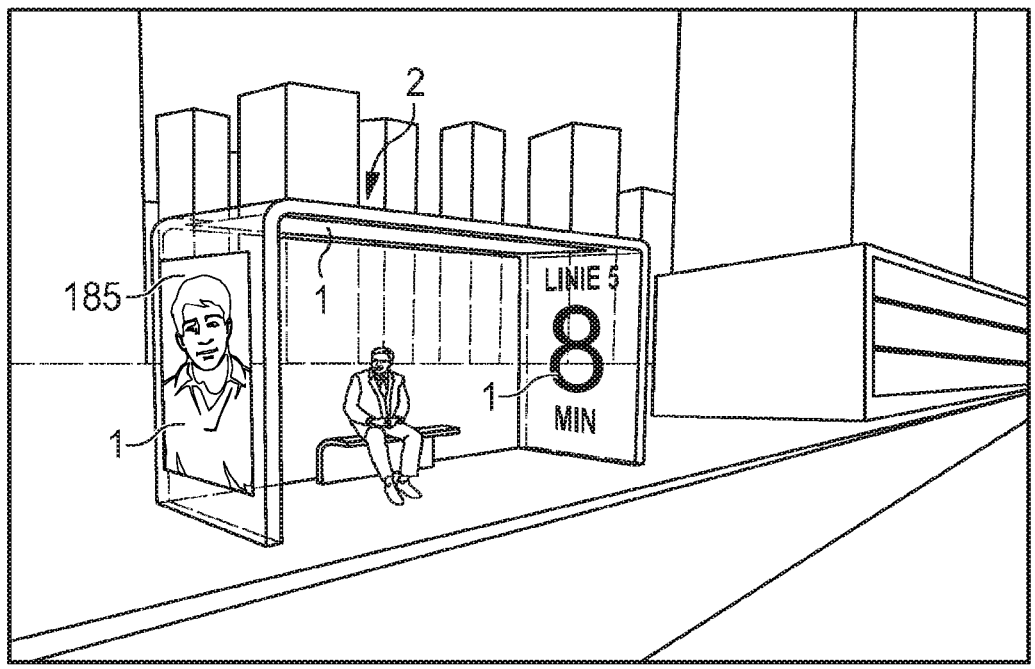

Further exemplary embodiments of a luminaire 2 described here are explained in greater detail in conjunction with FIGS. 65A to 65C. In this exemplary embodiment, the luminaire 2 forms rain protection, for example a bus shelter. In this case, the luminaire 2 can comprise a plurality of organic light-emitting diodes 1 embodied in transparent fashion. By way of example, the carriers 130, 131 of the luminaire 2 form the basic body of the bus shelter and thus the rain protection. An encapsulation can then be embodied as in conjunction with the luminaire 2 embodied as a shower cubicle (cf. FIGS. 33 to 35).

Furthermore, it is also possible, as indicated in FIG. 65B, for at least one of the organic light-emitting diodes 1 to be embodied as a large-area display device which, by way of example, can display the next transport links, the time of day, the outside temperature or further simple information.

Finally, it is also possible, as described in greater detail in conjunction with FIG. 65C, for one of the luminaires 2 to serve for illuminating an area 185a to be illuminated. The area 185a to be illuminated is, for example, an advertisement such as a poster or the like. In this case, the element 185 to be illuminated is exchangeable, such that the area 185a to be illuminated can be changed from time to time.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A device comprising:
   an organic light-emitting diode comprising an organic layer sequence, a radiation exit area and an encapsulation, wherein the organic layer sequence and the encapsulation are disposed on a flexible carrier, wherein the organic layer sequence comprises at least one radiation-emitting region which generates electromagnetic radiation in a spectral range from infrared radiation to UV radiation during operation, and wherein the encapsulation forms a seal of the organic layer sequence against environmental influences; and
   at least one touch-sensitive operating element, wherein the at least one touch-sensitive operating element comprises at least one touch sensor, and wherein the device is flexible.

2. The device according to claim 1, wherein the device is bendable or rollable.

3. The device according to claim 2, wherein the device maintains its form after bending.

4. The device according to claim 1, wherein the flexible carrier comprises a film or a plastic film or a laminate.

5. The device according to claim 1, wherein the encapsulation is flexible.

6. The device according to claim 1, wherein the touch-sensitive operating element is arranged at a light exit area of the device.

7. The device according to claim 1, wherein the at least one touch sensor is integrated into the organic light-emitting diode.

8. The device according to claim 1, wherein the device is drivable by means of a gesture control.

9. A device comprising:
   an organic light-emitting diode comprising an organic layer sequence, a radiation exit area and an encapsulation, wherein the organic layer sequence comprises at least one radiation-emitting region which generates electromagnetic radiation in a spectral range from infrared radiation to UV radiation during operation, and wherein the encapsulation forms a seal of the organic layer sequence against environmental influences,
   at least one touch-sensitive operating element, wherein the at least one touch-sensitive operating element comprises at least one touch sensor, and wherein
   the device is formed on a flexible carrier whereby the device is bendable or rollable.

10. The device according to claim 9, wherein the touch-sensitive operating element is arranged at a light exit area of the device.

11. The device according to claim 9, wherein the at least one touch sensor is integrated into the organic light-emitting diode.

12. The device according to claim 9, wherein the device is drivable by means of a gesture control.

* * * * *